US012325721B2

(12) United States Patent

Nie et al.

(10) Patent No.: US 12,325,721 B2
(45) Date of Patent: Jun. 10, 2025

(54) ORGANIC COMPOUND, APPLICATION THEREOF, AND ORGANIC ELECTROLUMINESCENT DEVICE

(71) Applicant: Shaanxi Lighte Optoelectronics Material Co., Ltd., Xi'an (CN)

(72) Inventors: Qiqi Nie, Xi'an (CN); Tiantian Ma, Xi'an (CN); Jiamei Cao, Xi'an (CN)

(73) Assignee: SHAANXI LIGHTE OPTOELECTRONICS MATERIAL CO., LTD., Xi'an (CN)

( * ) Notice: Subject to any disclaimer, the term of this patent is extended or adjusted under 35 U.S.C. 154(b) by 783 days.

(21) Appl. No.: 17/623,319

(22) PCT Filed: Nov. 26, 2020

(86) PCT No.: PCT/CN2020/131873

§ 371 (c)(1),
(2) Date: Dec. 28, 2021

(87) PCT Pub. No.: WO2021/135750

PCT Pub. Date: Jul. 8, 2021

(65) Prior Publication Data

US 2022/0306655 A1 Sep. 29, 2022

(30) Foreign Application Priority Data

Dec. 31, 2019 (CN) ......................... 201911416572.7
Oct. 21, 2020 (CN) ......................... 202011133615.3

(51) Int. Cl.
*H01L 51/00* (2006.01)
*C07F 5/02* (2006.01)
(Continued)

(52) U.S. Cl.
CPC ........... *C07F 5/027* (2013.01); *H10K 85/322* (2023.02); *H10K 85/615* (2023.02);
(Continued)

(58) Field of Classification Search
CPC ...... C07F 5/027; H10K 85/322; H10K 85/658
See application file for complete search history.

(56) References Cited

U.S. PATENT DOCUMENTS

2019/0280209 A1 9/2019 Fujita
2020/0223873 A1* 7/2020 Thöbes .............. H10K 85/6572
2023/0104248 A1* 4/2023 Stoessel ............. H10K 85/6572
252/301.16

FOREIGN PATENT DOCUMENTS

CN 105308026 A 2/2016
CN 106467553 A 3/2017
(Continued)

OTHER PUBLICATIONS

International Search Report from corresponding International Application No. PCT/CN2020/131873, mailed on Mar. 3, 2021, 6 pages.
(Continued)

*Primary Examiner* — Alexander C Kollias
(74) *Attorney, Agent, or Firm* — Tucker Ellis LLP

(57) ABSTRACT

The present disclosure provides an organic compound, said compound having a structure as represented by Formula (1) below, in which at least one among $Q_1$, $Q_2$, and $Q_3$ is (aa), and (bb) indicates a connective bond; $n_1$ and $n_2$ are the same or different, and are respectively independently selected from 0, 1, 2, 3, or 4; $n_3$ and $n_4$ are the same or different, and are respectively independently selected from 0, 1, 2, 3, 4, or 5; $n_5$ is selected from 0, 1, 2, or 3; $R_1$, $R_2$, $R_3$, $R_4$, and $R_5$ are the same or different, and are respectively independently selected from deuterium, cyano, halogen, a substituted or unsubstituted alkyl having 1 to 10 carbon atoms, a substituted or unsubstituted aryl having 6 to 40 carbon atoms, a substituted or unsubstituted heteroaryl having 2 to 40 carbon atoms, or a substituted or unsubstituted arylamine having 6 to 40 carbon atoms. The organic compound in the present
(Continued)

disclosure used for organic electroluminescent devices can significantly improve luminous efficacy and prolong the life of organic electroluminescent devices.

(1)

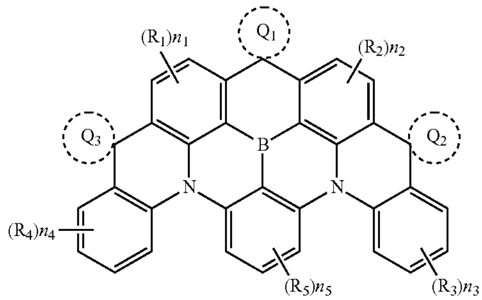

(aa)

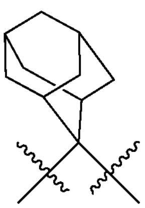

(bb)

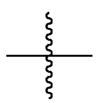

14 Claims, 1 Drawing Sheet

(51) Int. Cl.
*H10K 85/30* (2023.01)
*H10K 85/60* (2023.01)
*H10K 50/11* (2023.01)

(52) U.S. Cl.
CPC ......... *H10K 85/624* (2023.02); *H10K 85/636* (2023.02); *H10K 85/657* (2023.02); *H10K 85/6572* (2023.02); *H10K 85/6574* (2023.02); *H10K 85/6576* (2023.02); *H10K 85/658* (2023.02); *C07B 2200/05* (2013.01); *H10K 50/11* (2023.02)

(56) References Cited

FOREIGN PATENT DOCUMENTS

| | | | |
|---|---|---|---|
| CN | 109438350 | A | 3/2019 |
| CN | 109575059 | A | 4/2019 |
| CN | 109593042 | A | 4/2019 |
| CN | 110028459 | A | 7/2019 |
| CN | 110128279 | A | 8/2019 |
| CN | 110156756 | A | 8/2019 |
| CN | 110183333 | A | 8/2019 |
| CN | 110563647 | A | 12/2019 |
| KR | 20180127918 | A | 11/2018 |
| WO | 2017195669 | A1 | 11/2017 |
| WO | 2018150832 | A1 | 8/2018 |
| WO | 2019004247 | A1 | 1/2019 |
| WO | 2019074093 | A1 | 4/2019 |
| WO | 2019162332 | A1 | 8/2019 |
| WO | 2019194298 | A1 | 10/2019 |
| WO | 2019198699 | A1 | 10/2019 |
| WO | 2018186396 | A1 | 2/2020 |

OTHER PUBLICATIONS

Office Action from corresponding Korean Application No. 10-2021-7043405; dated Oct. 17, 2023, 10 pages with translation.

* cited by examiner

ORGANIC COMPOUND, APPLICATION THEREOF, AND ORGANIC ELECTROLUMINESCENT DEVICE

CROSS REFERENCE TO RELATED APPLICATIONS

This application claims priority to Chinese Patent Application No. CN201911416572.7, filed on Dec. 31, 2019, and Chinese Patent Application No. CN202011133615.3, filed on Oct. 21, 2020, the disclosures of which are incorporated herein by reference in their entirety as part of this application.

TECHNICAL FIELD

The present disclosure relates to the technical field of organic light-emitting materials, in particular to an organic compound, application thereof and an organic electroluminescent device.

BACKGROUND

With the development of electronic technology and the advancement of material science, the range of applications of electronic components for realizing electroluminescence or photoelectric conversion is increasingly widespread. Electronic components of this type typically each include a cathode and an anode which are oppositely disposed, and a functional layer disposed between the cathode and the anode. The functional layer consists of multiple organic or inorganic film layers and generally includes an energy conversion layer, a hole transporting layer between the energy conversion layer and the anode, and an electron transporting layer between the energy conversion layer and the cathode.

Taking an organic electroluminescent device as an example, the organic electroluminescent device generally includes an anode, a hole transporting layer, an electroluminescent layer as an energy conversion layer, an electron transporting layer, and a cathode which are stacked in sequence. When an electric voltage is applied to the anode and the cathode, the two electrodes generate an electric field, under the action of the electric field, electrons on the cathode side move towards the electroluminescent layer and holes on the anode side also move towards the light-emitting layer, electrons and holes are combined to form excitons in the electroluminescent layer, and the excitons are in an excited state to release energy outwards, thereby causing the electroluminescent layer to emit light outwards. Organic light-emitting diodes have self-luminous properties, and materials that dominate their light emission are mainly electroluminescent materials, however, current electroluminescent materials have low luminous efficacy, which often leads to failure of organic light-emitting diodes.

SUMMARY

The present disclosure aims to increase the luminous efficacy of electroluminescent devices and prolong the service life of electroluminescent devices.

In order to achieve the above object, a first aspect of the present disclosure provides a compound having a structure as represented by the following formula (1):

Formula (1)

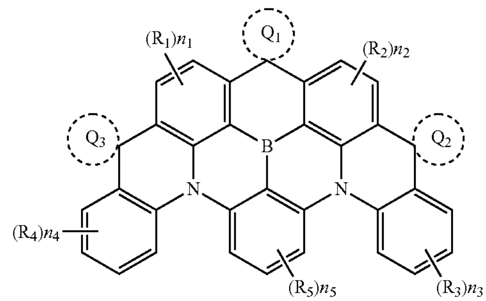

wherein at least one among $Q_1$, $Q_2$, and $Q_3$ is

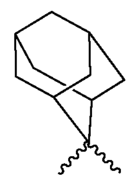

and

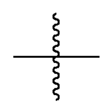

indicates a connective bond;

$n_1$ and $n_2$ are the same or different, and are respectively independently selected from 0, 1, 2, 3, or 4;

$n_3$ and $n_4$ are the same or different, and are respectively independently selected from 0, 1, 2, 3, 4, or 5;

$n_5$ is selected from 0, 1, 2, or 3;

$R_1$, $R_2$, $R_3$, $R_4$, and $R_5$ are the same or different, and are respectively independently selected from deuterium, cyano, halogen, a substituted or unsubstituted alkyl having 1 to 10 carbon atoms, a substituted or unsubstituted aryl having 6 to 40 carbon atoms, a substituted or unsubstituted heteroaryl having 2 to 40 carbon atoms, and a substituted or unsubstituted arylamine having 6 to 40 carbon atoms;

alternatively, two adjacent $R_1$ and $R_2$ are connected with each other to form a ring, or two adjacent $R_2$ and $R_3$ are connected with each other to form a ring, or two adjacent $R_3$ and $R_4$ are connected with each other to form a ring, or two adjacent $R_4$ and $R_5$ are connected with each other to form a ring, or two adjacent $R_1$ and $R_4$ are connected with each other to form a ring;

the substituents of $R_1$, $R_2$, $R_3$, $R_4$, and $R_5$ are the same or different, and are respectively independently selected from deuterium, cyano, halogen, an unsubstituted alkyl having 1 to 30 carbon atoms, an unsubstituted cycloalkyl having 3 to 30 carbon atoms, an unsubstituted heterocycloalkyl having 2 to 30 carbon atoms, an aryl having 6 to 30 carbon atoms optionally substituted with an alkyl having 1 to 5 carbon atoms, an unsubstituted heteroaryl having 1 to 30 carbon atoms, an unsubstituted alkoxy having 1 to 30 carbon atoms, an unsubstituted arylamine having 6 to 30 carbon atoms, an unsubstituted alkylsilyl having 1 to 30 carbon atoms, or an unsubstituted arylsilyl having 6 to 30 carbon atoms.

A second aspect of the present disclosure provides the application of the organic compound provided by the first aspect of the present disclosure in an organic electroluminescent device.

A third aspect of the present disclosure provides an organic electroluminescent device, comprising an anode, a cathode and at least one functional layer between the anode and the cathode, where the functional layer includes a hole injecting layer, a hole transporting layer, an organic electroluminescent layer, an electron transporting layer and an electron injecting layer; the organic electroluminescent layer contains the organic compound of the first aspect of the present disclosure.

By the above technical solution, the organic compound of the present disclosure has an adamantane-six-membered ring-based structure, and the structure is combined with a solid ring centered on a boron element, which is advantageous to improve the electron stability, prevent the disappearance of excitons, promote host energy transfer, and can significantly improve the stability of carriers and improve the luminescent properties of organic light-emitting devices. And the driving voltage of the organic electroluminescent device containing the organic compound of the present disclosure can be reduced.

Other features and advantages of the present disclosure will be described in detail in the subsequent Detailed Description.

BRIEF DESCRIPTION OF THE DRAWINGS

The above and other features and advantages of the present disclosure will become more apparent by describing in detail exemplary embodiments thereof with reference to the accompanying drawings.

Figure 1:
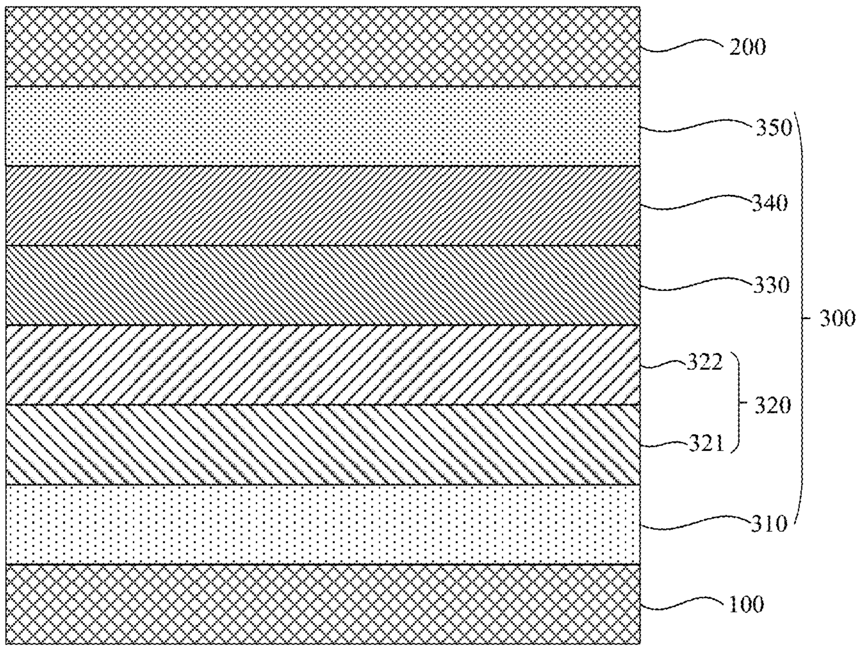
FIG. 1 is a structural schematic diagram of an organic electroluminescent device according to the embodiments of the present disclosure.
Figure 2:
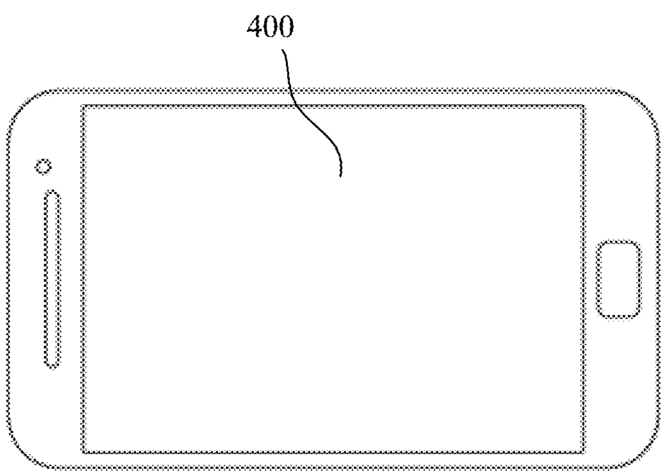
FIG. 2 is a structural schematic diagram of an electronic device according to the embodiments of the present disclosure.

The reference signs of main elements in the drawings are illustrated below:

100, anode; 200, cathode; 300, functional layer; 310, hole injecting layer; 320, hole transporting layer; 321, first hole transporting layer; 322, second hole transporting layer; 330, organic electroluminescent layer; 340, electron transporting layer; 350, electron injecting layer; 400, electronic device.

DETAILED DESCRIPTION

Exemplary embodiments will now be described more fully with reference to the accompanying drawings. Exemplary embodiments can, however, be implemented in many forms and should not be construed as limited to the embodiments set forth herein; on the contrary, these embodiments are provided so that the present disclosure will be thorough and complete, and the concept of the exemplary embodiments is fully conveyed to those skilled in the art. The described features, structures, or characteristics may be combined in any suitable manner in one or more embodiments. In the following description, numerous specific details are provided to provide a thorough understanding of embodiments of the present disclosure.

In the drawings, the area and layer thickness may be exaggerated for clarity. The same reference signs in the drawings denote the same or similar structures, and thus their detailed description will be omitted.

The described features, structures, or characteristics may be combined in any suitable manner in one or more embodiments. In the following description, numerous specific details are provided to provide a thorough understanding of embodiments of the present disclosure. One skilled in the art will recognize, however, that the technical solution of the present disclosure may be practiced without one or more of the specific details, or that other methods, elements, materials, etc. may be employed. In other instances, well-known structures, materials, or operations are not shown or described in detail to avoid obscuring the principal technical creatives of the present disclosure.

The terms "the" and "said" are used to indicate the presence of one or more elements/components/etc.; the terms "including" and "having" are used in an open, inclusive sense and mean that additional elements/components/etc. may be present in addition to the listed elements/components/etc.

A first aspect of the present disclosure provides an organic compound, having a structure as represented by the following formula (1):

Formula (1)

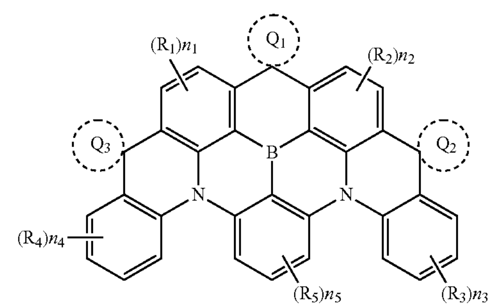

wherein at least one among $Q_1$, $Q_2$, and $Q_3$ is

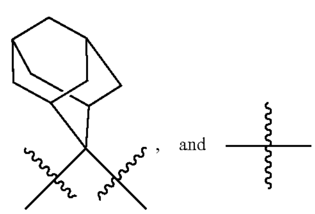

indicates a connective bond;

$n_1$ and $n_2$ are the same or different, and are respectively independently selected from 0, 1, 2, 3, or 4;

$n_3$ and $n_4$ are the same or different, and are respectively independently selected from 0, 1, 2, 3, 4, or 5;

$n_5$ is selected from 0, 1, 2, or 3;

$R_1$, $R_2$, $R_3$, $R_4$, and $R_5$ are the same or different, and are respectively independently selected from deuterium, cyano, halogen, a substituted or unsubstituted alkyl having 1 to 10 carbon atoms, a substituted or unsubstituted aryl having 6 to 40 carbon atoms, a substituted or unsubstituted heteroaryl having 2 to 40 carbon atoms, or a substituted or unsubstituted arylamine having 6 to 40 carbon atoms;

alternatively, two adjacent $R_1$ and $R_2$ are connected with each other to form a ring, or two adjacent $R_2$ and $R_3$ are connected with each other to form a ring, or two adjacent $R_3$ and $R_4$ are connected with each other to form a ring, or two adjacent $R_4$ and $R_5$ are connected with each other to form a ring, or two adjacent $R_1$ and $R_4$ are connected with each other to form a ring. It should be noted that "two adjacent $R_1$ and $R_2$ are connected with each other to form a ring" means that $R_1$ and $R_2$ may be present in a saturated or unsaturated cyclic form, or may be present independently of each other. For example, when two adjacent $R_1$ and $R_2$, two adjacent $R_2$ and $R_3$, two adjacent $R_3$ and $R_4$, and two adjacent $R_4$ and $R_5$ form rings, the ring-forming ways are, for example,

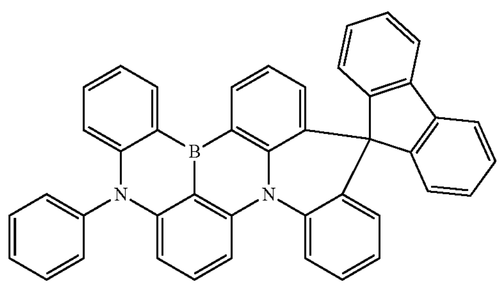

,

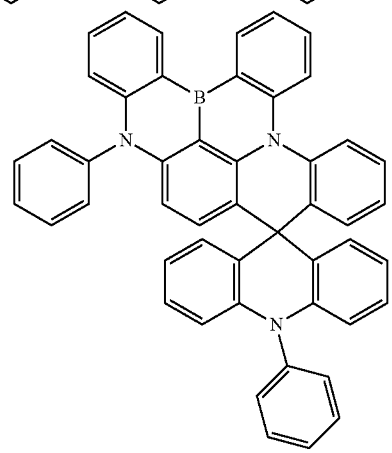

, or

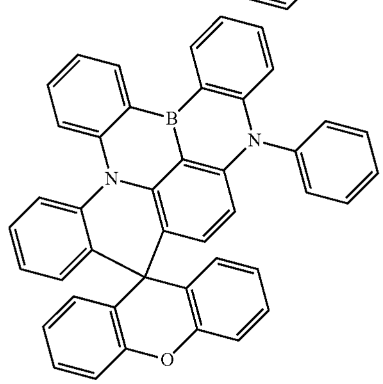

.

The substituents of $R_1$, $R_2$, $R_3$, $R_4$, and $R_5$ are the same or different, and are respectively independently selected from deuterium, cyano, halogen, an unsubstituted alkyl having 1 to 30 carbon atoms, an unsubstituted cycloalkyl having 3 to 30 carbon atoms, an unsubstituted heterocycloalkyl having 2 to 30 carbon atoms, an aryl having 6 to 30 carbon atoms optionally substituted with an alkyl having 1 to 5 carbon atoms, an unsubstituted heteroaryl having 1 to 30 carbon atoms, an unsubstituted alkoxy having 1 to 30 carbon atoms, an unsubstituted arylamine having 6 to 30 carbon atoms, an unsubstituted alkylsilyl having 1 to 30 carbon atoms, or an unsubstituted arylsilyl having 6 to 30 carbon atoms. In the present disclosure, "the aryl having 6 to 30 carbon atoms optionally substituted with the alkyl having 1 to 5 carbon atoms" means that the aryl may be substituted with the alkyl having 1 to 5 carbon atoms, or may not be substituted with the alkyl having 1 to 5 carbon atoms.

In the present disclosure, "at least one among $Q_1$, $Q_2$, and $Q_3$ is

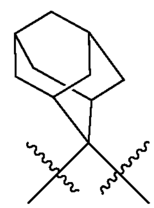

"

means that one of $Q_1$, $Q_2$, and $Q_3$ is

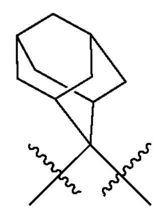

, or two of $Q_1$, $Q_2$, and $Q_3$ are

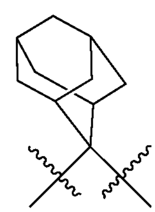

, or three of $Q_1$, $Q_2$, and $Q_3$ are

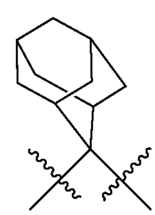

.

In the present disclosure, the dashed line " - - - " in Formula (1) indicates that a connective bond may be formed at the dashed line, or may not be formed at the dashed line. Specifically, the dashed line at $Q_3$ indicates that $Q_3$ may form a connective bond at this dashed line to be connected with the benzene rings to form a ring, or may not form a connective bond and not be connected with the benzene rings to form a ring; the dashed line at $Q_2$ indicates that $Q_2$ may form a connective bond at this dashed line to be connected with the benzene rings to form a ring, or may not form a connective bond and not be connected with the benzene rings to form a ring; the dashed line at $Q_1$ indicates that $Q_1$ may form a connective bond at this dashed line to be connected with the benzene rings to form a ring, or may not form a connective bond and not be connected with the benzene rings to form a ring.

In the present disclosure, the dashed line in Formula (1) means that one of $Q_1$, $Q_2$ and $Q_3$ does not exist when it is not "

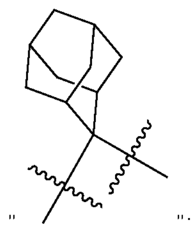 [SMILES: *C1(*)C2CC3CC(C2)CC1C3]

". For example, $Q_1$ does not exist when it is not "

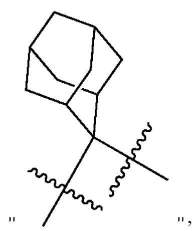

", $Q_2$ does not exist when it is not "

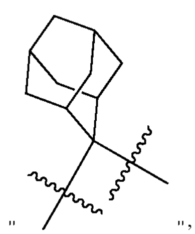 [SMILES: *C1(*)C2CC3CC(C2)CC1C3]

", $Q_3$ does not exist when it is not

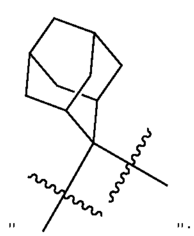 [SMILES: *C1(*)C2CC3CC(C2)CC1C3]

".

In the present disclosure, when $n_1$, $n_2$, $n_3$, $n_4$, or $n_5$ are selected from 0, the connected benzene ring is not substituted.

In the present disclosure, $n_1$ is the number of substituent $R_1$, and when $n_1$ is greater than or equal to 2, any two $R_1$ are the same or different; $n_2$ is the number of substituent $R_2$, when $n_2$ is greater than or equal to 2, any two $R_2$ are the same or different; $n_3$ is the number of substituent $R_3$, when $n_3$ is greater than or equal to 2, any two $R_3$ are the same or different; $n_4$ is the number of substituent $R_4$, when $n_4$ is greater than or equal to 2, any two $R_4$ are the same or different; $n_5$ is the number of substituent $R_5$, and when $n_5$ is greater than or equal to 2, any two $R_5$ are the same or different.

In the molecular structure of the organic compound of the present disclosure, the boron element in the organic compound forms a solid ring structure with the central arylamine. And the combination of the borylamine and electron-rich spiroarylamine can improve the electron stability, prevent the disappearance of excitons, and facilitate energy transfer of the host, thus maximizing the efficiency. Linking the adamantane-six-membered ring with the solid ring centered on the boron element, due to the alkane structure of adamantane, can greatly reduce the 7E-7E stacking effect of the molecules, and significantly improve the stability of carriers, thus improving the luminescent properties of organic light-emitting devices. The organic electroluminescent device containing the organic compound has higher luminous efficacy and longer service life.

In the present disclosure, the number of carbon atoms of $R_1$, $R_2$, $R_3$, $R_4$ and $R_5$ refers to the number of all carbon atoms. For example, if $R_1$, $R_2$, $R_3$, $R_4$ and $R_5$ are selected from a substituted aryl having 18 carbon atoms, the number of all carbon atoms of the aryl and the substituents thereon are 18; if $R_1$, $R_2$, $R_3$, $R_4$ and $R_5$ are selected from a substituted alkyl having 10 carbon atoms, the number of all carbon atoms of the alkyl and the substituents thereon is 10; if $R_1$, $R_2$, $R_3$, $R_4$ and $R_5$ are selected from a substituted heteroaryl having 10 carbon atoms, the number of all carbon atoms of the heteroaryl and the substituents thereon is 10; if $R_1$, $R_2$, $R_3$, $R_4$ and $R_5$ are selected from a substituted arylamine having 10 carbon atoms, the number of all carbon atoms of the arylamine and the substituents thereon is 10.

In the present disclosure, the descriptions used "are each independently . . . ", " . . . are respectively independently-"and" . . . are independently selected from" may interchangeable, and should be understood in a broad sense, which means that specific options expressed between identical symbols in different groups do not affect each other, or means that specific options expressed between identical symbols in the same group do not affect each other. For example, "

Formula Q-1

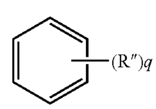

Formula Q-2

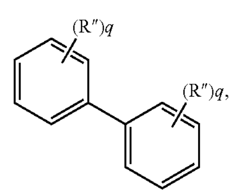

where each q is independently 0, 1, 2 or 3, and each R" is independently selected from hydrogen, deuterium, fluorine, or chlorine" means that the formula Q-1 indicates that there are q substituents R" on the benzene ring, each R" may be the same or different, and the options of each R" do not affect each other; the formula Q-2 indicates that there are q substituents R" on each benzene ring of biphenyl, the number q of R" substituents on both benzene rings may be the same or different from each other, each R" may be the same or different, and the options of each R" do not affect each other.

In the present disclosure, the term "substituted or unsubstituted" means that the functional groups described after the term may have or may not have substituents (substituents are collectively referred to as Rc hereinafter for ease of description). For example, "the substituted or unsubstituted aryl" refers to an aryl with a substituent Rc or an unsubstituted aryl. The above substituent, i.e. Rc, for example, may be deuterium, halogen, cyano, a heteroaryl having 3 to 20 carbon atoms, an aryl having 6 to 20 carbon atoms, a trialkylsilyl having 3 to 12 carbon atoms, a triarylsilyl having 18 to 30 carbon atoms, an alkyl having 1 to 10 carbon atoms, a haloalkyl having 1 to 10 carbon atoms, an alkenyl having 2 to 6 carbon atoms, an alkynyl having 2 to 6 carbon atoms, a cycloalkyl having 3 to 10 carbon atoms, a heterocycloalkyl having 2 to 10 carbon atoms, a cycloalkenyl having 5 to 10 carbon atoms, a heterocycloalkenyl having 4 to 10 carbon atoms, an alkoxy having 1 to 10 carbon atoms, an alkamine having 1 to 10 carbon atoms, an alkylthio having 1 to 10 carbon atoms, an aryloxy having 6 to 18 carbon atoms, an arylthio having 6 to 18 carbon atoms, an alkylsulfonyl having 6 to 18 carbon atoms, a trialkylphosphino having 3 to 18 carbon atoms, or a trialkylboryl having 3 to 18 carbon atoms.

In the present disclosure, in the expression "any two adjacent substituents form a ring", "any adjacent substituents" may include both substituents on the same atom and one substituent on each of two adjacent atoms; when there are two substituents on the same atom, the two substituents may form a saturated or unsaturated ring (e.g., a 3- to 18-membered saturated or unsaturated ring) with the atom to which they are jointly connected; when two adjacent atoms have one substituent on each, the two substituents may be fused to a ring, e.g., a naphthalene ring, a phenanthrene ring, or an anthracene ring.

In the present disclosure, when a specific definition is not otherwise provided, "hetero" means that at least one heteroatom such as B, O, N, P, Si, Se, or S is included in one functional group and the remaining atoms are carbon and hydrogen. An unsubstituted alkyl may be a "saturated alkyl" without any double or triple bonds.

In the present disclosure, "alkyl" may include a linear alkyl or a branched alkyl. The alkyl may have 1 to 20 carbon atoms, and in the present disclosure, a numerical range such as "1 to 20" refers to each integer in the given range. For example, "1 to 20 carbon atoms" refers to an alkyl that may include 1 carbon atom, 2 carbon atoms, 3 carbon atoms, 4 carbon atoms, 5 carbon atoms, 6 carbon atoms, 7 carbon atoms, 8 carbon atoms, 9 carbon atoms, 10 carbon atoms, 11 carbon atoms, 12 carbon atoms, 13 carbon atoms, 14 carbon atoms, 15 carbon atoms, 16 carbon atoms, 17 carbon atoms, 18 carbon atoms, 19 carbon atoms, or 20 carbon atoms. The alkyl may also be a medium-sized alkyl having 1 to 10 carbon atoms. The alkyl may also be a lower alkyl having 1 to 6 carbon atoms. In addition, the alkyl may be substituted or unsubstituted. Specific examples of the alkyl having 1 to 10 carbon atoms include, but are not limited to, methyl, ethyl, n-propyl, isopropyl, n-butyl, isobutyl, tert-butyl, n-pentyl, isopentyl, neopentyl, n-hexyl, n-heptyl, n-octyl, 2-ethylhexyl, nonyl, decyl, and the like.

In the present disclosure, the aryl refers to an optional functional or substituent derived from an aromatic hydrocarbon ring. The aryl may be a monocyclic aryl or a polycyclic aryl, in other words, the aryl may be a monocyclic aryl, a fused aryl, two or more monocyclic aryl conjugated by a carbon-carbon bond, a monocyclic aryl and a fused aryl conjugated by a carbon-carbon bond, and two or more fused aryl conjugated by a carbon-carbon bond. That is, two or more aromatic groups conjugated by a carbon-carbon bond may also be considered the aryl of the present disclosure. Where the aryl does not contain heteroatoms such as B, O, N, P, Si, Se, or S.

For example, in the present disclosure, phenyl, biphenyl, and the like are aryl. Examples of the aryl may include phenyl, naphthyl, fluorenyl, anthryl, phenanthryl, biphenyl, terphenyl, quaterphenyl, quinquephenyl, hexaphenyl, benzo[9,10]phenanthryl, pyrenyl, benzofluoranthenyl, chrysenyl, and the like, but are not limited thereto.

In the present disclosure, the substituted aryl means that one or more hydrogen atoms of the aryl are substituted with other groups. For example, at least one hydrogen atom is substituted with deuterium atom, F, Cl, Br, I, CN, hydroxyl, amino, branched alkyl, linear alkyl, cycloalkyl, alkoxy, alkylamine, aryl, heteroaryl, or other groups. It can be understood that a substituted aryl having 18 carbon atoms means that the total number of carbon atoms of the aryl and the substituents on the aryl is 18. For example, 9,9-dimethylfluorenyl has 15 carbon atoms.

In the present disclosure, the aryl as a substituent is exemplified by, but not limited to, phenyl, biphenyl, naphthyl, 9,9-dimethylfluorenyl, 9,9-diphenylfluorenyl, phenanthryl, anthryl, and the like.

In the present disclosure, the heteroaryl may be a heteroaryl including at least one of B, O, N, P, Si, Se and S as a heteroatom. The heteroaryl may be a monocyclic or polycyclic heteroaryl, that is, the heteroaryl may be a single aromatic ring system or multiple aromatic ring systems conjugated via carbon-carbon bonds, and either aromatic ring system is an aromatic monocyclic ring or an aromatic fused ring. By way of example, the heteroaryl may include thienyl, furanyl, pyrrolyl, imidazolyl, thiazolyl, oxazolyl, oxadiazolyl, triazolyl, pyridyl, bipyridyl, pyrimidinyl, triazinyl, acridinyl, pyridazinyl, pyrazinyl, quinolyl, quinazolinyl, quinoxalinyl, phenoxazinyl, phthalazinyl, pyridopyrimidinyl, pyridopyrazinyl, pyrazinopyrazinyl, isoquinolyl, indolyl, carbazolyl, N-arylcarbazolyl, N-heteroarylcarbazolyl, N-alkylcarbazolyl, benzoxazolyl, benzimidazolyl, benzothiazolyl, benzocarbazolyl, benzothienyl, dibenzothienyl, thienothienyl, benzofuranyl, phenanthrolinyl, isoxazolyl, thiadiazolyl, benzothiazolyl, phenothiazinyl, dibenzosilyl, dibenzofuranyl, phenyl-substituted dibenzofuranyl, dibenzofuranyl-substituted phenyl, etc., but is not limited thereto. Among them, thienyl, furanyl, phenanthrolinyl, etc., are heteroaryl of the single aromatic ring system, and N-arylcarbazolyl, N-heteroarylcarbazolyl, phenyl-substituted dibenzofuranyl, dibenzofuranyl-substituted phenyl, etc., are heteroaryl of the multiple aromatic ring systems conjugated via carbon-carbon bonds. In the present disclosure, the heteroaryl may be carbazolyl, dibenzofuranyl, and the like.

In the present disclosure, the heteroaryl as a substituent is exemplified by, but not limited to, pyridyl, carbazolyl, pyrimidinyl, pyridazinyl, triazinyl, quinolyl, isoquinolyl, quinazolinyl, pyrazinyl, dibenzothienyl, dibenzofuranyl, 9,9-dimethyl-9H-9-silafluorenyl, and the like.

In the present disclosure, the arylamine is a group formed by substituting at least one hydrogen in an amine (—$NH_2$) with an aromatic hydrocarbon. For example, an arylamine in which two hydrogens in an amine (—$NH_2$) are substituted by benzene is a diphenylamine. Exemplarily, the arylamine may be selected from anilino, diphenylamino, benzylamino, N-methylanilino, dimethyl aniline, N-p-toluenediamine and N-m-toluenediamine, and the like. In the present disclosure, the arylamine may be selected from diphenylamino, and dinaphthylamino.

In one specific embodiment of the present disclosure, the compound has a structure as represented by the following formula (1):

Formula (1)

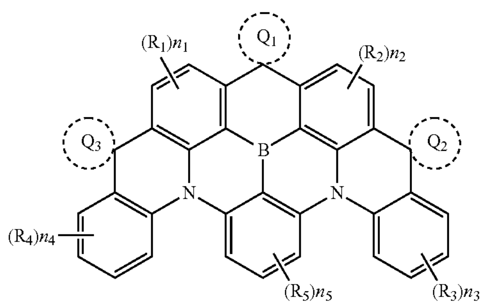

wherein at least one among $Q_1$, $Q_2$, and $Q_3$ is

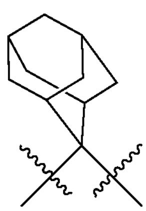

, and

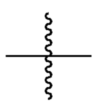

indicates a connective bond;

$n_1$ and $n_2$ are the same or different, and are respectively independently 0, 1, 2, 3, or 4;

$n_3$ and $n_4$ are the same or different, and are respectively independently 0, 1, 2, 3, 4, or 5;

$n_5$ is selected from 0, 1, 2, or 3;

$R_1$, $R_2$, $R_3$, $R_4$, and $R_5$ are the same or different, and are respectively independently selected from deuterium, cyano, halogen, an unsubstituted alkyl having 1 to 10 carbon atoms, a substituted or unsubstituted aryl having 6 to 40 carbon atoms, a substituted or unsubstituted heteroaryl having 2 to 40 carbon atoms, or a substituted or unsubstituted arylamine having 6 to 40 carbon atoms;

the substituents of $R_1$, $R_2$, $R_3$, $R_4$, and $R_5$ are the same or different, and are respectively independently selected from deuterium, cyano, halogen, an unsubstituted alkyl having 1 to 30 carbon atoms, an unsubstituted cycloalkyl having 3 to 30 carbon atoms, an unsubstituted heterocycloalkyl having 2 to 30 carbon atoms, a substituted or unsubstituted aryl having 6 to 30 carbon atoms, an unsubstituted heteroaryl having 1 to 30 carbon atoms, an unsubstituted alkoxy having 1 to 30 carbon atoms, an unsubstituted arylamine having 6 to 30 carbon atoms, an unsubstituted alkylsilyl having 1 to 30 carbon atoms, or an unsubstituted arylsilyl having 6 to 30 carbon atoms.

In one specific embodiment of the present disclosure, $R_1$ and $R_2$ may be connected to form a ring, $R_2$ and $R_3$ may be connected to form a ring, $R_3$ and $R_5$ may be connected to form a ring, $R_1$ and $R_4$ may be connected to form a ring, and $R_4$ and $R_5$ may be connected to form a ring, wherein the rings are independently a fused aromatic ring or a fused heteroaromatic ring, such as xanthene ring, a fluorene ring, 10-phenyl-9,10-dihydroacridine ring, and the like. For example, in compound

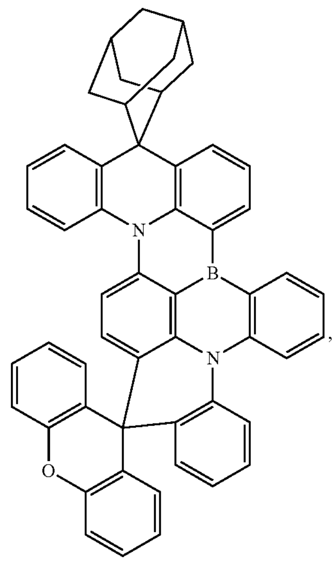 [SMILES: c1ccc2c(c1)Oc1ccccc1C21c2ccccc2N2c3ccccc3B3c4cccc5c4N(c4ccccc4C54C5CC6CC(C5)CC4C6)c4ccc1c2c43]

$R_3$ and $R_5$ form a 10-phenyl-9,10-dihydroacridine ring.

In the present disclosure, the meaning of A and B "may be connected to form a ring" is that A and B are independently of each other, and the two are not connected; or is that A and B are connected with each other to form a ring. For example, $R_1$ and $R_2$ may be connected to form a ring, which means that $R_1$ and $R_2$ are independent of each other and are not connected, or $R_1$ and $R_2$ are connected with each other to form a ring; $R_2$ and $R_3$ may be connected to form a ring, which means that $R_2$ and $R_3$ are independent of each other and are not connected, or $R_2$ and $R_3$ are connected with each other to form a ring; $R_3$ and $R_5$ may be connected to form a ring, which means $R_3$ and $R_5$ are independently of each other and are not connected, or $R_3$ and $R_5$ are connected with each other to form a ring; $R_1$ and $R_4$ may be connected to form a ring, which means $R_1$ and $R_4$ are independent of each other and are not connected, or $R_1$ and $R_4$ are connected with each other to form a ring; $R_4$ and $R_5$ may be connected to form a ring, which means that $R_4$ and $R_5$ are independent of each other and are not connected, or $R_4$ and $R_5$ are connected to each other to form a ring.

Further, the ring formed by connecting $R_1$ with $R_2$ may be saturated, e.g. cyclopentane or cyclohexane, and may also be unsaturated. The ring formed by connecting $R_2$ with $R_3$, the ring formed by connecting $R_1$ with $R_4$, the ring formed by connecting $R_4$ with $R_5$, and the ring formed by connecting $R_3$ with $R_5$ are similar in meaning to the ring formed by connecting $R_1$ with $R_2$.

Optionally, the ring is a saturated or unsaturated 3- to 7-membered ring.

The non-positioned connective bond in the present disclosure refers to a single bond "

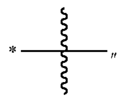

extending from a ring system, which indicates that one end of the connective bond may be connected to any position in the ring system through which the bond penetrates, and the other end is connected to the remainder of the compound molecule.

For example, as shown in the formula (f) below, the naphthyl represented by the formula (f) is connected to the other positions of the molecule by two non-positioned connective bonds penetrating the bicyclic ring, which represents the meaning including any of the possible connecting modes as shown in formulas (f-1) to (f-10).

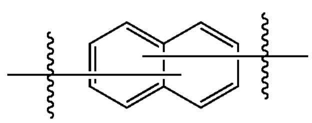

(f)

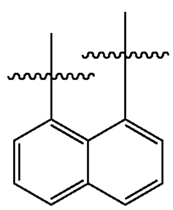

(f-1)

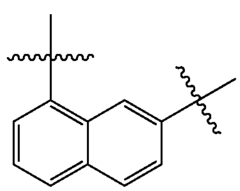

(f-2)

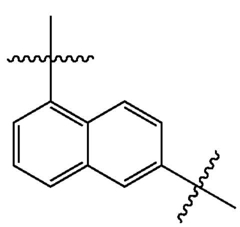

(f-3)

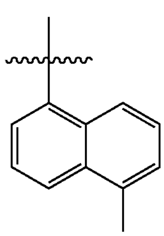

(f-4)

-continued

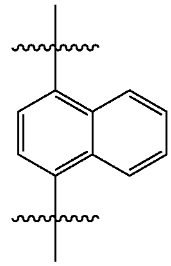

(f-5)

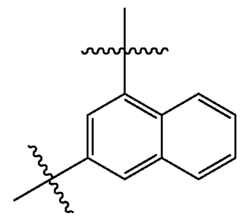

(f-6)

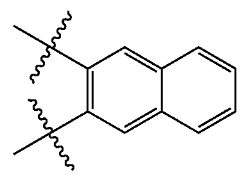

(f-7)

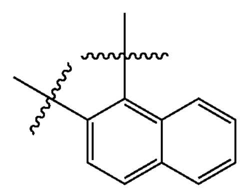

(f-8)

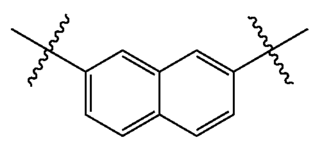

(f-9)

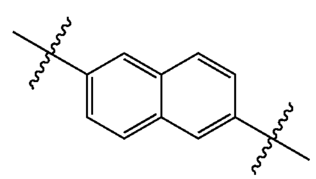

(f-10)

By way of further example, as shown in the formula (X') below, the phenanthrenyl represented by the formula (X') is connected to the other positions of the molecule by a non-positioned connective bond extending from the middle of the benzene ring on one side, which represents the meaning including any of the possible connecting modes as shown in formulas (X'-1) to (X'-4).

(X')

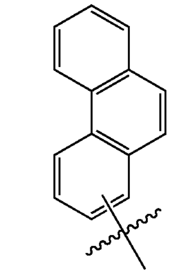

(X'-1)

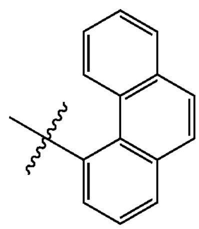

(X'-2)

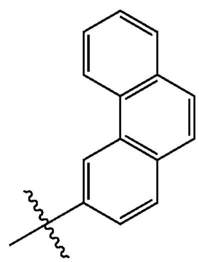

(X'-3)

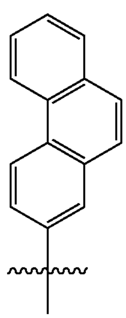

(X'-4)

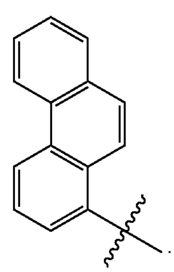

The non-positioned substituent in the present disclosure refers to a substituent which is connected by a single bond extending from the center of the ring system, which indicates that the substituent may be connected at any possible position in the ring system. For example, as shown in the formula (Y) below, the substituent R' group represented by the formula (Y) is connected to the quinoline ring by a non-positioned connective bond, which represents the meaning including any of the possible connecting modes as shown in formulas (Y-1) to (Y-7).

(Y)

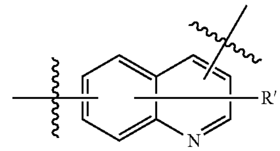

(Y-1)

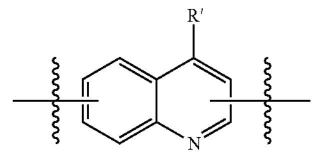

(Y-2)

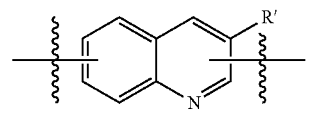

(Y-3)

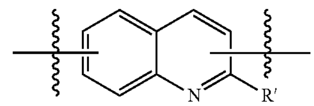

(Y-4)

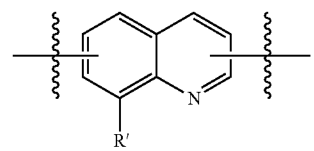

(Y-5)

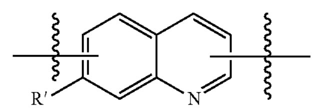

(Y-6)

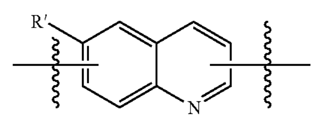

(Y-7)

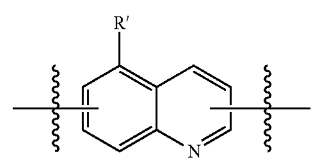

In the present disclosure, the halogen may be, for example, fluorine, chlorine, bromine, or iodine.

In the present disclosure, specific examples of the trialkylsilyl include, but are not limited to, trimethylsilyl, triethylsilyl, and the like.

In the present disclosure, specific examples of the triarylsilyl include, but are not limited to, triphenylsilyl, and the like.

In the present disclosure, specific examples of the haloalkyl include, but are not limited to, trifluoromethyl.

Hereinafter, the meaning for non-positionally connected or non-positionally substituted is the same as here and will not be repeated later.

In one specific embodiment of the present disclosure, $R_1$, $R_2$, $R_3$, $R_4$, and $R_5$ are the same or different, and are respectively independently selected from deuterium, cyano, fluorine, an unsubstituted alkyl having 1 to 5 carbon atoms, a substituted or unsubstituted aryl having 6 to 20 carbon atoms, a substituted or unsubstituted heteroaryl having 3 to 30 carbon atoms, or a substituted or unsubstituted arylamine having 10 to 20 carbon atoms.

In one specific embodiment of the present disclosure, the substituents of $R_1$, $R_2$, $R_3$, $R_4$, and $R_5$ are the same or different, and are respectively independently selected from deuterium, cyano, fluorine, an alkyl having 1 to 5 carbon atoms, a substituted or unsubstituted aryl having 6 to 20 carbon atoms, an unsubstituted heteroaryl having 3 to 20 carbon atoms, or an unsubstituted arylamine having 12 to 20 carbon atoms.

In one specific embodiment of the present disclosure, the substituents of $R_1$, $R_2$, $R_3$, $R_4$, and $R_5$ are the same or different, and are respectively independently selected from deuterium; cyan; fluorine; an alkyl having 1 to 5 carbon atoms; an aryl having 6 to 15 carbon atoms optionally substituted with methyl, ethyl, isopropyl or tert-butyl; or a heteroaryl having 5 to 12 carbon atoms.

In one specific embodiment of the present disclosure, the substituents of $R_1$, $R_2$, $R_3$, $R_4$, and $R_5$ are the same or different, and are respectively independently selected from deuterium, cyano, fluorine, methyl, ethyl, isopropyl, tert-butyl, phenyl, naphthyl, biphenyl, pyridyl, dibenzothienyl, 9,9-dimethyl-9H-9-silafluorenyl, dibenzofuranyl, 9,9-dimethylfluorenyl, carbazolyl, or phenyl substituted with tert-butyl.

In one specific embodiment of the present disclosure, said $R_1$, $R_2$, $R_3$, $R_4$, and $R_5$ are the same or different, and are respectively independently selected from deuterium, cyano, halogen, an alkyl having 1 to 10 carbon atoms, or the group consisting of the following groups:

i-1

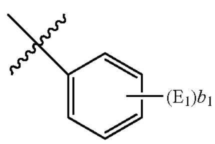

i-2

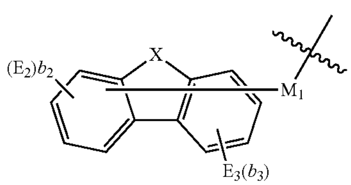

i-3

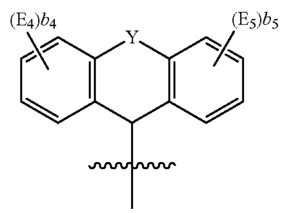

i-4

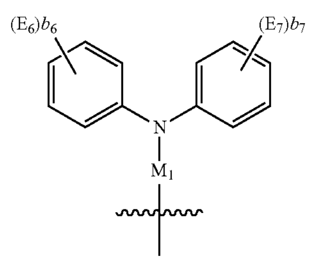

i-5

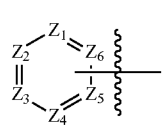

-continued i-6

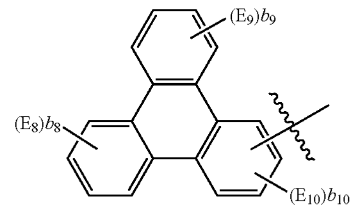

i-7

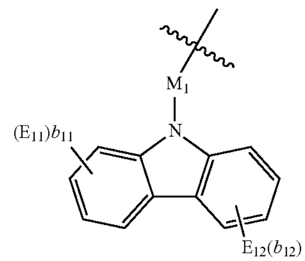

i-8

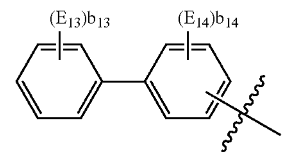

i-9

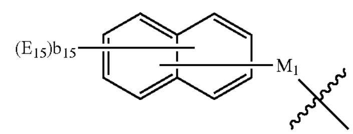

i-10

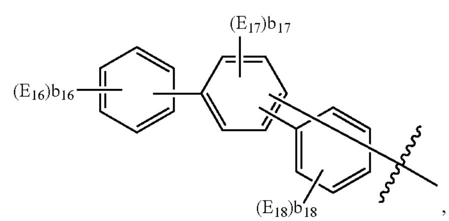

, wherein

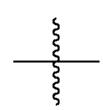

represents a chemical bond, $M_1$ is selected from single bond or

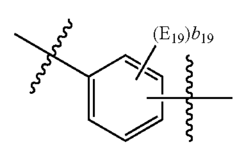

;

$b_1$, $b_6$, $b_7$, $b_{13}$ and $b_{16}$ are the same or different, and are respectively independently 1, 2, 3, 4, or 5;

$b_2$, $b_3$, $b_4$, $b_5$, $b_8$, $b_9$, $b_{11}$, $b_{12}$, $b_{14}$, $b_{17}$, $b_{18}$ and $b_{19}$ are the same or different, and are respectively independently 1, 2, 3, or 4;

$b_{10}$ is 1, 2, or 3;

$b_{15}$ is 1, 2, 3, 4, 5, 6, or 7;

X is selected from O, S, $Si(E_{20}E_{21})$, $C(E_{22}E_{23})$, $N(E_{24})$, or Se;

Y is selected from O, S, or $N(E_{25})$;

$Z_1$ to $Z_6$ are the same or different, and are each independently selected from C(E') or N, and at least one of $Z_1$ to $Z_6$ is N, where E' in said $Z_1$ to $Z_6$ are the same or different, and are respectively independently selected from hydrogen, an alkyl having 1 to 10 carbon atoms, an aryl having 6 to 18 carbon atoms, a heteroaryl having 3 to 18 carbon atoms, or a cycloalkyl having 3 to 10 carbon atoms, or adjacent E' may be connected to form a ring;

$E_1$ to $E_{25}$ are the same or different, and are respectively independently selected hydrogen, deuterium, halogen, cyano, an alkyl having 1 to 10 carbon atoms, an aryl having 6 to 18 carbon atoms, a heteroaryl having 3 to 18 carbon atoms, a cycloalkyl having 3 to 10 carbon atoms, or an aryl having 6 to 18 carbon atoms substituted with alkyl; or $E_{20}$ and $E_{21}$ may be connected to form a ring, or $E_{22}$ and $E_{23}$ may be connected to form a ring, or any two $E_6$ may be fused with the phenyl to which they are connected to form an aromatic ring, or any two $E_7$ may be fused with phenyl to which they are connected to form an aromatic ring, where $E_1$, $E_{13}$, $E_{14}$ and $E_{19}$ are not aryl.

In the present disclosure, $b_1$ is the number of substituent $E_1$, and when $b_1$ is greater than or equal to 2, any two $E_1$ are the same or different; $b_2$ is the number of substituent $E_2$, and when $b_2$ is greater than or equal to 2, any two $E_2$ are the same or different; $b_3$ is the number of substituent $E_3$, and when $b_3$ is greater than or equal to 2, any two $E_3$ are the same or different; $b_4$ is the number of substituent $E_4$, and when $b_4$ is greater than or equal to 2, any two $E_4$ are the same or different; $b_5$ is the number of substituent $E_5$, and when $b_5$ is greater than or equal to 2, any two $E_5$ are the same or different; $b_6$ is the number of substituent $E_6$, and when $b_6$ is greater than or equal to 2, any two $E_6$ are the same or different; $b_7$ is the number of substituent $E_7$, and when $b_7$ is greater than or equal to 2, any two $E_7$ are the same or different; $b_8$ is the number of substituent $E_8$, and when $b_8$ is greater than or equal to 2, any two $E_8$ are the same or different; $b_9$ is the number of substituent $E_9$, and when $b_9$ is greater than or equal to 2, any two $E_9$ are the same or different; $b_{10}$ is the number of substituent $E_{10}$, and when $b_{10}$ is greater than or equal to 2, any two $E_{10}$ are the same or different; $b_{11}$ is the number of substituent $E_{11}$, and when $b_{11}$ is greater than or equal to 2, any two $E_{11}$ are the same or different; $b_{12}$ is the number of substituent $E_{12}$, and when $b_{12}$ is greater than or equal to 2, any two $E_{12}$ are the same or different; $b_{13}$ is the number of substituent $E_{13}$, and when $b_{13}$ is greater than or equal to 2, any two $E_{13}$ are the same or different; $b_{14}$ is the number of substituent $E_{14}$, and when $b_{14}$ is greater than or equal to 2, any two $E_{14}$ are the same or different; $b_{15}$ is the number of substituent $E_{15}$, and when bis is greater than or equal to 2, any two $E_{15}$ are the same or different; $b_{16}$ is the number of substituent $E_{16}$, and when $b_{16}$ is greater than or equal to 2, any two $E_{16}$ are the same or different; $b_{17}$ is the number of substituent $E_{17}$, and when $b_{17}$ is greater than or equal to 2, any two $E_{17}$ are the same or different; bis is the number of substituent $E_{18}$, and when $b_{18}$ is greater than or equal to 2, any two $E_{18}$ are the same or different; big is the number of substituent $E_{19}$, and when big is greater than or equal to 2, any two $E_{19}$ are the same or different.

In the present disclosure, when $b_1$ to bis are selected from 0, the benzene ring is not substituted.

Optionally, $E_6$ and $E_7$ are fused with the phenyl to which they are connected to form an aromatic ring, for example, $E_6$ and $E_7$ are fused with the benzene ring to which they are connected to form a naphthyl.

Adjacent E' may be connected to form a ring, which means that $Z_1$ and $Z_2$ form a ring, or $Z_2$ and $Z_3$ form a ring, or $Z_3$ and $Z_4$ form a ring, or $Z_4$ and $Z_6$ form a ring, or $Z_5$ and $Z_6$ form a ring, $Z_6$ and $Z_1$ form a ring, of course also including $Z_2$ and $Z_3$ form a ring and $Z_5$ and $Z_6$ form a ring, etc.

In the present disclosure, the meaning of A and B "may be connected to form a ring" is that A and B are independently of each other and are not connected; or A and B are connected with each other to form a ring. For instance, $E_{20}$ and $E_{21}$ may be connected to form a ring For example, $E_{20}$ and $E_{21}$ are independent of each other and are not connected, or $E_{20}$ and $E_{21}$ are connected with each other to form a ring. $E_{22}$ and $E_{23}$ may be connected to form a ring, for example, $E_{22}$ and $E_{23}$ are independent of each other and are not connected, or $E_{22}$ and $E_{23}$ are connected with each other to form a ring.

For instance, $Z_3$ and $Z_4$ may be connected to form a ring. For example, E' of $Z_3$ and E' of $Z_4$ are independent of each other and are not connected, or E' of $Z_3$ and E' of $Z_4$ and the atom to which E' is connected are connected to form a ring, the ring refers to a saturated or unsaturated ring. Optionally, the number of carbon atoms of the ring may be 5, for example

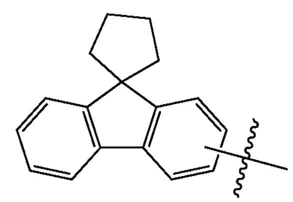

or is 6, for example

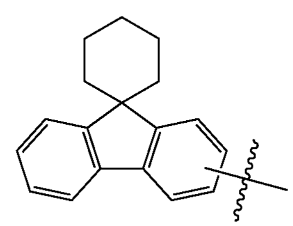

and may also be 13, for example

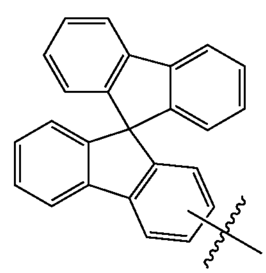

Of course, the number of carbon atoms forming the ring may also be other values, which will not be listed one by one here, and the number of carbon atoms in the ring is not specifically defined in the present disclosure.

In one specific embodiment of the present disclosure, said $R_1$, $R_2$, $R_3$, $R_4$, and $R_5$ are the same or different, and are respectively independently selected from the group consisting of the following group: deuterium, cyano, fluorine, an alkyl having 1 to 5 carbon atoms, a substituted or unsubstituted aryl having 6 to 25 carbon atoms, a substituted or unsubstituted heteroaryl having 3 to 20 carbon atoms, and a substituted or unsubstituted arylamine having 12 to 20 carbon atoms, where the number of carbon atoms of the aryl in the aryl having 6 to 25 carbon atoms may be selected from 6, 8, 10, 12, 14, 16, 18, 20, or 25, and the number of carbon atoms of the heteroaryl in the heteroaryl having 3 to 20 carbon atoms may be selected from 3, 4, 5, 9, 12, 18, or 20.

In one specific embodiment of the present disclosure, said $R_1$, $R_2$, $R_3$, $R_4$, and $R_5$ are the same or different, and are respectively independently selected from the group consisting of deuterium, cyano, fluorine, an alkyl having 1 to 5 carbon atoms, a substituted or unsubstituted aryl having 6 to 10 carbon atoms, a substituted or unsubstituted heteroaryl having 3 to 12 carbon atoms, and a substituted or unsubstituted arylamine having 12 to 15 carbon atoms.

In one specific embodiment of the present disclosure, said $R_1$, $R_2$, $R_3$, $R_4$, and $R_5$ are the same or different, and are respectively independently selected from the group consisting of the following groups: deuterium, cyano, fluorine, an alkyl having 1 to 5 carbon atoms, and a substituted or unsubstituted W; and the unsubstituted W is selected from the groups below:

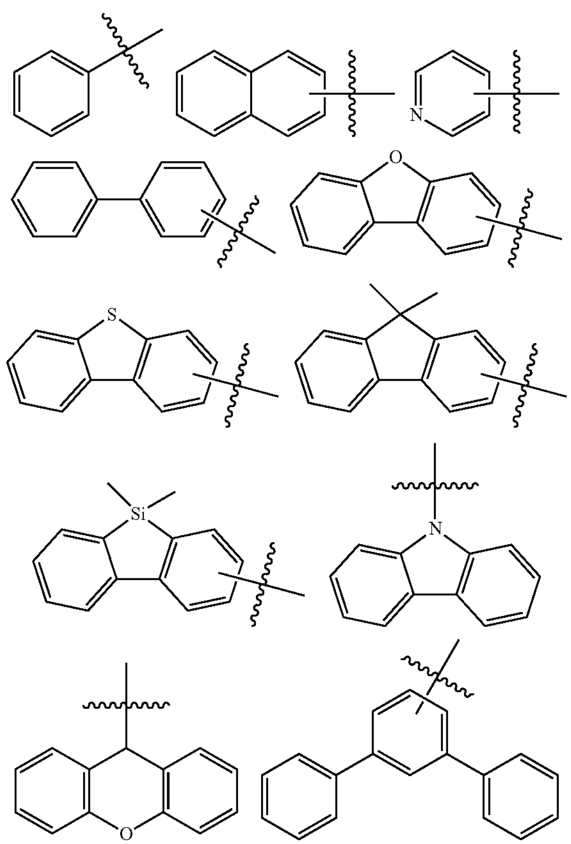

-continued

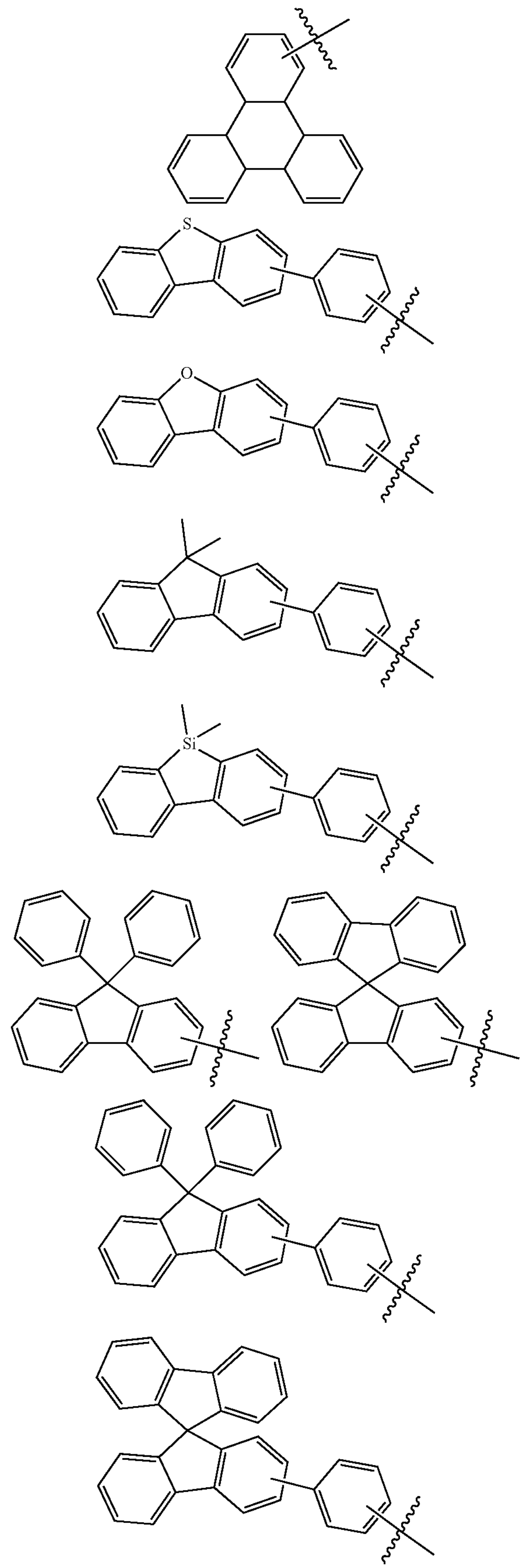

-continued

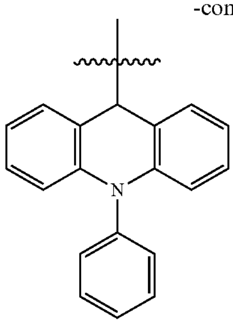
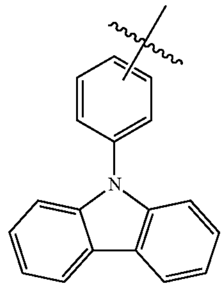
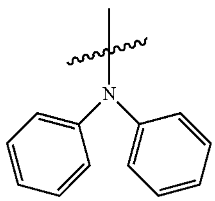
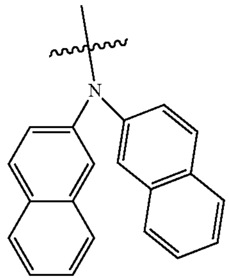
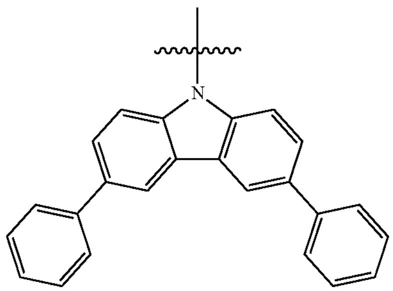
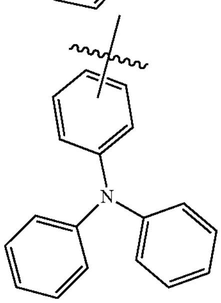
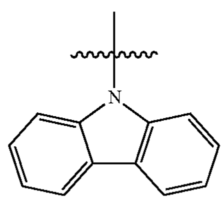

when W group is substituted, the substituents of W are selected from deuterium, fluorine, cyano, methyl, ethyl, isopropyl, tert-butyl, phenyl, naphthyl, carbazolyl, dibenzofuranyl, dibenzothienyl, biphenyl, pyridyl, 9,9-dimethylfluorenyl, or 9,9-dimethyl-9H-9-silafluorenyl; when W has a plurality of substituents, the plurality of the substituents are the same or different.

In one specific embodiment of the present disclosure, said $R_1$, $R_2$, $R_3$, $R_4$, and $R_5$ are the same or different, and are respectively independently selected from the group consisting of the following groups: deuterium, cyano, fluorine, methyl, ethyl, n-propyl, isopropyl, n-butyl, sec-butyl, tert-butyl, and the groups below,

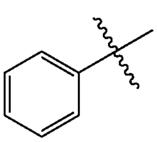
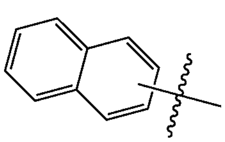
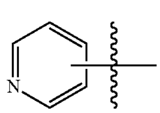

-continued

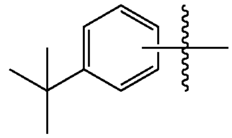
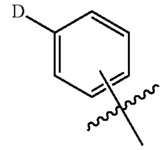
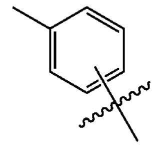
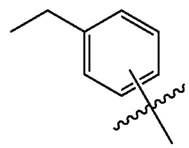
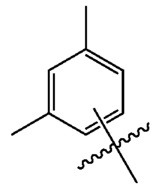
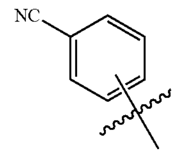
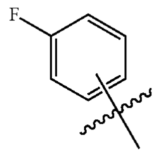
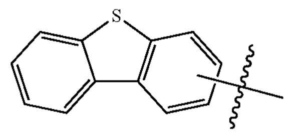
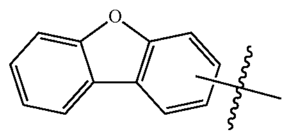
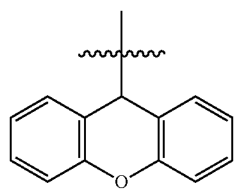
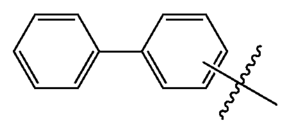
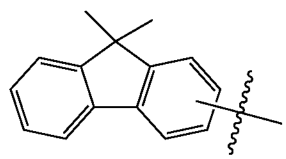
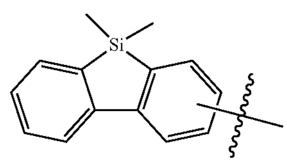
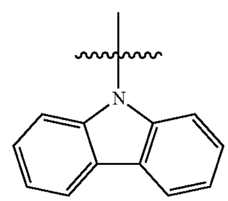
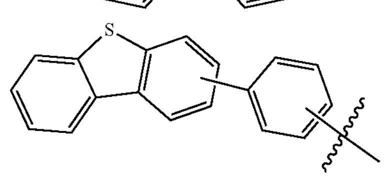
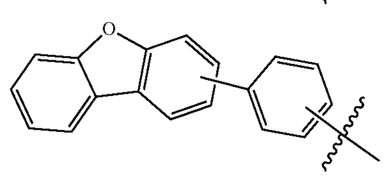
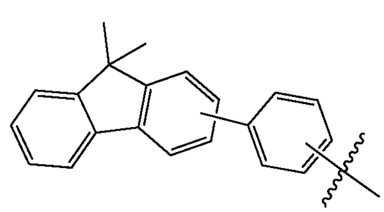

-continued
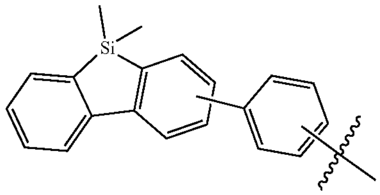
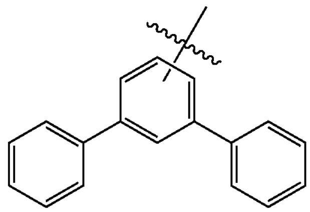
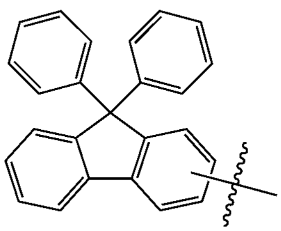
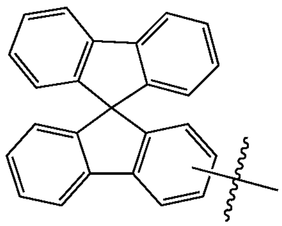
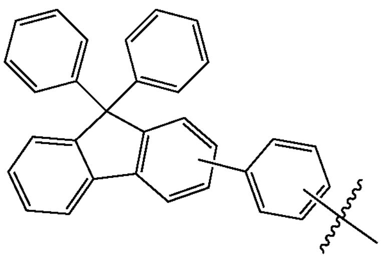
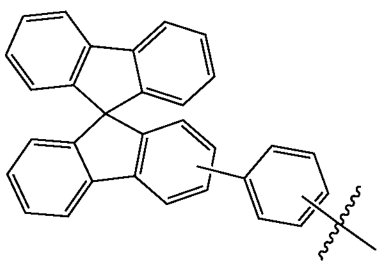
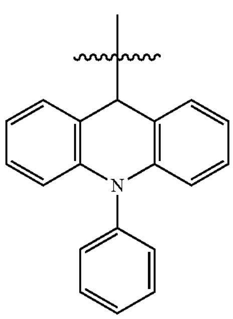
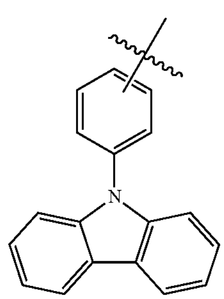
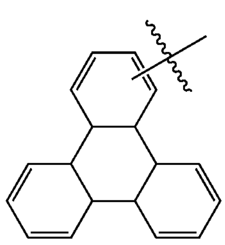
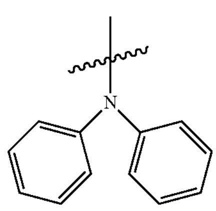
-continued
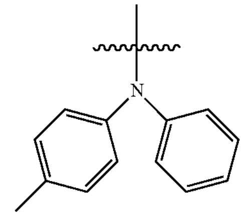
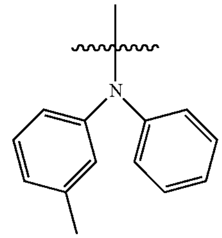
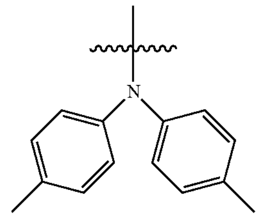
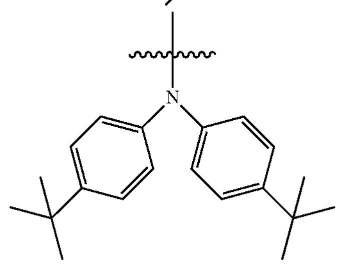
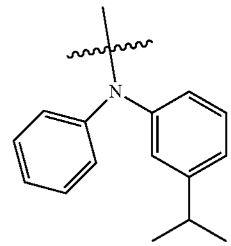
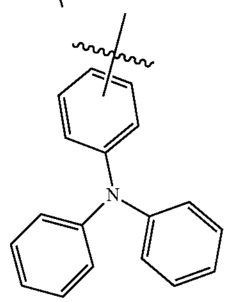
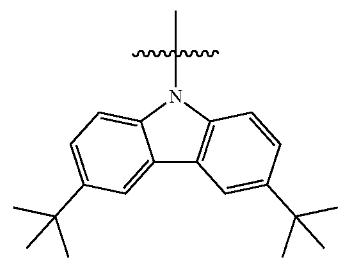
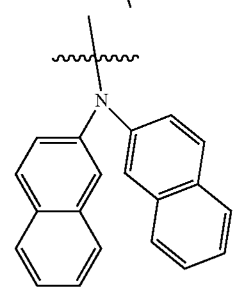
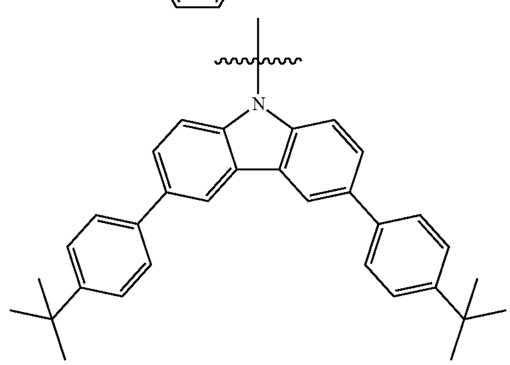
In one specific embodiment of the present disclosure, said $R_1$, $R_2$, $R_3$, $R_4$, and $R_5$ are the same or different, and are respectively independently selected from the group consisting of the following groups: deuterium, cyano, fluorine, methyl, ethyl, n-propyl, isopropyl, n-butyl, sec-butyl, tert-butyl, and the groups below,
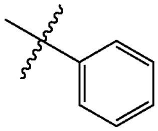
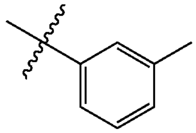
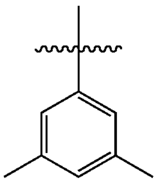
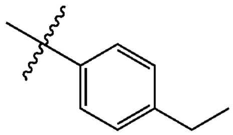
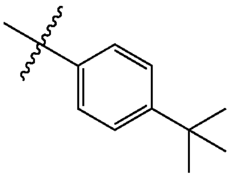
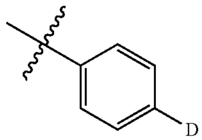
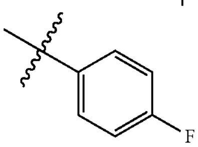
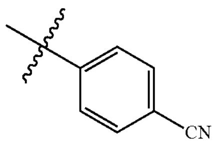
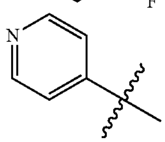
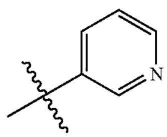
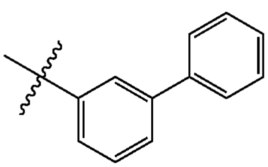
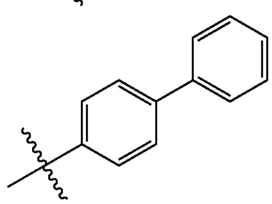
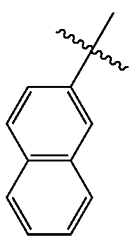
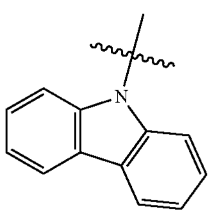
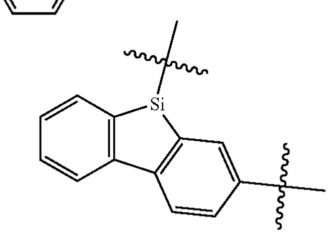
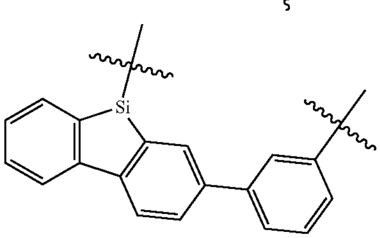
-continued
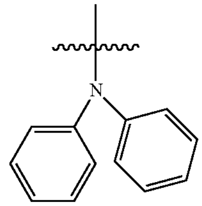
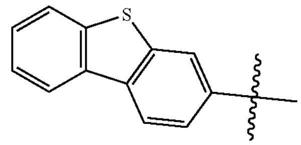
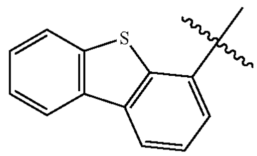
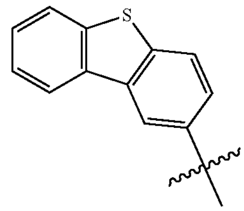
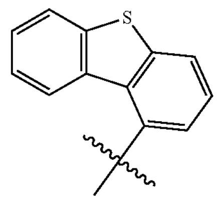
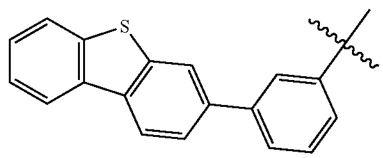
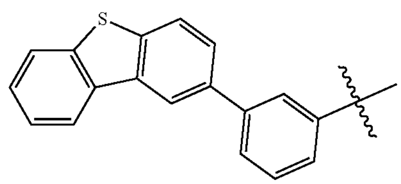
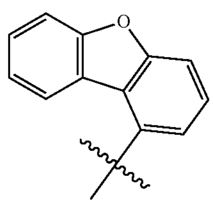
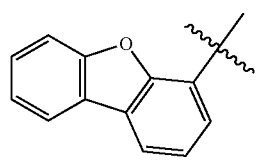
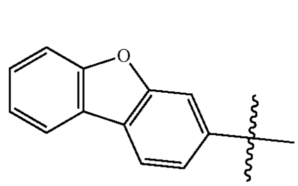
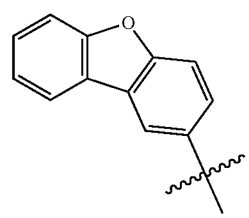
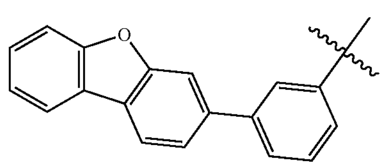

-continued
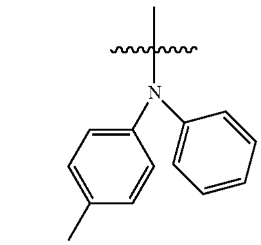
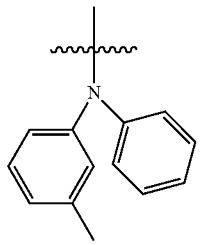
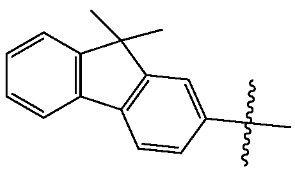
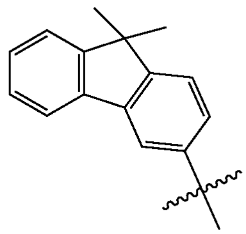
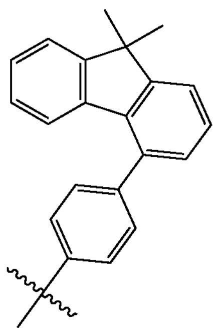
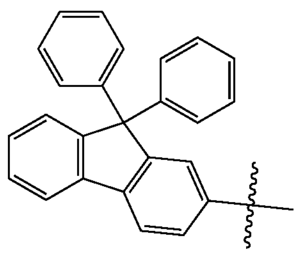
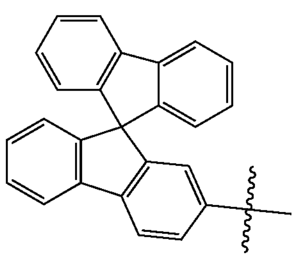
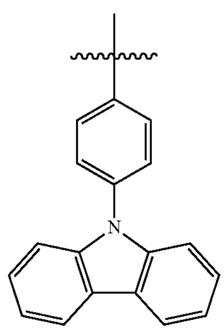
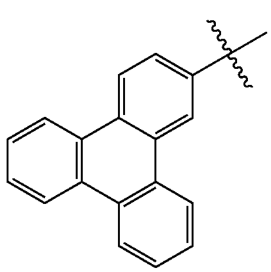
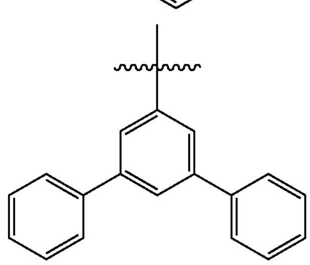
-continued
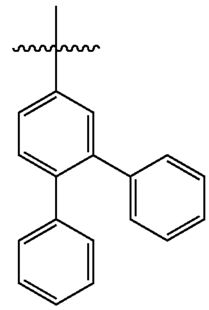
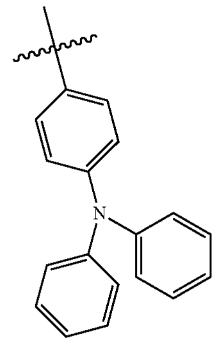
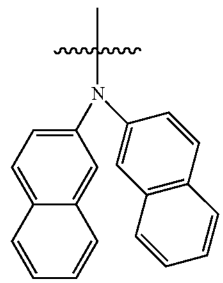
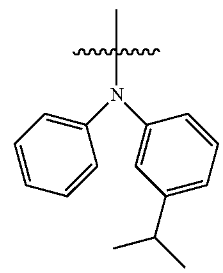
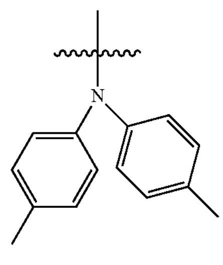
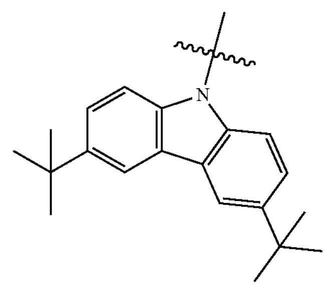
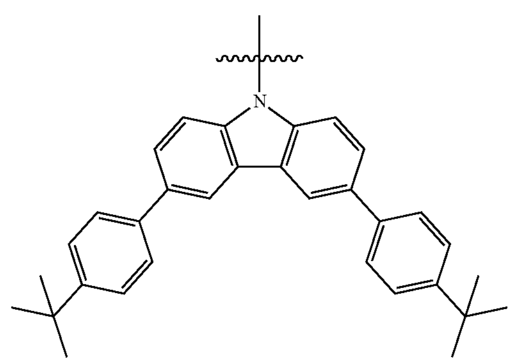
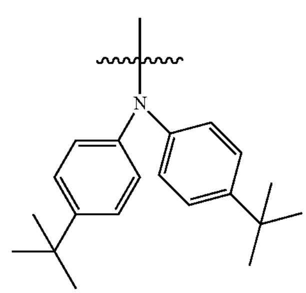

-continued
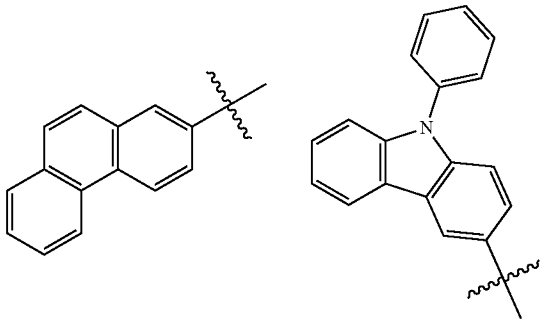
In one specific embodiment of the present disclosure, the organic compound is selected from one or more of the following compounds P1 to P200:
P1
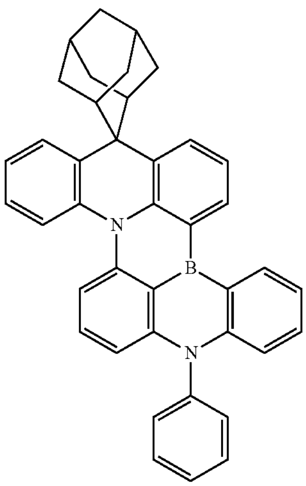
P2
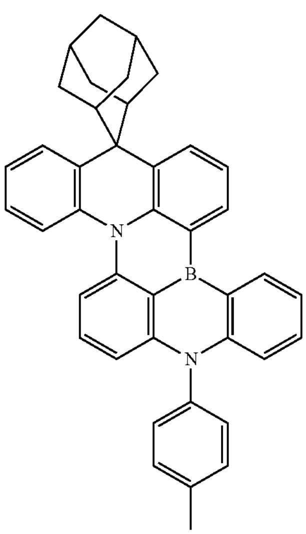
-continued
P3
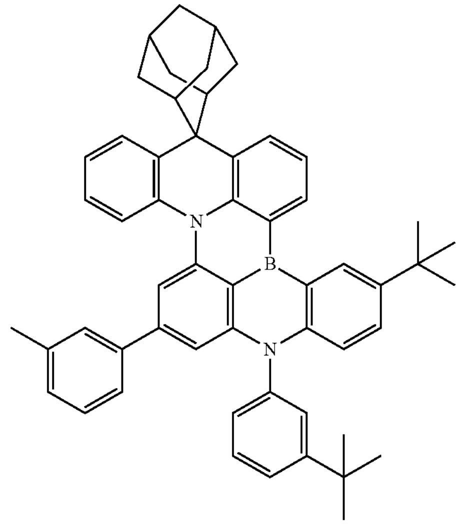
P4
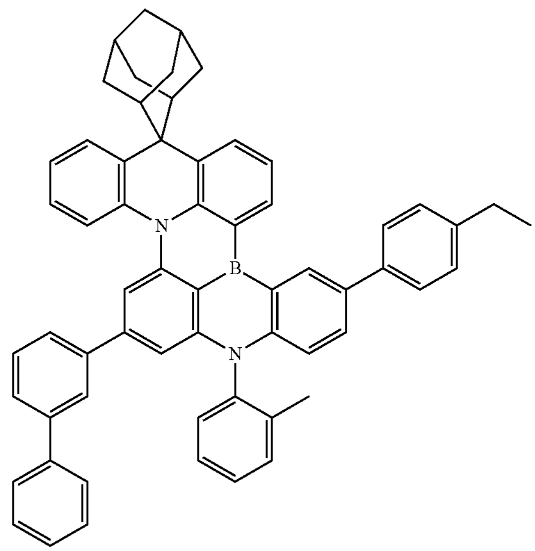
P5
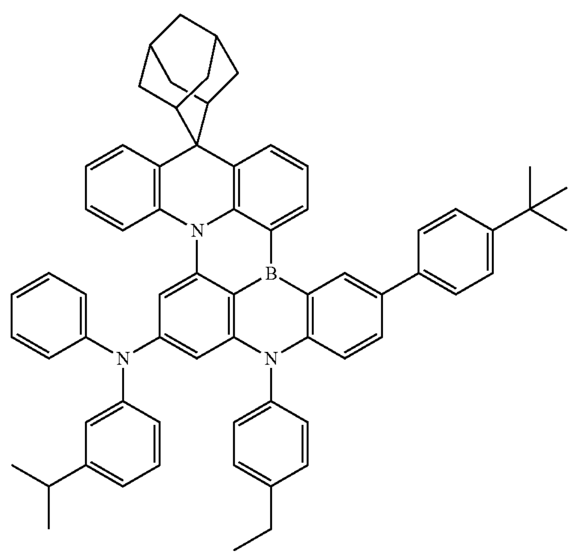

-continued
P6
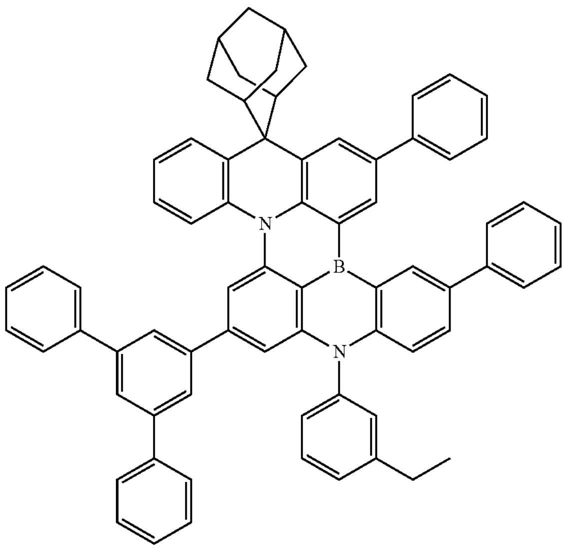
P7
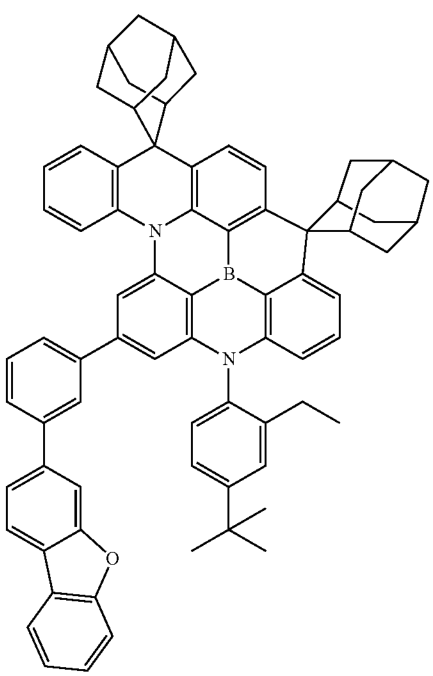
-continued
P8
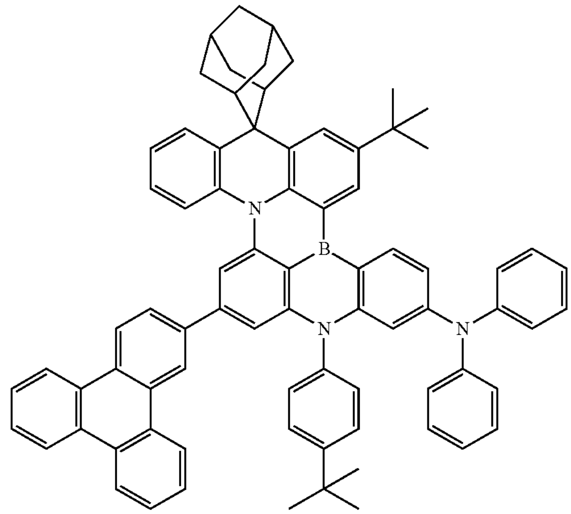
P9
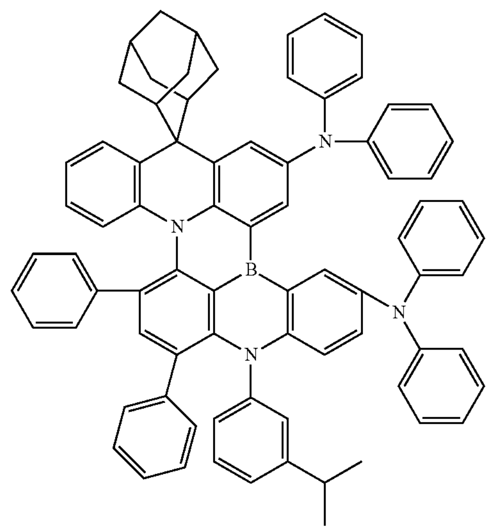
P10
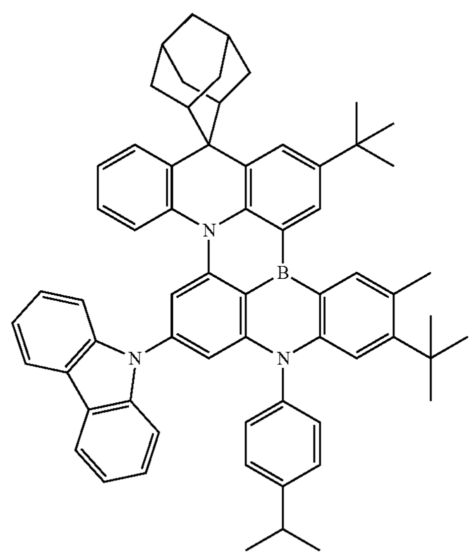

-continued
P11
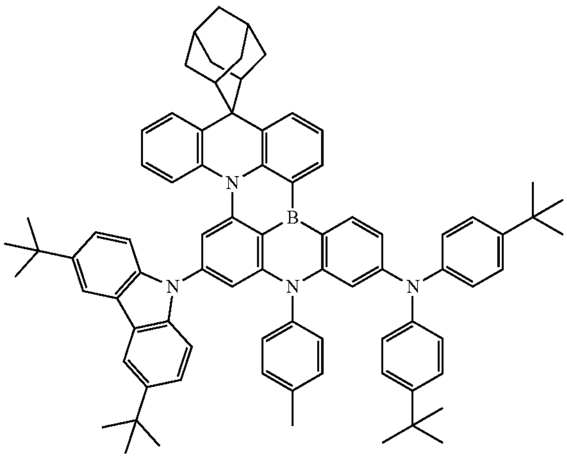
P12
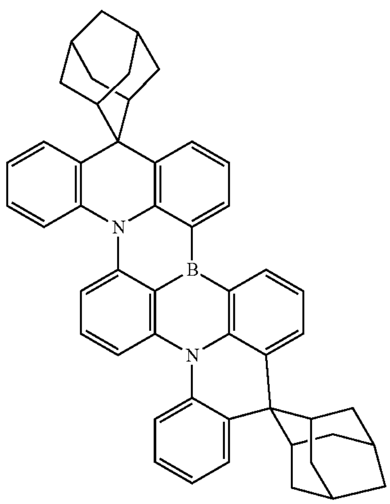
P13
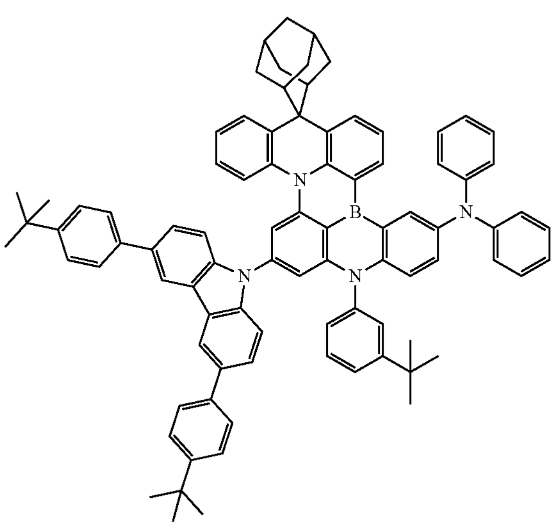
-continued
P14
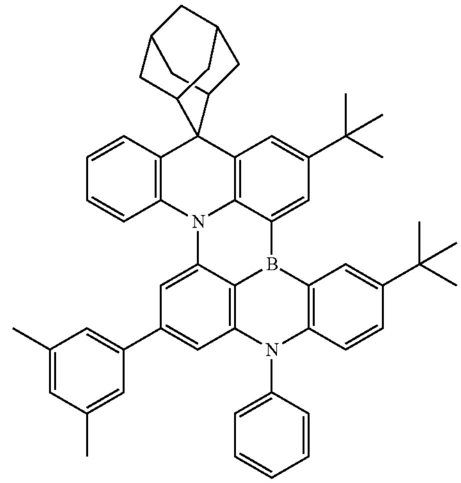
P15
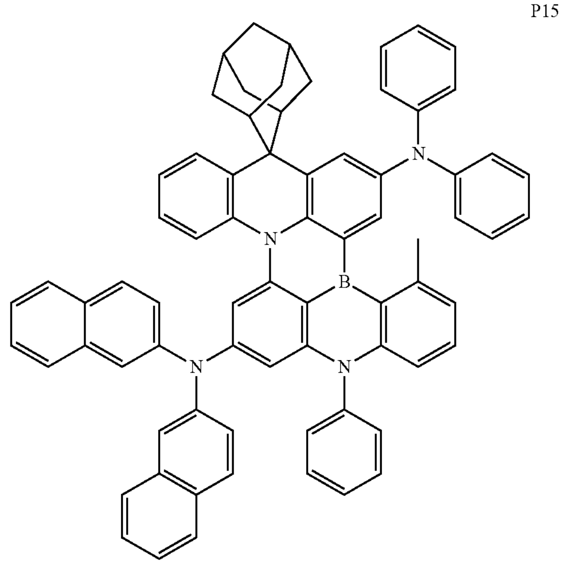
P16
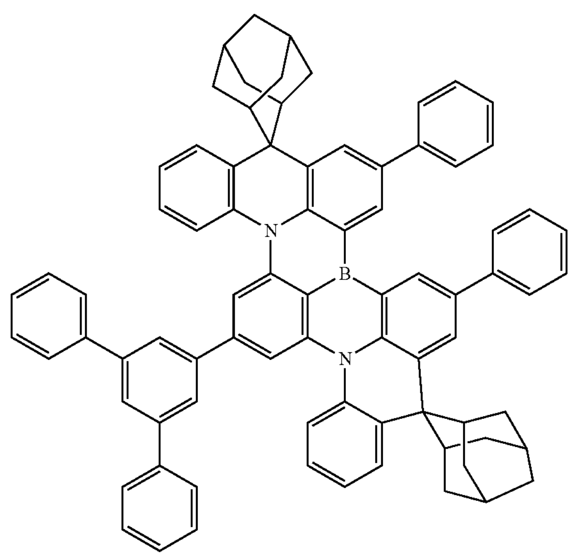

-continued
P17
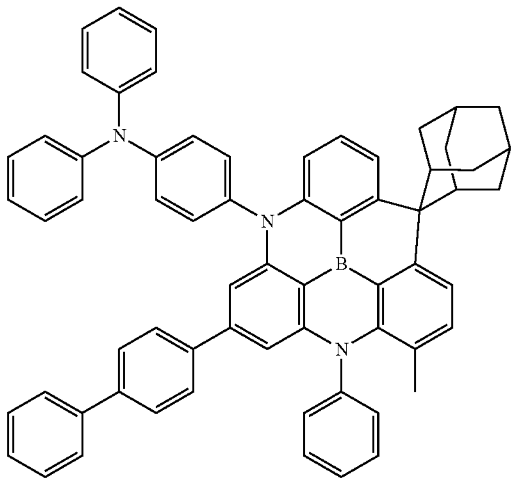
P18
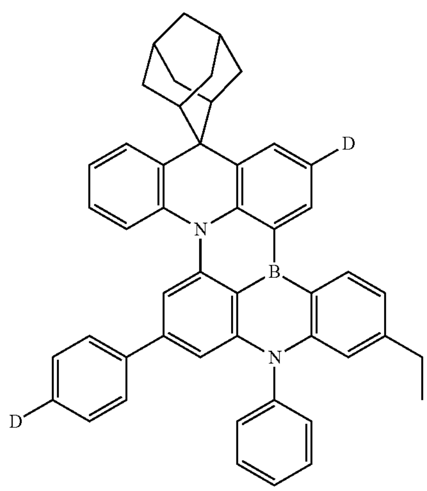
P19
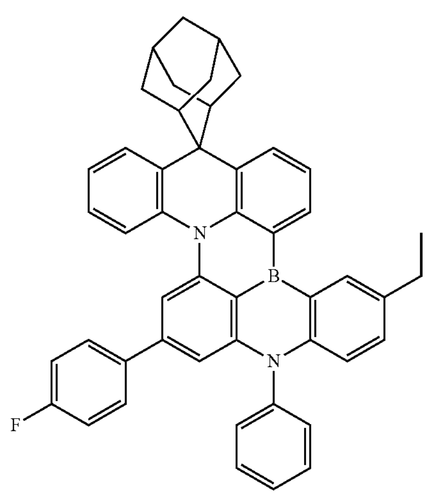
-continued
P20
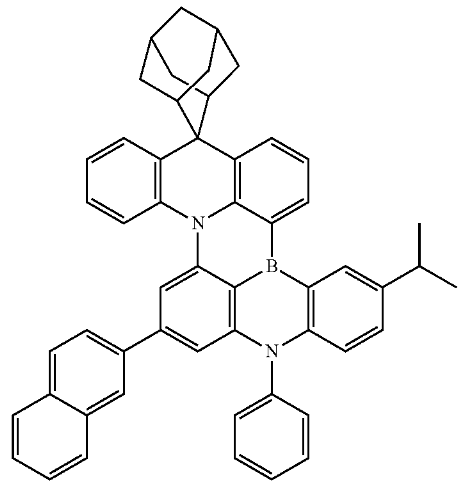
P21
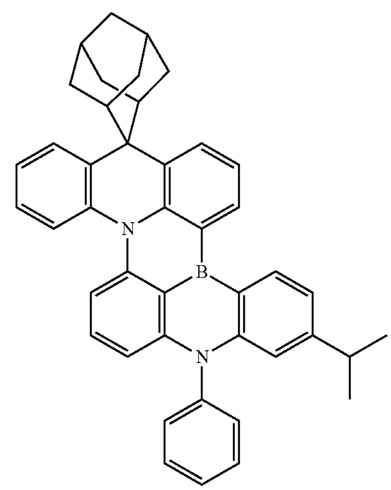
P22
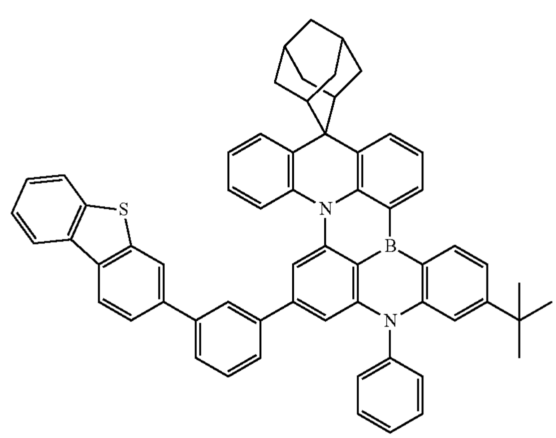

-continued
P23
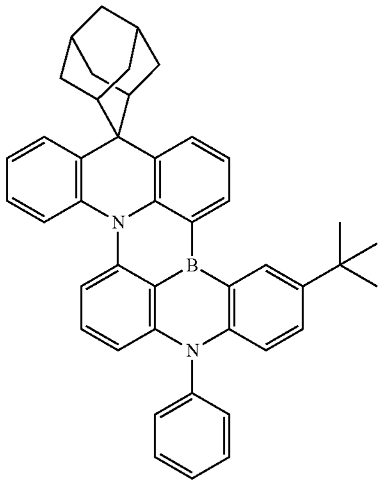
P24
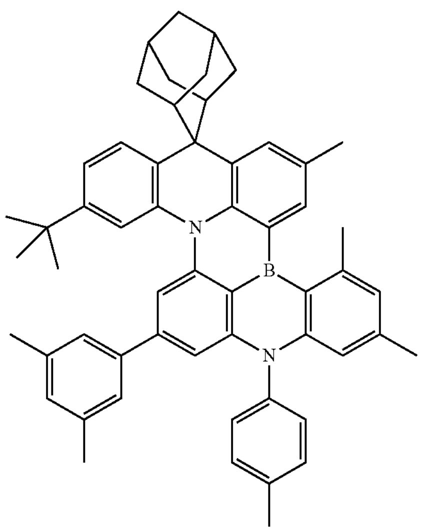
P25
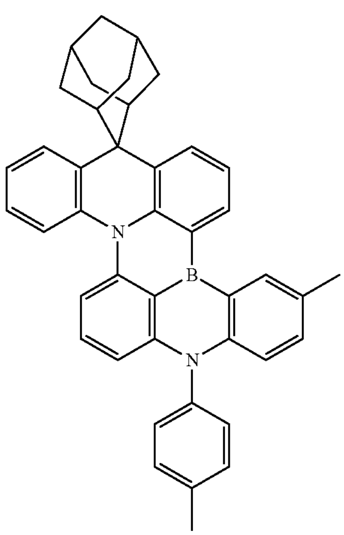
-continued
P26
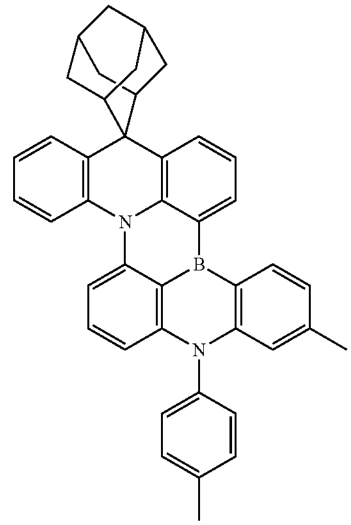
P27
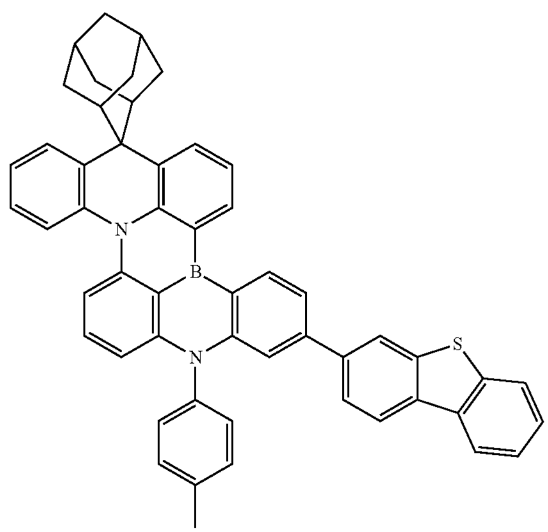
P28
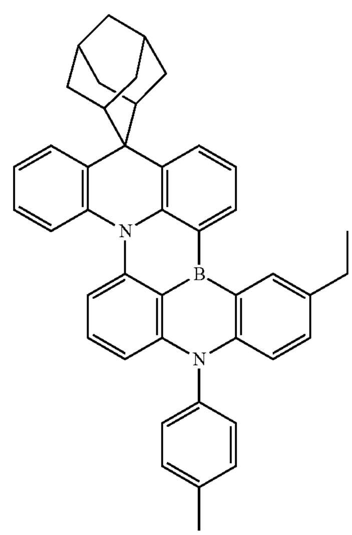

P29
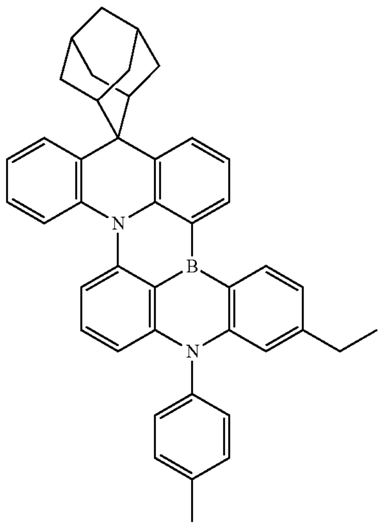
P30
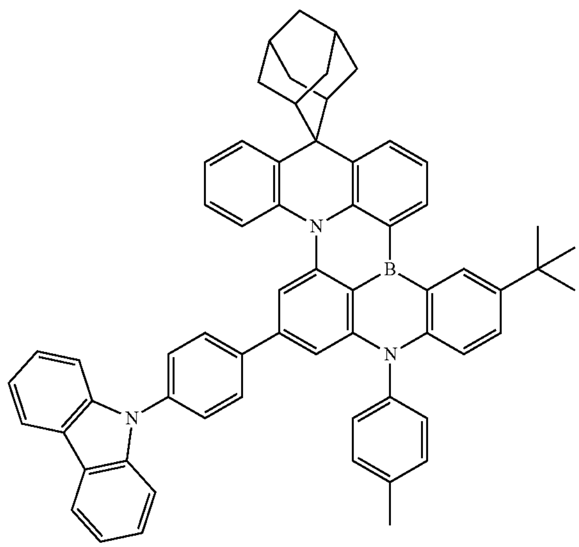
P31
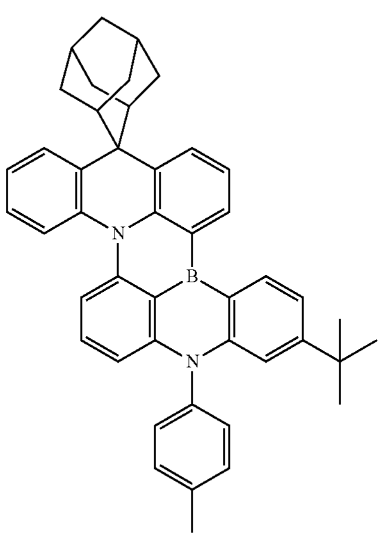
P32
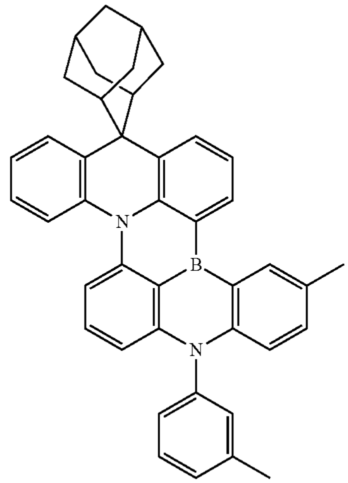
P33
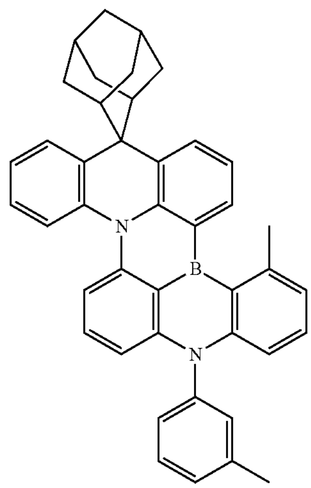
P34
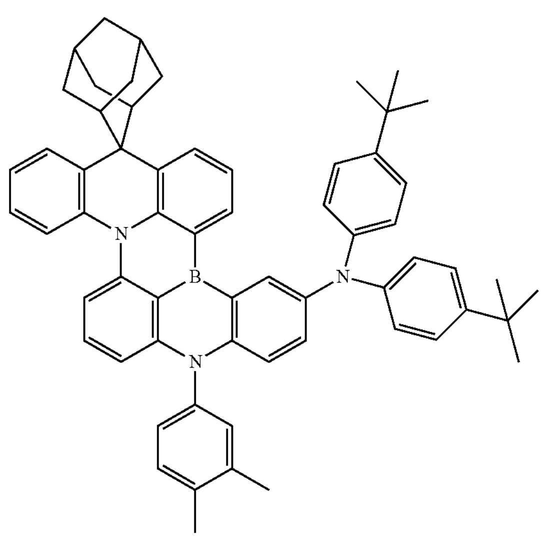

-continued
P35
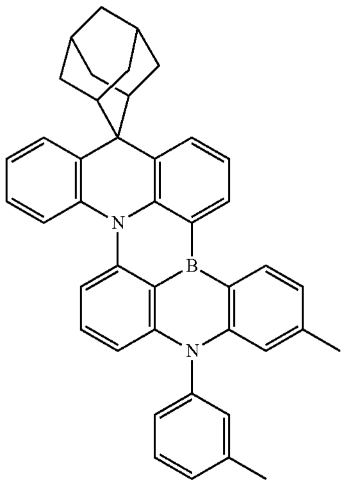
P36
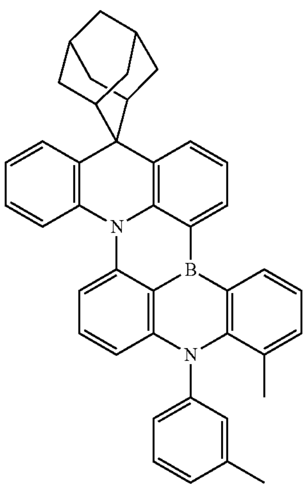
P37
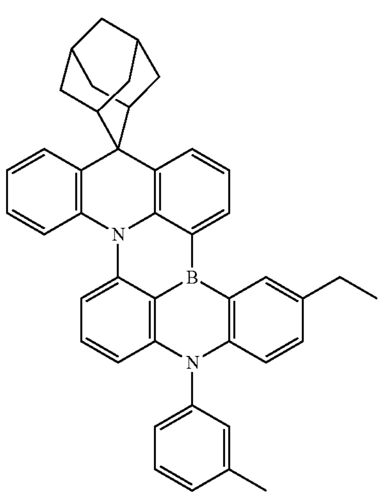
-continued
P38
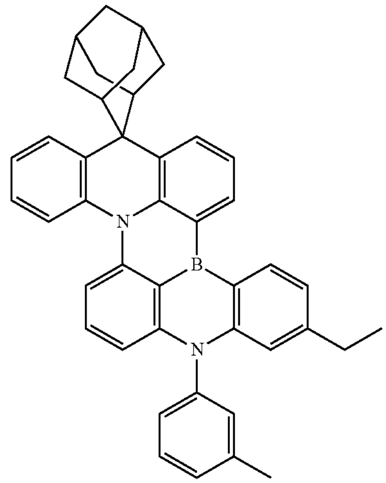
P39
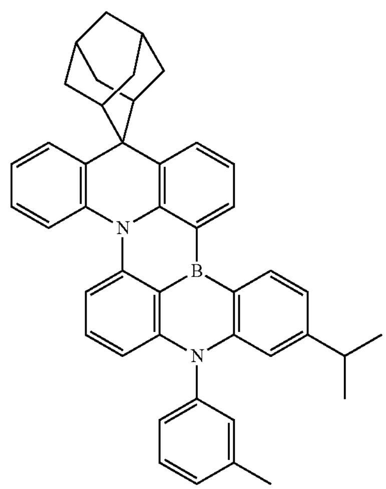
P40
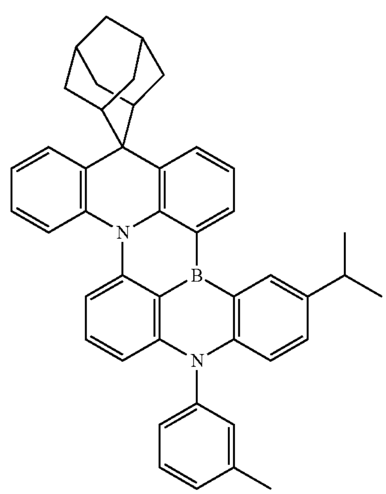

-continued
P41
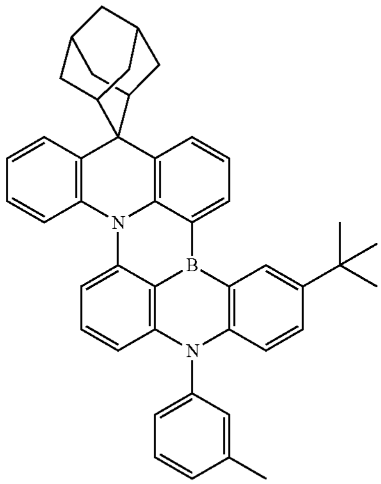
P42
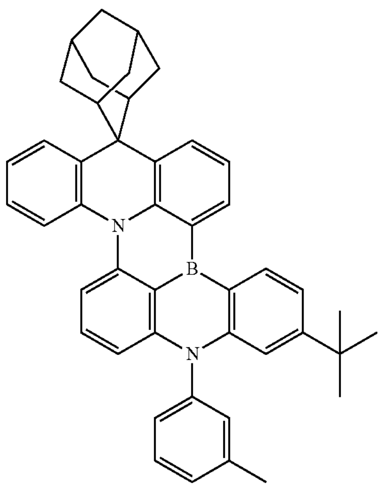
P43
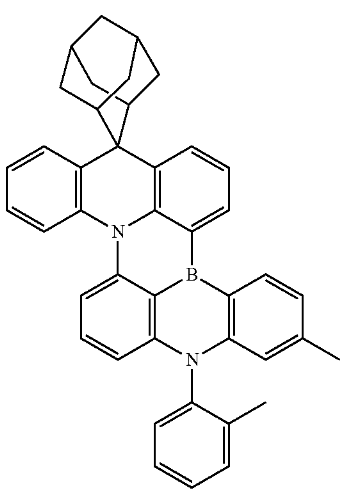
-continued
P44
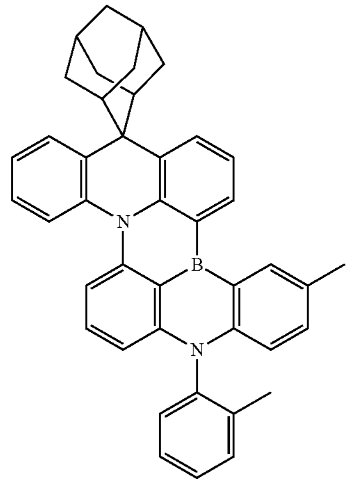
P45
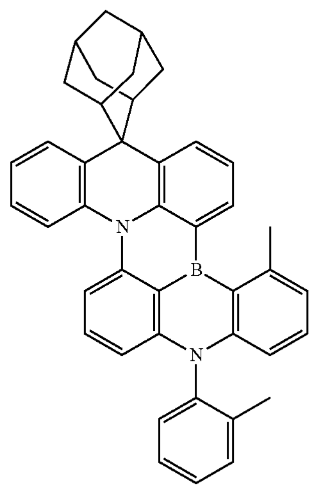
P46
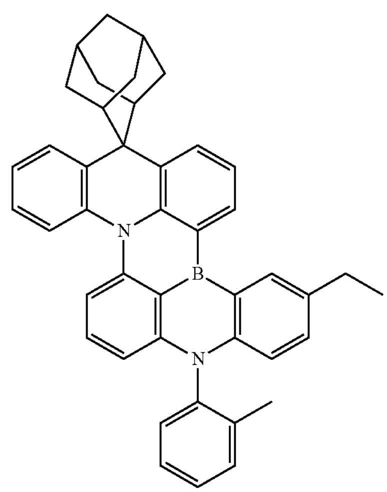

-continued
P47
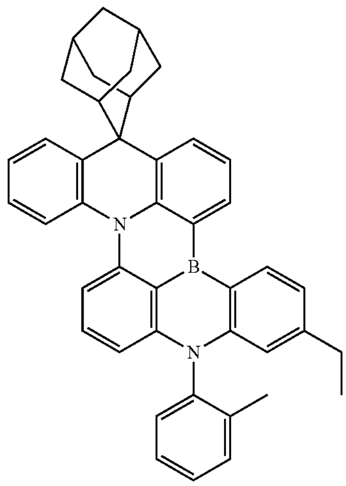
P48
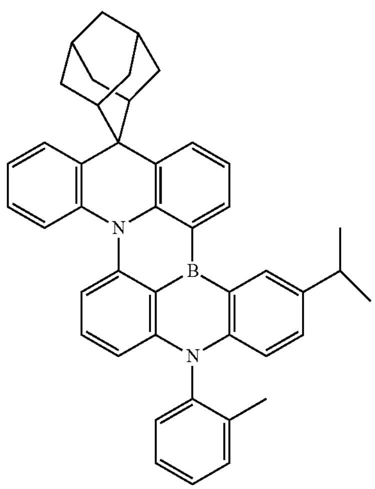
P49
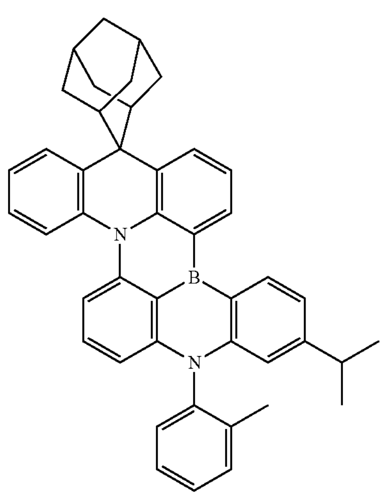
-continued
P50
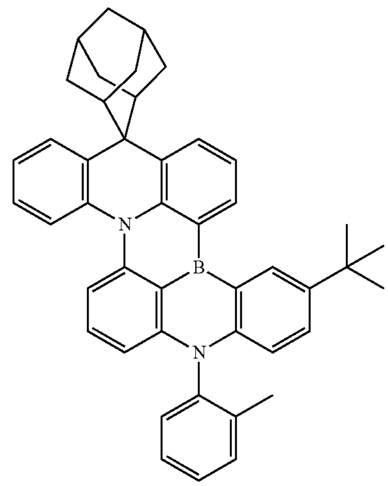
P51
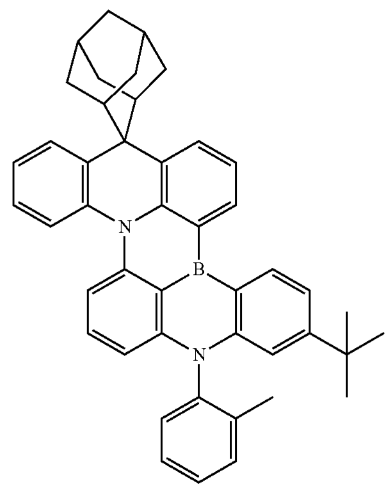
P52
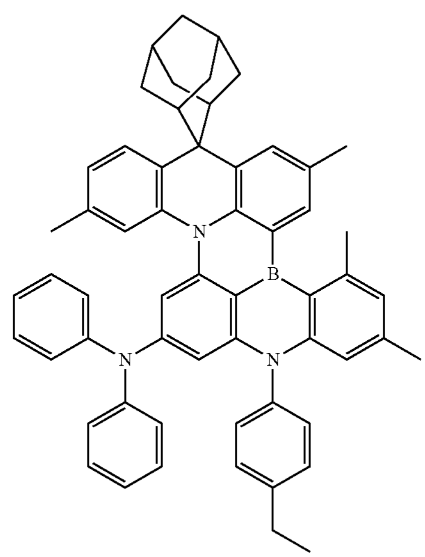

-continued
P53
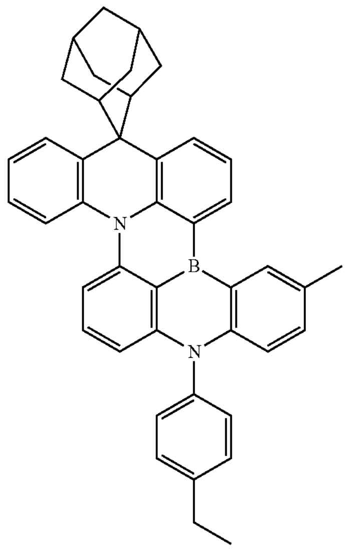
P54
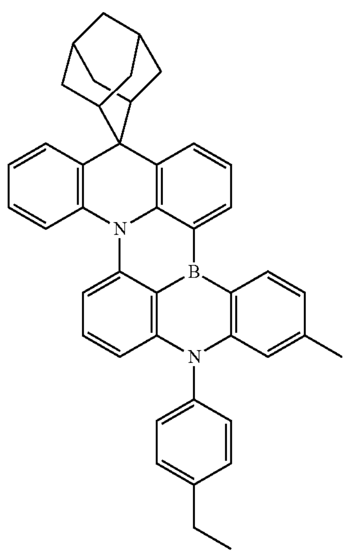
P55
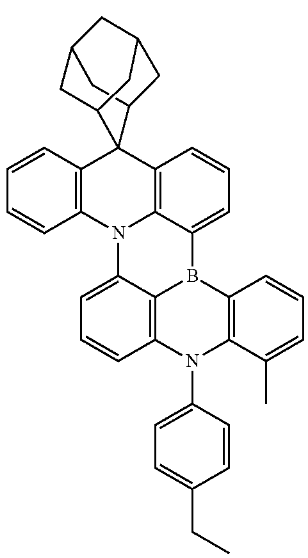
-continued
P56
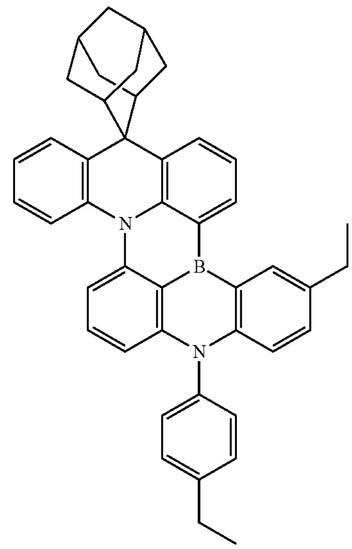
P57
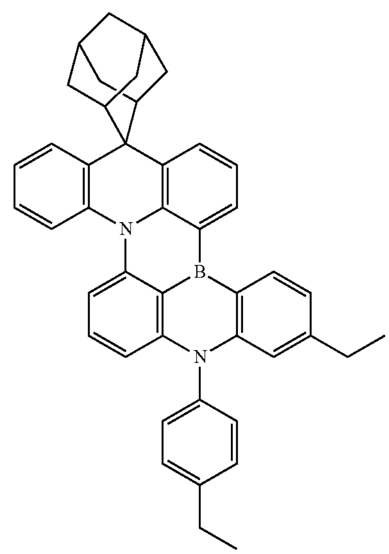
P58
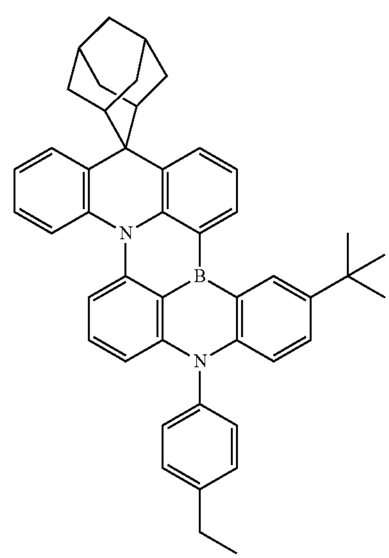

-continued
P59
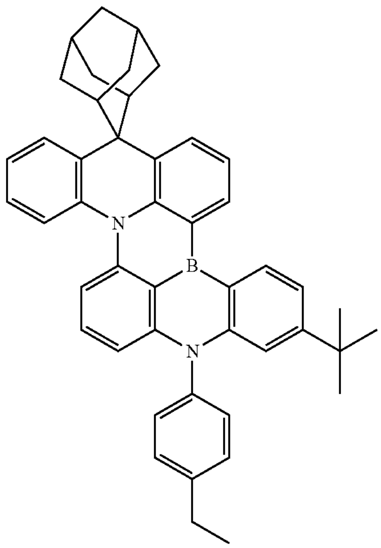
P60
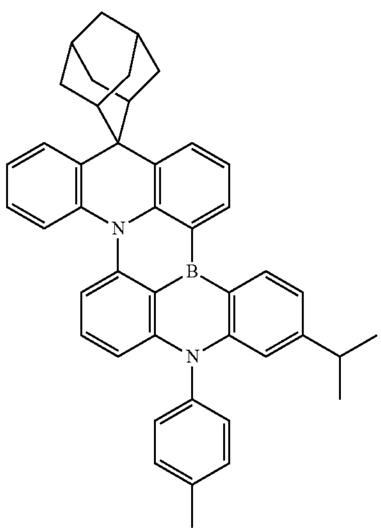
P61
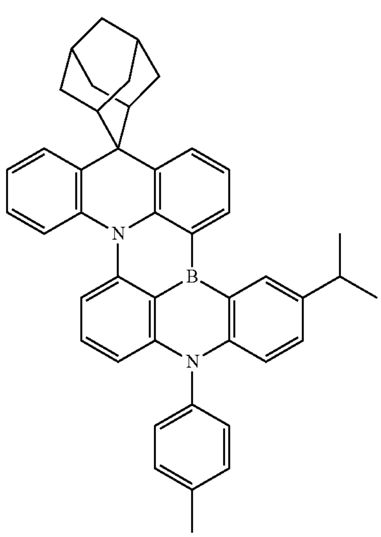
-continued
P62
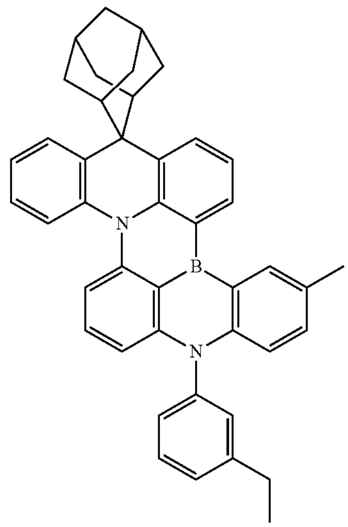
P63
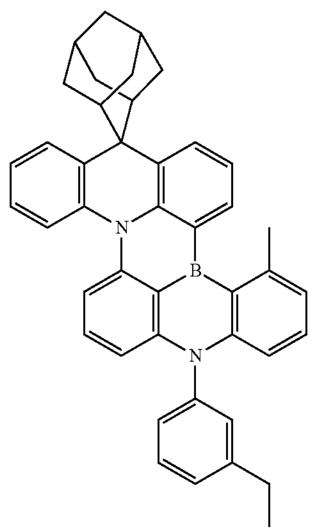
P64
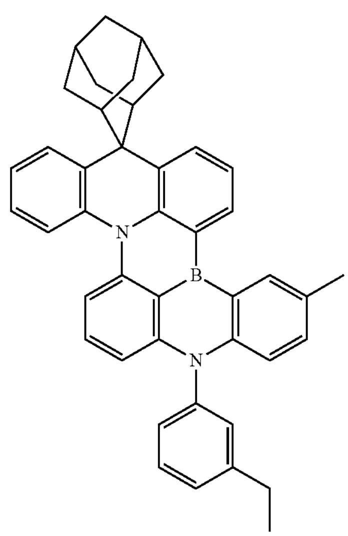

P65
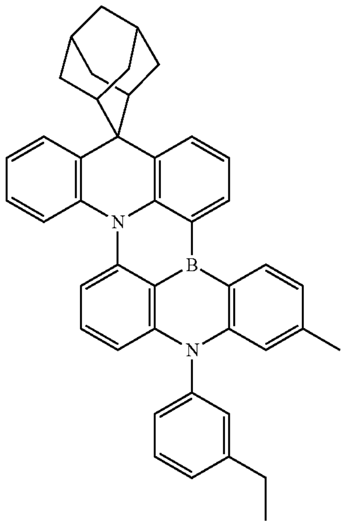
P66
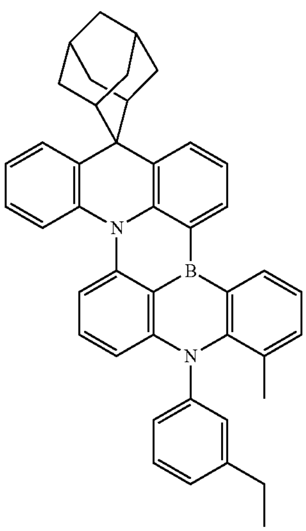
P67
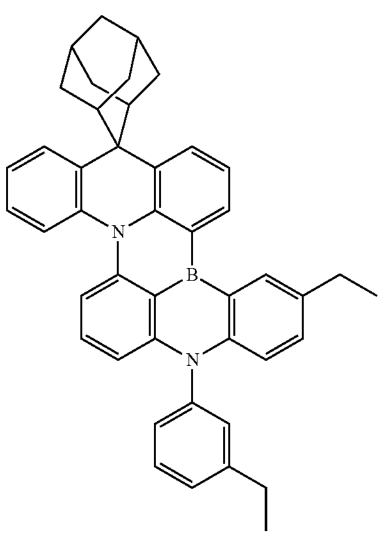
P68
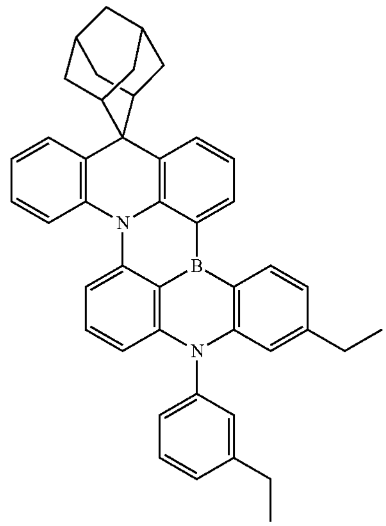
P69
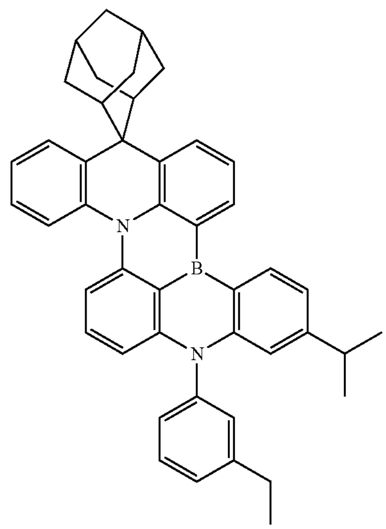
P70
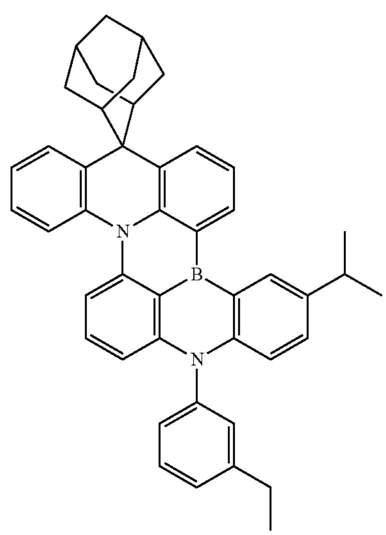

-continued
P71
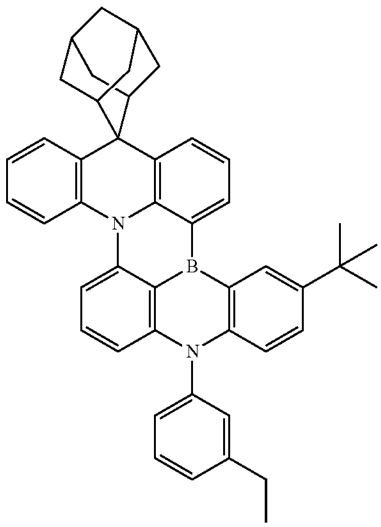
P72
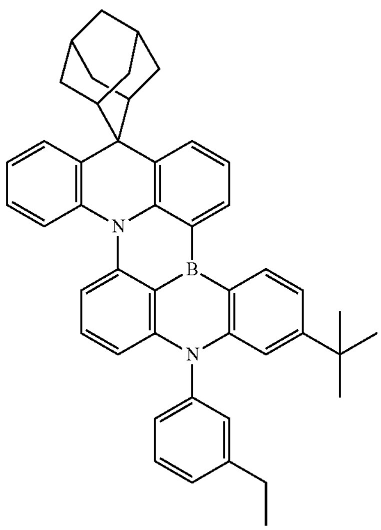
P73
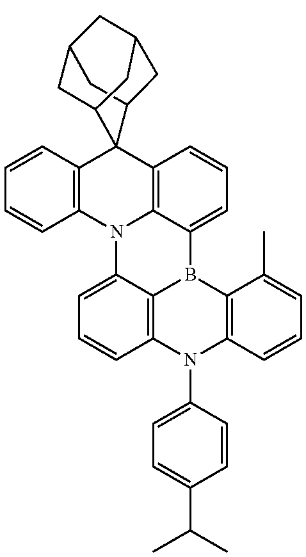
-continued
P74
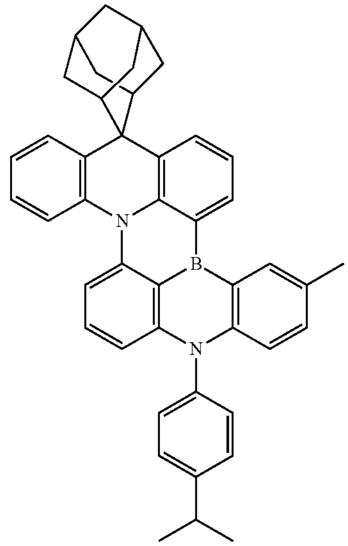
P75
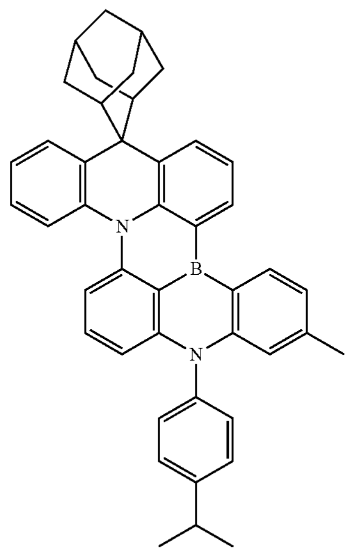
P76
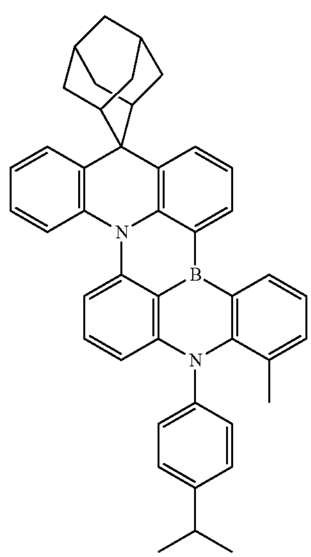

-continued
P77
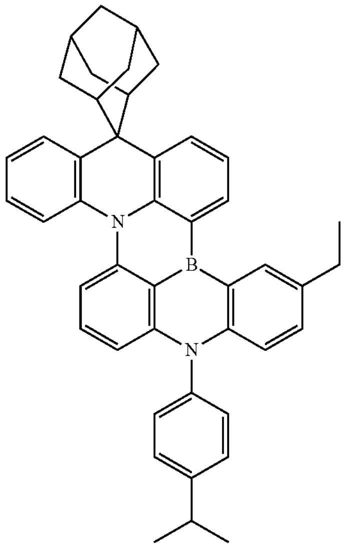
P78
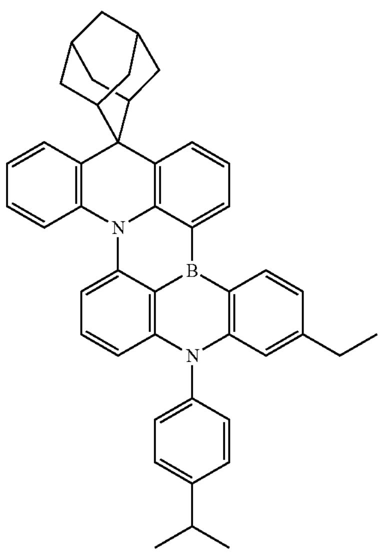
P79
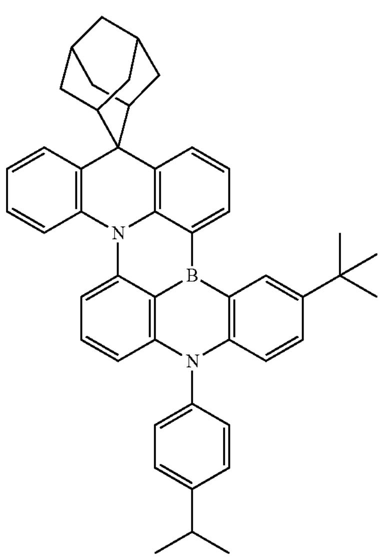
-continued
P80
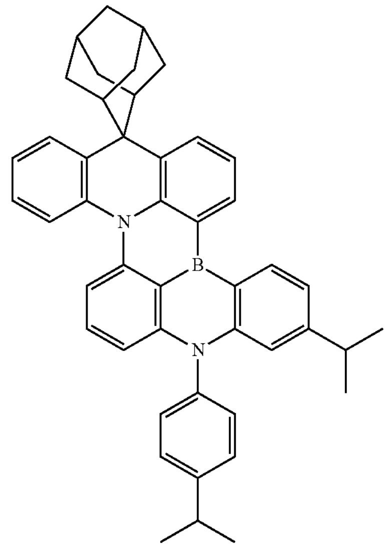
P81
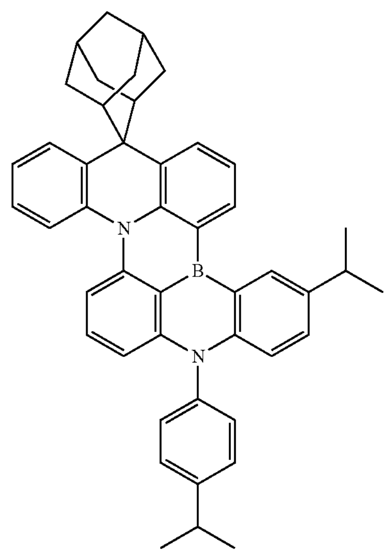
P82
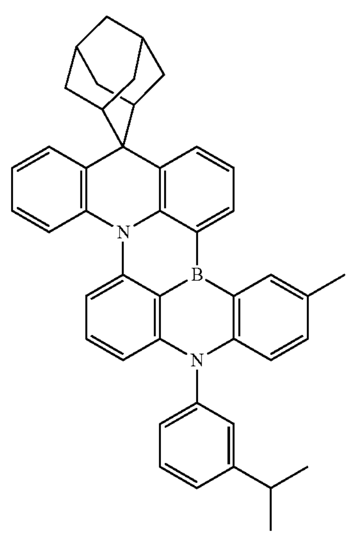

-continued
P83
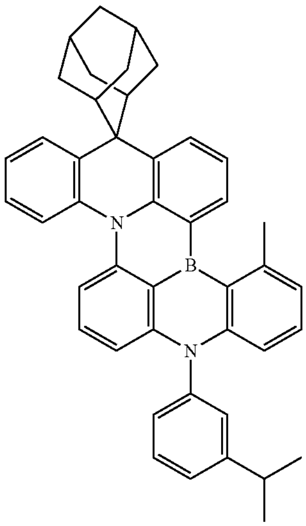
P84
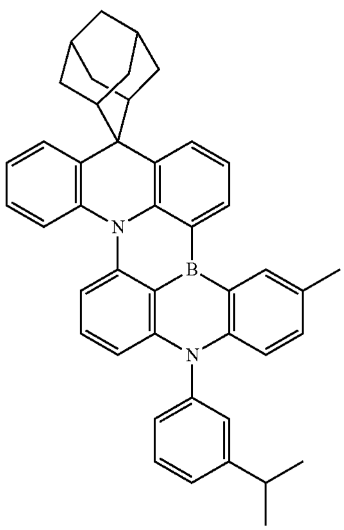
P85
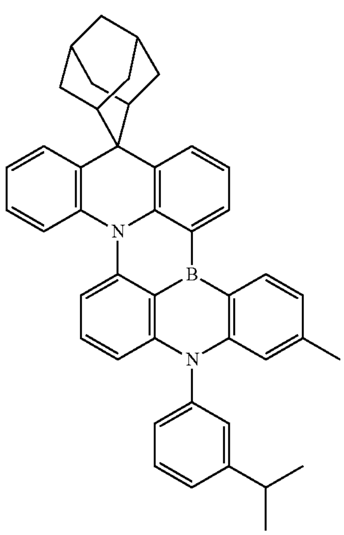
-continued
P86
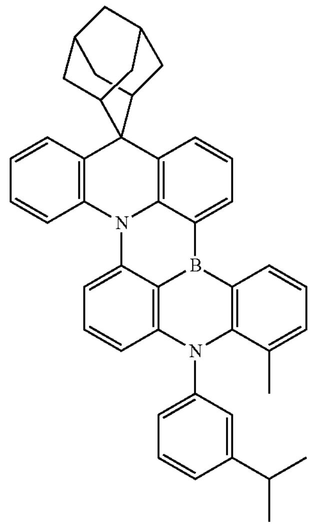
P87
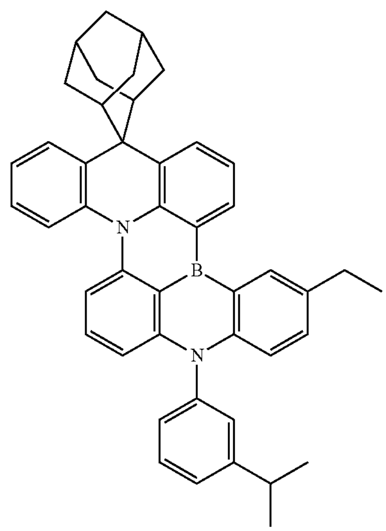
P88
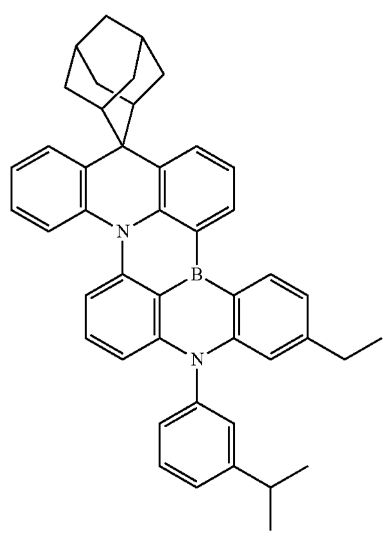

-continued
P89
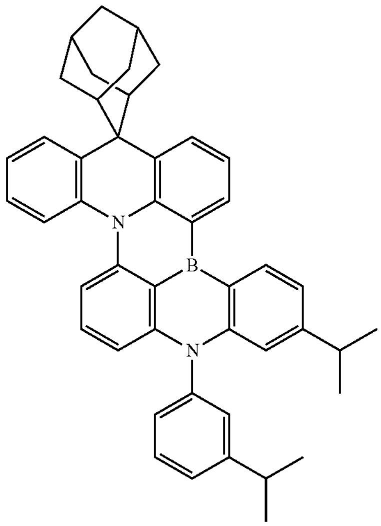
P90
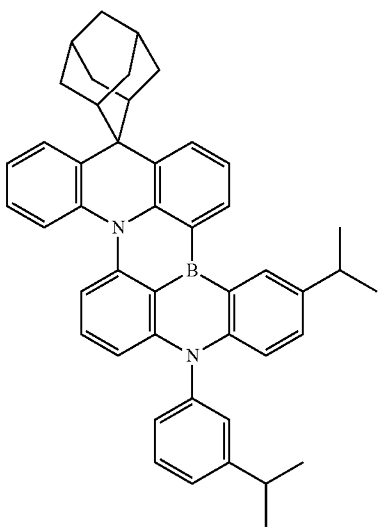
P91
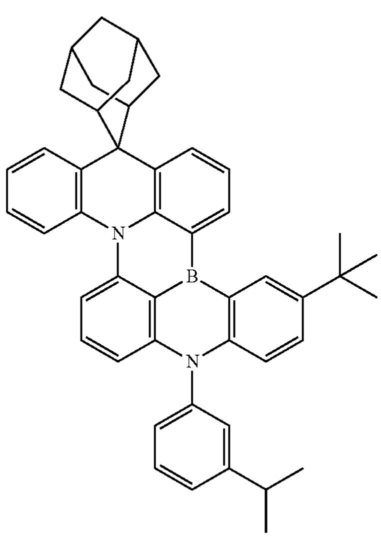
-continued
P92
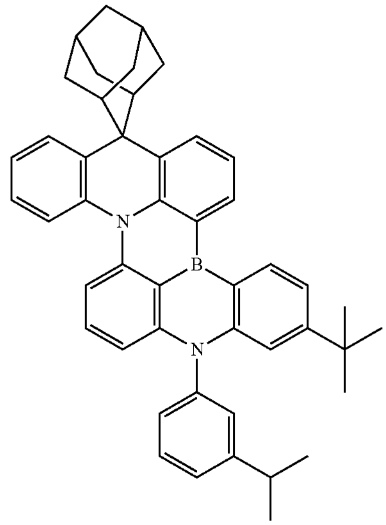
P93
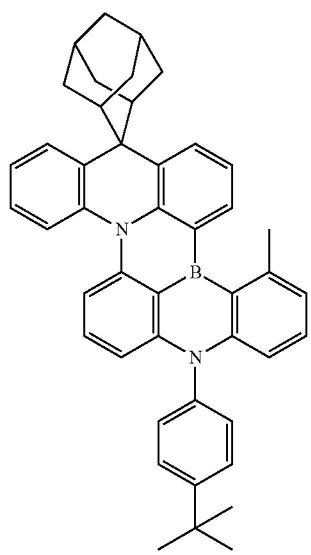
P94
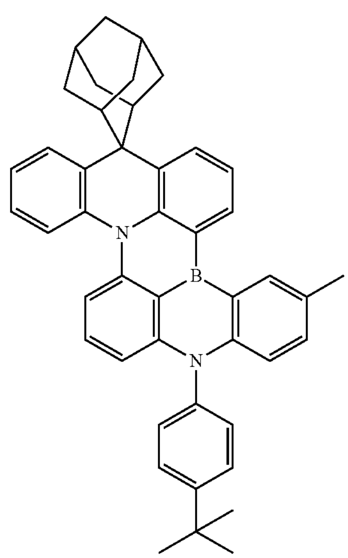

P95
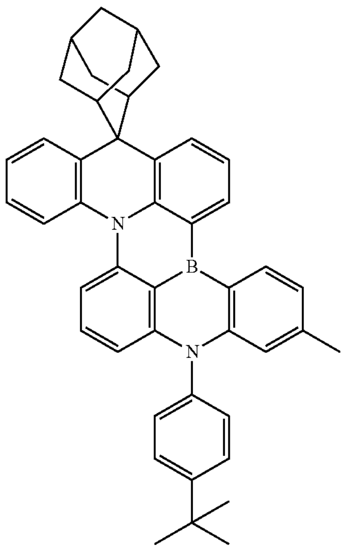
P96
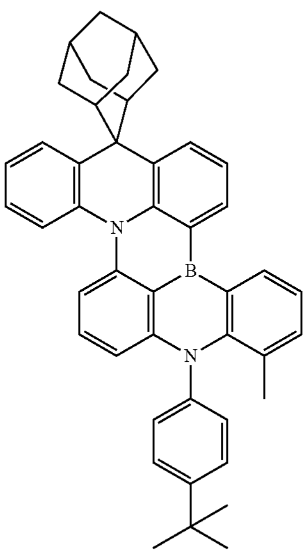
P97
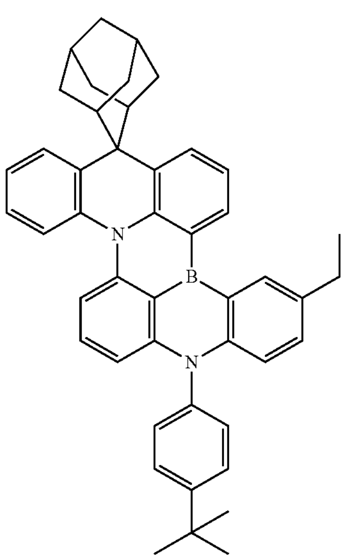
P98
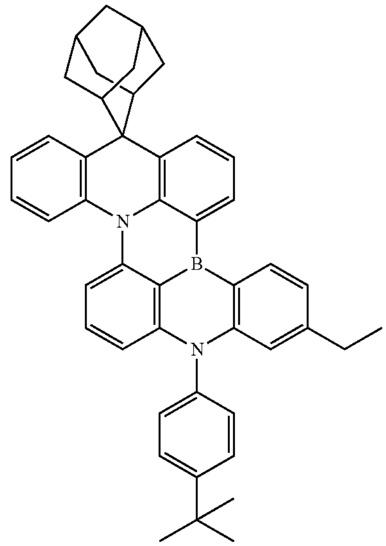
P99
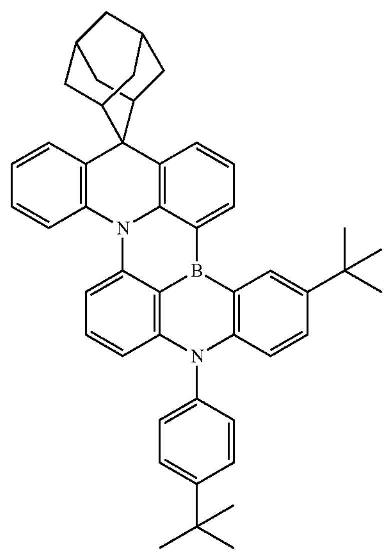
P100
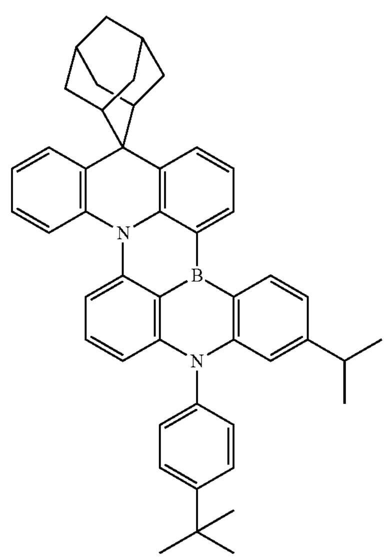

-continued
P101
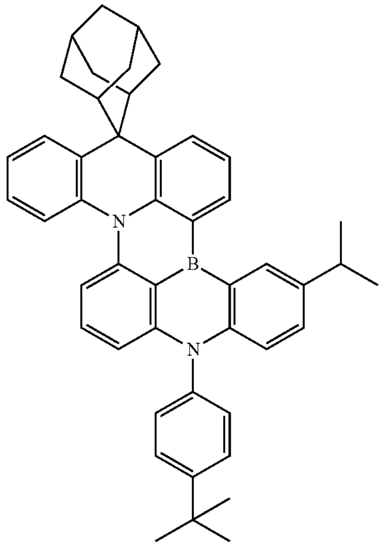
P102
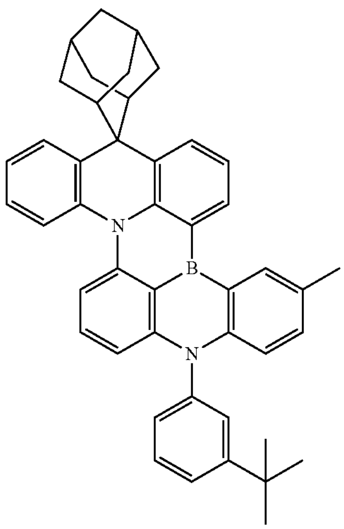
P103
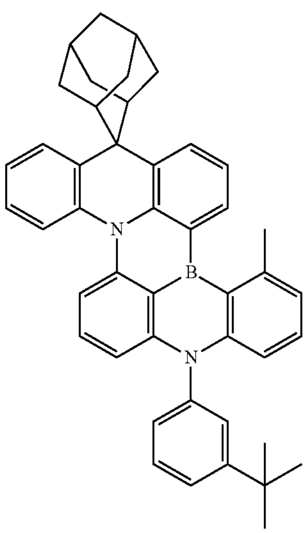
-continued
P104
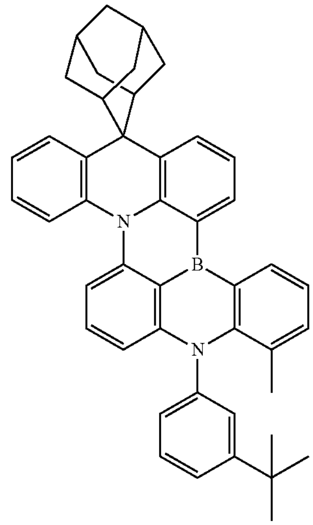
P105
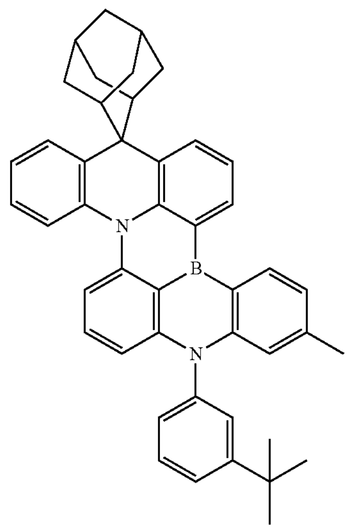
P106
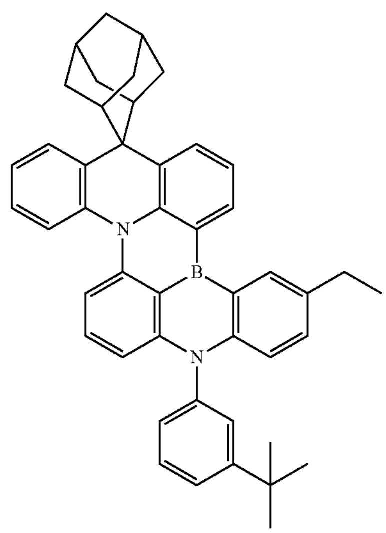

-continued
P107
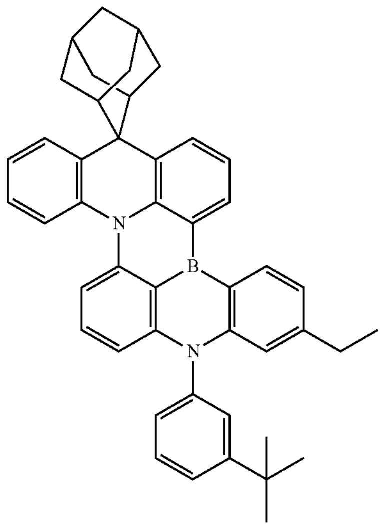
P108
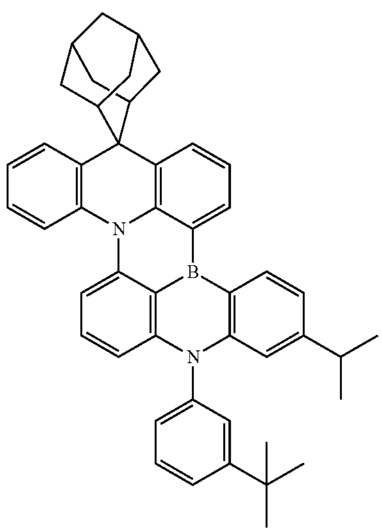
P109
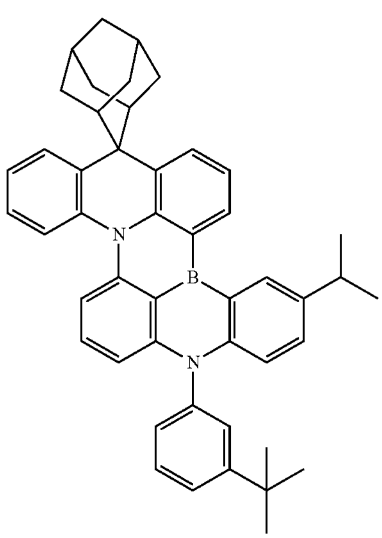
-continued
P110
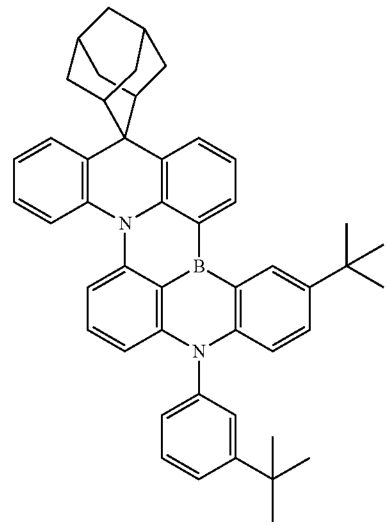
P111
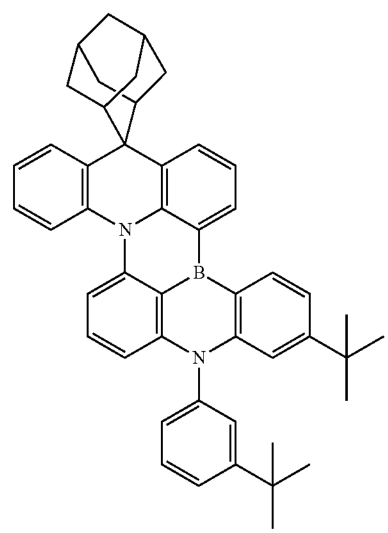
P112
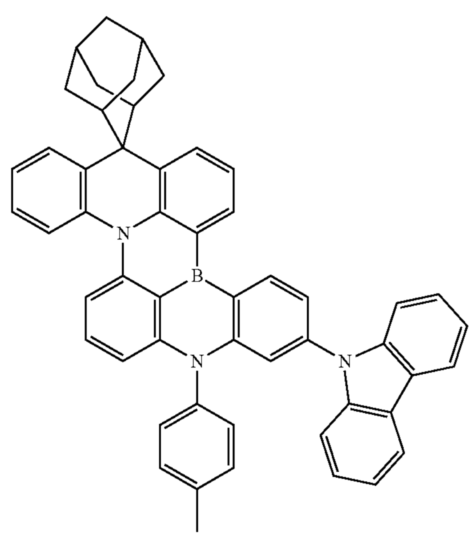

-continued
P113
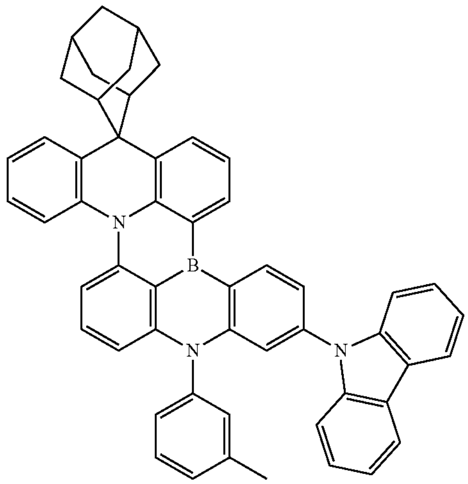
P114
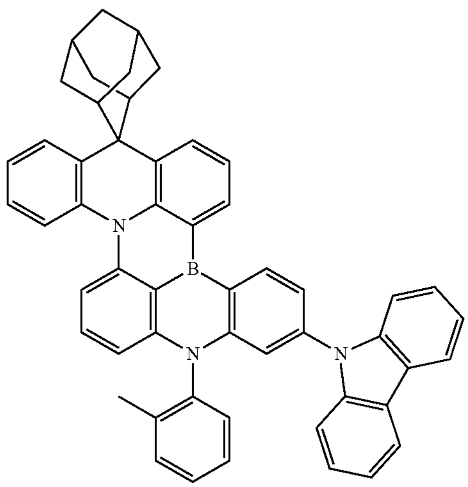
P115
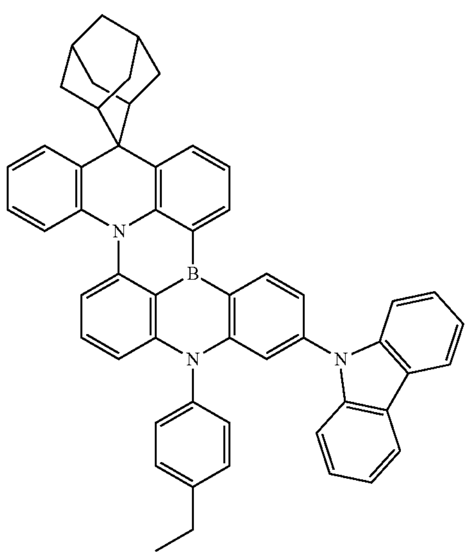
-continued
P116
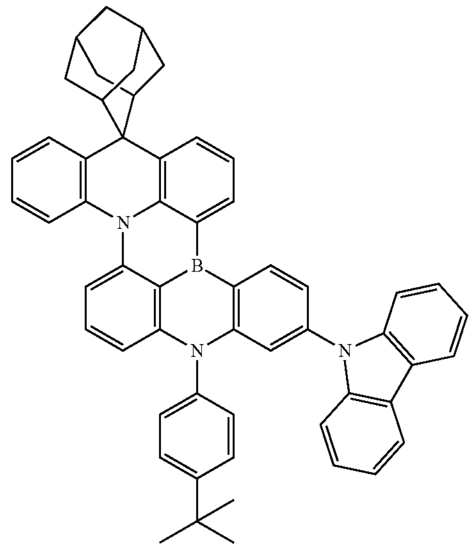
P117
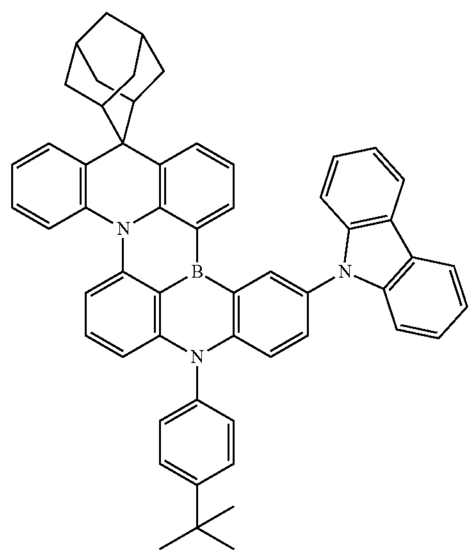
P118
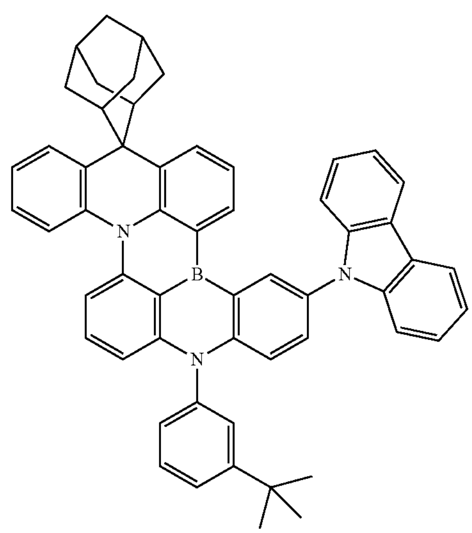

P119
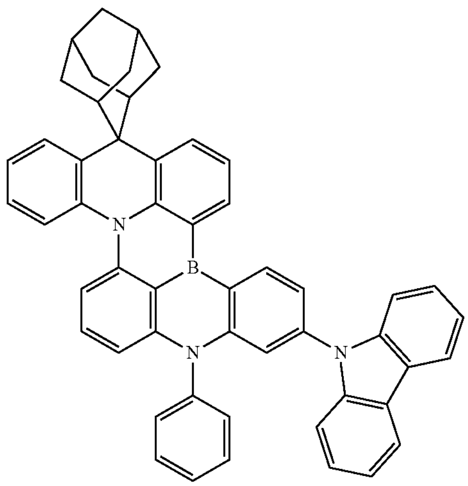
P120
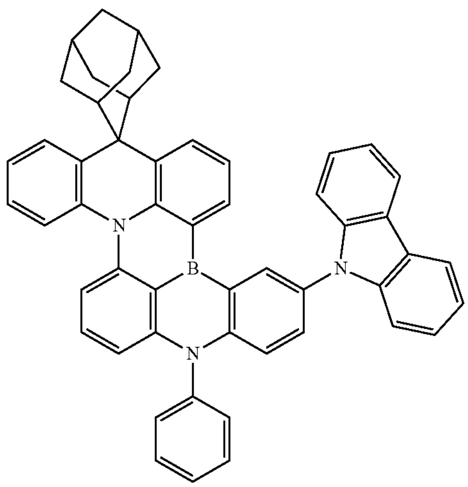
P121
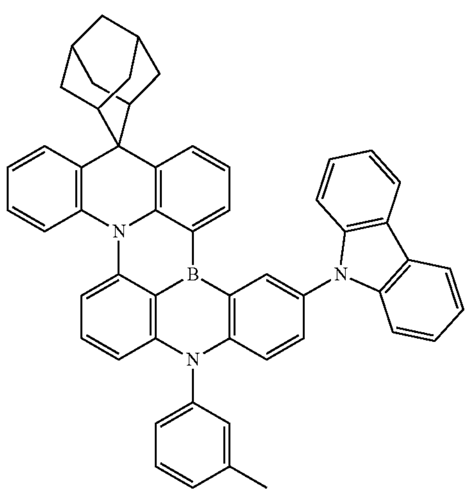
P122
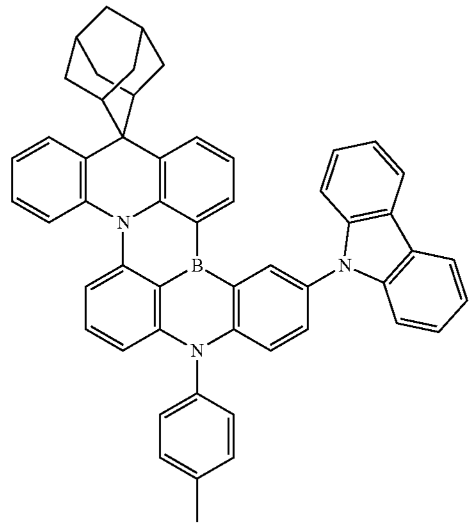
P123
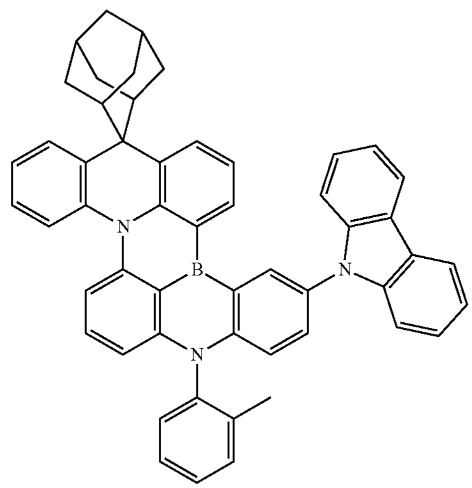
P124
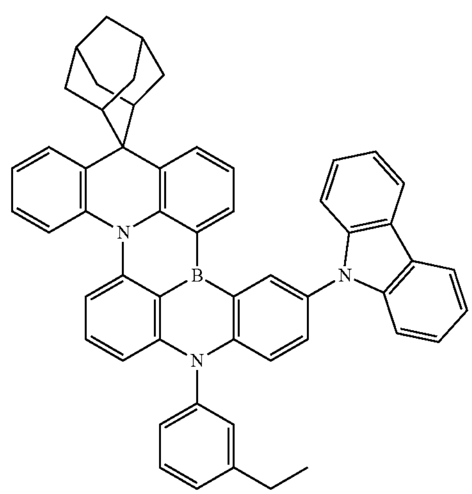

-continued
P125
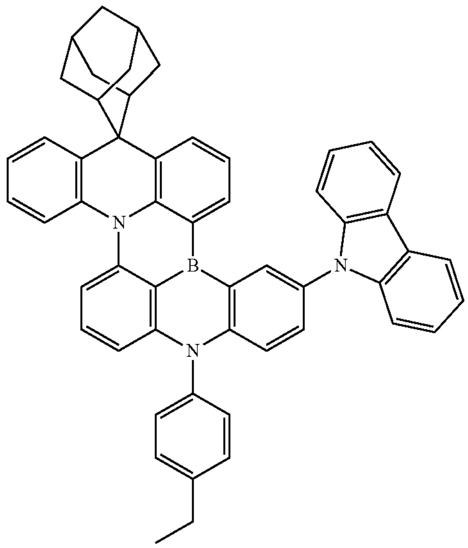
P126
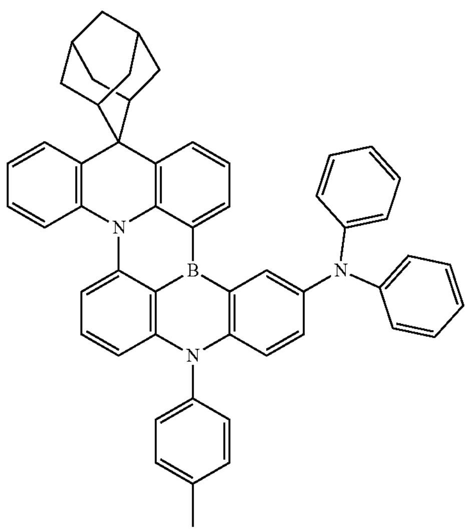
P127
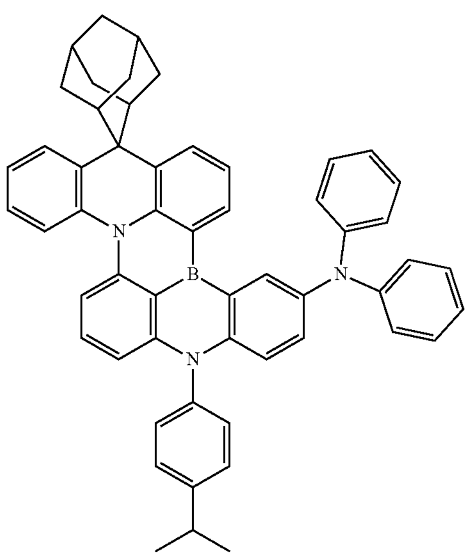
-continued
P128
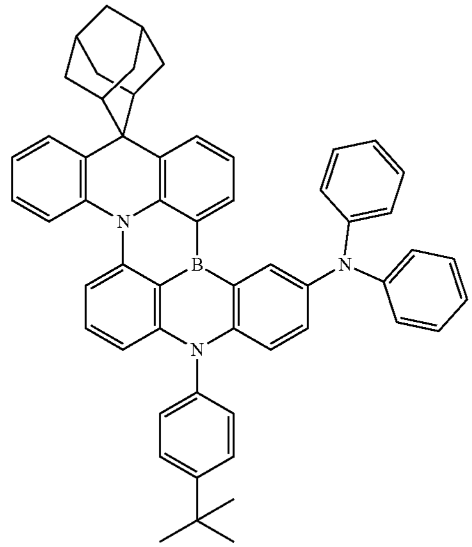
P129
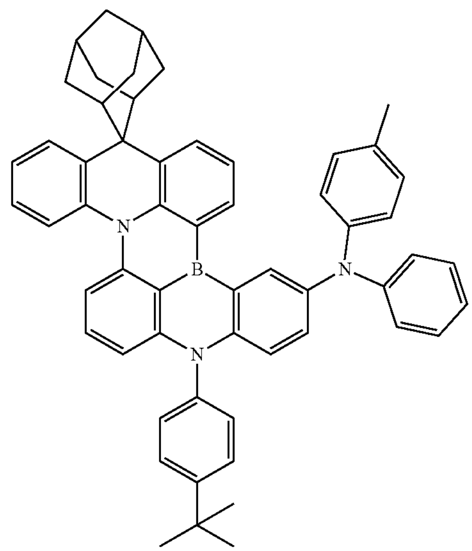
P130
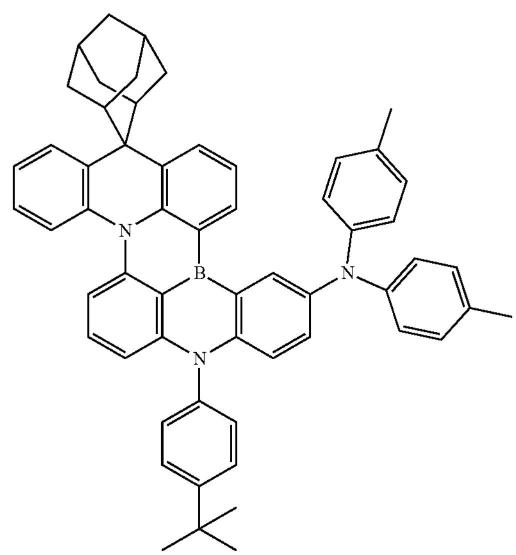

-continued
P131
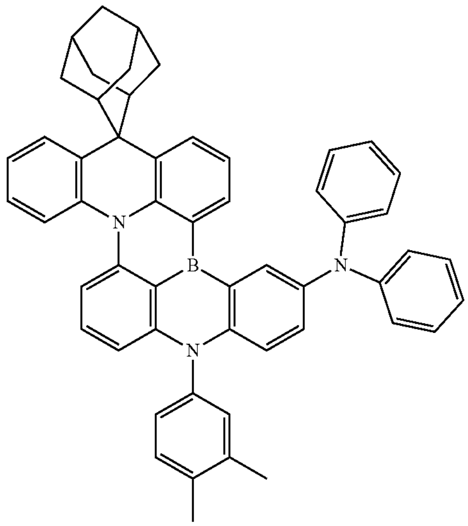
P132
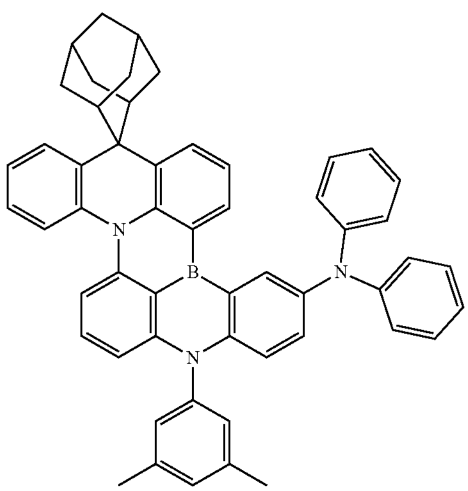
P133
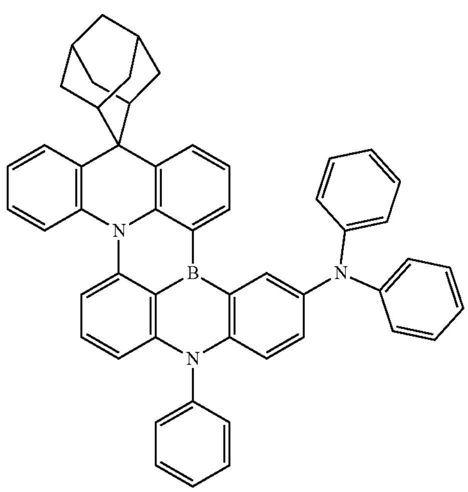
-continued
P134
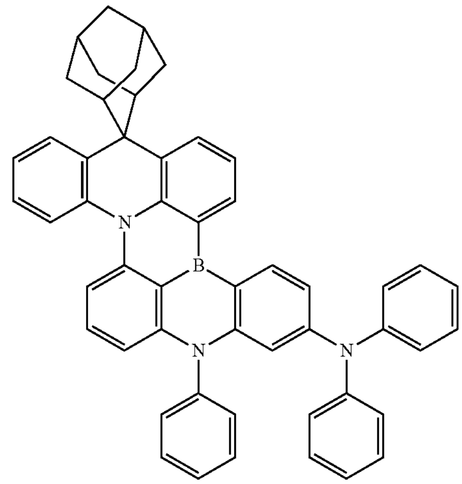
P135
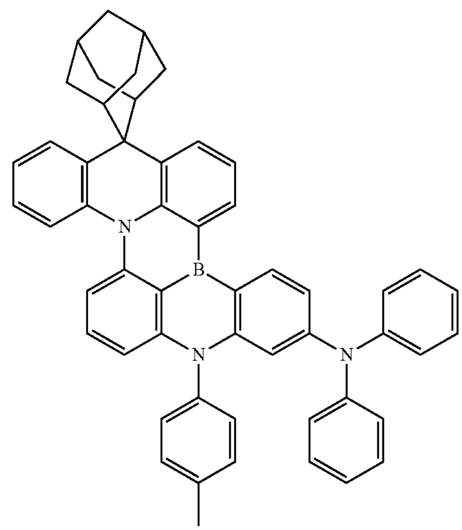
P136
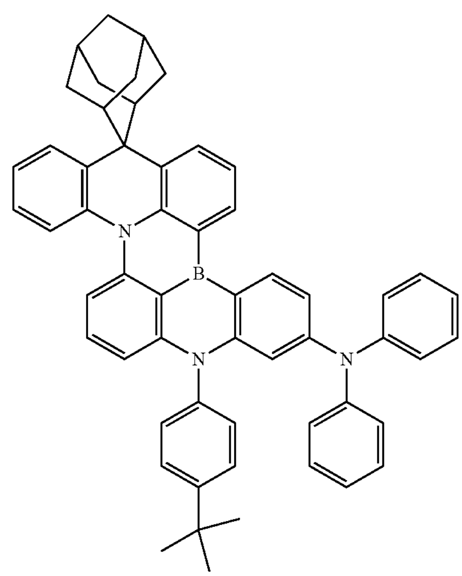

-continued
P137
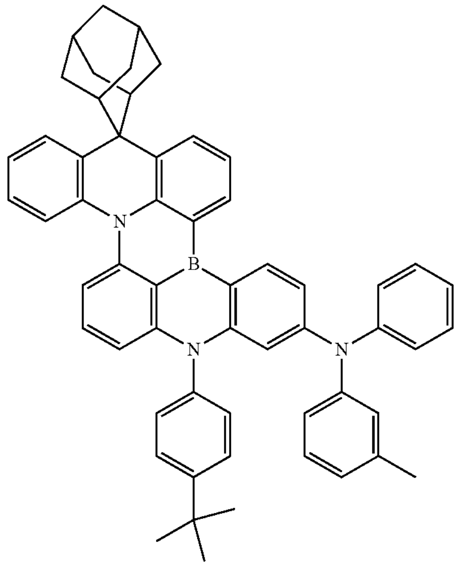
P138
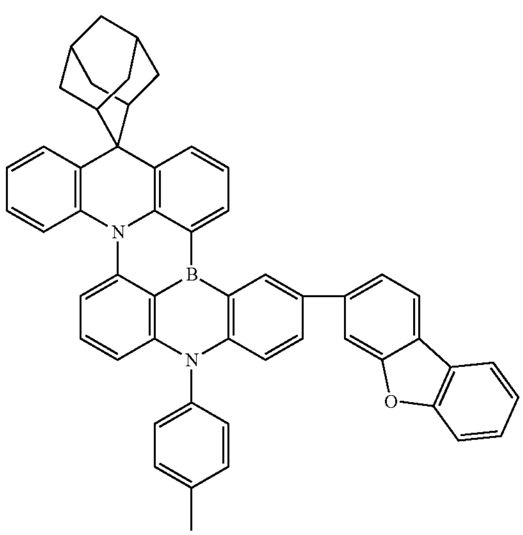
-continued
P139
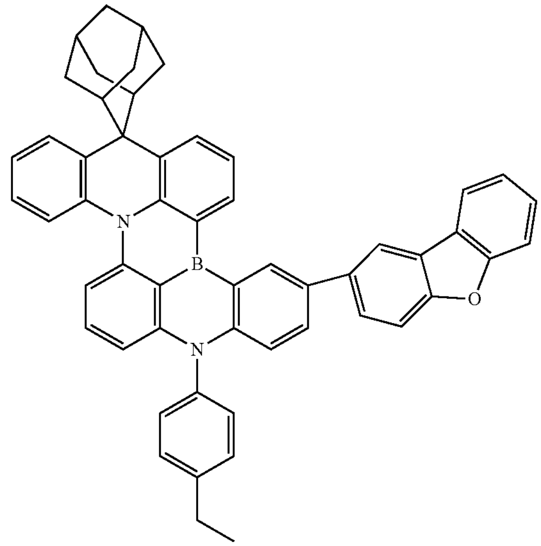
P140
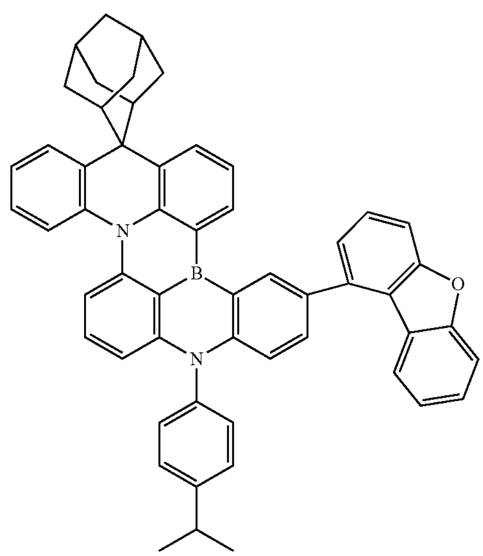

-continued
P141
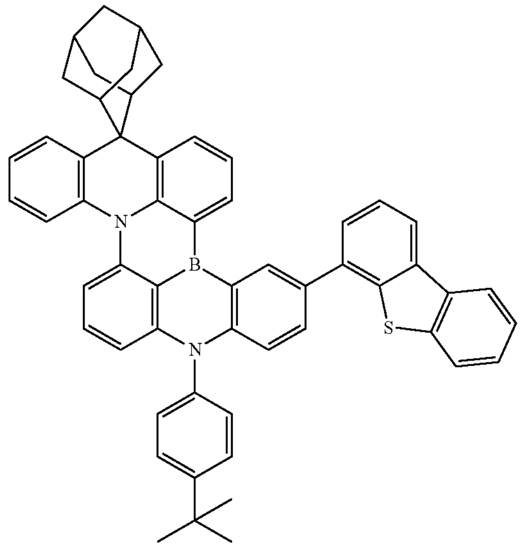
P142
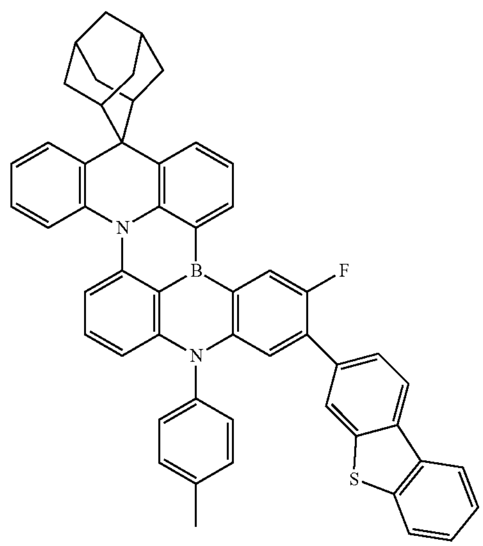
P143
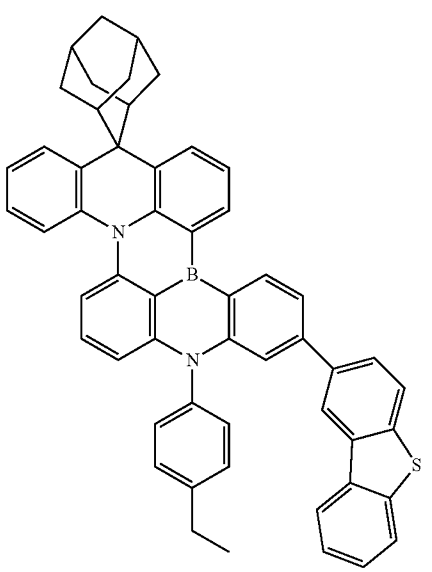
-continued
P144
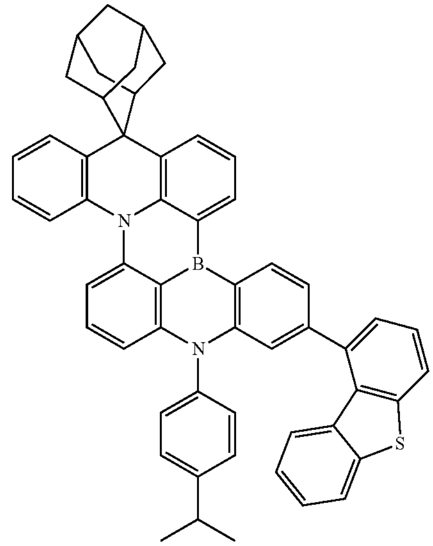
P145
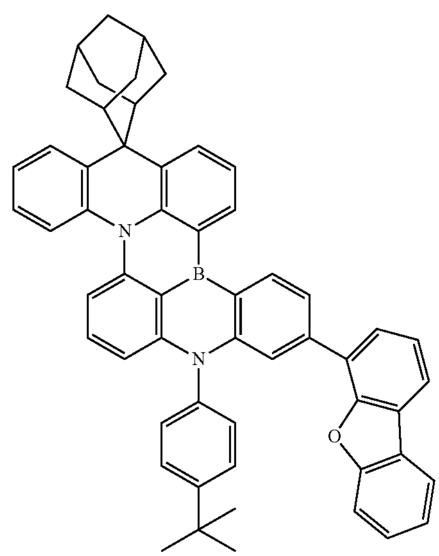

-continued
P146
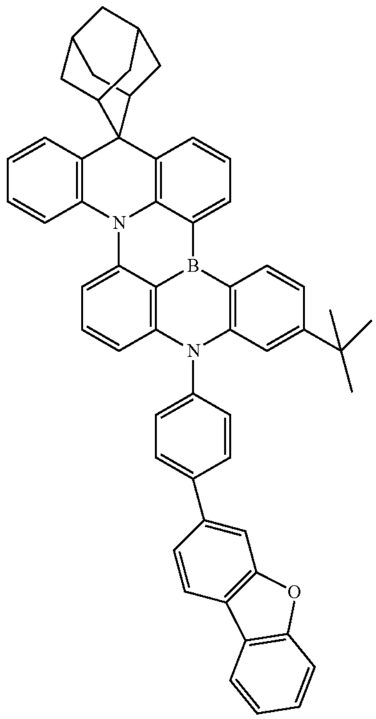
P147
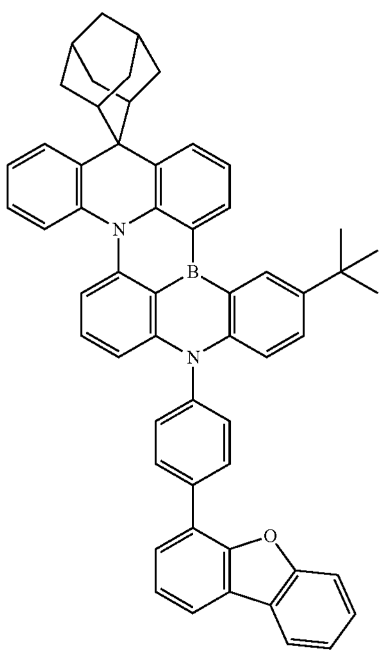
-continued
P148
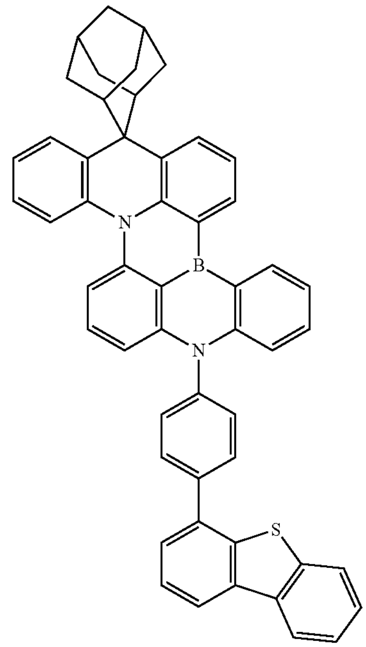
P149
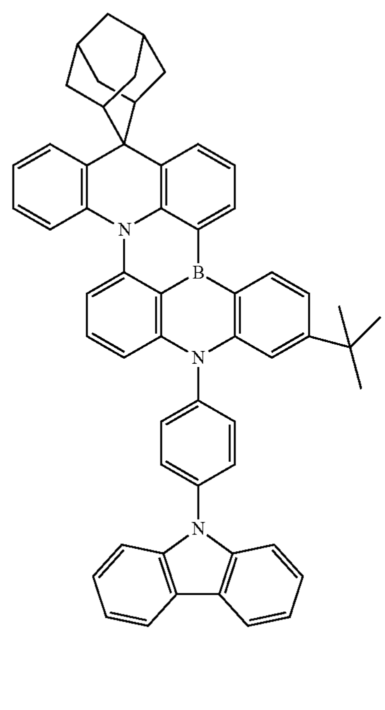

-continued
P150
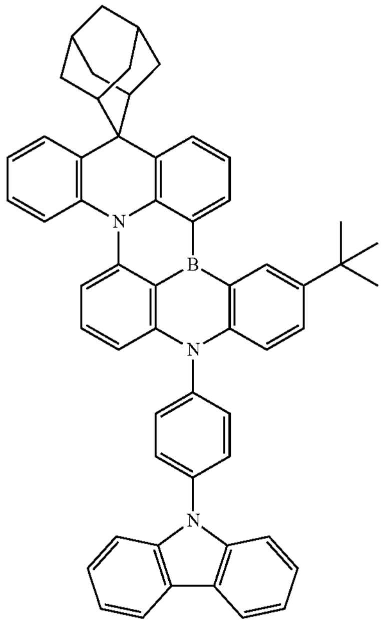
P150
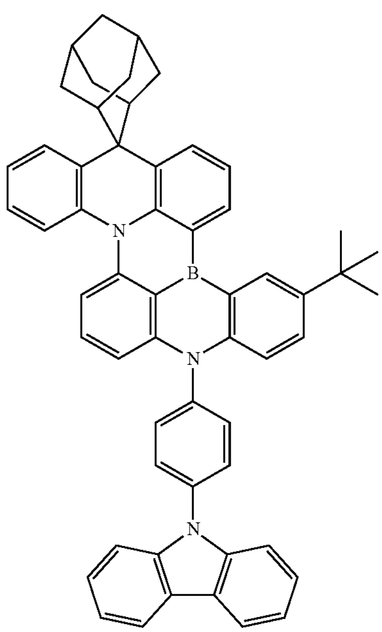
-continued
P151
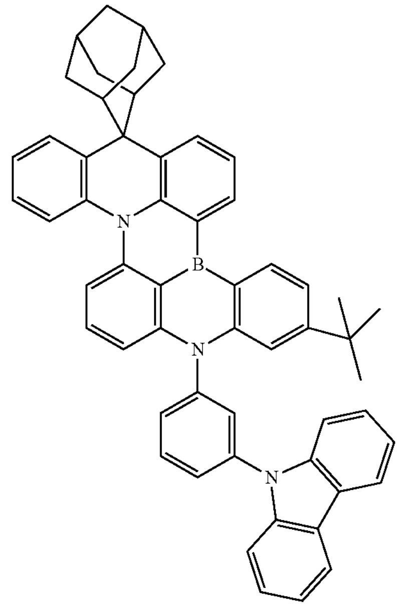
P152
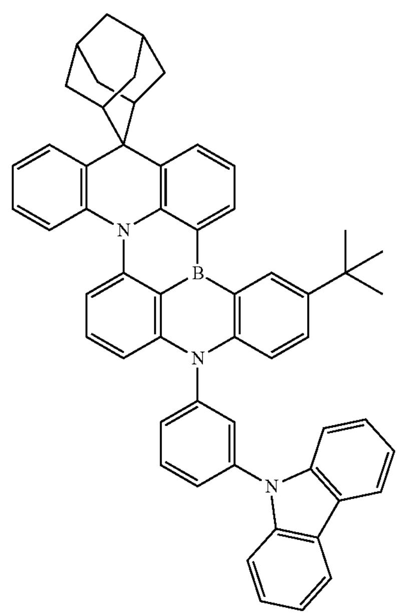

-continued
P153
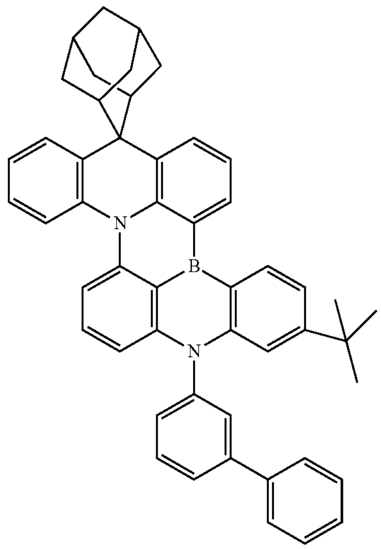
P154
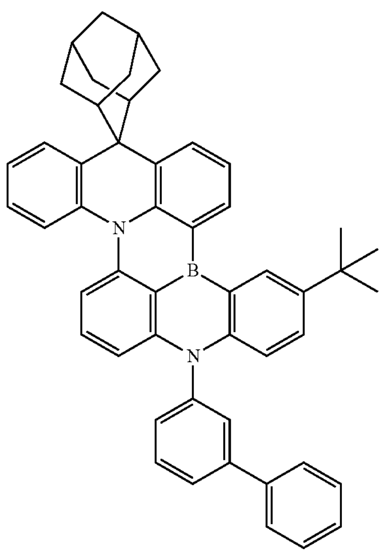
P155
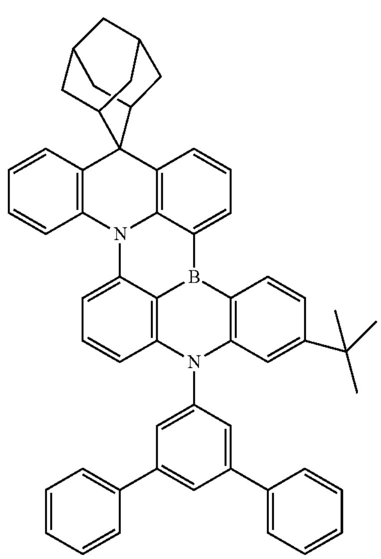
-continued
P156
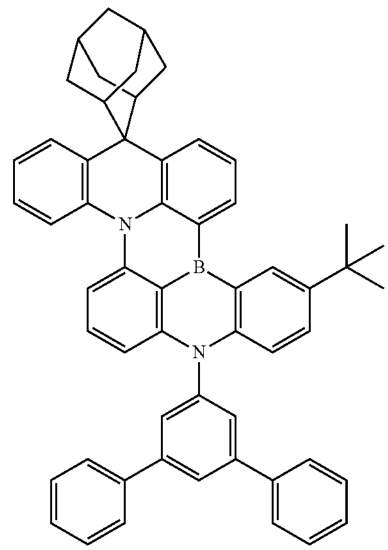
P157
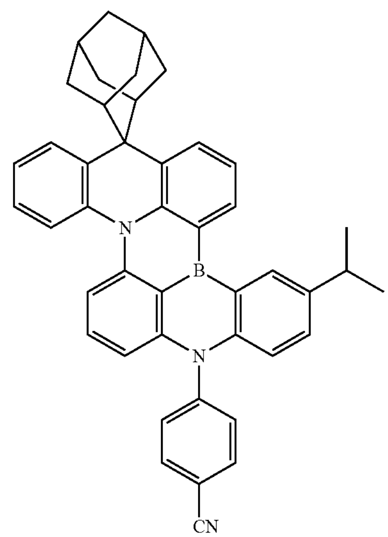
P158
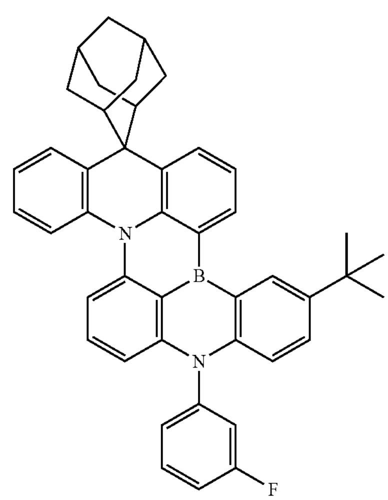

P159
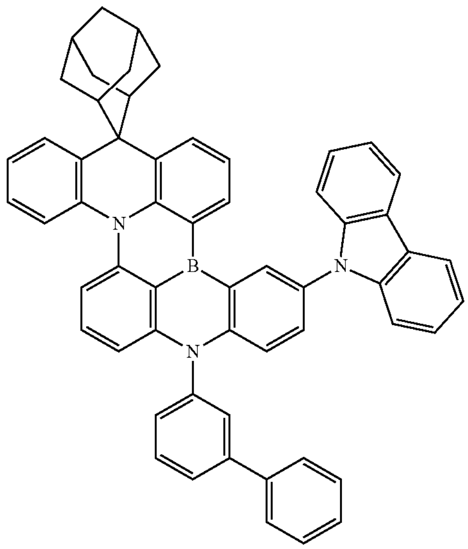
P160
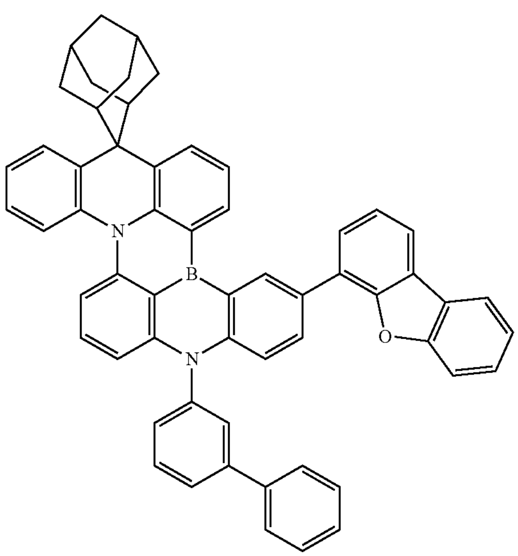
P161
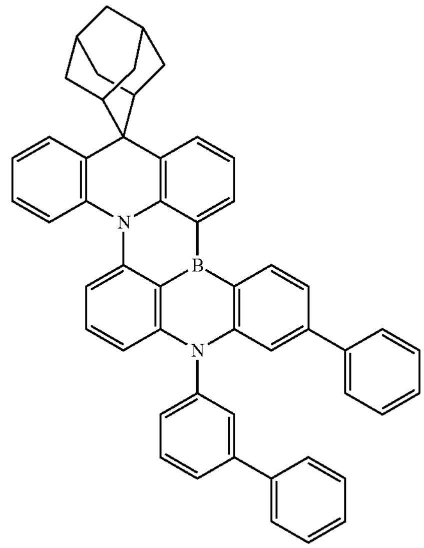
P162
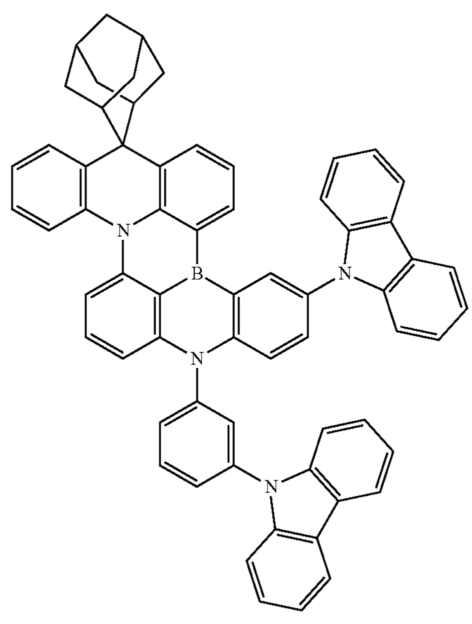

-continued
P163
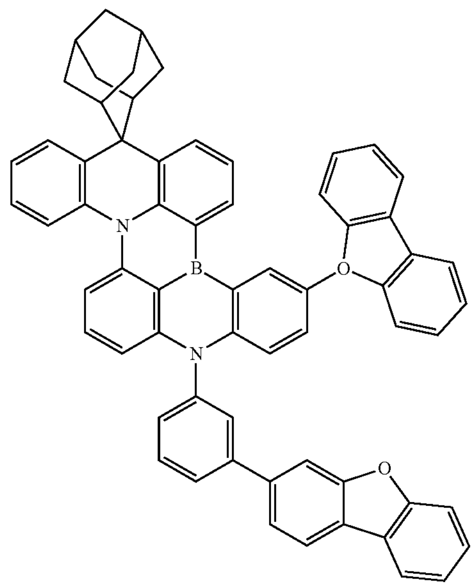
P164
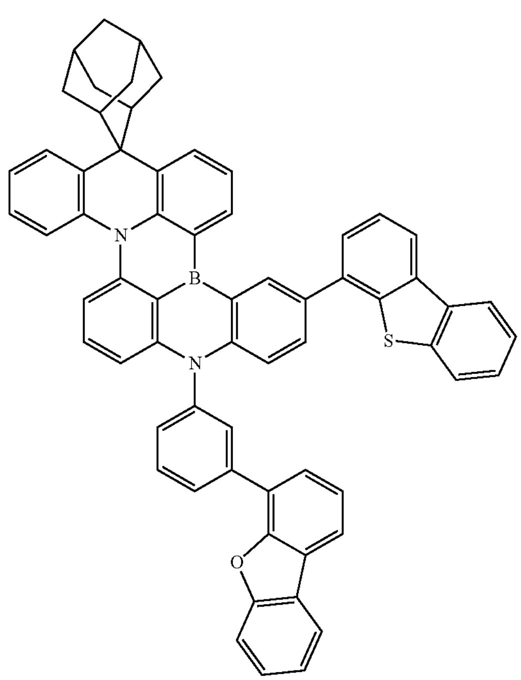
-continued
P165
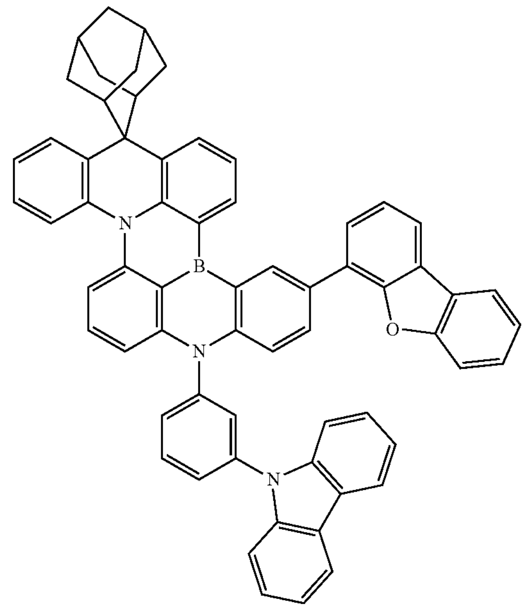
P166
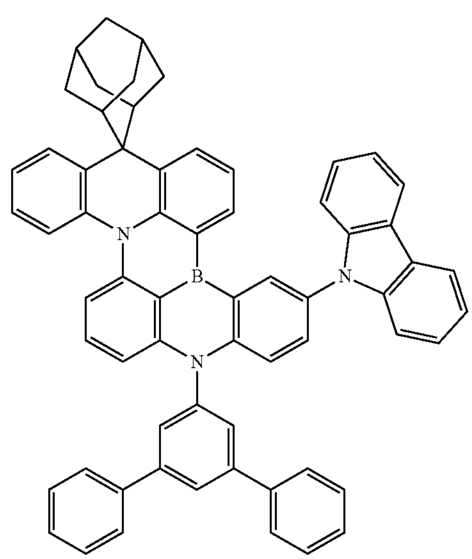

-continued
P167
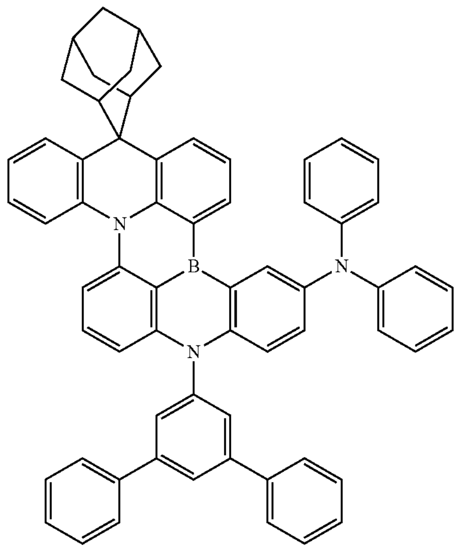
P168
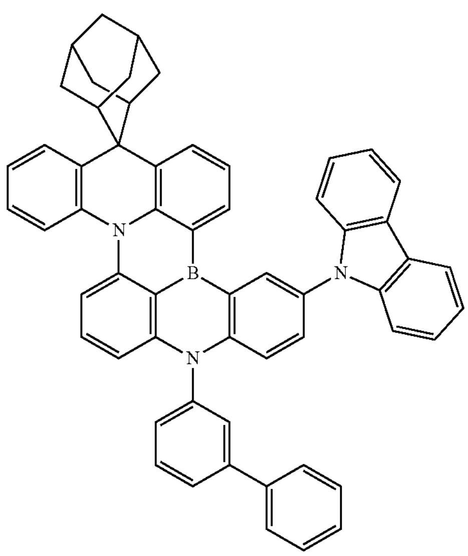
P169
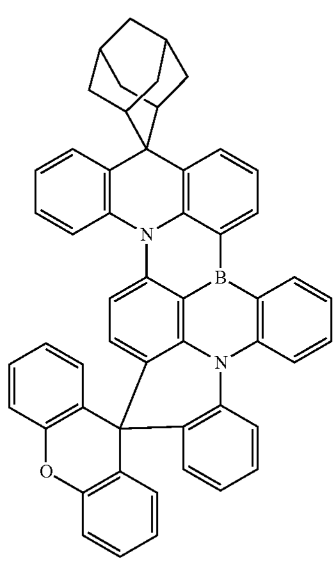
-continued
P170
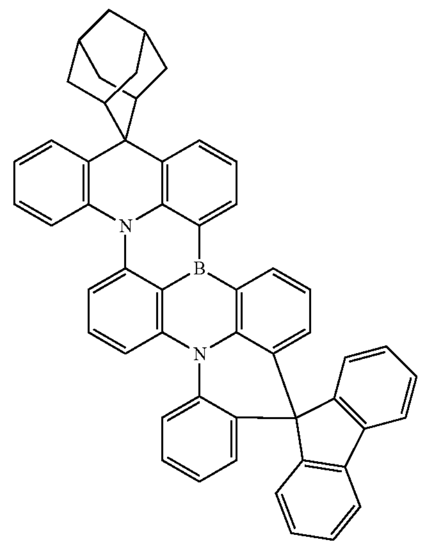
P171
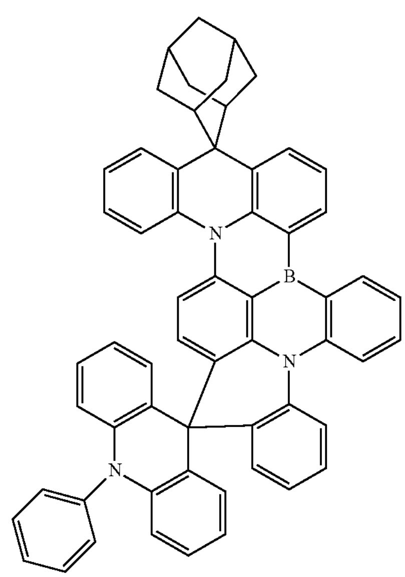

-continued
P172
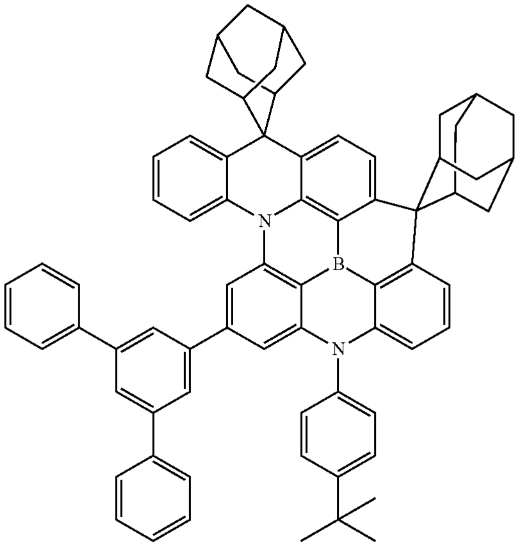
P173
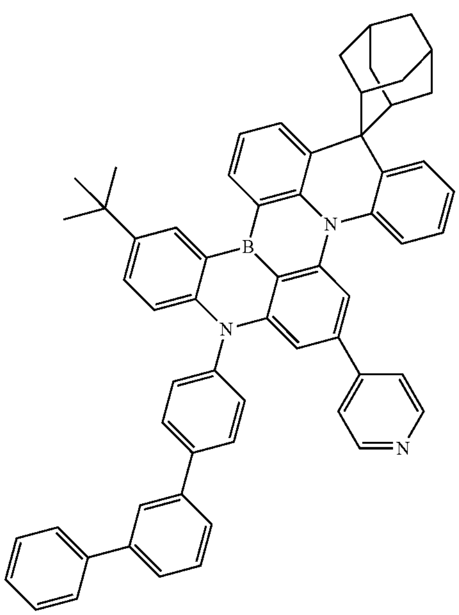
-continued
P174
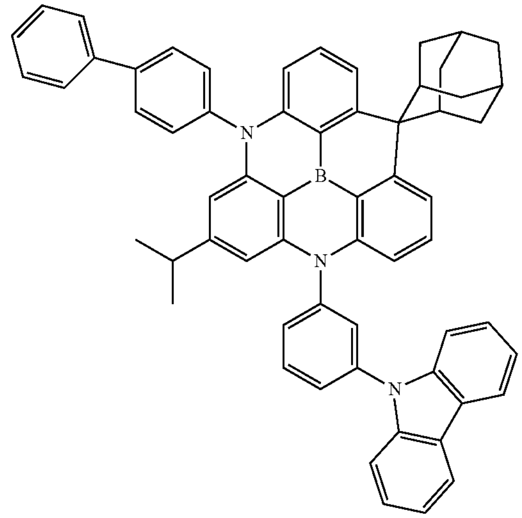
P175
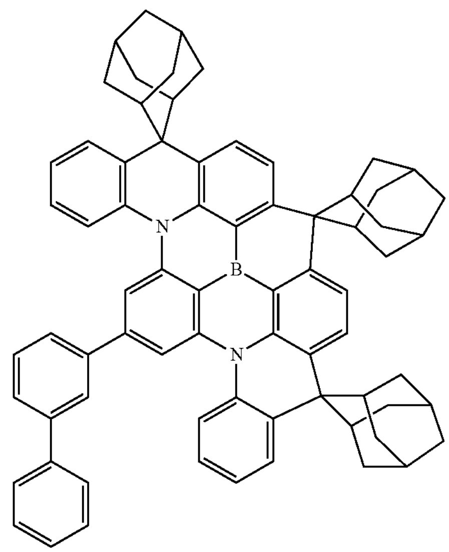
P176
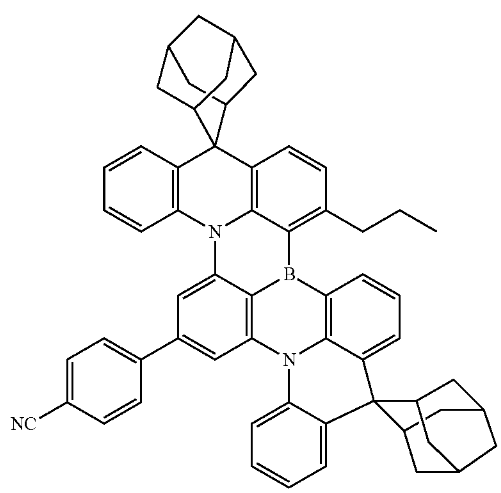

-continued
P177
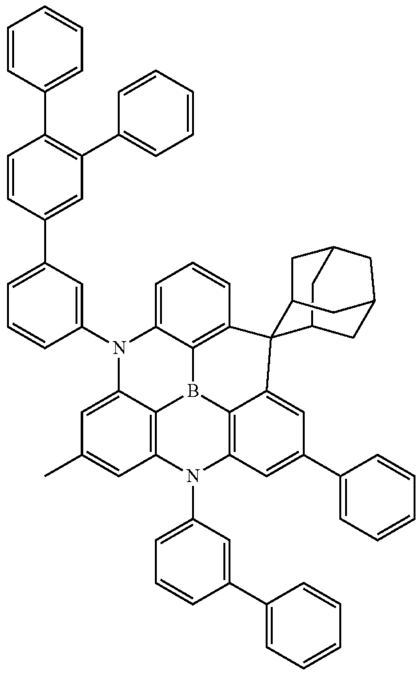
P178
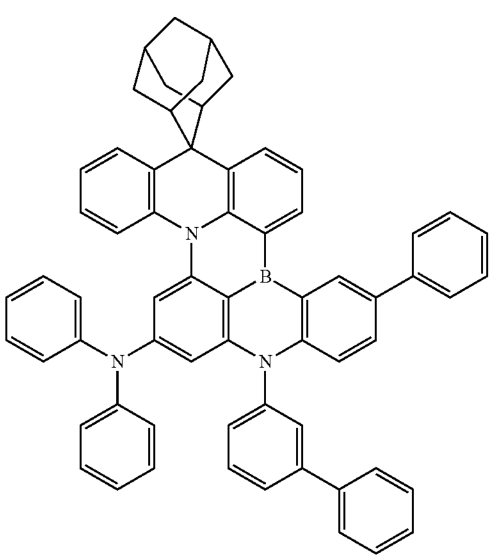
-continued
P179
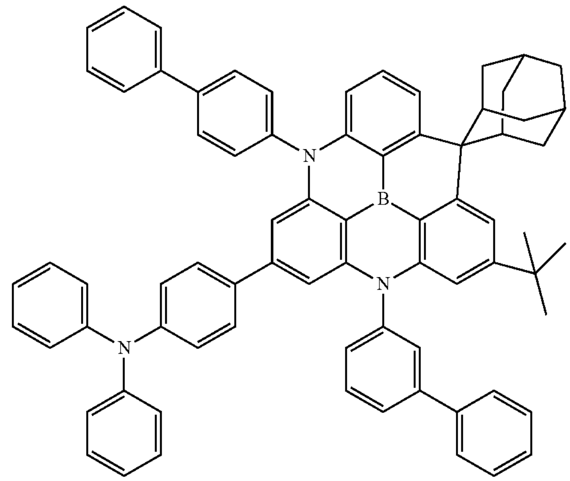
P180
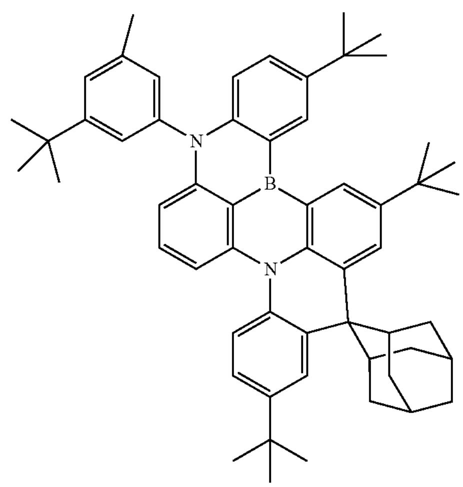
P181
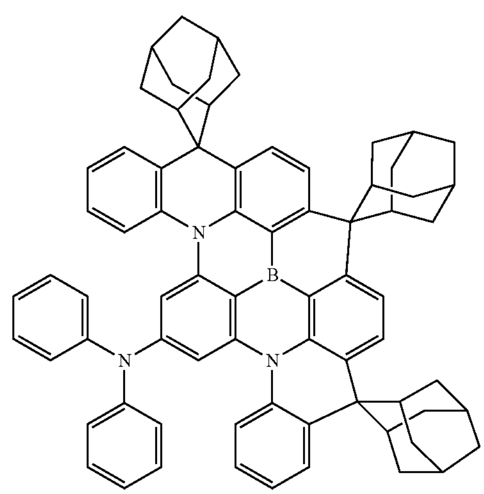

-continued
P182
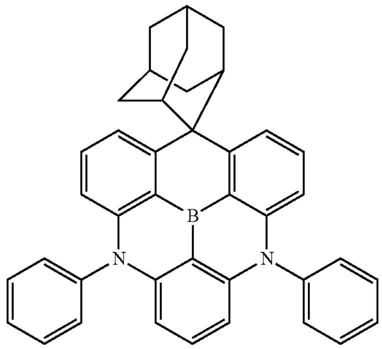
P183
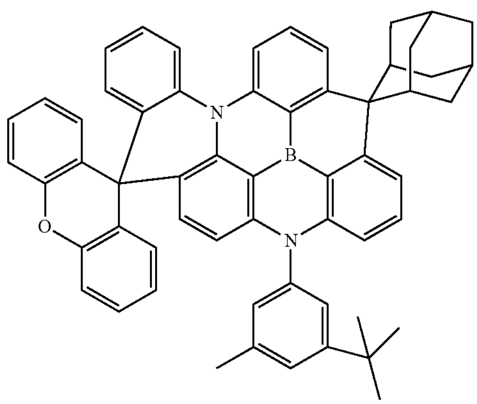
P184
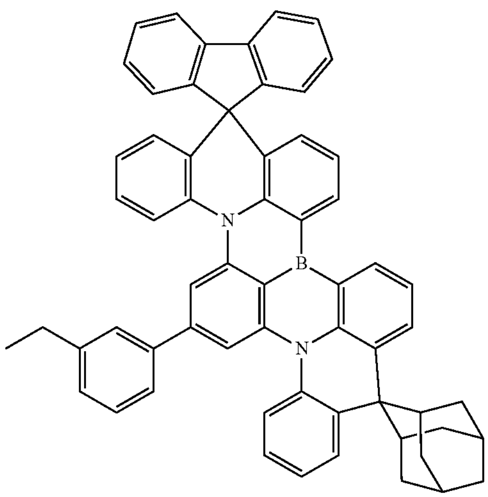
-continued
P185
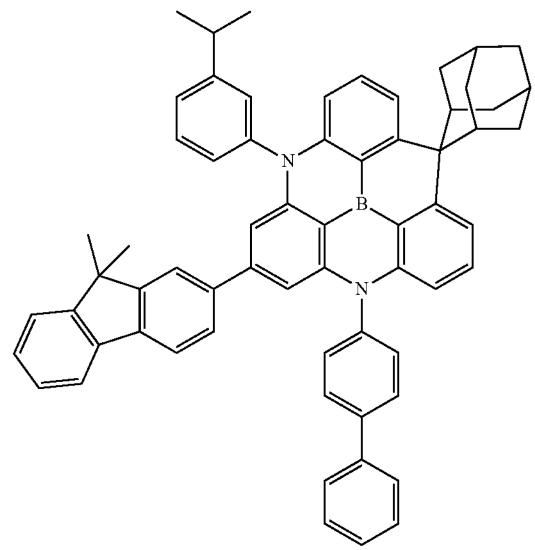
P186
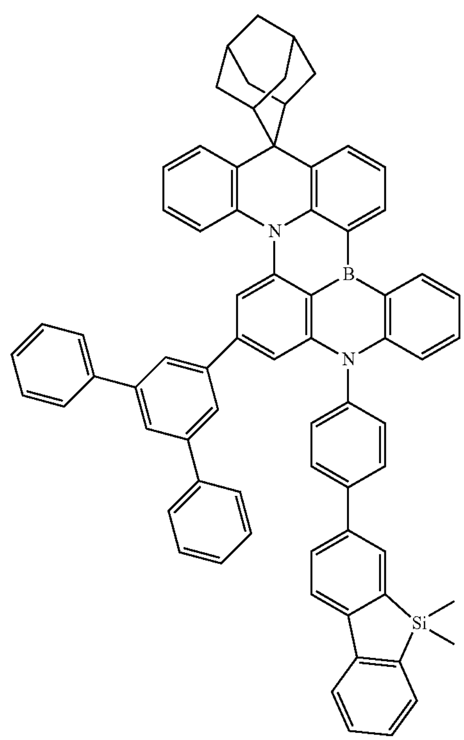

-continued
P187
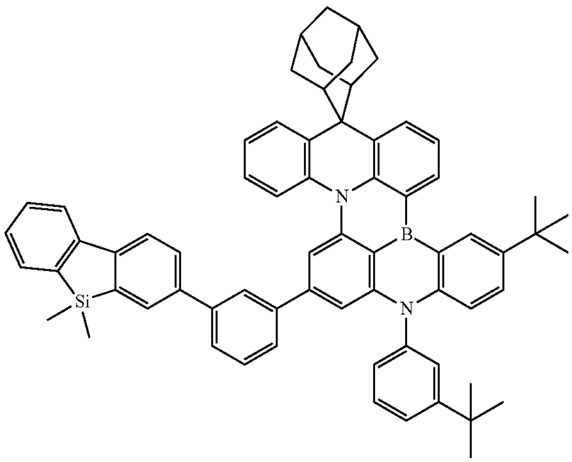
P188
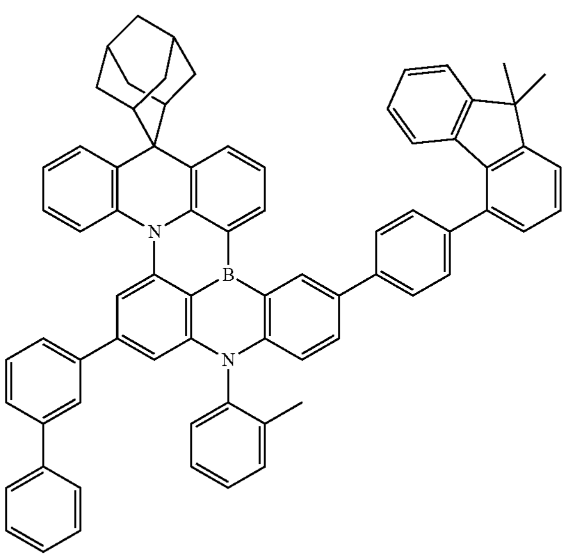
-continued
P189
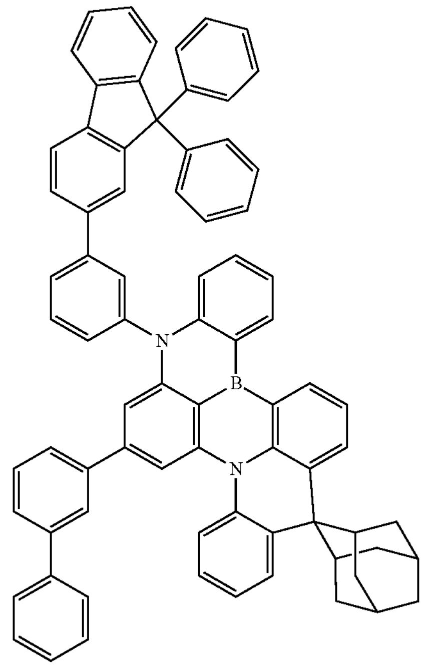
P190
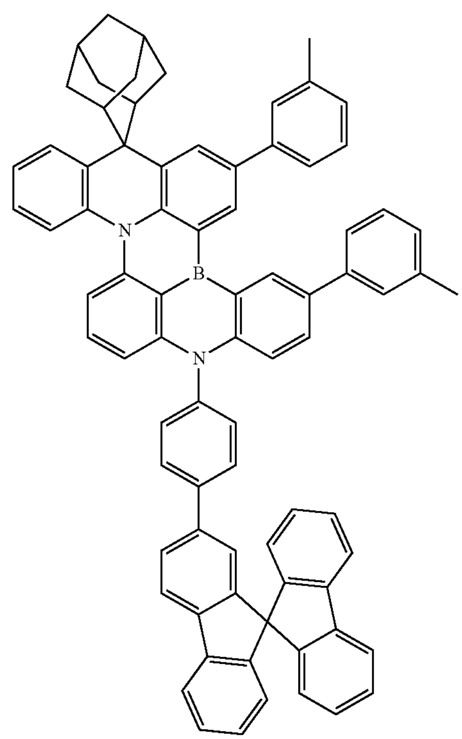

-continued
P191
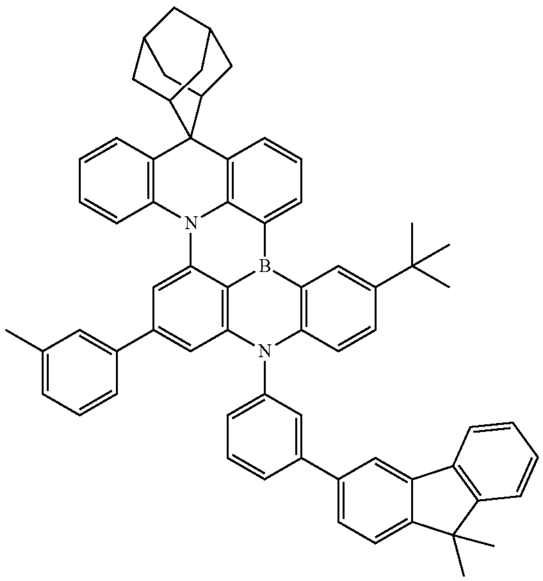
P192
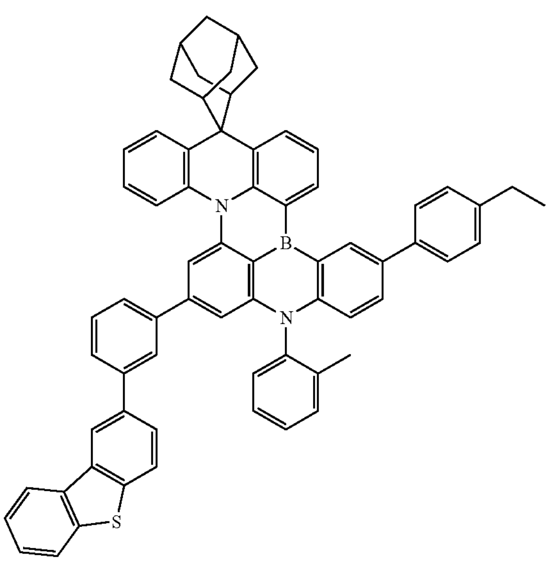
-continued
P193
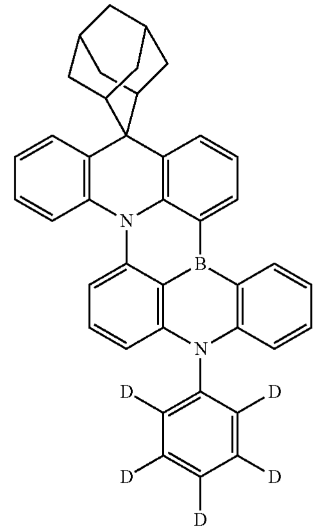
P194
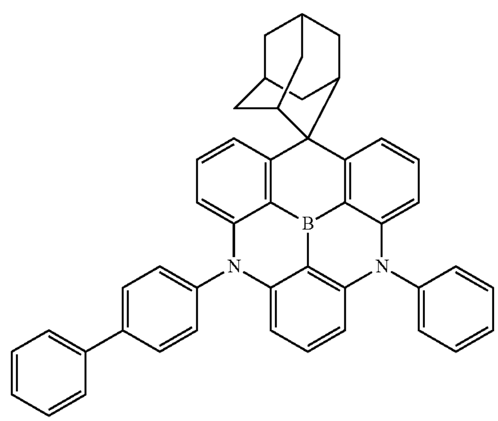
P195
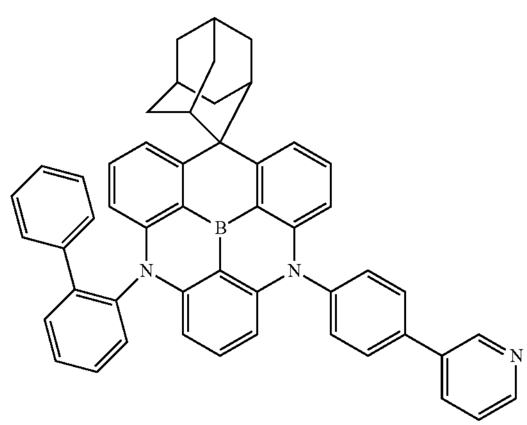

-continued

P196

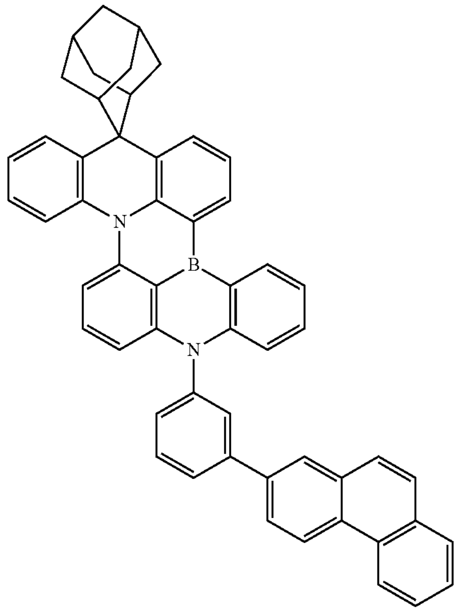

P197

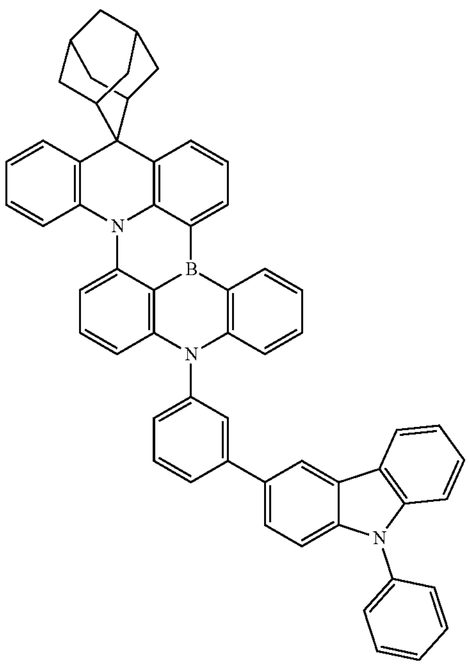

P198

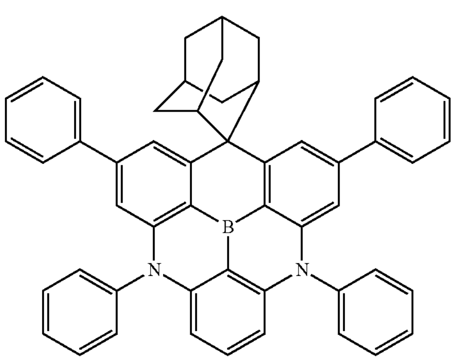

-continued

P199

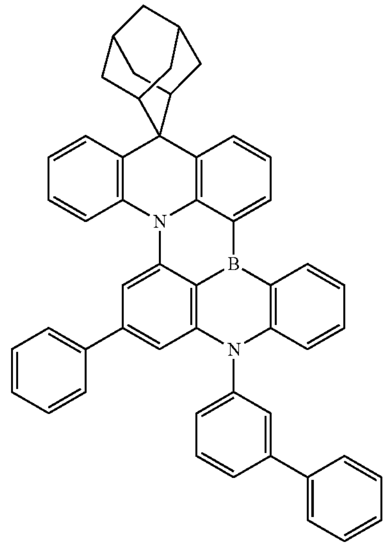

P200

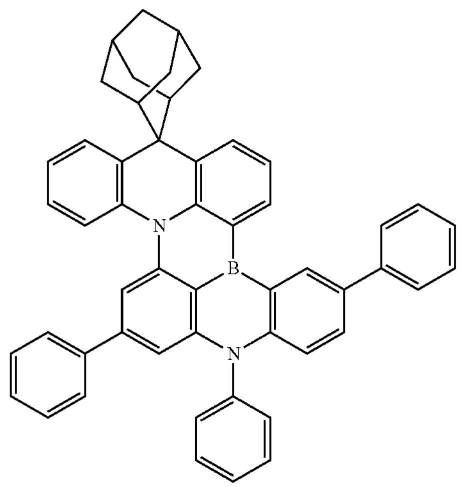

A second aspect of the present disclosure provides application of the organic compound provided by the first aspect of the present disclosure in an organic electroluminescent device. According to the present disclosure, the organic compound can be used as an organic electroluminescent layer material of the organic electroluminescent device.

A third aspect of the present disclosure provides an organic electroluminescent device, comprising an anode, a cathode and at least one functional layer between the anode and the cathode, wherein the functional layer includes a hole injecting layer, a hole transporting layer, an organic electroluminescent layer, an electron transporting layer and an electron injecting layer; the organic electroluminescent layer comprises the organic compound provided by the first aspect of the present disclosure, optionally comprises at least one of the compounds P1 to P184.

For example, as shown in FIG. 1, the organic electroluminescent device includes an anode 100 and a cathode 200 which are oppositely disposed, and a functional layer 300 disposed between the anode 100 and the cathode 200; the functional layer 300 comprises the compound provided by the present disclosure.

Optionally, the compound provided by the present disclosure is used to form at least one organic film layer in the functional layer 300 to improve the life characteristics, efficiency characteristics, and reduce the driving voltage of the organic electroluminescent device. In certain embodiments, the mass production stability of the organic electroluminescent device can also be improved.

Optionally, the functional layer 300 includes an organic electroluminescent layer 330, the organic electroluminescent layer 330 contains the compound provided by the present disclosure. Where the organic electroluminescent layer 330 may be composed of the compound provided by the present disclosure, or may be composed of the compound provided by the present disclosure together with other materials.

In one embodiment of the present disclosure, as shown in FIG. 1, the organic electroluminescent device includes an anode 100, a hole injecting layer 310, a hole transporting layer 320, an organic electroluminescent layer 330, an electron transporting layer 340, an electron injecting layer 350, and a cathode 200 which are stacked in sequence. The compound provided by the present disclosure may be applied to the organic electroluminescent layer 330 of the organic electroluminescent device, and can effectively improve electron transporting properties of the organic electroluminescent device.

Optionally, the anode 100 includes the following anode materials, which is preferably the material having a large work function that facilitates hole injection into the functional layer. Specific examples of the anode material include metals such as nickel, platinum, vanadium, chromium, copper, zinc, and gold or alloys thereof, metal oxides such as zinc oxide, indium oxide, indium tin oxide (ITO), and indium zinc oxide (IZO); combination of metals and oxides such as ZnO:Al or $SnO_2$:Sb; or conductive polymers such as poly(3-methylthiophene), poly[3,4-(ethylene-1,2-dioxy) thiophene] (PEDT), polypyrrole, and polyaniline, but are not limited thereto. A transparent electrode containing indium tin oxide (ITO) as an anode is preferably included.

Optionally, the organic electroluminescent layer 330 consists of a single light-emitting material, or also contains a host material and a guest material. Optionally, the organic electroluminescent layer 330 consists of a host material and a guest material. Holes injected into the organic electroluminescent layer 330 and electrons injected into the organic electroluminescent layer 330 may be combined in the organic electroluminescent layer 330 to form excitons, the excitons transfer energy to the host material, and the host material transfers energy to the guest material, thereby enabling the guest material to emit light.

The guest material of the organic electroluminescent layer 330 may be a compound having a condensed aryl ring or a derivative thereof, a compound having a heteroaryl ring or a derivative thereof, an aromatic amine derivative, or other materials, which is not particularly limited in the present disclosure. In one embodiment of the present disclosure, the guest material of the organic electroluminescent layer 330 may be $Ir(piq)_2(acac)$. In another embodiment of the present disclosure, the guest material of the organic electroluminescent layer 330 may be BD-1, or may also be the compound provided by the present disclosure.

The electron transporting layer 340 may be of a single-layer structure, or may also be a multi-layer structure, which may include one or more electron transporting materials. The electron transporting materials may be selected from a benzimidazole derivative, an oxadiazole derivative, a quinoxaline derivative, or other electron transporting materials, which is not particularly limited in the present disclosure. For example, in one embodiment of the present disclosure, the electron transporting layer 340 may be composed of DBimiBphen and LiQ.

Optionally, the cathode 200 includes a cathode material, which is a material with a small work function that facilitates electron injection into the functional layer. Specific examples of the cathode material include metals such as magnesium, calcium, sodium, potassium, titanium, indium, yttrium, lithium, gadolinium, aluminum, silver, tin and lead or alloys thereof; or multilayer materials such as LiF/Al, Liq/Al, $LiO_2$/Al, LiF/Ca, LiF/Al and $BaF_2$/Ca, but not limited thereto. A metal electrode containing aluminium as a cathode is preferably included.

Optionally, as shown in FIG. 1, a hole injecting layer 310 is also arranged between the anode 100 and the hole transporting layer 320 to enhance the capability of injecting holes into the hole transporting layer 320. The hole injecting layer 310 may adopt a benzidine derivative, a starburst arylamine compound, a phthalocyanine derivative, or other materials, which is not particularly limited in the present disclosure. In one embodiment of the present disclosure, the hole injecting layer 310 may consist of m-MTDATA.

Optionally, the hole transporting layer 320 includes a first hole transporting layer 321 and a second hole transporting layer 322, and the first hole transporting layer 321 is disposed to be closer to the surface of the anode 100 than the second hole transporting layer 322; and the first hole transporting layer 321 or the second hole transporting layer 322 comprises the organic compound provided by the present disclosure. Here, one of the first hole transporting layer 321 or the second hole transporting layer 322 may contain the organic compound provided by the present disclosure, or both the first hole transporting layer 321 and the second hole transporting layer 322 may contain the organic compound provided by the present disclosure. It can be understood that the first hole transporting layer 321 or the second hole transporting layer 322 may also contain other materials or may not contain other materials. It can be understood that in another embodiment of the present disclosure, the second hole transporting layer 322 may be considered as an electron blocking layer of the organic electroluminescent device.

Optionally, as shown in FIG. 1, an electron injecting layer 350 is also be disposed between the cathode 200 and the electron transporting layer 340 to enhance the capability of injecting electrons into the electron transporting layer 340. The electron injecting layer 350 may include inorganic materials such as alkali metal sulfide or alkali metal halide, or may include complexs of alkali metal and organic substance. In one embodiment of the present disclosure, the electron injecting layer 350 includes LiQ.

The organic electroluminescent device of the present disclosure is based on the excellent properties of the organic compound of the present disclosure, has good carrier conduction efficiency and life, reduces the driving voltage of the organic electroluminescent device, and improves light-emitting properties.

The present disclosure is further illustrated below by way of examples, but the present disclosure is not limited in any way thereby.

All of the compounds of the synthetic methods not mentioned in the present disclosure are raw products obtained by commercial routes.

Synthesis Example 1 (Organic Compound P1)

Synthesis of Intermediate I-A-1

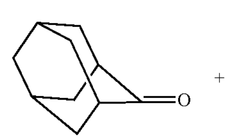

-continued

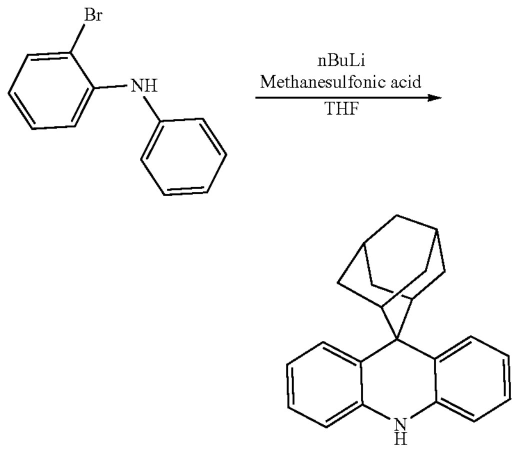

I-A-1

(1) 2-bromo-N-phenylaniline (50 g, 199.7 mmol) was dissolved in tetrahydrofuran THE (300 mL) to be clear, then the obtained solution was placed in a dry round-bottom flask under nitrogen protection, and was cooled to the system temperature of −78° C. with liquid nitrogen, nBuLi (2.5 M) (96.7 mL, 241.8 mmol) was started to be added dropwise while keeping the temperature constant, a solution of adamantanone (30 g, 199.7 mmol) in tetrahydrofuran THE (100 mL) was added dropwise into the system after stirring for 1 h, the mixture was naturally heated to room temperature after adding dropwise was finished, methanesulfonic acid (46.5 g, 483.6 mmol) was added, and the mixture was heated to reflux for 1 h under stirring. The reaction solution was cooled to room temperature, deionized water was added thereto to be stirred for 0.5 h, followed by extraction with ethyl acetate (200 mL), and the organic phases were mixed, dried over anhydrous magnesium sulfate, filtered, and the solvent was removed under reduced pressure; the resulting crude product was purified by recrystallization using ethyl acetate/ethanol (1:2) to obtain Intermediate I-A-1 (43 g, a yield of 71%) as a white solid.

Synthesis of Intermediate I-A-3

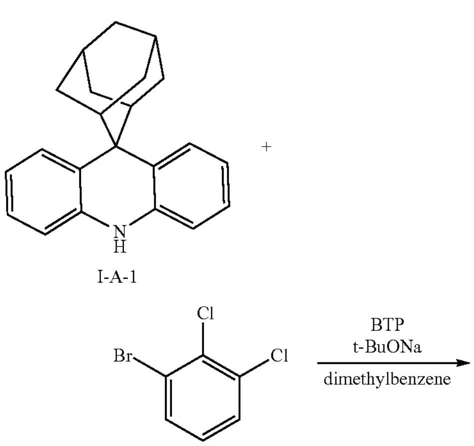

-continued

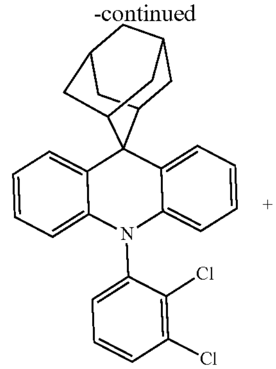

I-A-2

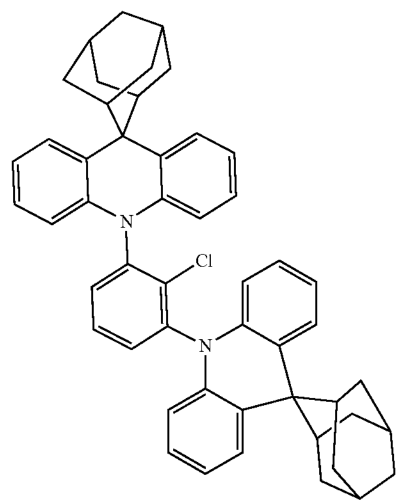

I-A-3

(2) Intermediate I-A-1 (5.1 g, 16.9 mmol) was added to a round-bottom flask containing xylene (50 mL), followed by addition of sodium tert-butoxide (2.3 g, 23.8 mmol), the system was heated to 180° C., followed by addition of 2,3-dichlorobromobenzene (3.8 g, 16.9 mmol) and tetra-n-butyl titanate BTP (0.08 g, 0.238 mmol), stirring was performed for 12 h, then the system was cooled to room temperature, the reaction was quenched with aqueous solution of ammonium chloride, and subjected to extraction with ethyl acetate to obtain organic phase, which was dried over anhydrous magnesium sulfate, filtered and the solvent was removed under reduced pressure; the resulting crude product was purified by silica column chromatography with dichloromethane/n-heptane (1:2) to obtain Intermediate I-A-2 (3.18 g, a yield of 42%) as a white solid and the yellow Intermediate I-A-3 (2.3 g, a yield of 19%).

Synthesis of Intermediate I-A-4

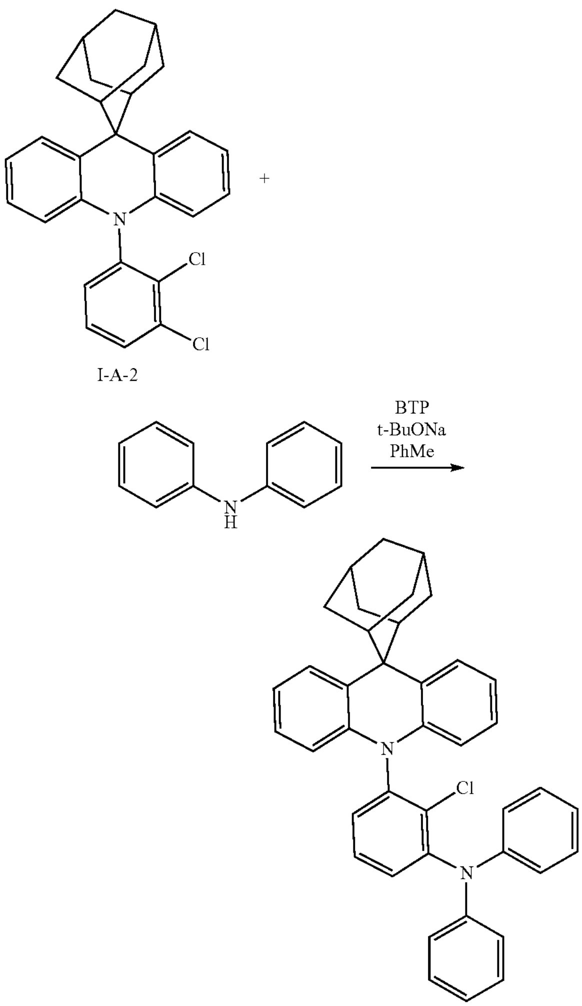

I-A-2

I-A-4

(3) Under the protection of nitrogen, Intermediate I-A-2 (2.5 g, 5.64 mmol) was dissolved in a round-bottom flask containing 50 mL toluene, and sodium tert-butoxide (1.18 g, 12.3 mmol) was added, stirring was turned on, and the system temperature was raised to 110° C., then diphenylamine (1.0 g, 6.11 mmol) and tetra-n-butyl titanate BTP (0.06 g, 0.18 mmol) were added sequentially, stirring was performed for 12 h and then the stirred product was cooled to room temperature. The reaction was quenched by the addition of aqueous solution of ammonium chloride, and subjected to extraction with ethyl acetate to obtain the organic phase, which was dried over anhydrous magnesium sulfate and filtered, and the solvent was removed under reduced pressure. The resulting residue was purified by silica column chromatography purification with dichloromethane/n-heptane (1:2) to obtain Intermediate I-A-4 (2.56 g, a yield of 78%) as a white solid.

Synthesis of the Organic Compound P1

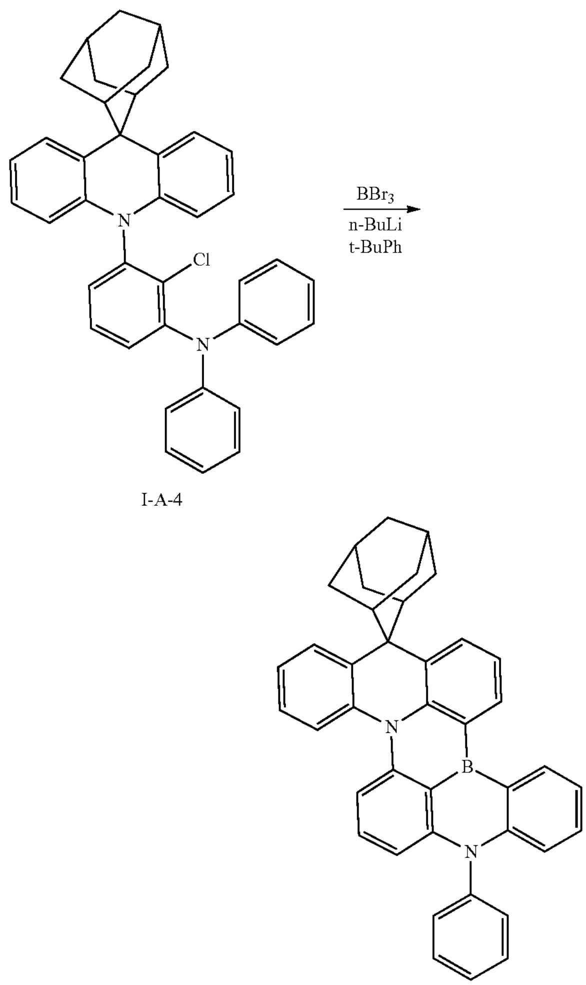

I-A-4

P1

(4) Under the protection of nitrogen, Intermediate I-A-4 (2.03 g, 3.52 mmol) was dissolved in a round-bottom flask containing tert-butylbenzene (20 mL), after n-butyllithium (2.5 M, 0.83 mL) was added dropwise, the mixture was heated to 200° C. and kept for 6 h, the system was cooled to room temperature, and then was cooled to −78° C. with liquid nitrogen, boron tribromide (1 M, 1.6 mL) was added slowly dropwise, after dropwise addition was finished, the reaction was reheated to 180° C., and after 2 h, the reaction mixture was quenched with aqueous solution of sodium thiosulfate, then subjected to extraction with toluene to obtain the organic phase, which was dried over anhydrous magnesium sulfate and filtered, and the solvent was removed under reduced pressure. The resulting residue was recrystallized for purification with toluene to obtain the organic compound P1 (0.87 g, a yield of 44.7%) as solid. Mass spectrometry: m/z=553.3 [M+H]+.

Nuclear magnetic resonance data for the organic compound P1

$^1$H NMR (400 MHz, $CD_2Cl_2$): 8.24 (d, 1H), 7.98 (dd, 1H), 7.72-7.56 (m, 6H), 7.31 (t, 1H), 7.11-6.97 (m, 5H), 6.88-6.74 (m, 4H), 6.68 (dd, 1H), 2.35-2.13 (m, 8H), 1.91 (s, 2H), 1.73 (d, 2H), 1.56 (s, 2H).

Synthesis Example 2 (Organic Compound P12)

Synthesis of the Organic Compound P12

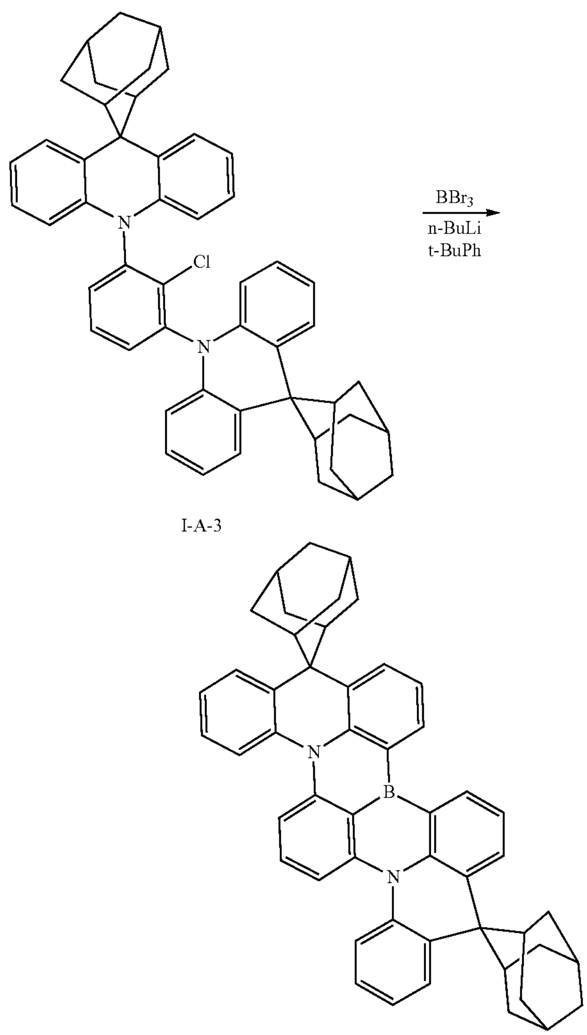

Under the protection of nitrogen, Intermediate I-A-3 (2.3 g, 3.25 mmol) was dissolved in a round-bottom flask containing tert-butylbenzene (50 mL), after n-butyllithium (2.5 M, 1.13 mL) was added dropwise, the mixture was heated to 200° C. and kept for 6 h, the system was cooled to room temperature, and was cooled to −78° C. with liquid nitrogen, boron tribromide (1 M, 1.6 mL) was added slowly dropwise, after dropwise addition was finished, the reaction was reheated to 180° C., and after 2 h, the reaction mixture was quenched with aqueous solution of sodium thiosulfate, and then subjected to extraction with toluene to obtain the organic phase, which was dried over anhydrous magnesium sulfate and filtered, and the solvent was removed under reduced pressure. The resulting residue was recrystallized for purification with toluene to obtain the organic compound P12 (1.37 g, a yield of 61.6%) as solid, Mass spectrometry: m/z=685.4 $[M+H]^+$.

Synthesis Examples 3 to 8

The organic compounds were prepared by the same method as in Synthesis Example 1 except that the raw material 1 in Table 1 was used instead of diphenylamine in step (3) in Example 1. Structures and characterization data of the finally prepared organic compounds are shown in Table 1.

TABLE 1

| Synthesis Example No. | Compound No. | Raw material 1 | Organic Compound Structure | Compound Final Yield, % | Mass spectrometry (m/z), [M + H]+ |
|---|---|---|---|---|---|
| 3 | P2 | 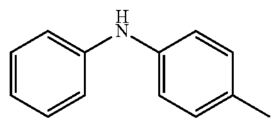 | 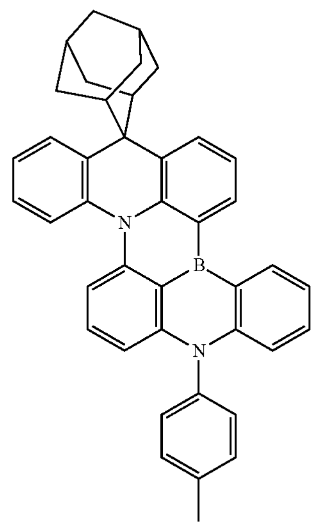 [SMILES: Cc1ccc(N2c3ccccc3B3c4cccc5c4N(c4ccccc4C54C5CC6CC(C5)CC4C6)c4cccc2c43)cc1] | 69 | 567.3 |
| 4 | P23 | 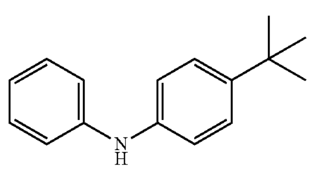 [SMILES: CC(C)(C)c1ccc(Nc2ccccc2)cc1] | 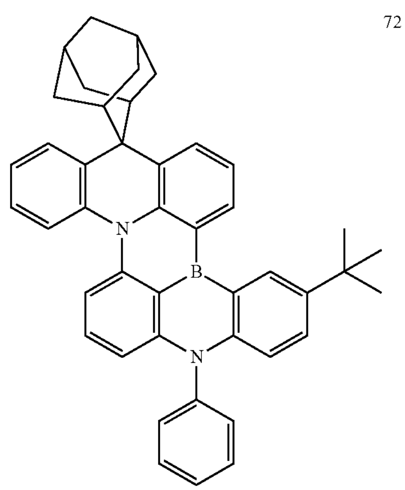 | 72 | 609.3 |

TABLE 1-continued
| Synthesis Example No. | Compound No. | Raw material 1 | Organic Compound Structure | Compound Final Yield, % | Mass spectrometry (m/z), [M + H]+ |
|---|---|---|---|---|---|
| 5 | P33 | 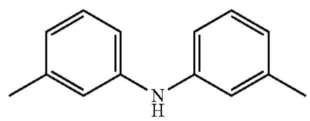 | 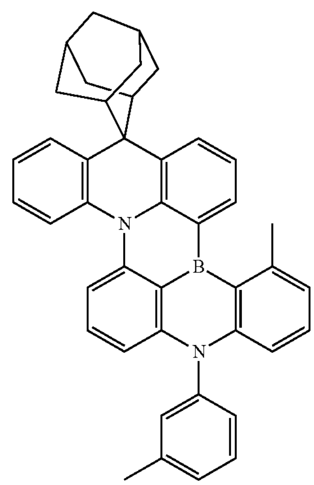 [SMILES: Cc1cccc(N2c3cccc(C)c3B3c4cccc5c4N(c4ccccc4C54C5CC6CC(C5)CC4C6)c4cccc2c43)c1] | 74 | 581.3 |
| 6 | P56 | 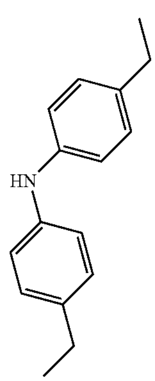 [SMILES: CCc1ccc(Nc2ccc(CC)cc2)cc1] | 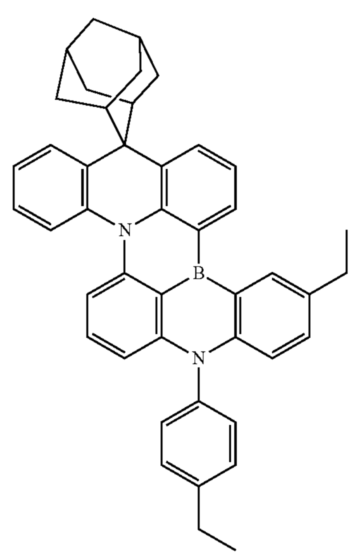 [SMILES: CCc1ccc(N2c3ccc(CC)cc3B3c4cccc5c4N(c4ccccc4C54C5CC6CC(C5)CC4C6)c4cccc2c43)cc1] | 60 | 609.3 |

TABLE 1-continued
| Synthesis Example No. | Compound No. | Raw material 1 | Organic Compound Structure | Compound Final Yield, % | Mass spectrometry (m/z), [M + H]+ |
|---|---|---|---|---|---|
| 7 | P73 | 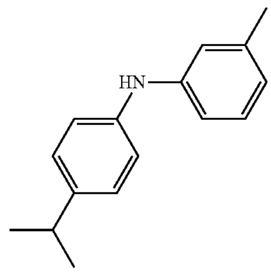 [SMILES: Cc1cccc(Nc2ccc(C(C)C)cc2)c1] | 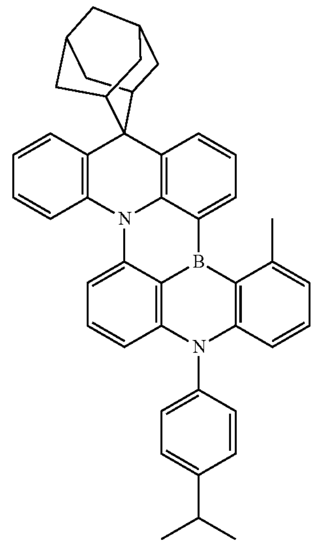 [SMILES: Cc1cccc2c1B1c3cccc4c3N(c3ccccc3C43C4CC5CC(C4)CC3C5)c3cccc(c31)N2c1ccc(C(C)C)cc1] | 68 | 609.3 |
| 8 | P99 | 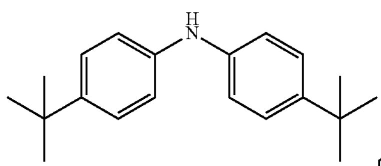 | 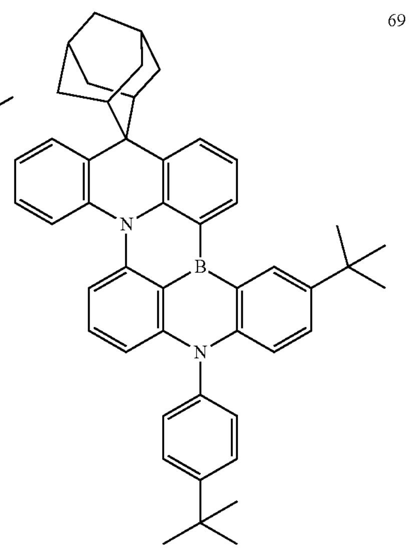 | 69 | 651.4 |
Synthesis Example 9 (Organic Compound P122)
Synthesis of Intermediate I-B
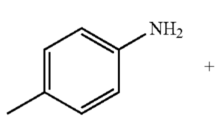
-continued
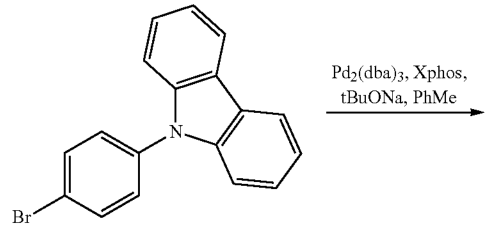

-continued

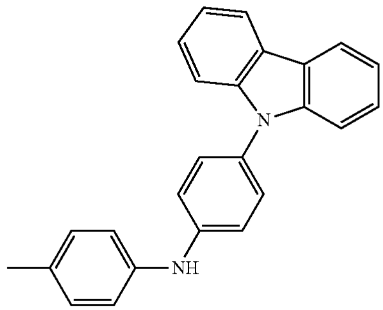

I-B (1) p-methylaniline (4.1 g, 38.0 mmol), 9-(4-bromophenyl)-9H-carbazole (11.54 g, 35.8 mmol), tris(dibenzylideneacetone)dipalladium (0.35 g, 0.38 mmol), 2-dicyclohexylphosphino-2',4',6'-triisopropylbiphenyl (0.36 g, 0.76 mmol) and sodium tert-butoxide (5.48 g, 57.0 mmol) were added to toluene (80 mL), and heated to 108° C. under nitrogen protection and stirred for 2 h; after cooling to room temperature, the reaction solution was washed with water, then dried over magnesium sulfate, and filtered, and the filtrate was decompressed to remove the solvent; the obtained crude product was purified by recrystallization with dichloromethane/ethyl acetate system to obtain Intermediate I-B (11.5 g, 92%) as a pale yellow solid.

Synthesis of Intermediate I-A-5

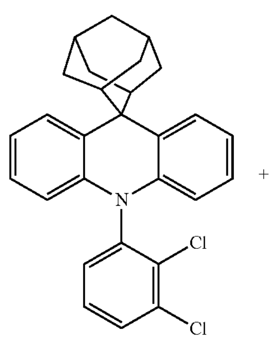

I-A-2

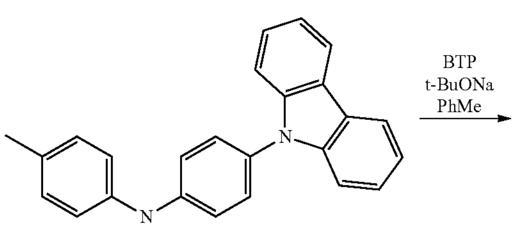

I-B

-continued

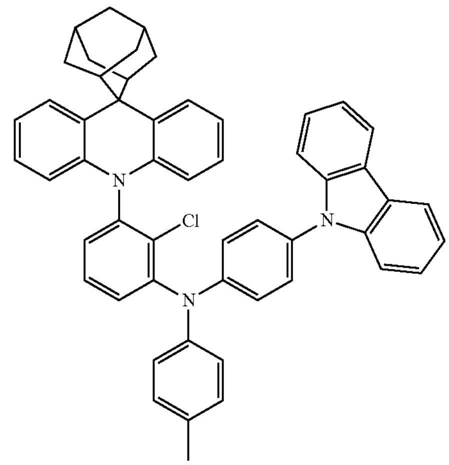

I-A-5

Under the protection of nitrogen, Intermediate I-A-2 (1.5 g, 3.33 mmol, prepared in Synthesis Example 1) was dissolved in a round-bottom flask containing 100 mL toluene, and sodium tert-butoxide (1.2 g, 12.7 mmol) was added, stirring was turned on, and the system temperature was raised to 150° C., followed by sequential addition of Intermediate I-B (3.25 g, 9.33 mmol) and BTP (0.1 g, 0.18 mmol), and after stirring was performed for 12 hours, the system was cooled to room temperature. The reaction was quenched by the addition of aqueous solution of ammonium chloride, and subjected to extraction with ethyl acetate to obtain the organic phase, which was dried over anhydrous magnesium sulfate and filtered, and the solvent was removed under reduced pressure. The resulting residue was purified by silica column chromatography purification with dichloromethane/n-heptane (1:2) to obtain Intermediate 1-A-5 (1.13 g, a yield of 44.7%) as a white solid.

Synthesis of the Organic Compound P122

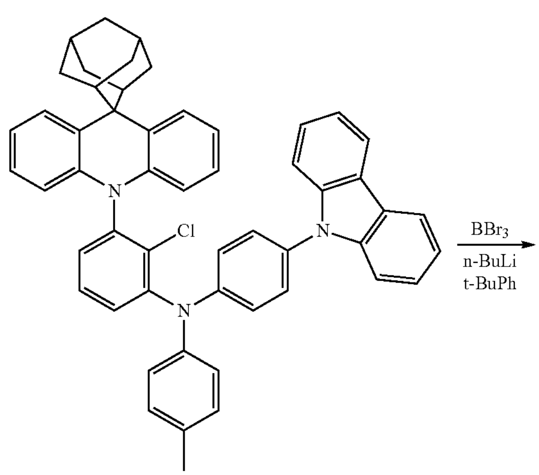

I-A-5

-continued

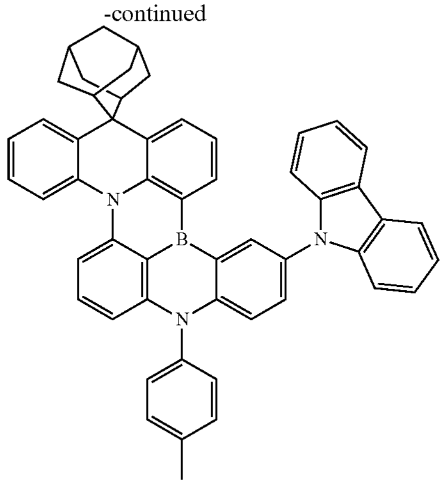

P122

(3) Under the protection of nitrogen, Intermediate I-A-5 (6.67 g, 8.8 mmol) was dissolved in a round-bottom flask containing tert-butylbenzene (20 mL), after n-butyllithium (2.5 M, 0.83 mL) was added dropwise, the mixture was heated to 200° C. and kept for 6 h, the system was cooled to room temperature, and was cooled to −78° C. with liquid nitrogen, boron tribromide (1 M, 1.6 mL) was added slowly dropwise, after dropwise addition was finished, the reaction was reheated to 180° C., and after 2 h, the reaction mixture was quenched with aqueous solution of sodium thiosulfate, and subjected to extraction with toluene to obtain the organic phase, which was dried over anhydrous magnesium sulfate and filtered, and the solvent was removed under reduced pressure. The resulting residue was recrystallized for purification with toluene to obtain the organic compound P122 (0.97 g, a yield of 15%) as a solid and mass spectrometry: m/z=732.4 $[M+H]^+$.

Synthesis Examples 10 to 17

The organic compounds were prepared by the same method as in Example 9 except that the intermediates listed in Table 2 were synthesized by using a raw material 2 in Table 2 instead of p-methylaniline in step (1) in Example 9 and using a raw material 3 instead of 9-(4-bromophenyl)-9H-carbazole. Then by using the intermediates in Table 2 instead of the Intermediate I-B of step (2) in Example 9, the structures and characterization data of the finally prepared organic compounds are shown in Table 3.

TABLE 2

| Inter-medi-ate No. | Raw material 2 | Raw material 3 | Intermediate |
|---|---|---|---|
| I-C | 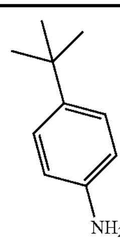 | 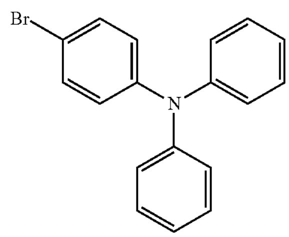 [SMILES: Brc1ccc(N(c2ccccc2)c2ccccc2)cc1] | 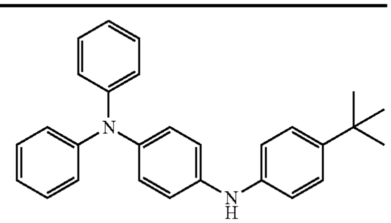 |
| I-D | | 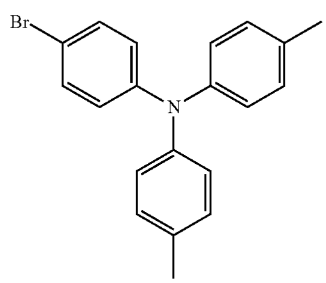 [SMILES: Cc1ccc(N(c2ccc(C)cc2)c2ccc(Br)cc2)cc1] | 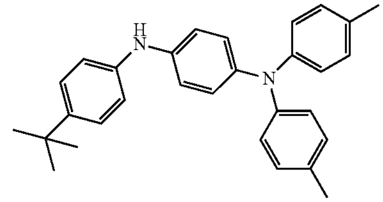 [SMILES: Cc1ccc(N(c2ccc(C)cc2)c2ccc(Nc3ccc(C(C)(C)C)cc3)cc2)cc1] |
| I-E | | 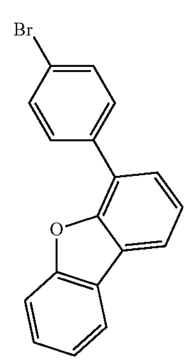 [SMILES: Brc1ccc(-c2cccc3c2oc2ccccc23)cc1] | 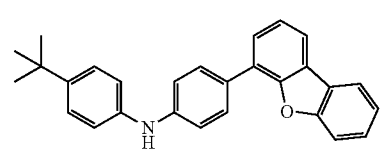 [SMILES: CC(C)(C)c1ccc(Nc2ccc(-c3cccc4c3oc3ccccc34)cc2)cc1] |

TABLE 2-continued
| Intermediate No. | Raw material 2 | Raw material 3 | Intermediate |
|---|---|---|---|
| I-F | 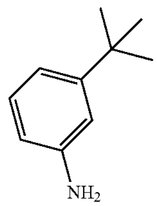 | 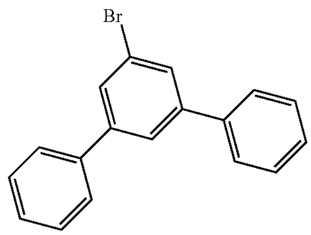 [SMILES: Brc1cc(-c2ccccc2)cc(-c2ccccc2)c1] | 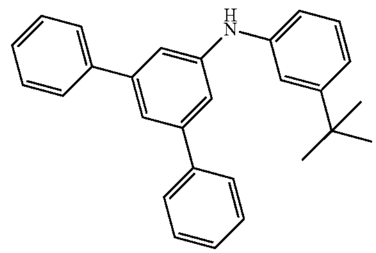 [SMILES: CC(C)(C)c1cccc(Nc2cc(-c3ccccc3)cc(-c3ccccc3)c2)c1] |
| I-G | 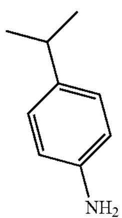 | 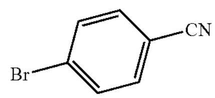 | 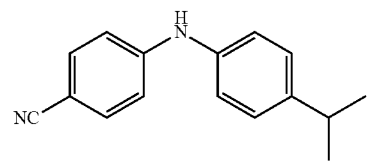 [SMILES: CC(C)c1ccc(Nc2ccc(C#N)cc2)cc1] |
| I-H | 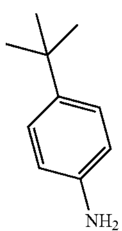 | 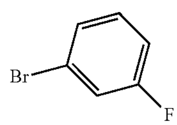 | 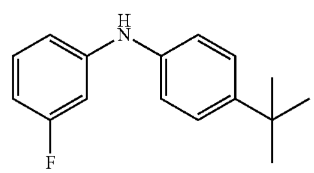 [SMILES: CC(C)(C)c1ccc(Nc2cccc(F)c2)cc1] |
| I-I | 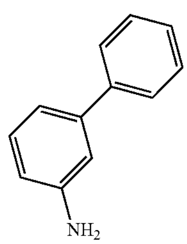 [SMILES: Nc1cccc(-c2ccccc2)c1] | 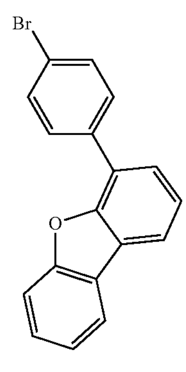 [SMILES: Brc1ccc(-c2cccc3c2oc2ccccc23)cc1] | 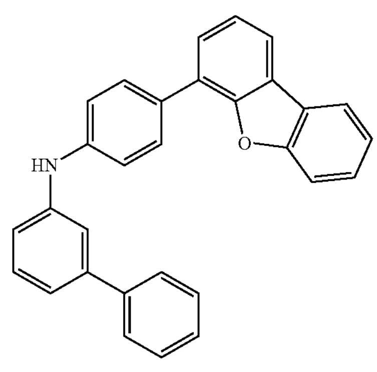 [SMILES: c1ccc(-c2cccc(Nc3ccc(-c4cccc5c4oc4ccccc45)cc3)c2)cc1] |
| I-J | 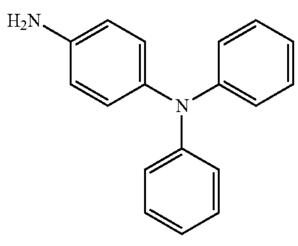 [SMILES: Nc1ccc(N(c2ccccc2)c2ccccc2)cc1] | 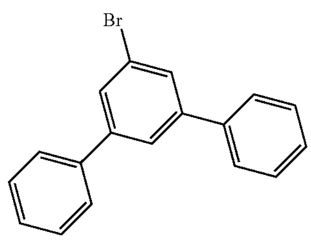 [SMILES: Brc1cc(-c2ccccc2)cc(-c2ccccc2)c1] | 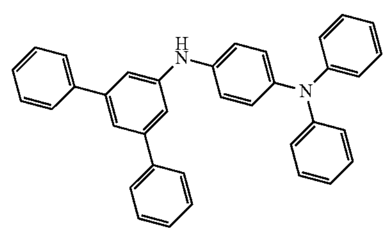 [SMILES: c1ccc(-c2cc(Nc3ccc(N(c4ccccc4)c4ccccc4)cc3)cc(-c3ccccc3)c2)cc1] |

TABLE 3
| Synthesis Example No. | Compound No. | Intermediate and Number thereof | Organic Compound Structure | Yield, % | Mass spectrometry (m/z), [M + H]⁺ |
|---|---|---|---|---|---|
| 10 | P128 | 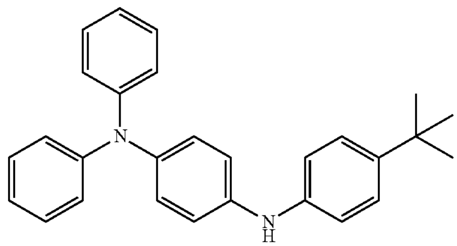 I-C | 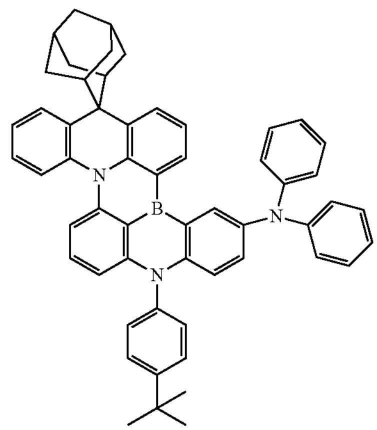 [SMILES: CC(C)(C)c1ccc(N2c3ccc(N(c4ccccc4)c4ccccc4)cc3B3c4cccc5c4N(c4ccccc4C54C5CC6CC(C5)CC4C6)c4cccc2c43)cc1] | 50 | 776.4 |
| 11 | P130 | 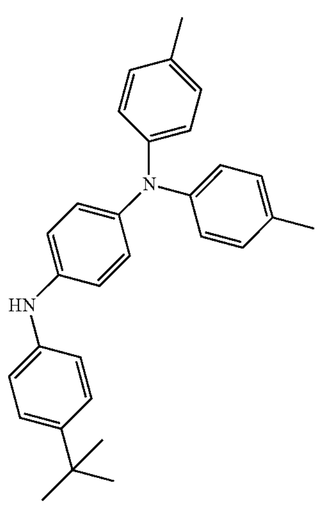 I-D | 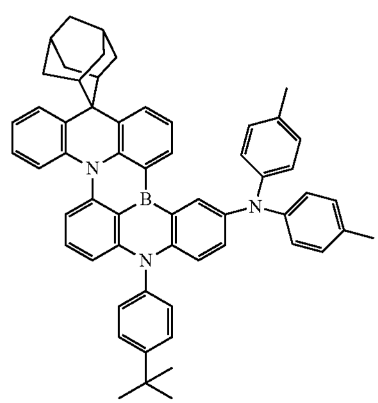 [SMILES: Cc1ccc(N(c2ccc(C)cc2)c2ccc3c(c2)B2c4cccc5c4N(c4ccccc4C54C5CC6CC(C5)CC4C6)c4cccc(c42)N3c2ccc(C(C)(C)C)cc2)cc1] | 38 | 804.4 |

TABLE 3-continued
| Synthesis Example No. | Compound No. | Intermediate and Number thereof | Organic Compound Structure | Yield, % | Mass spectrometry (m/z), [M + H]+ |
|---|---|---|---|---|---|
| 12 | P147 | 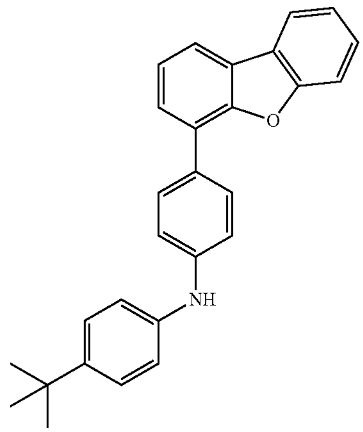 I-E | 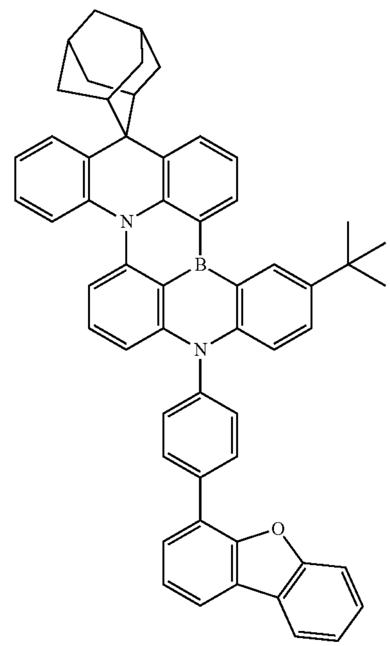 [SMILES: CC(C)(C)c1ccc2c(c1)B1c3cccc4c3N(c3ccccc3C43C4CC5CC(C4)CC3C5)c3cccc(c31)N2c1ccc(-c2cccc3c2oc2ccccc23)cc1] | 41 | 775.5 |
| 13 | P155 | 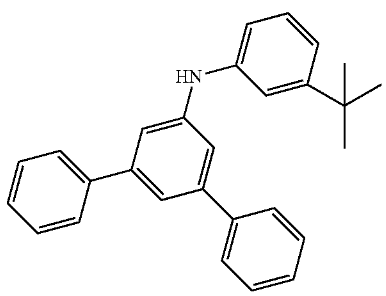 I-F | 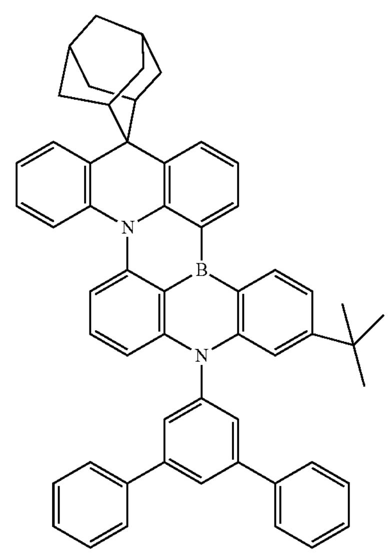 [SMILES: CC(C)(C)c1ccc2c(c1)N(c1cc(-c3ccccc3)cc(-c3ccccc3)c1)c1cccc3c1B2c1cccc2c1N3c1ccccc1C21C2CC3CC(C2)CC1C3] | 43 | 761.4 |

TABLE 3-continued
| Synthesis Example No. | Compound No. | Intermediate and Number thereof | Organic Compound Structure | Yield, % | Mass spectrometry (m/z), [M + H]+ |
|---|---|---|---|---|---|
| 14 | P157 | 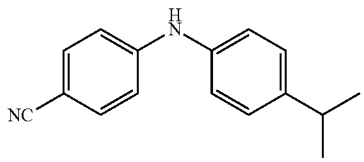 I-G | 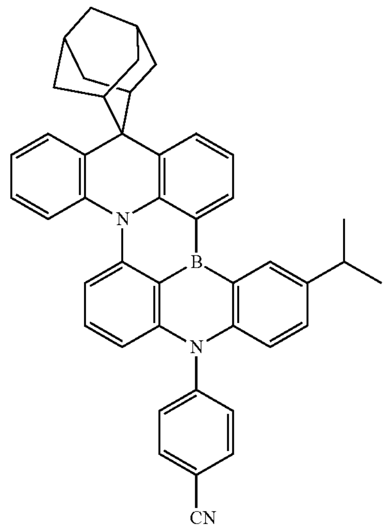 [SMILES: CC(C)c1ccc2c(c1)B1c3cccc4c3N(c3ccccc3C43C4CC5CC(C4)CC3C5)c3cccc(c31)N2c1ccc(C#N)cc1] | 56 | 620.3 |
| 15 | P158 | 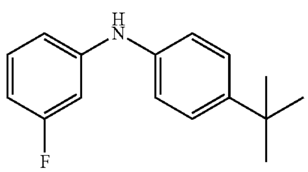 I-H | 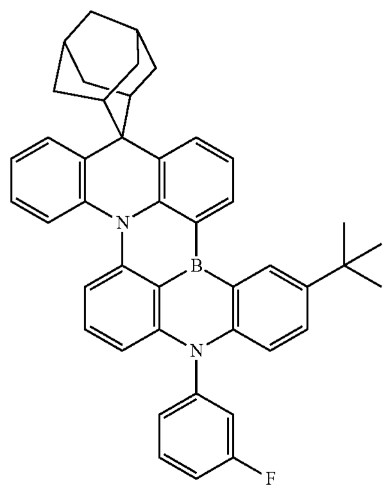 [SMILES: CC(C)(C)c1ccc2c(c1)B1c3cccc4c3N(c3ccccc3C43C4CC5CC(C4)CC3C5)c3cccc(c31)N2c1cccc(F)c1] | 47 | 627.3 |
| 16 | P160 | 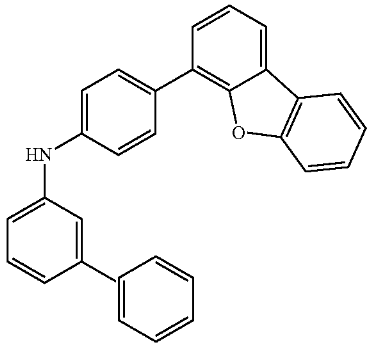 I-I | 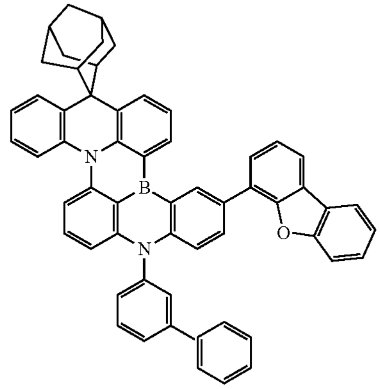 | 49 | 795.4 |

TABLE 3-continued

| Synthesis Example No. | Compound No. | Intermediate and Number thereof | Organic Compound Structure | Yield, % | Mass spectrometry (m/z), [M + H]+ |
|---|---|---|---|---|---|
| 17 | P167 | 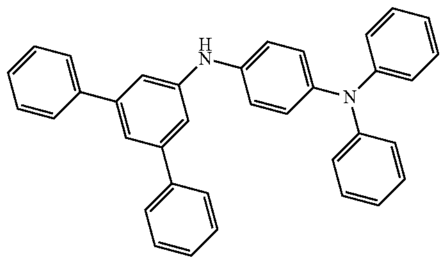 I-J | 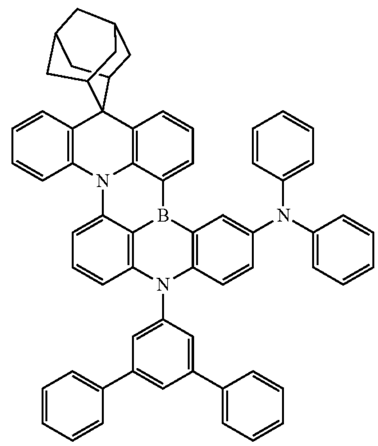 [SMILES: c1ccc(-c2cc(-c3ccccc3)cc(N3c4ccc(N(c5ccccc5)c5ccccc5)cc4B4c5cccc6c5N(c5ccccc5C65C6CC7CC(C6)CC5C7)c5cccc3c54)c2)cc1] | 32 | 878.4 |

Synthesis Example 18 (Organic Compound P170)

Synthesis of Intermediates I-K

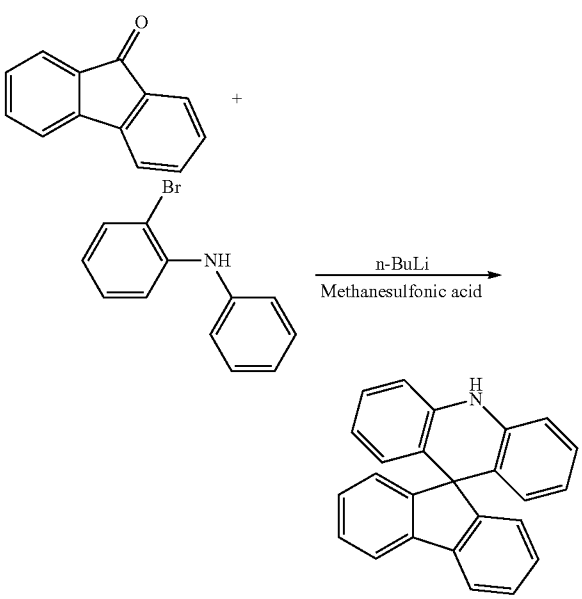

I-K (1) After 2-bromo-N-phenylaniline (30 g, 120.9 mmol) was dissolved in 300 mL of THF under nitrogen, the system was cooled to 78° C. with liquid nitrogen, and nBuLi (241.8 mmol, 96.7 mL) was added thereto. After stirring was performed for 1 h while heat preservation, 9-fluorenone (21.8 g, 120.9 mmol) was added slowly dropwise to the system, and after stirring was performed for 12 h while heat preservation, the reaction was heated to room temperature and methanesulfonic acid (46.5 g, 483.6 mmol) was added, and the mixture was refluxed and stirred. After the reaction was carried out for 1 h, the mixture was quenched with water, subjected to extraction with ethyl acetate, dried over anhydrous magnesium sulfate, filtered, and concentrated under reduced pressure. The obtained concentrate was purified by recrystallization with an ethyl acetate and ethanol system (1:3) to obtain Intermediate 1-K (28.05 g, a yield of 70%) as solid.

Synthesis of Intermediate I-K-1

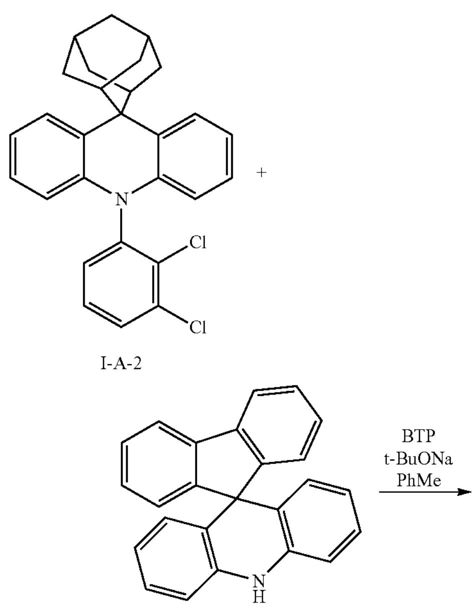

-continued

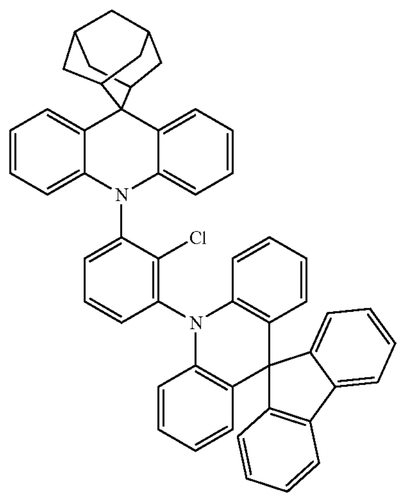

I-K-1

-continued

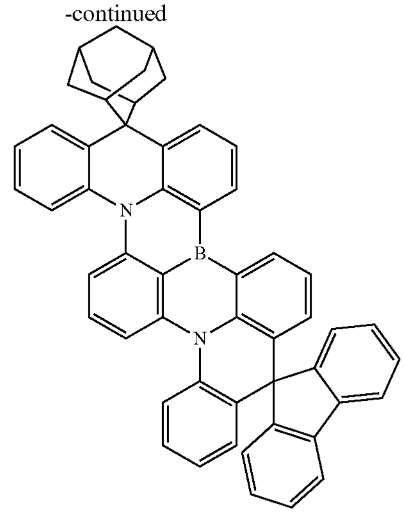

P170

(2) Under the protection of nitrogen, Intermediate I-A-2 (8.2 g, 18.33 mmol) was dissolved in a round-bottom flask containing 100 mL toluene, sodium tert-butoxide (3.5 g, 36.7 mmol) was added, stirring was turned on, and the system temperature was raised to 150° C., followed by sequential addition of Intermediate I-K (6.1 g, 18.33 mmol) and BTP (0.1 g, 0.18 mmol), and after stirring for 12 h, the system was cooled to room temperature. The reaction was quenched by the addition of aqueous solution of ammonium chloride, and subjected to extraction with ethyl acetate to obtain the organic phase, which was dried over anhydrous magnesium sulfate and filtered, and the solvent was removed under reduced pressure. The resulting was purified by silica column chromatography purification with dichloromethane/n-heptane (1:2) to obtain Intermediate I-K-1 (7.13 g, a yield of 52.5%) as a white solid.

Synthesis of the Organic Compound P170

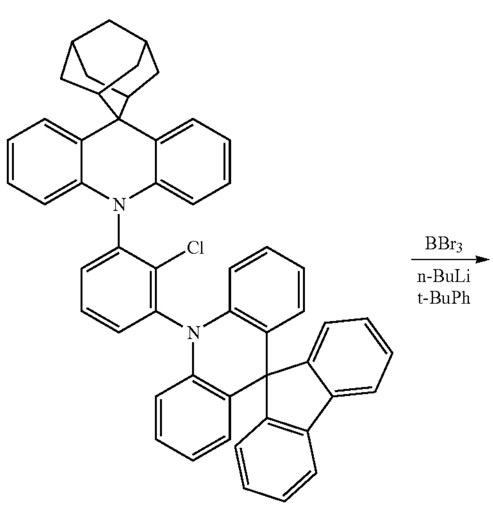

I-K-1

(3) Under the protection of nitrogen, Intermediate I-K-1 (6.5 g, 8.8 mmol) was dissolved in a round-bottom flask containing tert-butylbenzene (50 mL), after n-butyllithium (2.5 M, 3.83 mL) was added dropwise, the mixture was heated to 200° C. and kept for 6 h, the system was cooled to room temperature, and was cooled to −78° C. with liquid nitrogen, boron tribromide (1 M, 9.6 mL) was added slowly dropwise, after dropwise addition was finished, the reaction was reheated to 180° C., and after 2 h, the reaction mixture was quenched with aqueous solution of sodium thiosulfate, subjected to extraction with toluene to obtain the organic phase, which was dried over anhydrous magnesium sulfate and filtered, and the solvent was removed under reduced pressure. The resulting was recrystallized for purification with toluene to obtain the organic compound P170 (2.08 g, a yield of 33%) as solid. Mass spectrometry: m/z=715.72 $[M+H]^+$.

Synthesis Examples 19 to 20

The organic compounds were prepared by the same method as in Example 18 except that the intermediates listed in Table 4 were synthesized by using a raw material 4 in Table 4 instead of 9-fluorenone in step (1) in Example 18 and using a raw material 5 instead of 2-bromo-N-phenylaniline. Then the intermediates in Table 4 were used instead of Intermediate I-K of step (1) in Example 18. Structures and characterization data of the finally prepared compounds are shown in Table 5.

TABLE 4
| Intermediate | Raw material 4 | Raw material 5 | Intermediate Structure |
|---|---|---|---|
| I-L | 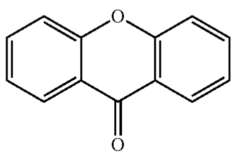 [SMILES: O=c1c2ccccc2oc2ccccc12] | 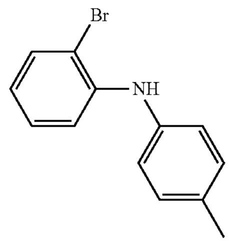 | 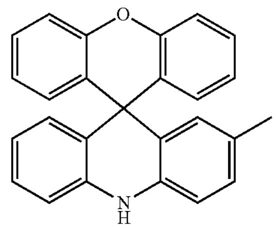 [SMILES: Cc1ccc2c(c1)C1(c3ccccc3N2)c2ccccc2Oc2ccccc21] |
| I-M | 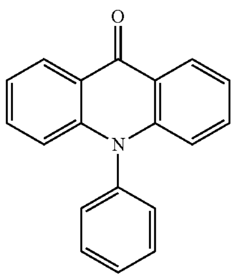 [SMILES: O=c1c2ccccc2n(-c2ccccc2)c2ccccc12] | 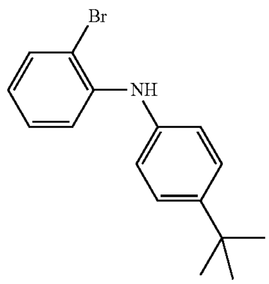 [SMILES: CC(C)(C)c1ccc(Nc2ccccc2Br)cc1] | 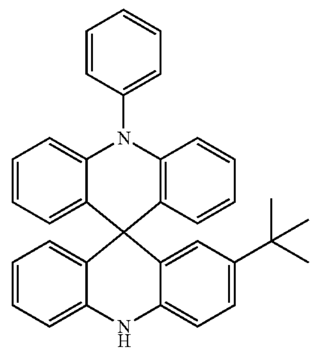 [SMILES: CC(C)(C)c1ccc2c(c1)C1(c3ccccc3N2)c2ccccc2N(c2ccccc2)c2ccccc21] |
TABLE 5
| Synthetic Example No. | Compound No. | Intermediate and number thereof | Compound Structure | Yield, % | Mass spectrometry (m/z) [M + H]+ |
|---|---|---|---|---|---|
| 19 | P169 | 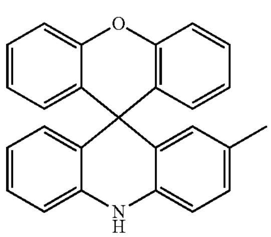 I-L | 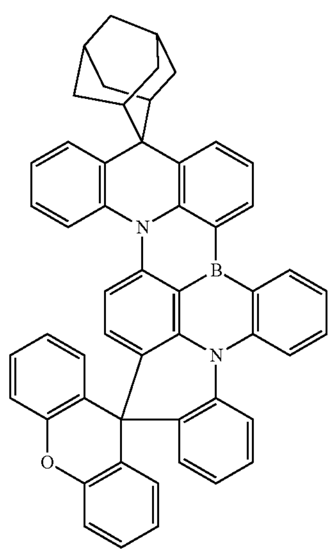 [SMILES: c1ccc2c(c1)Oc1ccccc1C21c2ccccc2N2c3ccccc3B3c4cccc5c4N(c4ccccc4C54C5CC6CC(C5)CC4C6)c4ccc1c2c43] | 51 | 731.3 |

TABLE 5-continued

| Synthetic Example No. | Compound No. | Intermediate and number thereof | Compound Structure | Yield, % | Mass spectrometry (m/z) [M + H]+ |
|---|---|---|---|---|---|
| 20 | P171 | 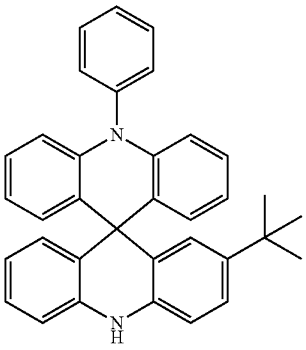 I-M | 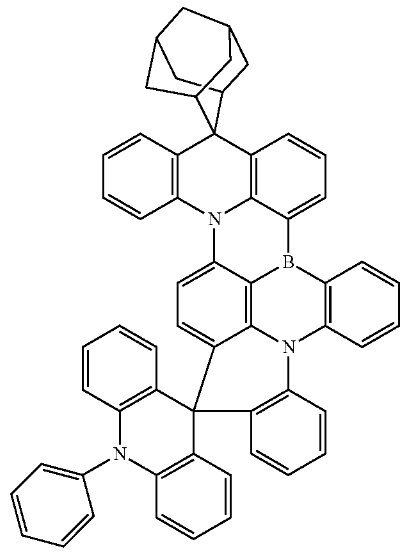 [SMILES: c1ccc(N2c3ccccc3C3(c4ccccc42)c2ccccc2N2c4ccccc4B4c5cccc6c5N(c5ccccc5C65C6CC7CC(C6)CC5C7)c5ccc3c2c54)cc1] | 43 | 806.4 |

Synthesis Example 21 (Organic Compound P182)

Synthesis of Intermediate II-1

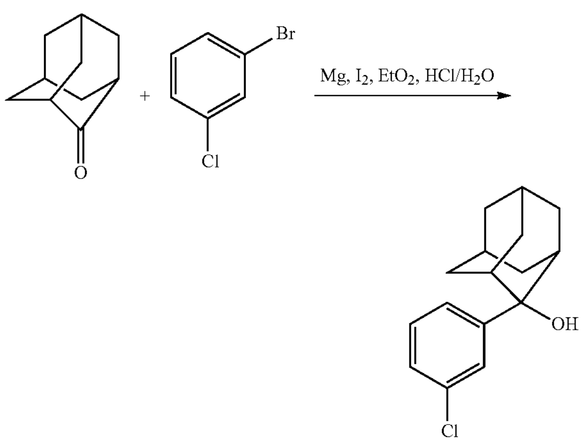

II-1

(1) Magnesium ribbons (13.54 g, 564 mmol) and diethyl ether (100 mL) were placed in a dry round-bottom flask under nitrogen protection, and iodine (100 mg) was added. Then a solution of m-chlorobromobenzene (36 g, 187.0 mmol) in diethyl ether (200 mL) was slowly dropped into the flask, and after dropwise addition was finished, the mixture was heated to 35° C. and stirred for 3 h; the reaction solution was cooled to 0° C. and a solution of adamantanone (22.4 g, 149 mmol) in diethyl ether (200 mL) was slowly added dropwise into the cooled reaction solution, after dropwise addition was finished, the mixture was heated to 35° C. and stirred for 6 h; the reaction solution was cooled to room temperature, 5% hydrochloric acid was added to the cooled reaction solution until pH was smaller than 7, stirring was performed for 1 h, diethyl ether (200 mL) was added for extraction, the obtained organic phases were mixed, dried over anhydrous magnesium sulfate, and filtered, and the solvent was removed under reduced pressure; the resulting crude product was purified by silica column chromatography using n-heptane as a mobile phase to obtain Intermediate II-1 (24 g, a yield of 61%) as solid.

Synthesis of Intermediate II-2

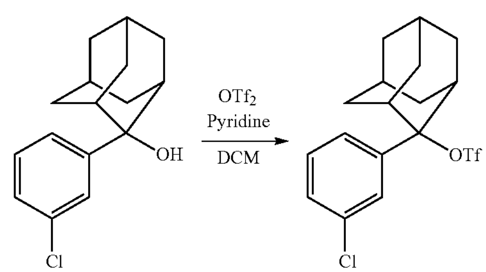

II-1 II-2

(2) Intermediate II-1 (10.74 g, 40.9 mmol), pyridine (6.2 g, 78 mmol) and dichloromethane (150 mL) were added into a round-bottom flask, and cooled to −10° C. under nitrogen atmosphere, trifluoromethanesulfonic anhydride (11.0 g, 39 mmol) was added slowly dropwise at −10° C. to −5° C., and stirring was performed for 3 hours while heat preservation; then the reaction solution was washed with diluted hydrochloric acid until the pH was equal to 8, liquid separation was performed, the organic phase was dried over anhydrous magnesium sulfate, and filtered, and the solvent was removed under reduced pressure; the obtained crude product was purified by silica gel column chromatography with dichloromethane/n-heptane (1:2) to obtained Intermediate II-2 (14.6 g, a yield of 90.4%) as a white solid.

Synthesis of Intermediate II-3

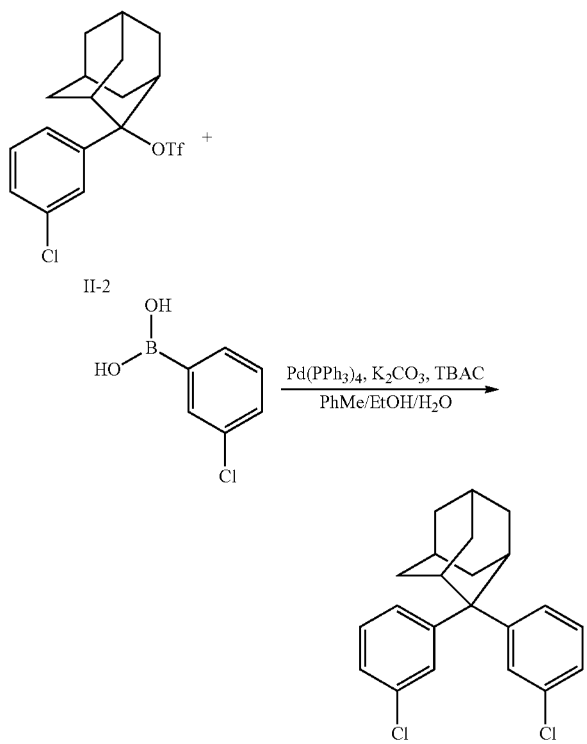

II-2
II-3

(3) Intermediate II-2 (12.3 g, 31.17 mmol), m-chlorophenylboronic acid (3.89 g, 24.93 mmol), tetrakis(triphenylphosphine)palladium (0.72 g, 0.62 mmol), potassium carbonate (6.45 g, 46.75 mmol), tetrabutylammonium chloride (1.73 g, 6.23 mmol), toluene (80 mL), ethanol (20 mL) and deionized water (20 mL) were added into a round-bottom flask and heated to 78° C. under nitrogen protection and stirred for 6 h; the reaction solution was cooled to room temperature, toluene (100 mL) was added for extraction, the obtained organic phases were mixed, dried over anhydrous magnesium sulfate, and filtered, and the solvent was removed under reduced pressure; the resulting crude product was purified by silica column chromatography using n-heptane as a mobile phase, followed by recrystallization with a dichloromethane/ethyl acetate system to obtain Intermediate II-3 (7.5 g, a yield of 84.2%) as a white solid.

Synthesis of Intermediate II-4

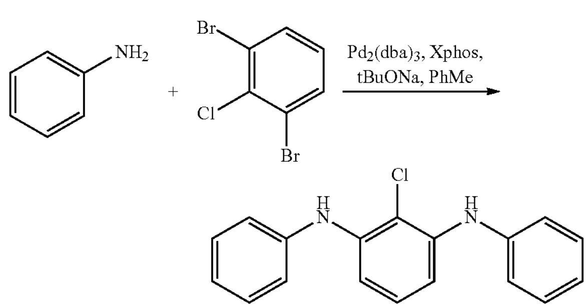

II-4

(4) 2,6-dibromo-1-chlorobenzene (6.9 g, 25.5 mmol), aniline (2.4 g, 25.9 mmol), tris(dibenzylideneacetone)dipalladium (0.23 g, 0.25 mmol), 2-dicyclohexylphosphino-2',4',6'-triisopropylbiphenyl (0.24 g, 0.50 mmol) and sodium tert-butoxide (3.67 g, 38.22 mmol) were added into toluene (40 mL) and heated to 108° C. under nitrogen protection and stirred for 2 h; after cooling to room temperature, the reaction solution was washed with water, dried over magnesium sulfate, and filtered, and the solvent was removed from the filtrate under reduced pressure; the crude product was purified by recrystallization with a dichloromethane/ethyl acetate system to obtain Intermediate II-4 (3.2 g, a yield of 42.6%) as a pale yellow solid.

Synthesis of Intermediate II-5

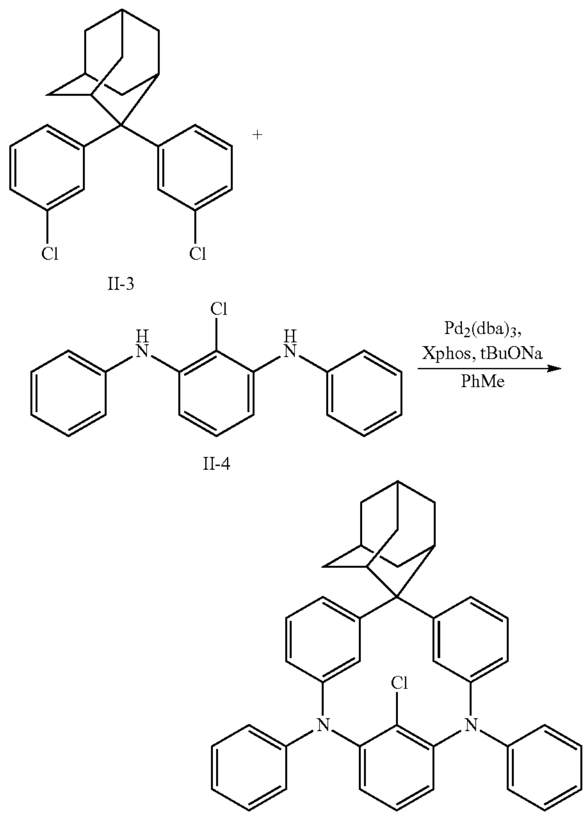

II-5

(5) Intermediate II-3 (4.6 g, 12.77 mmol), Intermediate II-4 (3.8 g, 12.77 mmol), tris(dibenzylideneacetone)dipalladium (0.12 g, 0.13 mmol), 2-dicyclohexylphosphino-2',6'-dimethoxybiphenyl (0.10 g, 0.25 mmol) and sodium tert-butoxide (1.84 g, 19.17 mmol) were added to toluene (40 mL), and heated to 108° C. under nitrogen protection and stirred for 1 h; after cooling to room temperature, the reaction solution was washed with water, dried over magnesium sulfate, and filtered, and the solvent was removed from the filtrate under reduced pressure; the crude product was purified by recrystallization with toluene system to obtain Intermediate II-5 (4.35 g, a yield of 58.8%) as a white solid.

Synthesis of the Compound P182

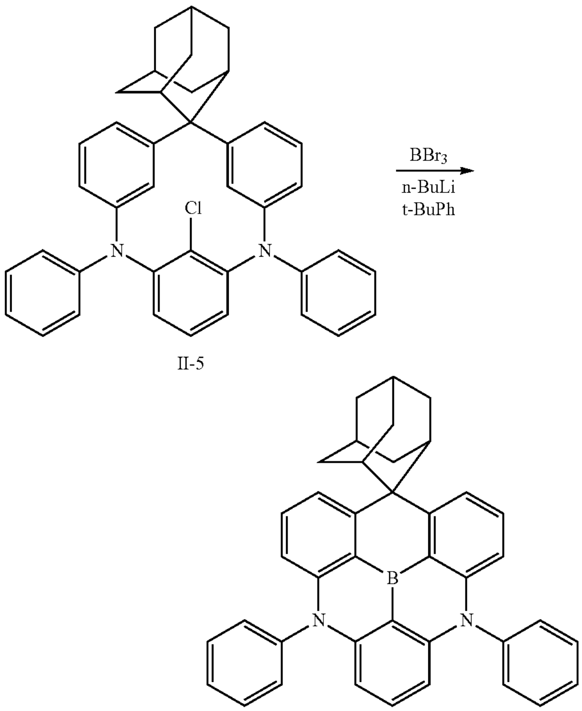

II-5

P182

(6) Under the protection of nitrogen, Intermediate II-5 (5.1 g, 8.8 mmol) was dissolved in a round-bottom flask containing tert-butylbenzene (50 mL), after n-butyllithium (2.5 M, 3.83 mL) was added dropwise, the mixture was heated to 200° C. and kept for 6 h, the system was cooled to room temperature, and was cooled −78° C. with liquid nitrogen, boron tribromide (1 M, 9.6 mL) was added slowly dropwise, after dropwise addition was finished, the reaction was reheated to 180° C., and after 2 h, the reaction mixture was quenched with aqueous solution of sodium thiosulfate, subjected to extraction with toluene to obtain the organic phase was, which was dried over anhydrous magnesium sulfate and filtered, and the solvent was removed under reduced pressure. The resulting residue was purified by recrystallization with toluene to obtained the organic compound P182 (2.07 g, a yield of 42.6%) as solid. Mass spectrometry: m/z=553.3 $[M+H]^+$.

Device Example 1

Preparation of an anode: a TOP substrate (manufactured by Corning) with an ITO thickness of 1500 Å was cut into a dimension of 40 mm (length)×40 mm (width)×0.7 mm (thickness), and was prepared into an experimental substrate with a cathode overlap, an anode and an insulation layer pattern by using the photoetching process, and surface treatment was performed with UV ozone and $O_2$:$N_2$ plasma to increase the work function of the anode (the experimental substrate) and remove scum.

m-MTDATA (4,4',4"-tris(N-3-methylphenyl-N-phenylamino)triphenylamine) was subjected to vacuum evaporation on the experimental substrate (the anode) to form a hole injecting layer (HIL) having a thickness of 100 Å, and NPB was subjected to vacuum evaporation on the hole injecting layer to form a first hole transporting layer (HTL1) having a thickness of 1000 Å.

TCTA (4,4',4"-tris(carbazol-9-yl)triphenylamine) was subjected to evaporation on the first hole transporting layer to form a second hole transporting layer (HTL2) having a thickness of 150 Å.

α,β-ADN was used as a host, and doped with the organic compound P1 prepared by Synthesis Example 1, and the host and the dopant formed an organic electroluminescent layer (EML) having a thickness of 220 Å according to a film thickness ratio of 30:3.

DBimiBphene (4,7-Diphenyl-2,9-bis(4-(1-phenyl-1H-benzo[d]imidazol-2-yl)phenyl)-1,10-phenanthraline) and LiQ (8-hydroxyquinoline lithium) were mixed at a weight ratio of 1:1 and evaporated to form an electron transporting layer (ETL) having a thickness of 300 Å, metal Yb was evaporated on the electron transporting layer to form an electron injecting layer (EIL) having a thickness of 10 Å, and then magnesium (Mg) and silver (Ag) were mixed at an evaporation rate of 1:9 and were subjected to vacuum evaporation on the electron injecting layer to form a cathode having a thickness of 120 Å.

CP-1 was evaporated on the above cathode to form an organic capping layer (CPL) with a thickness of 670 Å, thereby the preparation of an organic electroluminescent device was completed.

Where the structural formulas of m-MTDATA, NPB, TCTA, α,β-ADN, DBimiBphen, CP-1, and LiQ are shown below.

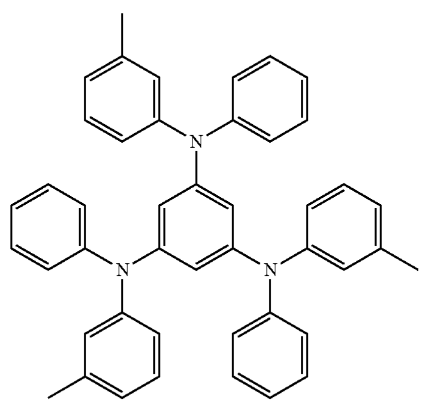

m-MTDATA

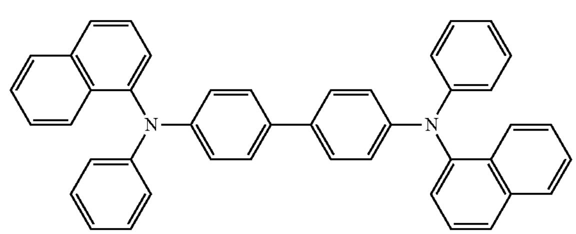

NPB

-continued

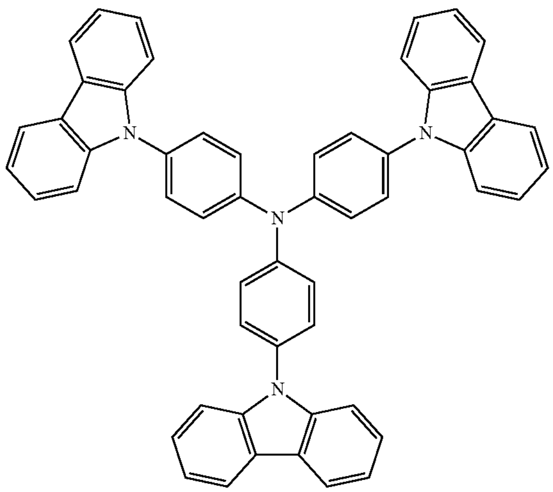

TCTA

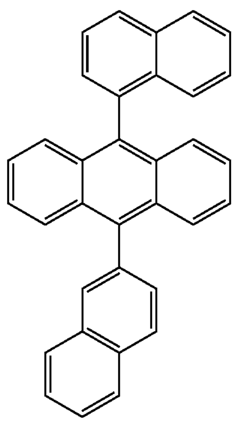

α, β-ADN

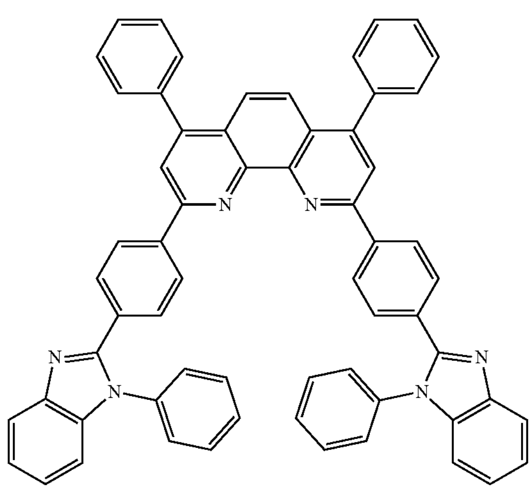

DBimiBphen

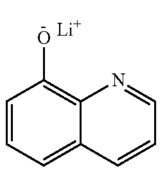

LiQ

-continued

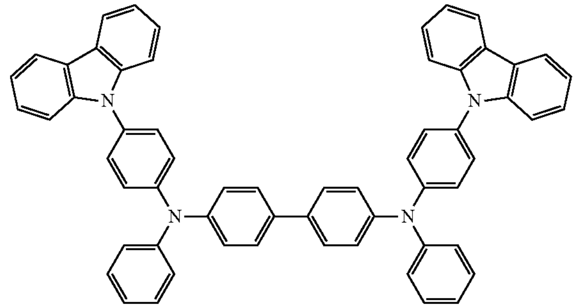

CP-1

Device Examples 2 to 21

The organic electroluminescent devices were prepared by employing the same method as in Device Example 1, except that the organic compound P1 in Device Example 1 was sequentially replaced by compounds other than compounds A to E listed in Table 8 to prepare the organic electroluminescent devices.

Device Comparative Examples 1 to 5

The organic electroluminescent devices were prepared by employing the same method as in Device Example 1, except that compounds A to E listed below were used instead of the organic compound 1 in Device Example 1 to prepare the organic electroluminescent devices.

A

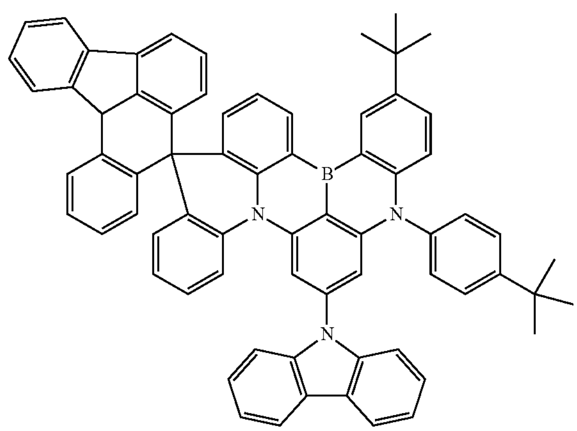

B

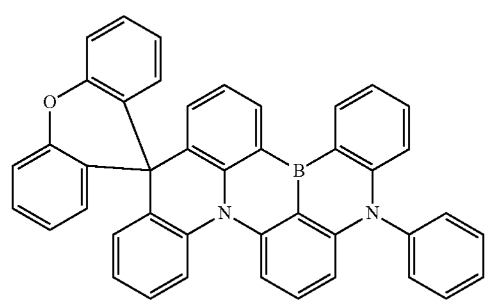

-continued

C

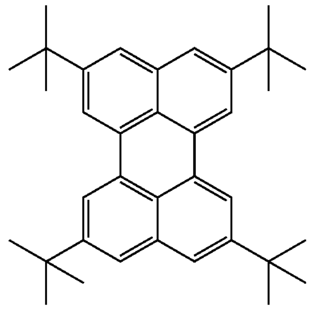

D

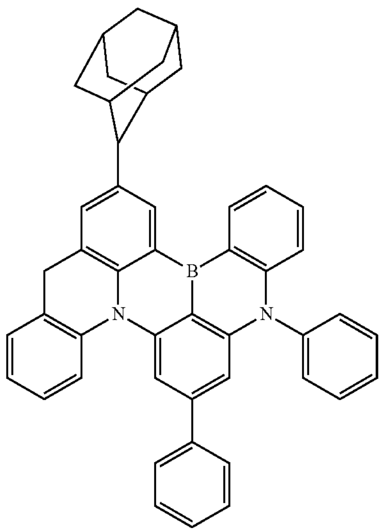

-continued

E

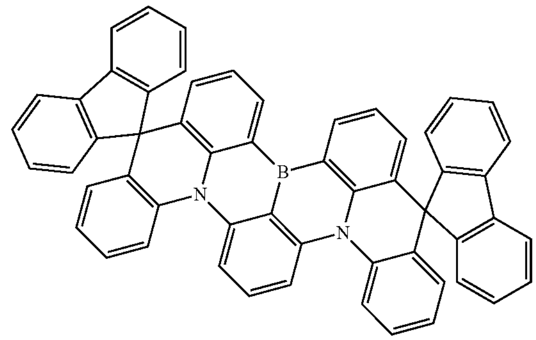

Test Examples

The organic electroluminescent devices were prepared in the Device Examples and Device Comparative Examples were tested for IVL (Current-Voltage-Brightness) performance of the devices under conditions of 10 $mA/cm^2$, and T95 lifetime of the devices was tested at 15 $mA/cm^2$. The test results for the above tests are shown in Table 8.

TABLE 8

| Device Example No. | Organic Compound No. | Operating Voltage Volt (V) | luminous efficacy (Cd/A) | External Quantum Efficiency EQE (%) | T95 device lifetime (h) | Color Coordinates, CIEy |
|---|---|---|---|---|---|---|
| Example 1 | Organic compound P1 | 3.92 | 6.4 | 12.7 | 167 | 0.049 |
| Example 2 | Organic compound P12 | 3.93 | 6.3 | 12.7 | 165 | 0.049 |
| Example 3 | Organic compound P2 | 3.95 | 6.3 | 12.9 | 170 | 0.048 |
| Example 4 | Organic compound P23 | 4.01 | 6.5 | 12.6 | 164 | 0.049 |
| Example 5 | Organic compound P33 | 4.00 | 6.2 | 12.0 | 172 | 0.048 |
| Example 6 | Organic compound P56 | 3.99 | 6.2 | 12.9 | 173 | 0.048 |
| Example 7 | Organic compound P73 | 3.93 | 6.4 | 12.7 | 165 | 0.049 |
| Example 8 | Organic compound P99 | 4.01 | 6.5 | 12.6 | 166 | 0.049 |
| Example 9 | Organic compound P122 | 4.01 | 6.2 | 12.0 | 170 | 0.048 |
| Example 10 | Organic compound P128 | 3.98 | 6.3 | 12.7 | 167 | 0.049 |
| Example 11 | Organic compound P130 | 3.99 | 6.5 | 12.9 | 163 | 0.048 |
| Example 12 | Organic compound P147 | 3.93 | 6.4 | 12.7 | 165 | 0.049 |

TABLE 8-continued

| Device Example No. | Organic Compound No. | Operating Voltage Volt (V) | luminous efficacy (Cd/A) | External Quantum Efficiency EQE (%) | T95 device lifetime (h) | Color Coordinates, CIEy |
|---|---|---|---|---|---|---|
| Example 13 | Organic compound P155 | 3.96 | 6.5 | 12.6 | 163 | 0.049 |
| Example 14 | Organic Compound P157 | 4.02 | 6.2 | 12.0 | 170 | 0.048 |
| Example 15 | Organic compound P158 | 3.99 | 6.2 | 12.9 | 173 | 0.048 |
| Example 16 | Organic compound P160 | 3.95 | 6.4 | 12.7 | 165 | 0.049 |
| Example 17 | Organic compound P167 | 4.01 | 6.5 | 12.6 | 163 | 0.049 |
| Example 18 | Organic compound P170 | 4.01 | 6.5 | 12.6 | 161 | 0.049 |
| Example 19 | Organic compound P169 | 4.01 | 6.2 | 12.0 | 169 | 0.048 |
| Example 20 | Organic compound P171 | 3.99 | 6.4 | 12.5 | 168 | 0.048 |
| Example 21 | Organic compound P182 | 3.97 | 6.5 | 12.4 | 170 | 0.048 |
| Comparative Example 1 | Organic Compound A | 4.37 | 4.8 | 9.2 | 145 | 0.048 |
| Comparative Example 2 | Organic Compound B | 4.38 | 4.4 | 11.2 | 130 | 0.049 |
| Comparative Example 3 | Organic Compound C | 4.40 | 5.7 | 10.8 | 105 | 0.048 |
| Comparative Example 4 | Organic Compound D | 4.41 | 4.3 | 9.7 | 123 | 0.049 |
| Comparative Example 5 | Organic Compound E | 4.39 | 4.9 | 10.5 | 139 | 0.048 |

It can be known From Table 8 that the performance of organic electroluminescent devices of Device Examples 1 to 21 was substantially improved compared with that of the organic electroluminescent devices of Device Comparative Examples 1 to 5, which is mainly reflected in that the operating voltage of the device is reduced by at least 8.000, the luminous efficacy is increased by at least 8.8%, and the lifetime is increased by at least 11.03%. This is due to the adamantane-six-membered ring-based structure included in the organic compound of the present disclosure, and the structure can increase the carrier conduction efficiency and the life of organic electroluminescent devices by increasing the electron density of the conjugated system throughout the organic compound and increasing the hole conduction efficiency of the organic compound. And combining a compound formed by the adamantane-six-membered ring with a solid ring centered on the boron element can greatly improve carrier stability and improve the luminescent performance of organic light-emitting devices.

Preferred embodiments of the present disclosure have been described in detail above, but the present disclosure is not limited to the specific details in the above-described embodiments, and the technical solutions of the present disclosure may be subjected to many simple modifications within the technical idea of the present disclosure, and these simple modifications are within the protection scope of the present disclosure.

In addition, it should be noted that each specific technical feature described in the above detailed embodiments may be combined in any suitable manner without contradiction, and various possible combinations are not further described in the present disclosure in order to avoid unnecessary repetition.

In addition, any combination between the various different embodiments of the present disclosure is also possible, and should likewise be considered as the contents disclosed by the present disclosure as long as they do not depart from the idea of the present disclosure.

What is claimed is:

1. An organic compound, having a structure as represented by the following formula (1):

Formula (1)

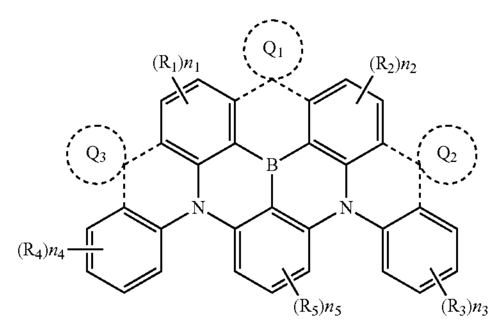

wherein at least one among $Q_1$, $Q_2$, or $Q_3$ is

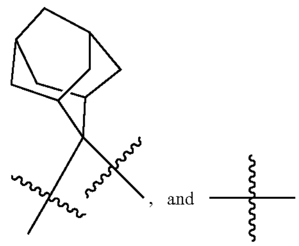

indicates a connective bond;

$n_1$ and $n_2$ are the same or different, and are respectively independently 0, 1, 2, 3, or 4;

$n_3$ and $n_4$ are the same or different, and are respectively independently 0, 1, 2, 3, 4, or 5;

$n_5$ is selected from 0, 1, 2, or 3;

$R_1$, $R_2$, $R_3$, $R_4$, and $R_5$ are the same or different, and are respectively independently selected from deuterium, cyano, halogen, a substituted or unsubstituted alkyl having 1 to 10 carbon atoms, a substituted or unsubstituted aryl having 6 to 40 carbon atoms, a substituted or unsubstituted heteroaryl having 2 to 40 carbon atoms, or a substituted or unsubstituted arylamine having 6 to 40 carbon atoms, alternatively, two adjacent $R_1$ and $R_2$ are connected with each other to form a ring, or two adjacent $R_2$ and $R_3$ are connected with each other to form a ring, or two adjacent $R_3$ and $R_4$ are connected with each other to form a ring, or two adjacent $R_4$ and $R_5$ are connected with each other to form a ring, or two adjacent $R_1$ and $R_4$ are connected with each other to form a ring;

the substituents of $R_1$, $R_2$, $R_3$, $R_4$, and $R_5$ are the same or different, and are respectively independently selected from deuterium, cyano, halogen, an unsubstituted alkyl having 1 to 30 carbon atoms, an unsubstituted cycloalkyl having 3 to 30 carbon atoms, an unsubstituted heterocycloalkyl having 2 to 30 carbon atoms, an aryl having 6 to 30 carbon atoms optionally substituted with an alkyl having 1 to 5 carbon atoms, an unsubstituted heteroaryl having 1 to 30 carbon atoms, an unsubstituted alkoxy having 1 to 30 carbon atoms, an unsubstituted arylamine having 6 to 30 carbon atoms, an unsubstituted alkylsilyl having 1 to 30 carbon atoms, or an unsubstituted arylsilyl having 6 to 30 carbon atoms.

2. The organic compound according to claim 1, wherein the organic compound has the structure as represented by the following formula (1):

Formula (1)

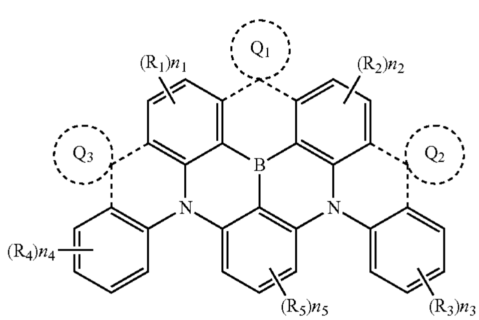

wherein at least one among $Q_1$, $Q_2$, or $Q_3$ is

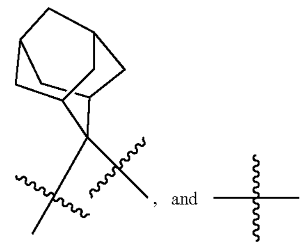

indicates a connective bond;

$n_1$ and $n_2$ are the same or different, and are respectively independently 0, 1, 2, 3 or 4;

$n_3$ and $n_4$ are the same or different, and are respectively independently 0, 1, 2, 3, 4 or 5;

$n_5$ is selected from 0, 1, 2, or 3;

$R_1$, $R_2$, $R_3$, $R_4$, and $R_5$ are the same or different, and are respectively independently selected from deuterium, cyano, halogen, the unsubstituted alkyl having 1 to 10 carbon atoms, the substituted or unsubstituted aryl having 6 to 40 carbon atoms, the substituted or unsubstituted heteroaryl having 2 to 40 carbon atoms, or the substituted or unsubstituted arylamine having 6 to 40 carbon atoms; and the substituents of $R_1$, $R_2$, $R_3$, $R_4$, and $R_5$ are the same or different, and are respectively independently selected from deuterium, cyano, halogen, the unsubstituted alkyl having 1 to 30 carbon atoms, the unsubstituted cycloalkyl having 3 to 30 carbon atoms, the unsubstituted heterocycloalkyl having 2 to 30 carbon atoms, the substituted or unsubstituted aryl having 6 to 30 carbon atoms, the unsubstituted heteroaryl having 1 to 30 carbon atoms, the unsubstituted alkoxy having 1 to 30 carbon atoms, the unsubstituted arylamine having 6 to 30 carbon atoms, the unsubstituted alkylsilyl having 1 to 30 carbon atoms, or the unsubstituted arylsilyl having 6 to 30 carbon atoms.

3. The organic compound according to claim 1, wherein one or more of:

$R_1$ and $R_2$ are connected to form a ring,
$R_2$ and $R_3$ are connected to form a ring,
$R_3$ and $R_5$ are connected to form a ring,
$R_1$ and $R_4$ are connected to form a ring, and/or
$R_4$ and $R_5$ are connected to form a ring.

4. The organic compound according to claim 1, wherein the substituents of $R_1$, $R_2$, $R_3$, $R_4$, and $R_5$ are the same or different, and are respectively independently selected from deuterium, cyano, fluorine, an alkyl having 1 to 5 carbon atoms, a substituted or unsubstituted aryl having 6 to 20 carbon atoms, an unsubstituted heteroaryl having 3 to 20 carbon atoms, or an unsubstituted arylamine having 12 to 20 carbon atoms.

5. The organic compound according to claim 1, wherein the substituents of $R_1$, $R_2$, $R_3$, $R_4$, and $R_5$ are the same or different, and are respectively independently selected from deuterium, cyano, fluorine, an alkyl having 1 to 5 carbon atoms, an aryl having 6 to 15 carbon atoms optionally substituted with methyl, ethyl, isopropyl or tert-butyl, or a heteroaryl having 5 to 12 carbon atoms.

6. The organic compound according to claim 1, wherein said $R_1$, $R_2$, $R_3$, $R_4$, and $R_5$ are the same or different, and are respectively independently selected from deuterium, cyano, halogen, an alkyl having 1 to 10 carbon atoms, or the group consisting of the following groups:

i-1

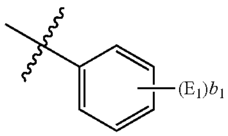

i-2

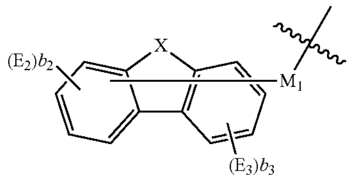

i-3

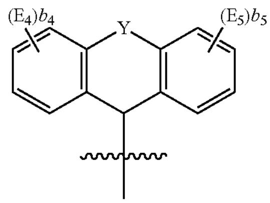

i-4

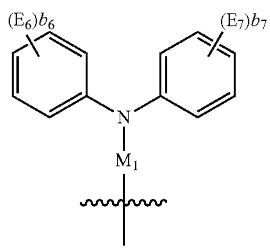

i-5

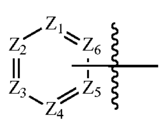

i-6

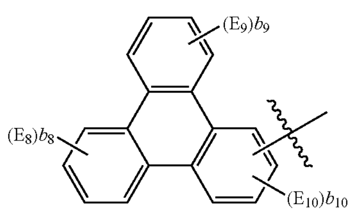

i-7

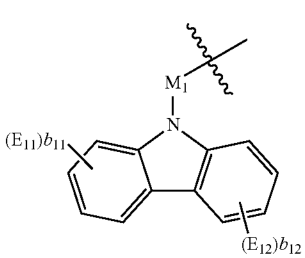

i-8

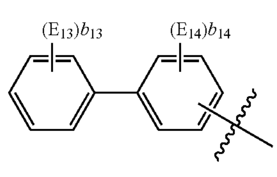

-continued i-9

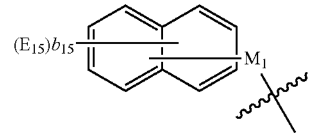

i-10

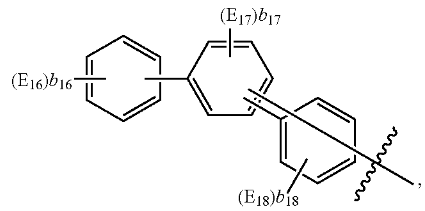

wherein

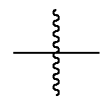

represents a chemical bond, $M_1$ is selected from single bond or

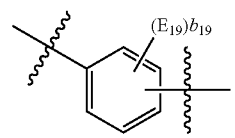

$b_1$, $b_6$, $b_7$, $b_{13}$ and $b_{16}$ are the same or different, and are respectively independently 1, 2, 3, 4 or 5;

$b_2$, $b_3$, $b_4$, $b_5$, $b_8$, $b_9$, $b_{11}$, $b_{12}$, $b_{14}$, $b_{17}$, $b_{18}$ and $b_{19}$ are the same or different, and are respectively independently 1, 2, 3 or 4;

$b_{10}$ is 1, 2 or 3;

$b_{15}$ is 1, 2, 3, 4, 5, 6 or 7;

X is selected from O, S, Si($E_{20}E_{21}$), C($E_{22}E_{23}$), N($E_{24}$), or Se;

Y is selected from O, S, or N($E_{25}$);

$Z_1$ to $Z_6$ are the same or different, and are each independently selected from C(E') or N, and at least one of $Z_1$ to $Z_6$ is N, wherein E' in said $Z_1$ to $Z_6$ are the same or different, and are respectively independently selected from hydrogen, an alkyl having 1 to 10 carbon atoms, an aryl having 6 to 18 carbon atoms, a heteroaryl having 3 to 18 carbon atoms, or a cycloalkyl having 3 to 10 carbon atoms, or adjacent E' are connected to form a ring; and $E_1$ to $E_{25}$ are the same or different, and are respectively independently selected from hydrogen, deuterium, halogen, a cyano, an alkyl having 1 to 10 carbon atoms, an aryl having 6 to 18 carbon atoms, a heteroaryl having 3 to 18 carbon atoms, a cycloalkyl having 3 to 10 carbon atoms, or an aryl having 6 to 18 carbon atoms substituted with an alkyl; or $E_{20}$ and $E_{21}$ are connected to form a ring, or $E_{22}$ and $E_{23}$ are connected to form a ring, or any two $E_6$ are fused with the phenyl to which they are connected to form an aromatic ring, or any two $E_7$ are fused with the phenyl to which they are connected to form an aromatic ring.

7. The organic compound according to claim 1, wherein said $R_1$, $R_2$, $R_3$, $R_4$, and $R_5$ are the same or different, and are respectively independently selected from the group consisting of the following groups: deuterium, cyano, fluorine, an alkyl having 1 to 5 carbon atoms, a substituted or unsubstituted aryl having 6 to 25 carbon atoms, a substituted or unsubstituted heteroaryl having 3 to 20 carbon atoms, and a substituted or unsubstituted arylamine having 12 to 20 carbon atoms.

8. The organic compound according to claim 1, wherein said $R_1$, $R_2$, $R_3$, $R_4$, and $R_5$ are the same or different, and are respectively independently selected from the group consisting of the following groups: deuterium, cyano, fluorine, an alkyl having 1 to 5 carbon atoms, and a substituted or unsubstituted W; wherein the unsubstituted W is selected from the groups below:

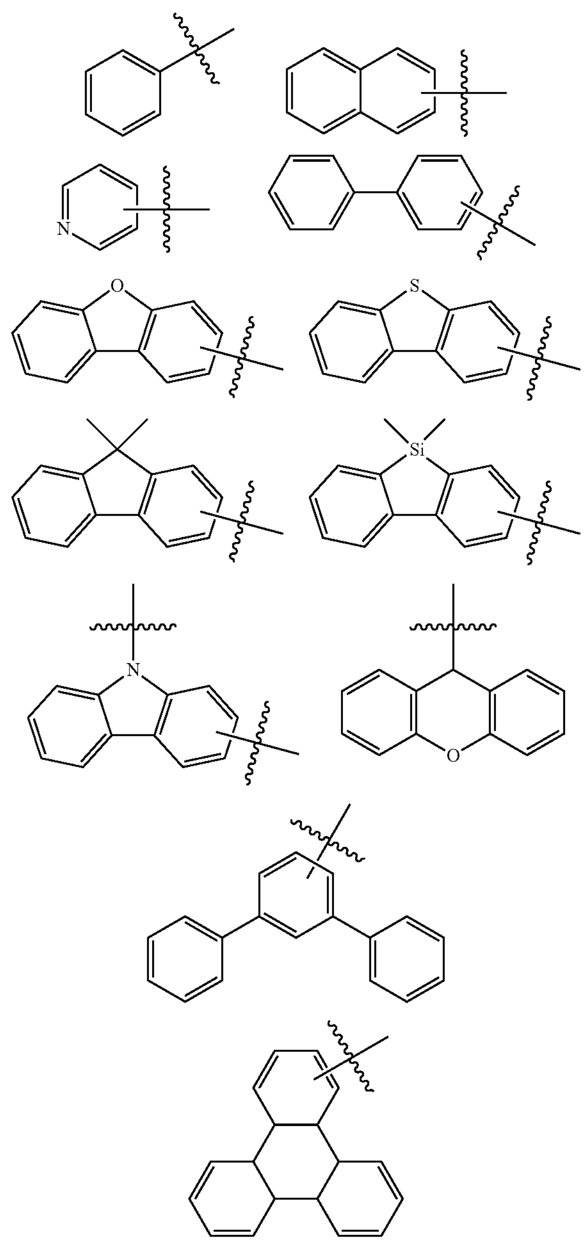

-continued

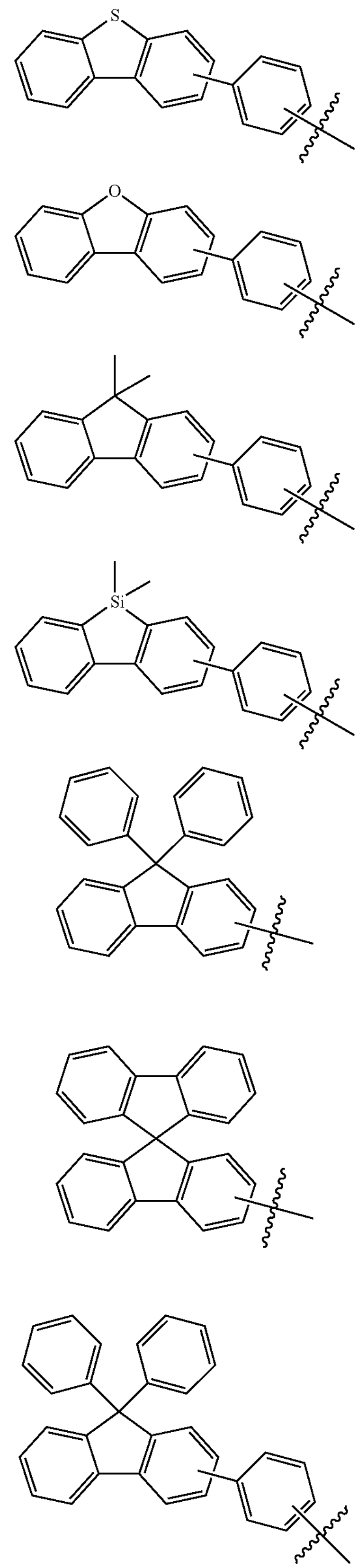

-continued

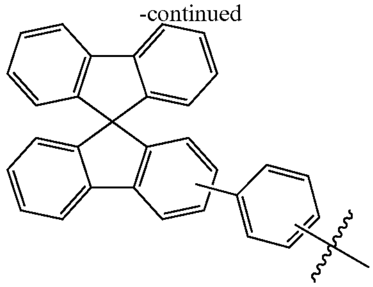

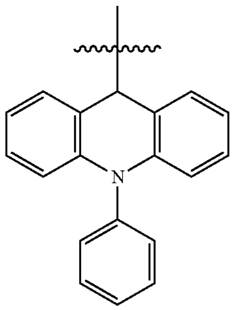

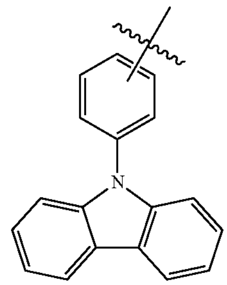

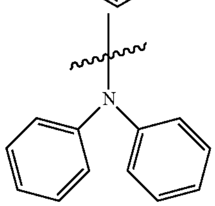

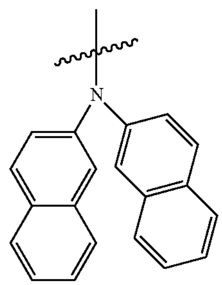

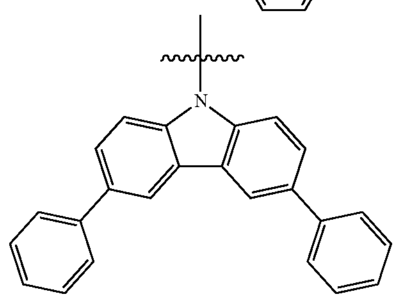

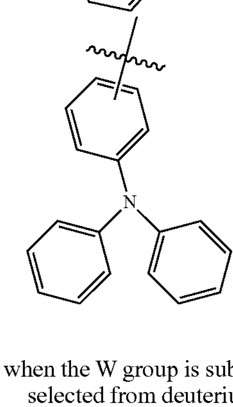

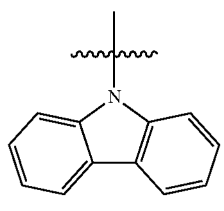

when the W group is substituted, the substituents of W are selected from deuterium, fluorine, cyano, methyl, ethyl, isopropyl, tert-butyl, phenyl, naphthyl, carbazolyl, dibenzofuranyl, dibenzothienyl, biphenyl, pyridyl, 9,9-dimethylfluorenyl, or 9,9-dimethyl-9H-9-silafluorenyl;

when W has a plurality of substituents, the substituents of the plurality of substituents are the same or different.

9. The organic compound according to claim 1, wherein said $R_1$, $R_2$, $R_3$, $R_4$, and $R_5$ are the same or different, and are respectively independently selected from the group consisting of the following groups: deuterium, cyano, fluorine, methyl, ethyl, n-propyl, isopropyl, n-butyl, sec-butyl, tert-butyl and the groups below:

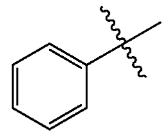

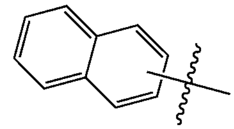

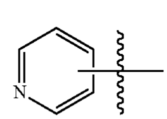

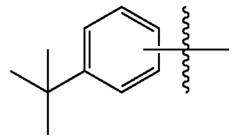

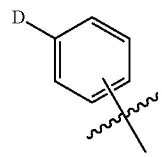

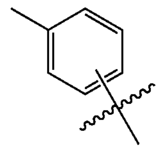

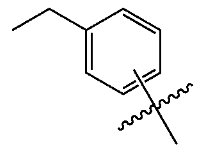

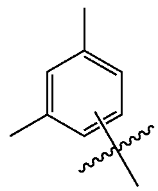

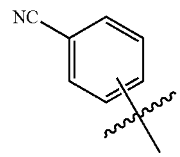

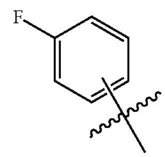

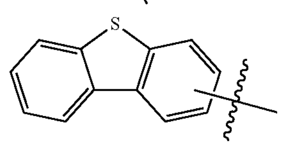

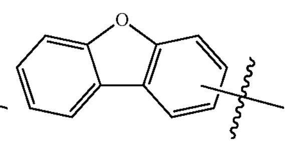

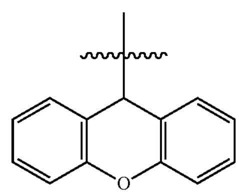

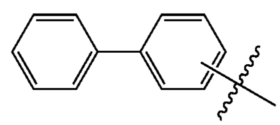

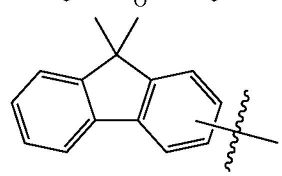

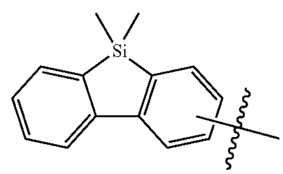

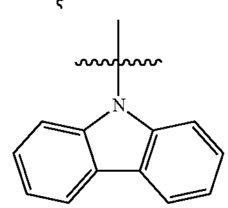

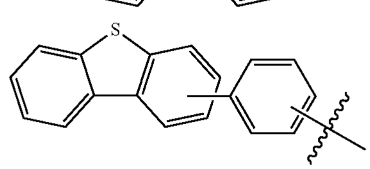

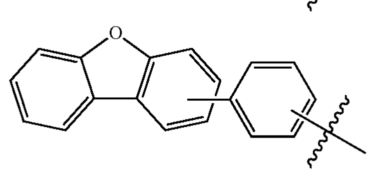

-continued
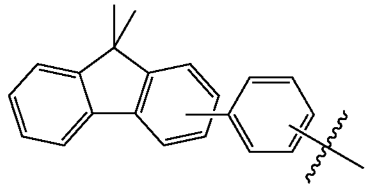
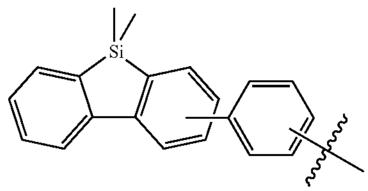
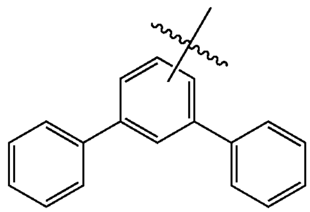
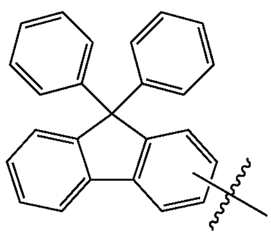
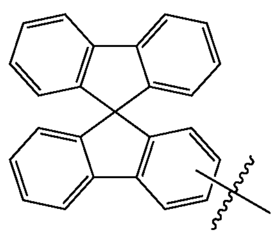
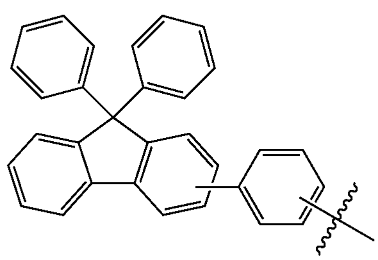
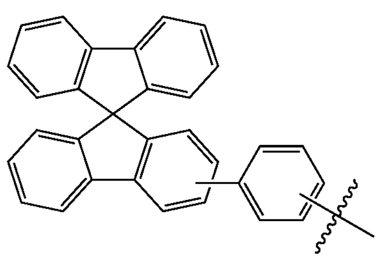
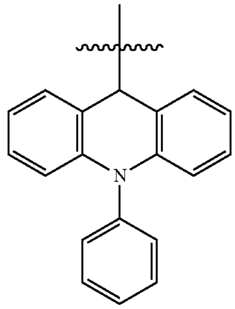
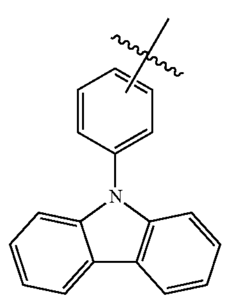
-continued
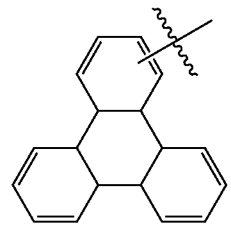
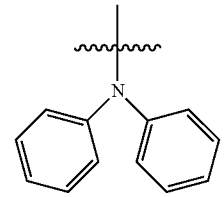
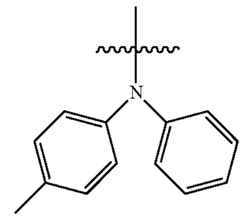
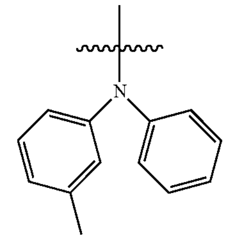
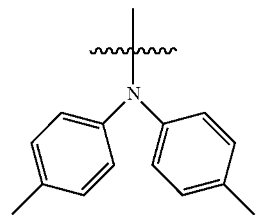
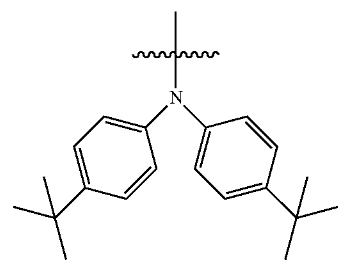
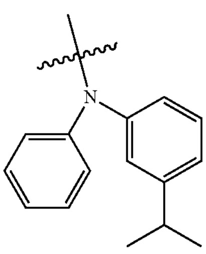
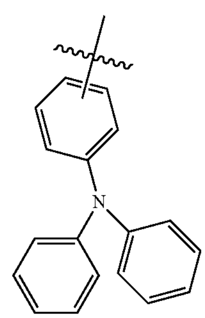
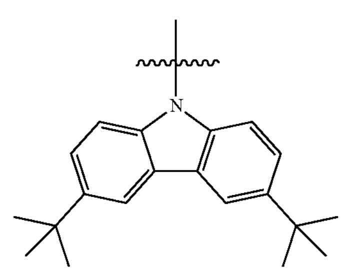

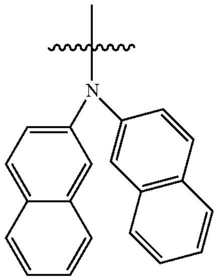
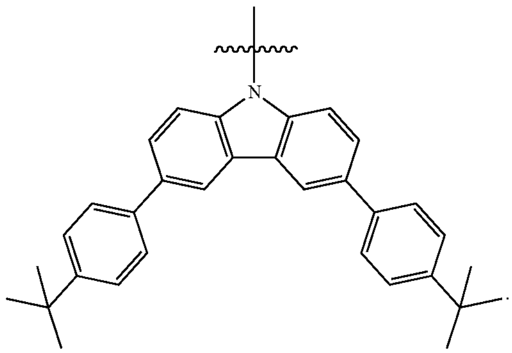
10. The organic compound according to claim 1, wherein said $R_1$, $R_2$, $R_3$, Ra, and $R_5$ are the same or different, and are respectively independently selected from the group consisting of the following groups: deuterium, cyano, fluorine, methyl, ethyl, n-propyl, isopropyl, n-butyl, sec-butyl, tert-butyl and the groups below:
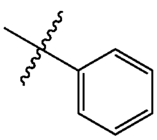
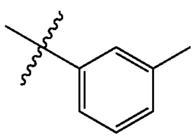
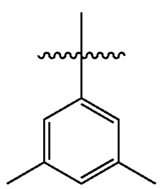
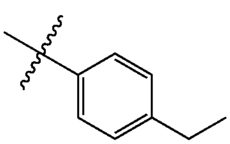
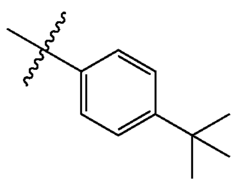
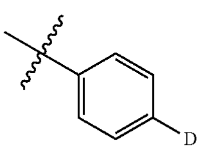
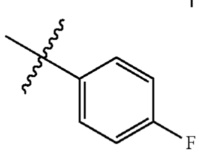
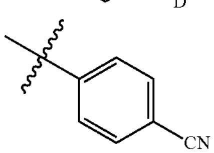
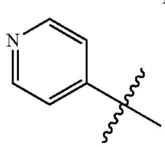
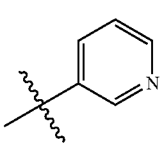
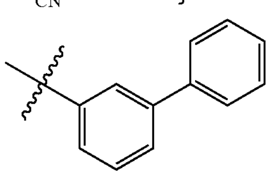
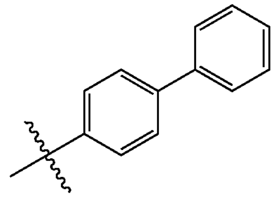
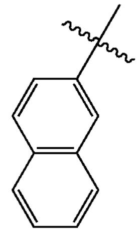
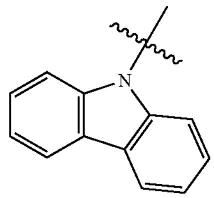
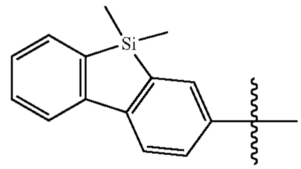
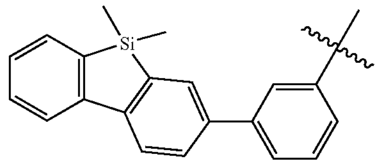
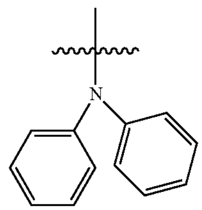
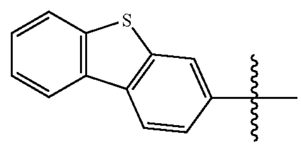
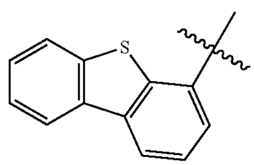
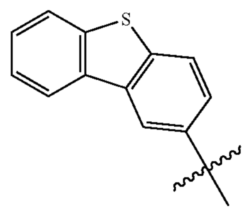
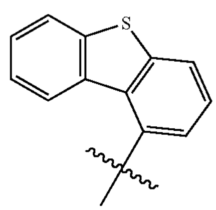
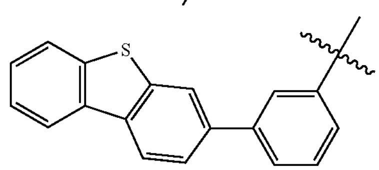
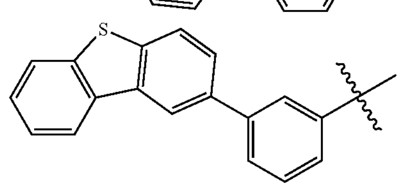
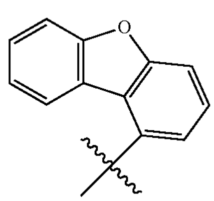
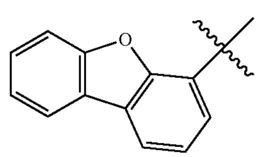

-continued
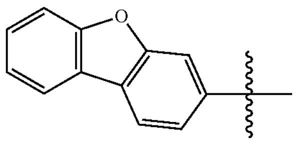
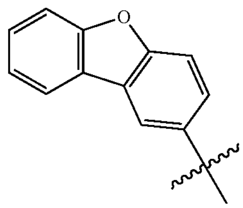
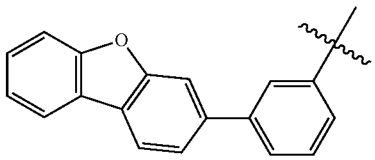
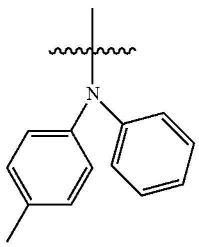
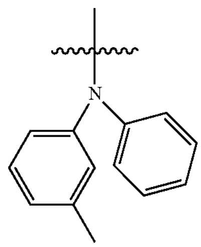
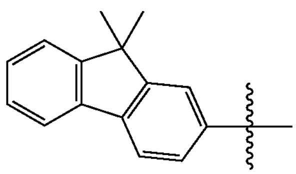
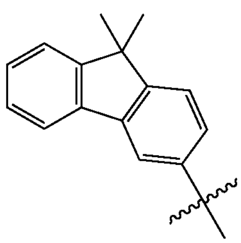
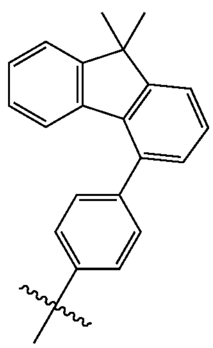
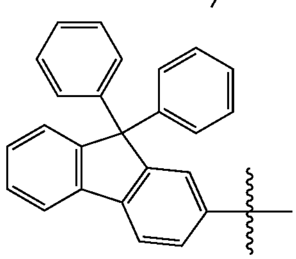
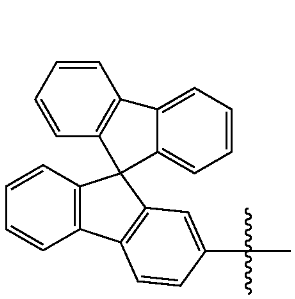
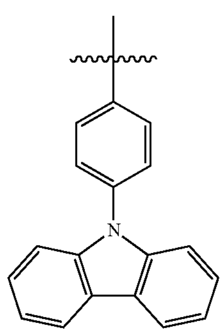
-continued
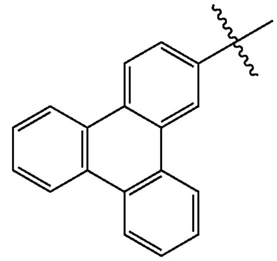
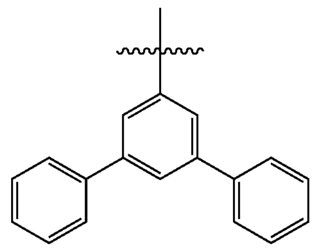
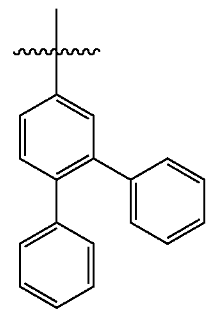
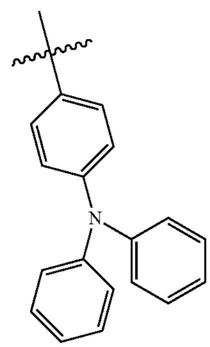
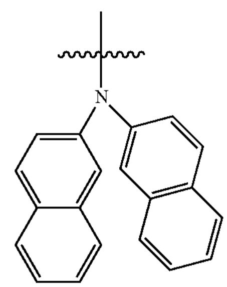
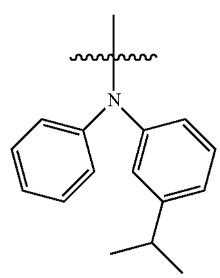
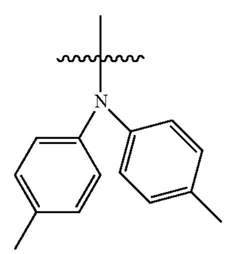
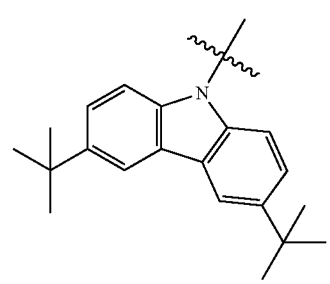

-continued
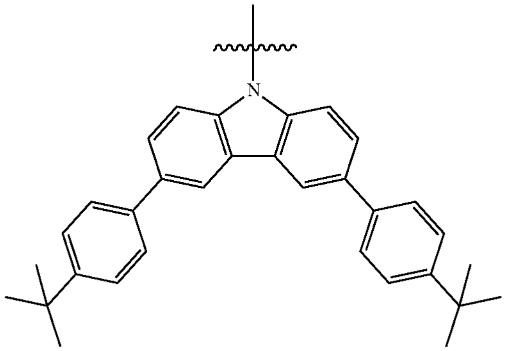
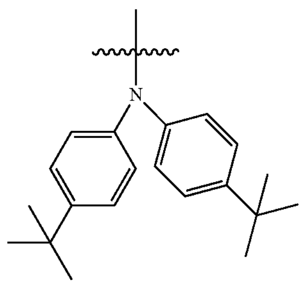
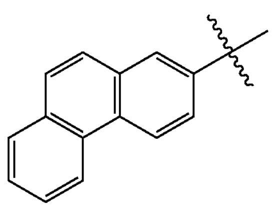
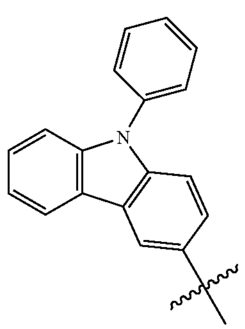
11. The organic compound according to claim 1, wherein the organic compound is selected from one or more of the following compounds P1 to P200:
P1
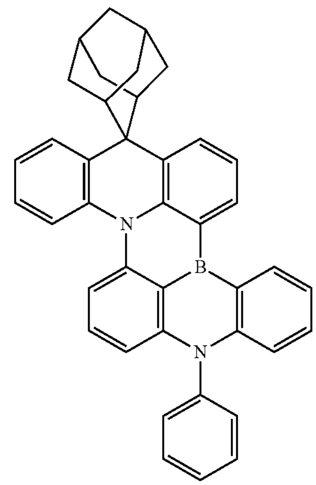
P2
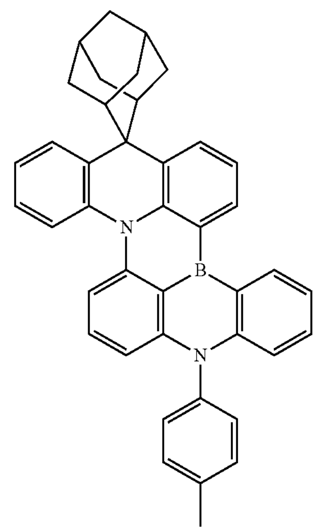
P3
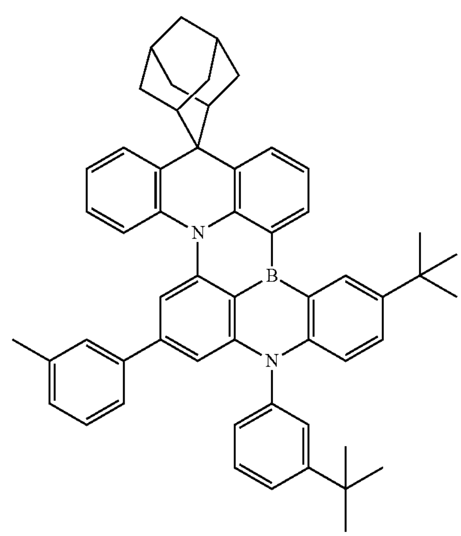

-continued
P4
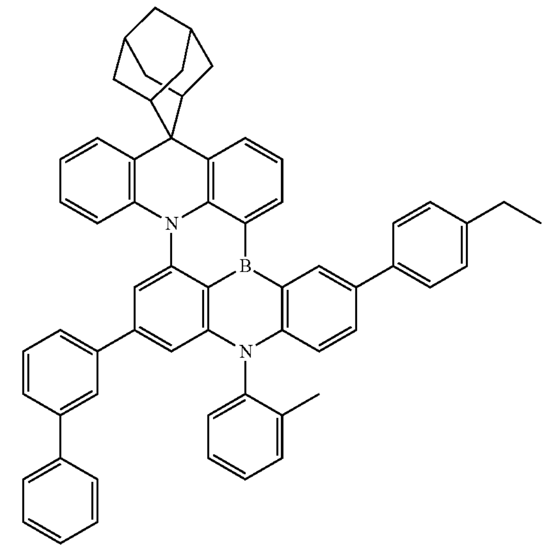
P5
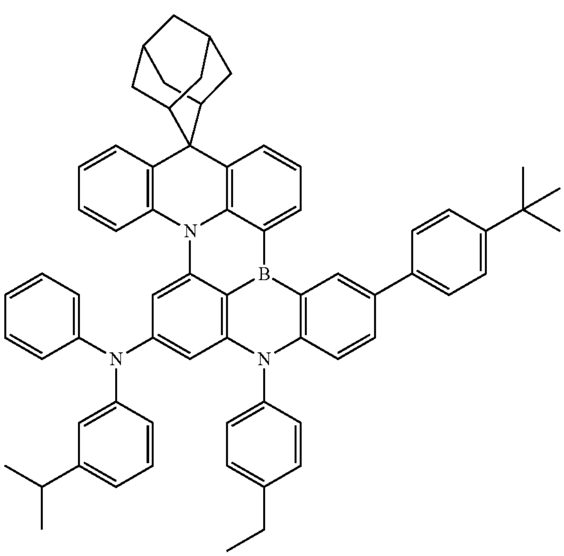
-continued
P6
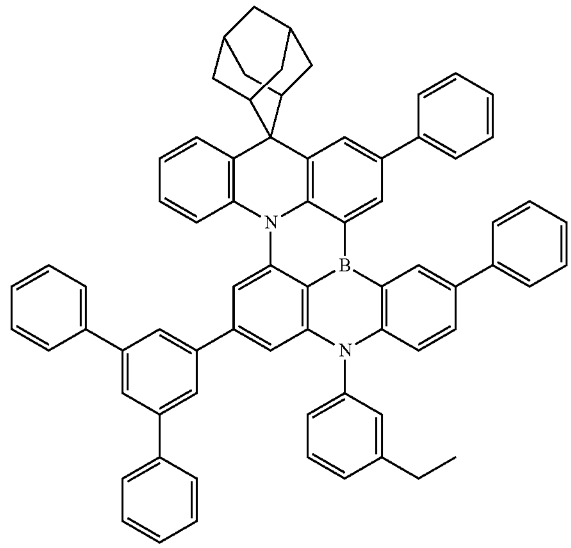
P7
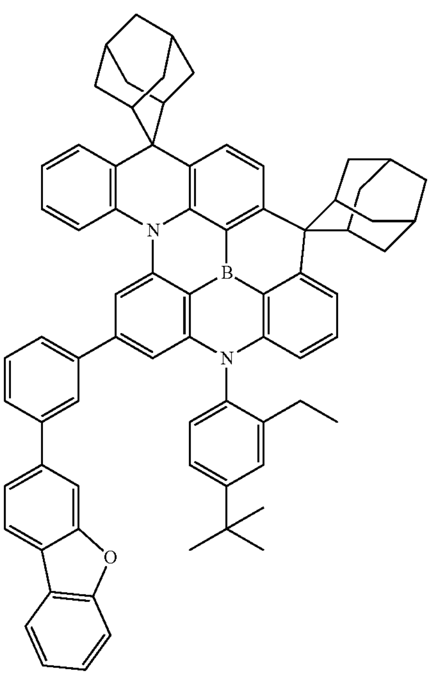

-continued
P8
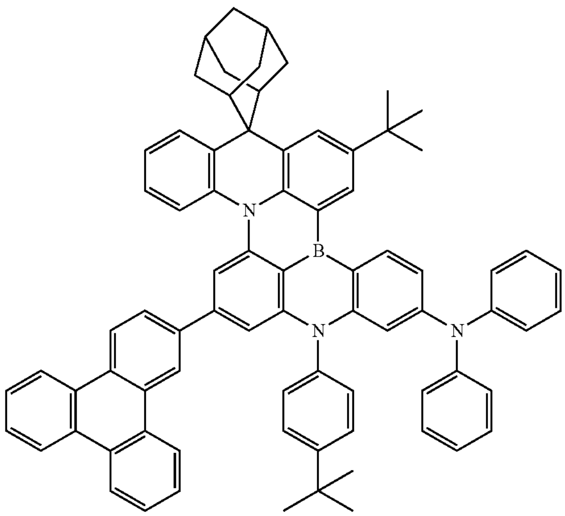
P9
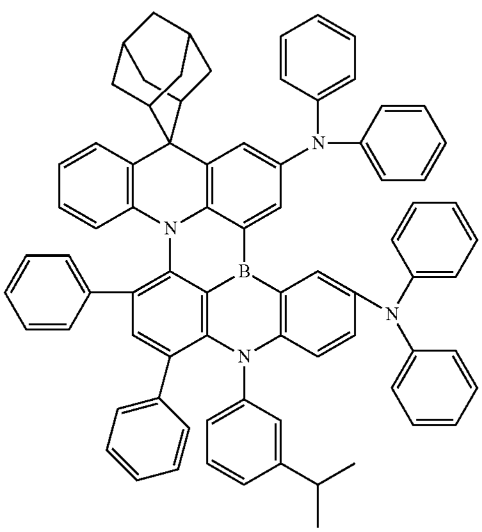
P10
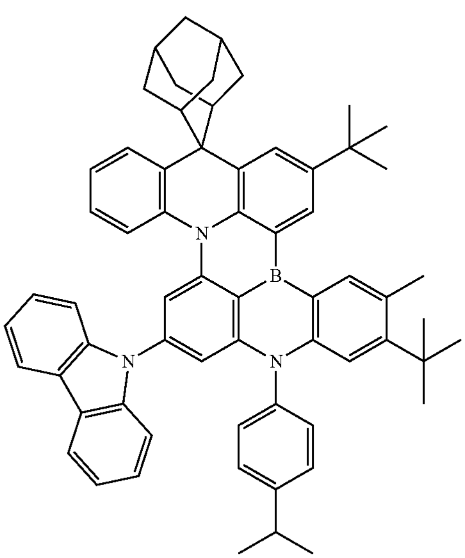
-continued
P11
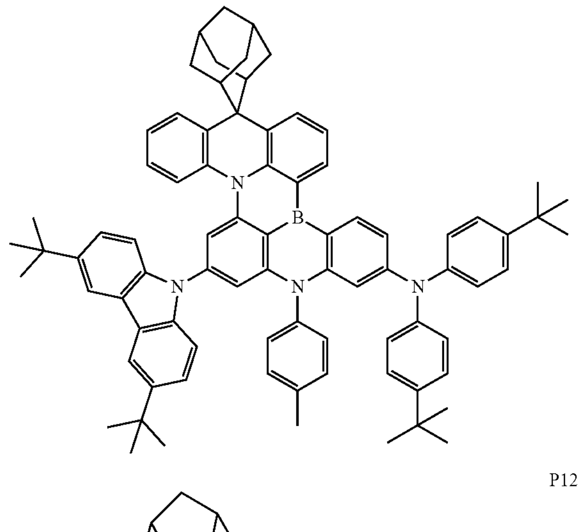
P12
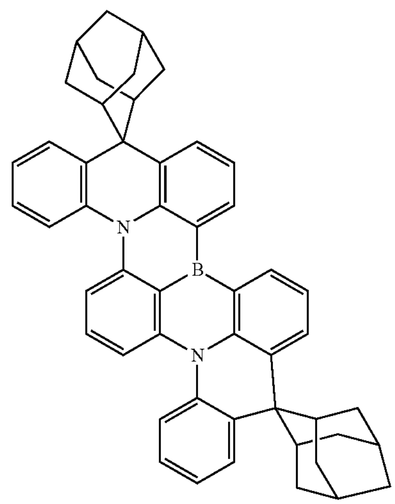
P13
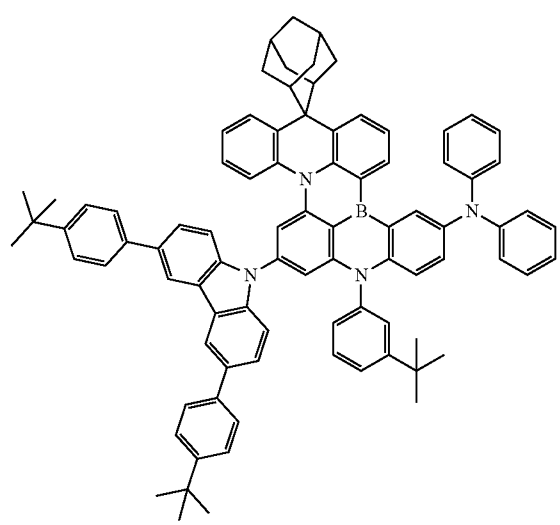

-continued
P14
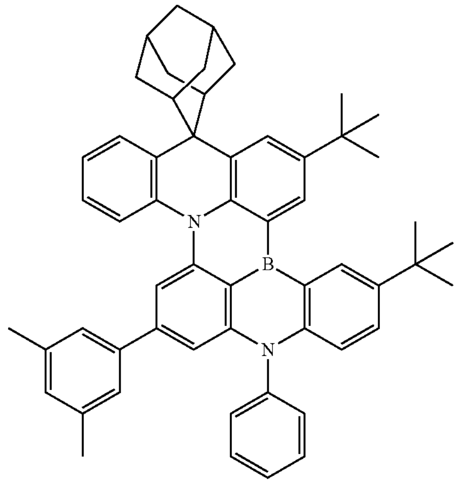
P15
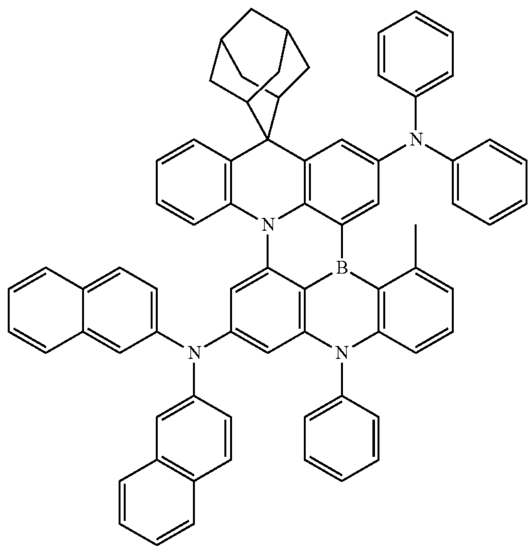
P16
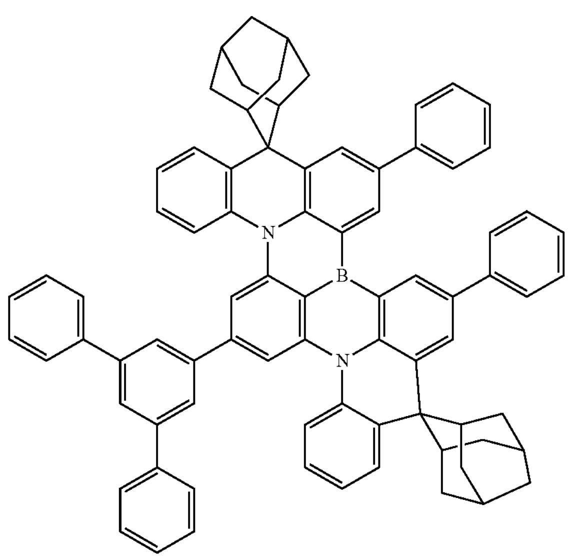
-continued
P17
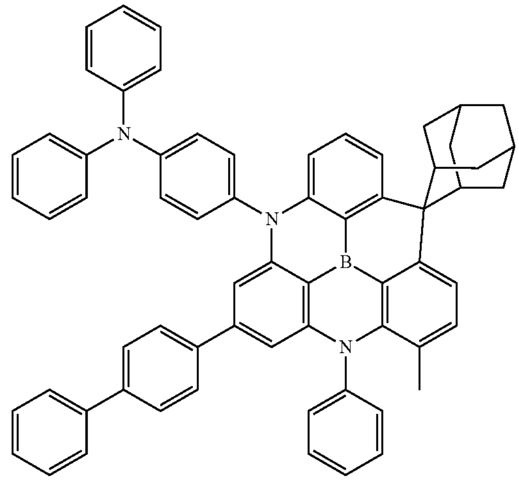
P18
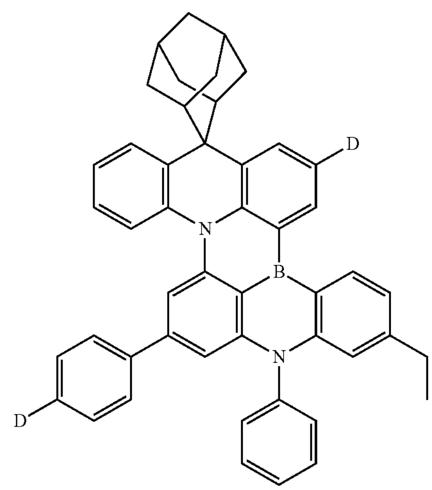
P19
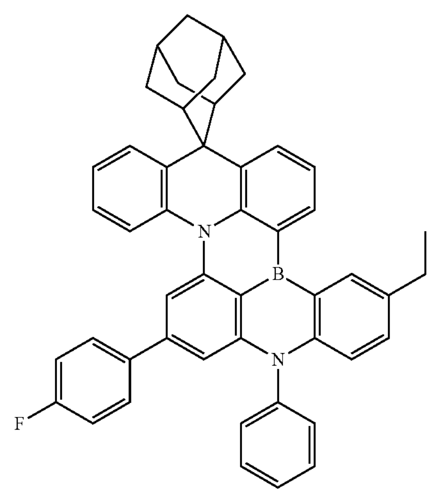

-continued
P20
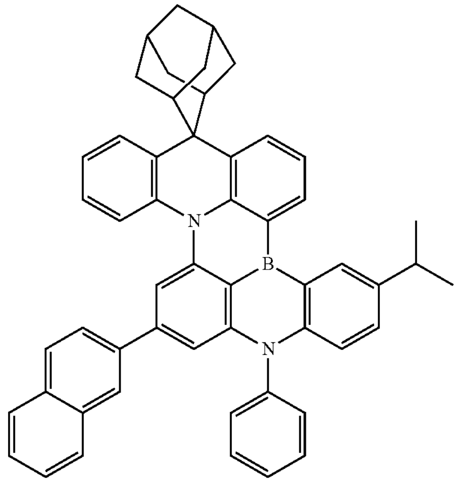
P21
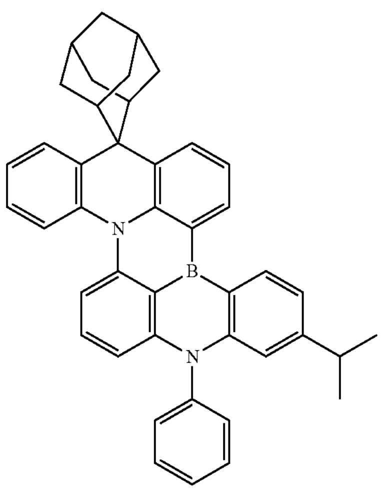
P22
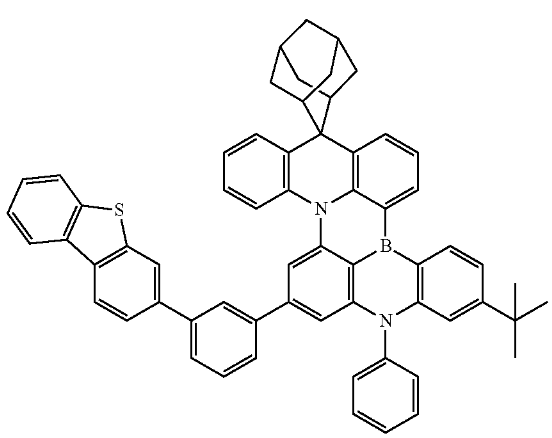
-continued
P23
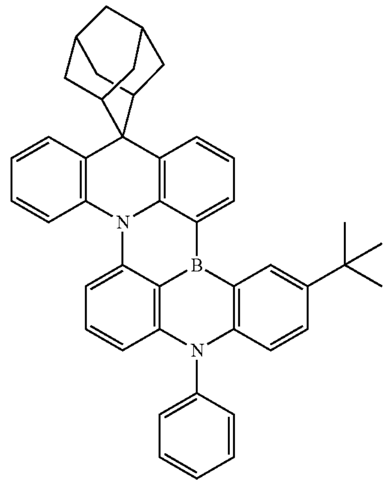
P24
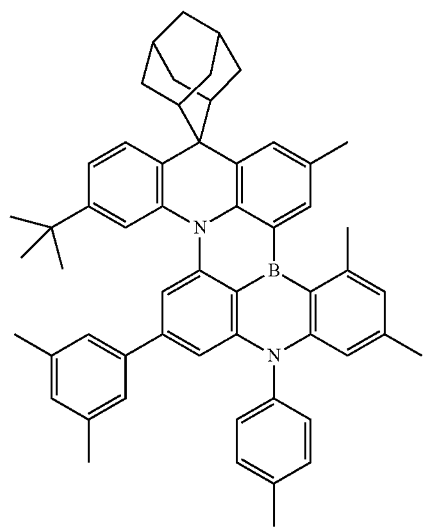
P25
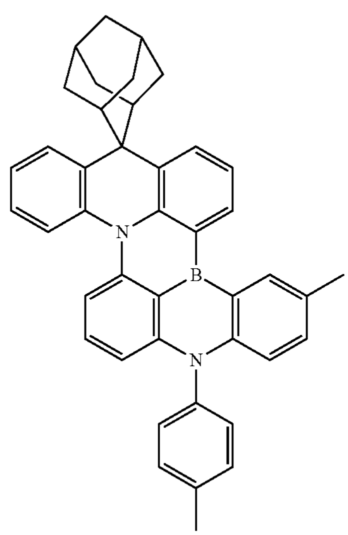

P26
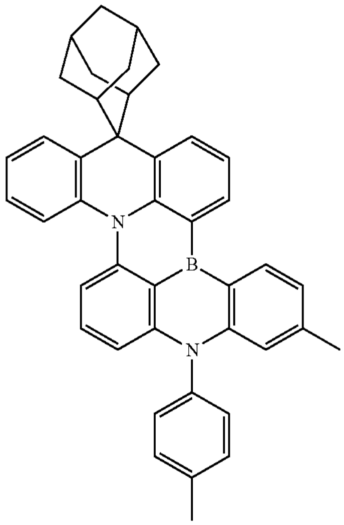
P27
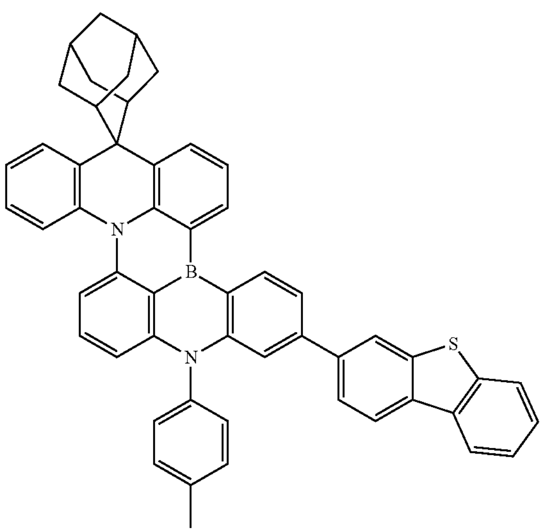
P28
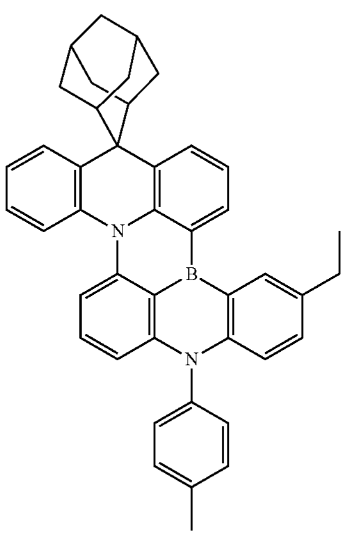
P29
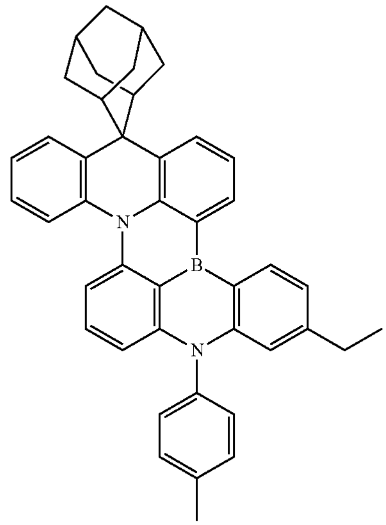
P30
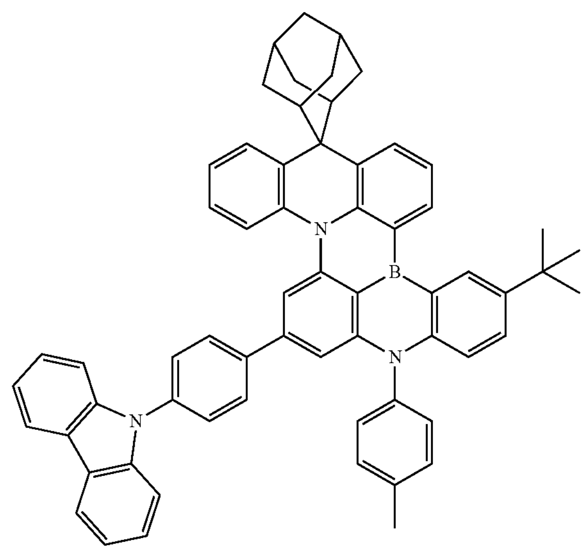
P31
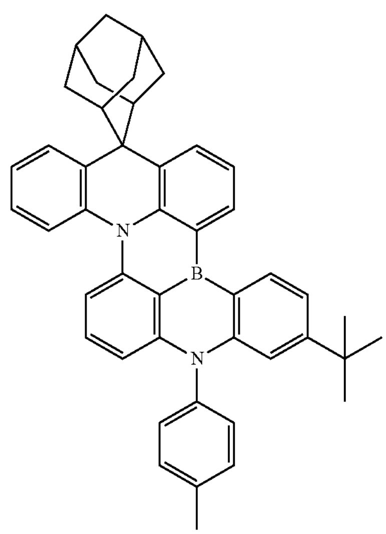

-continued
P32
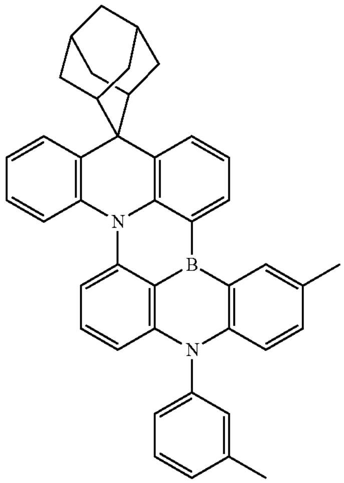
P33
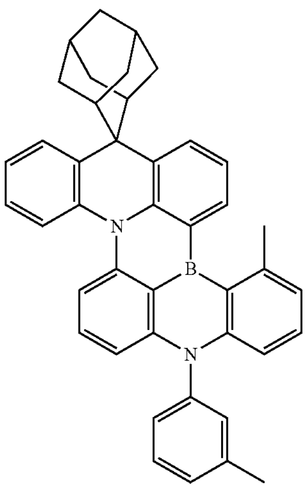
P34
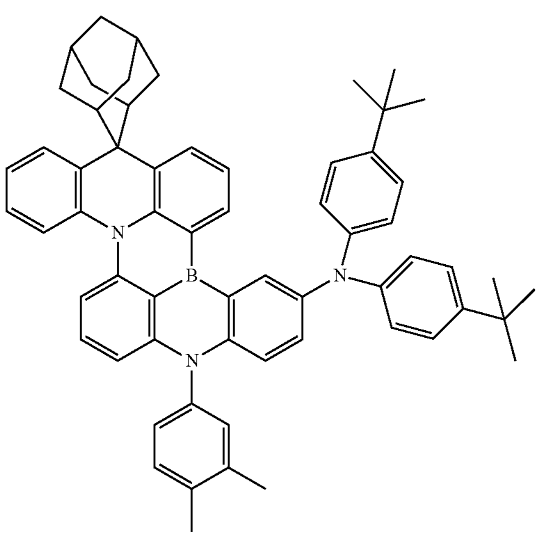
-continued
P35
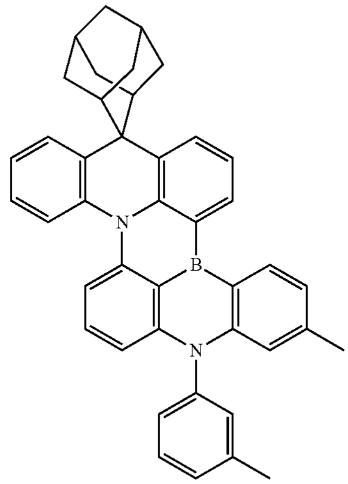
P36
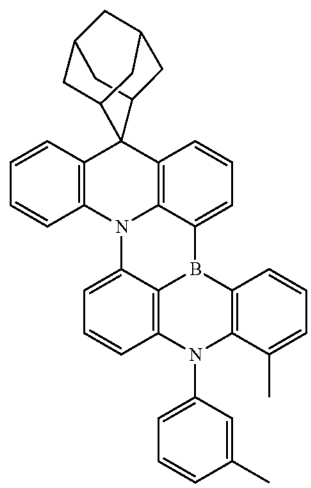
P37
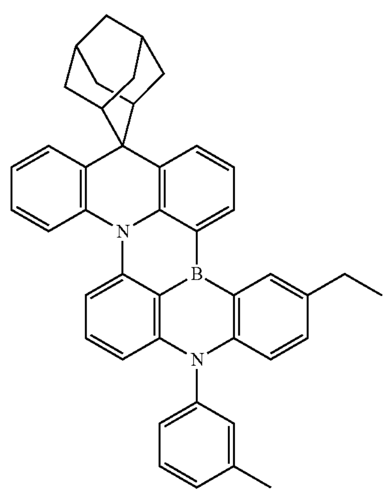

-continued
P38
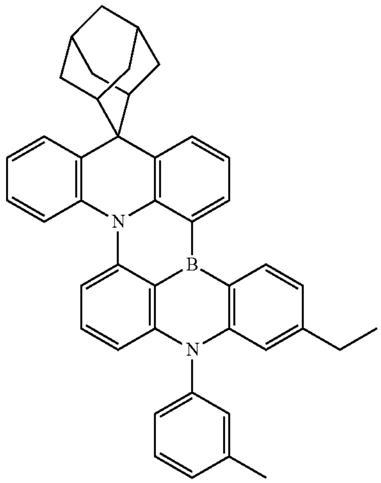
P39
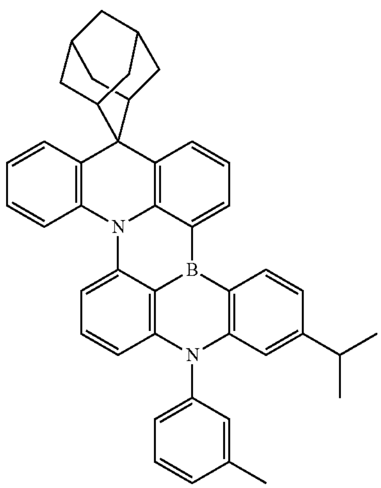
P40
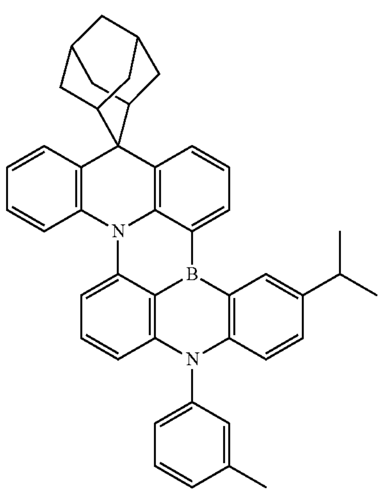
-continued
P41
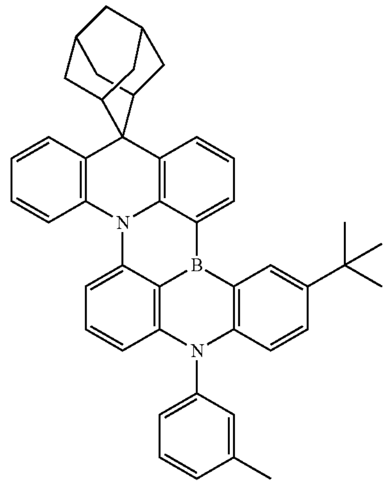
P42
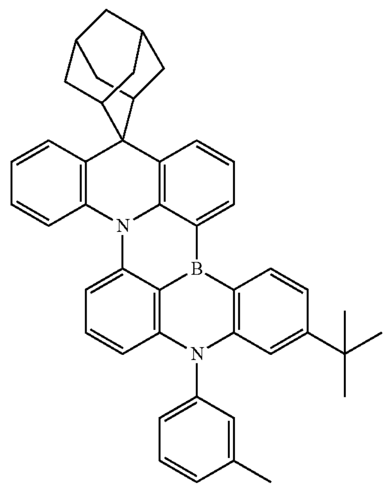
P43
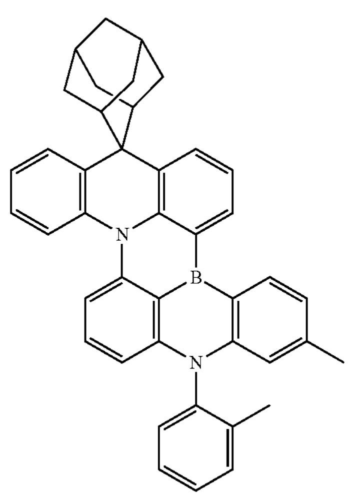

-continued
P44
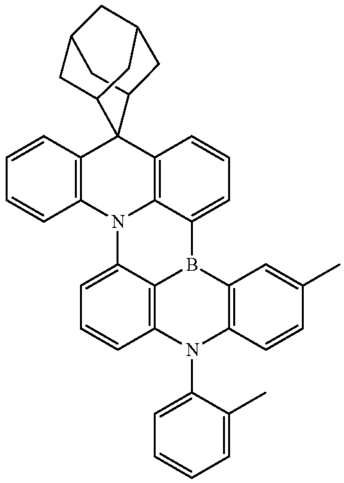
P45
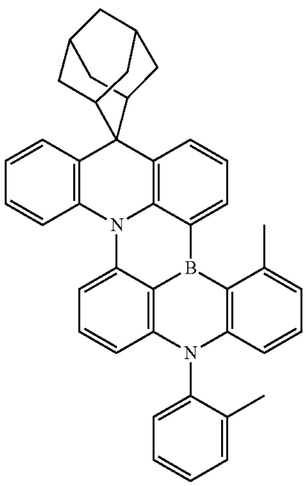
P46
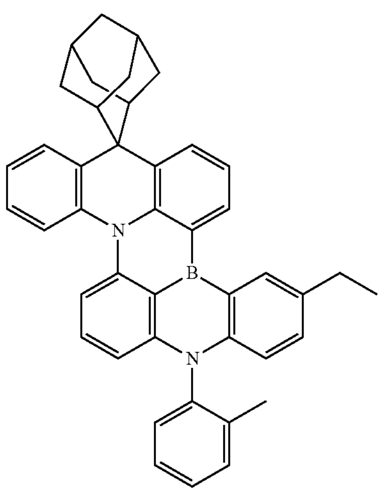
-continued
P47
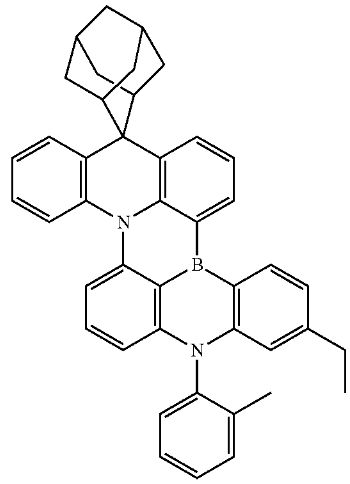
P48
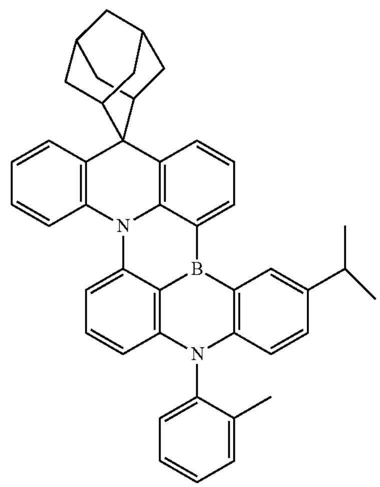
P49
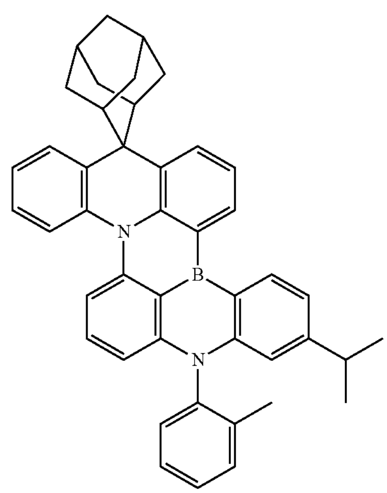

-continued
P50
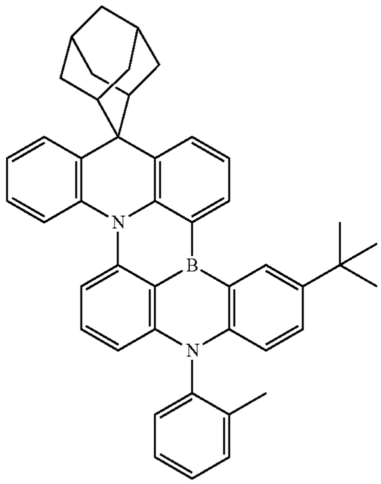
P51
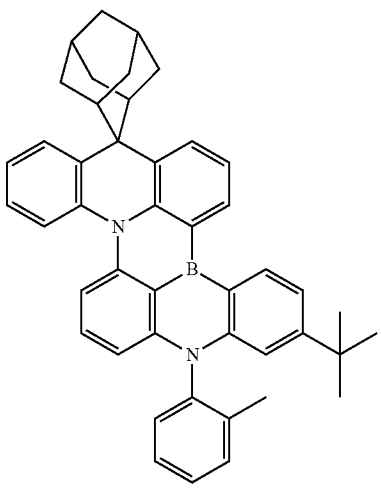
P52
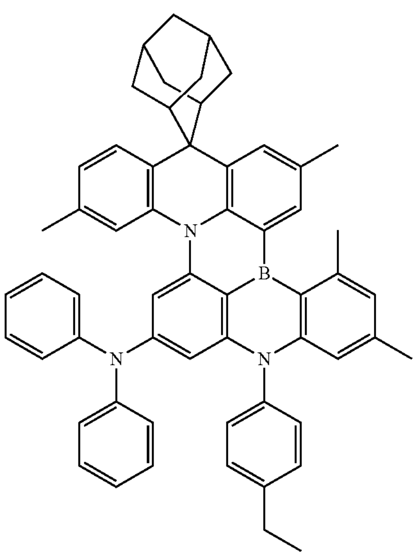
-continued
P53
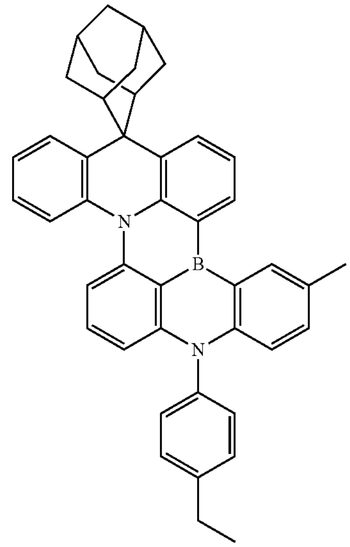
P54
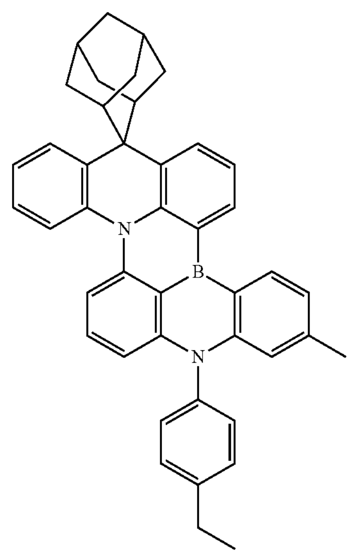
P55
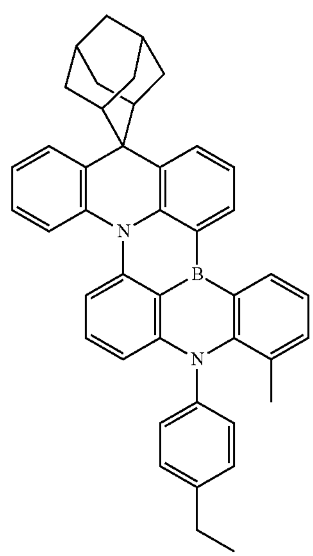

-continued
P56
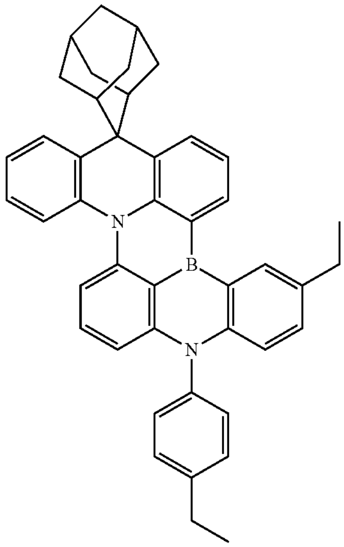
P57
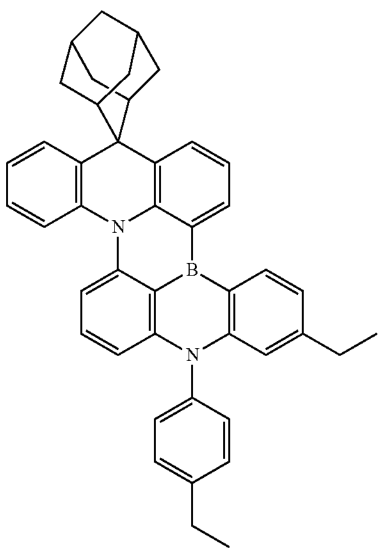
P58
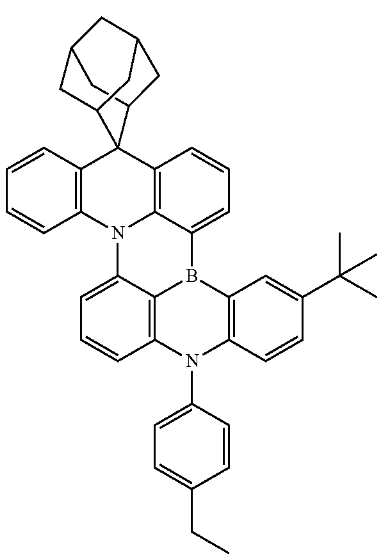
-continued
P59
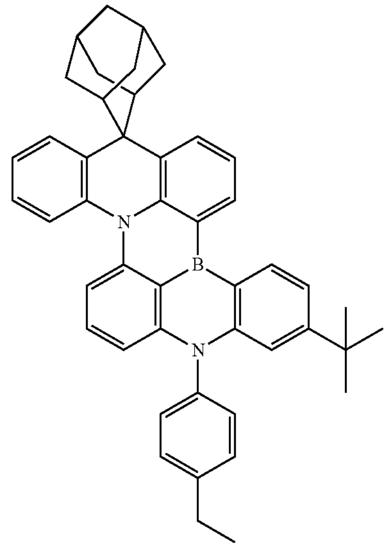
P60
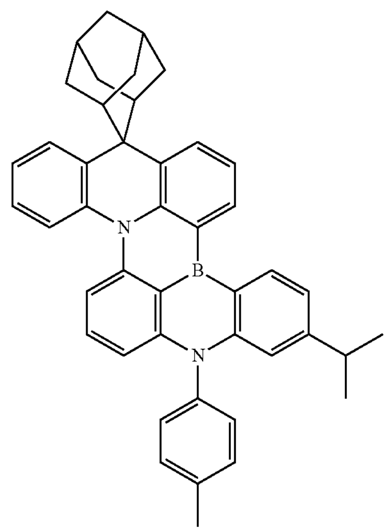
P61
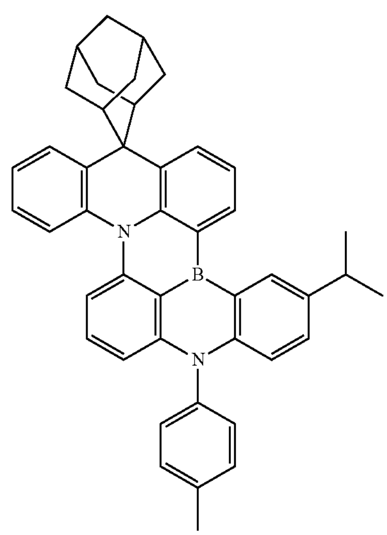

P62
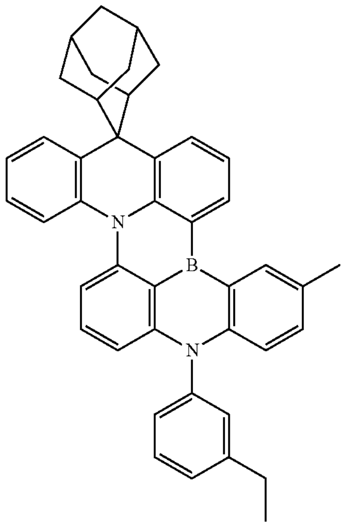
P63
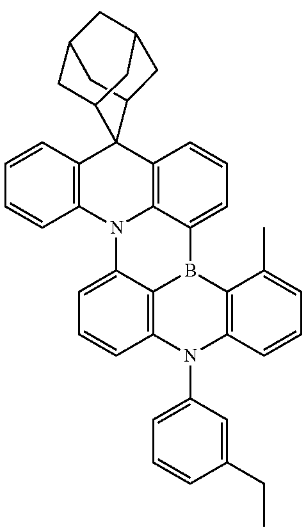
P64
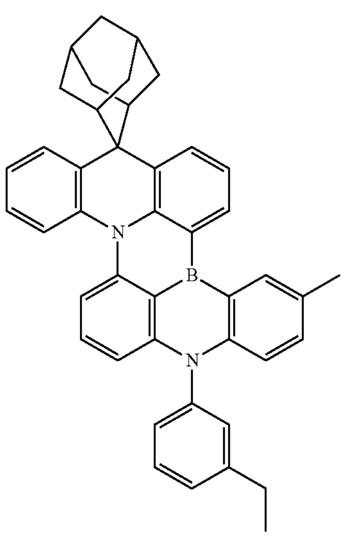
P65
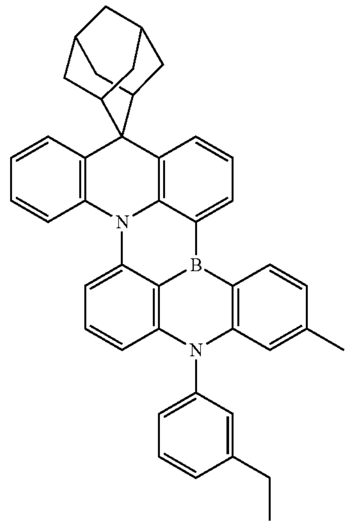
P66
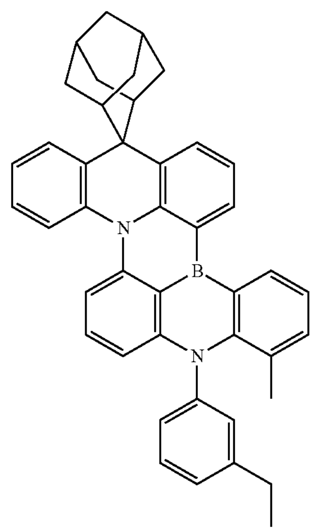
P67
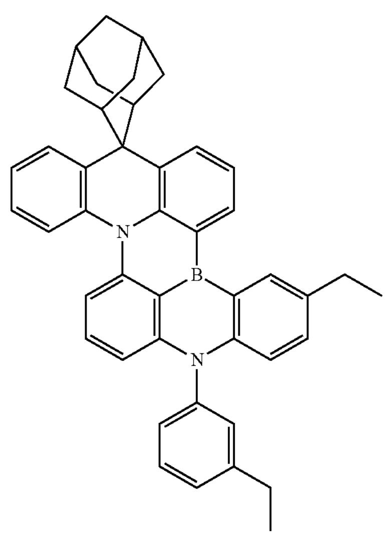

P68
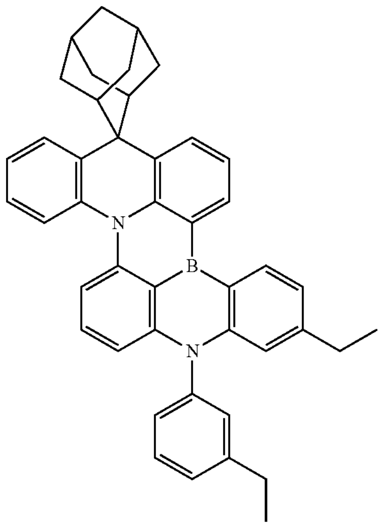
P69
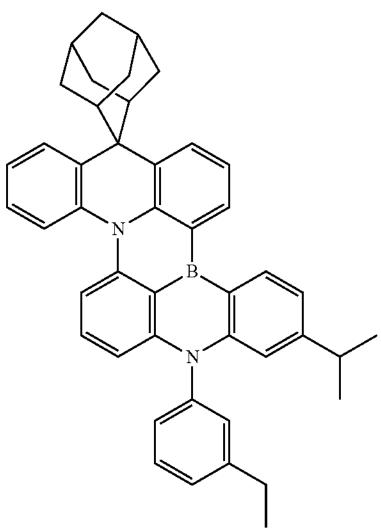
P70
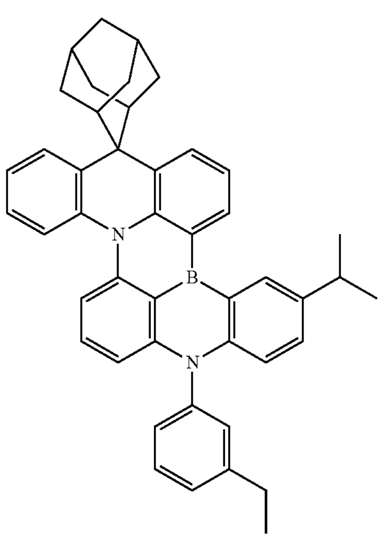
P71
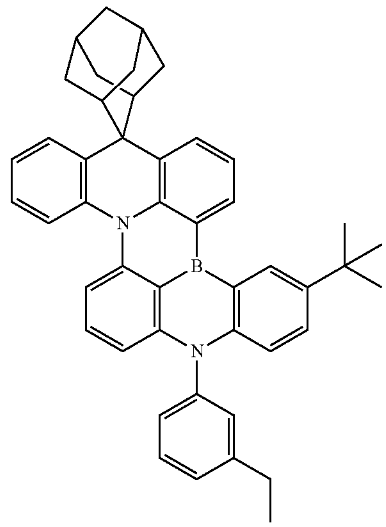
P72
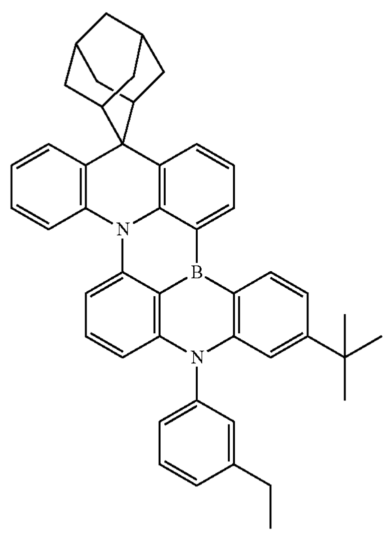
P73
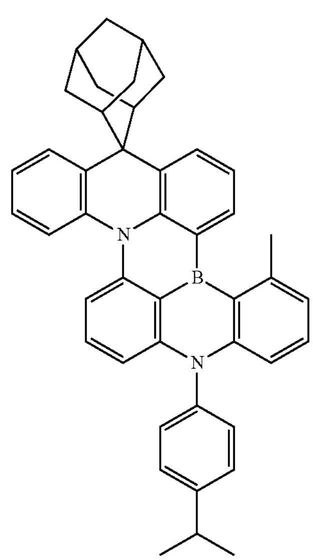

-continued
P74
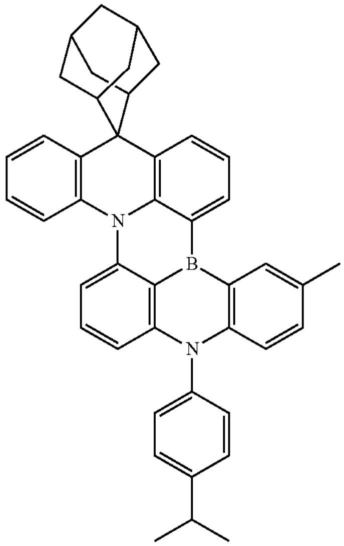
P75
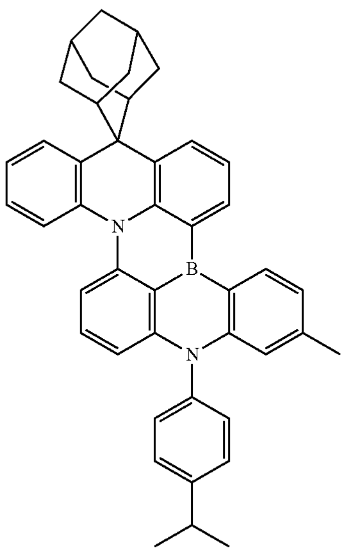
P76
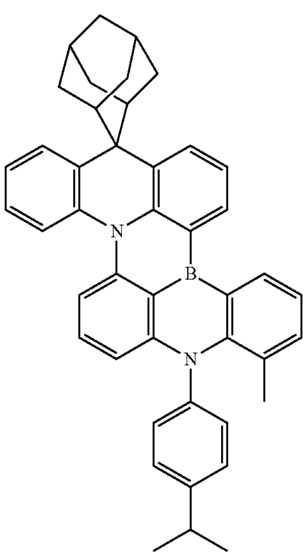
-continued
P77
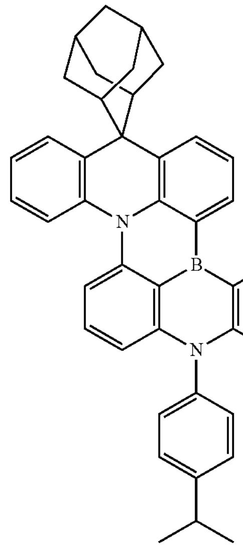
P78
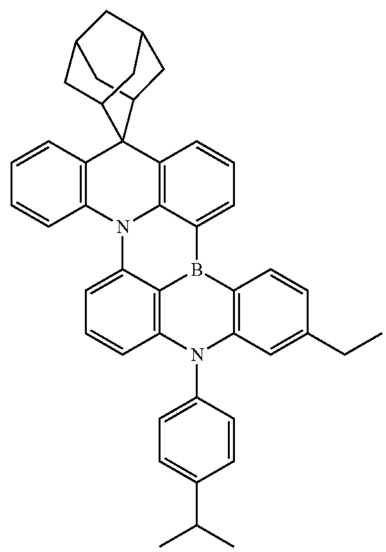
P79
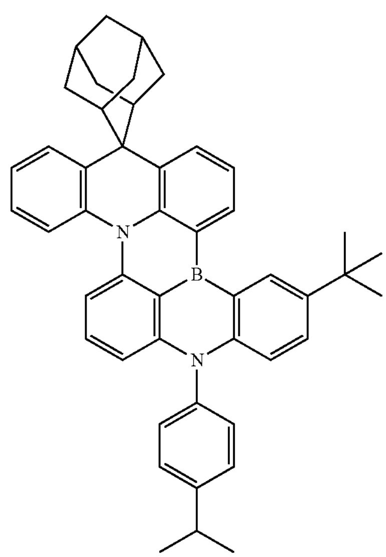

-continued
P80
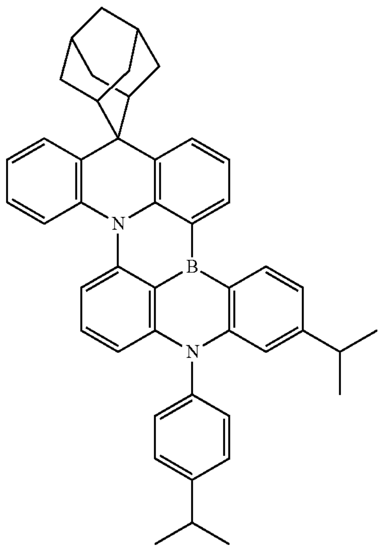
P81
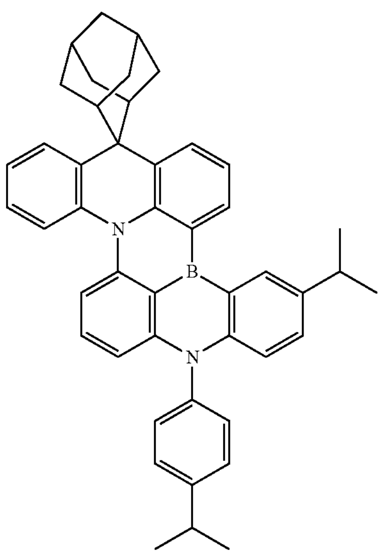
P82
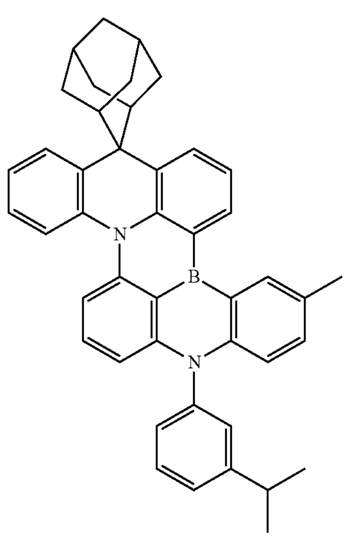
-continued
P83
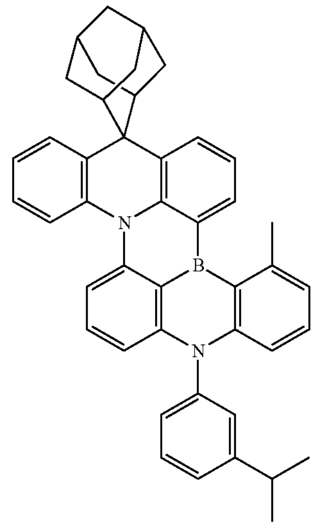
P84
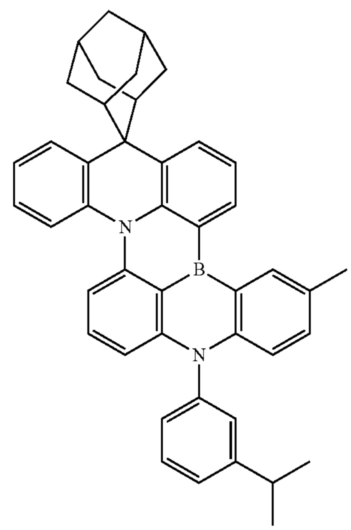
P85
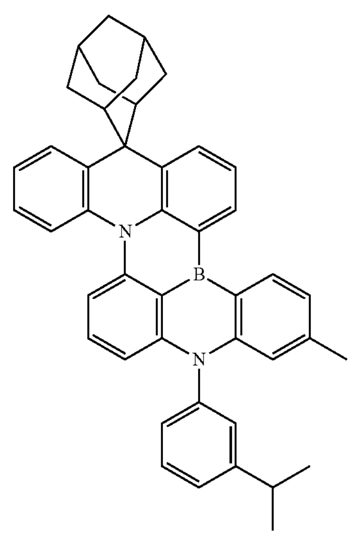

-continued
P86
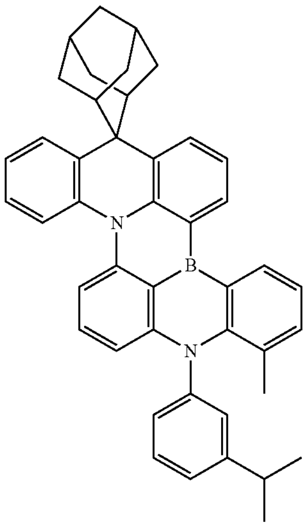
P87
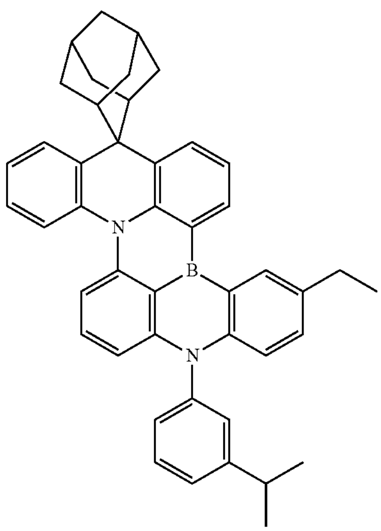
P88
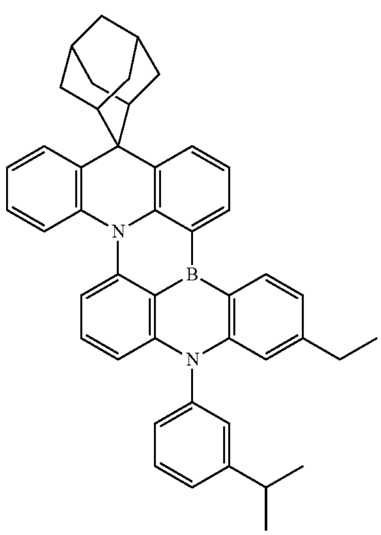
-continued
P89
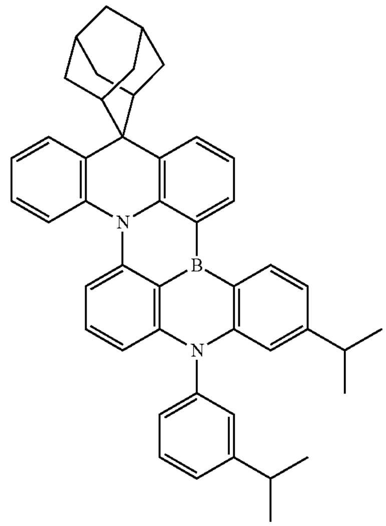
P90
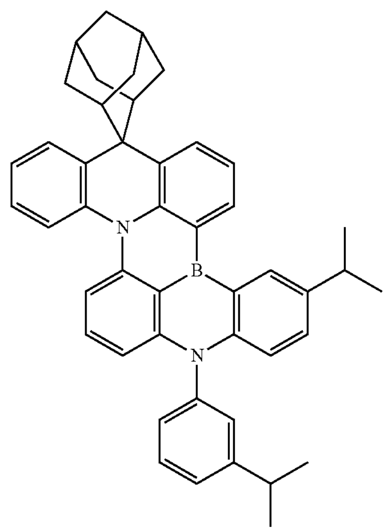
P91
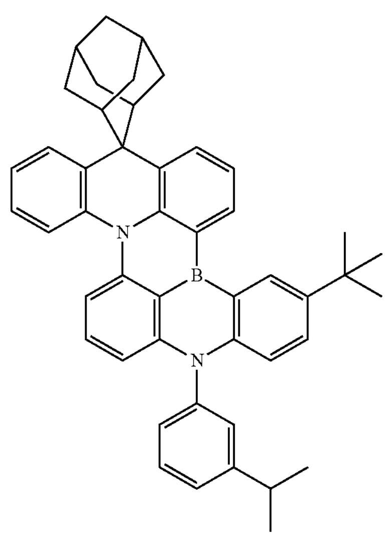

-continued
P92
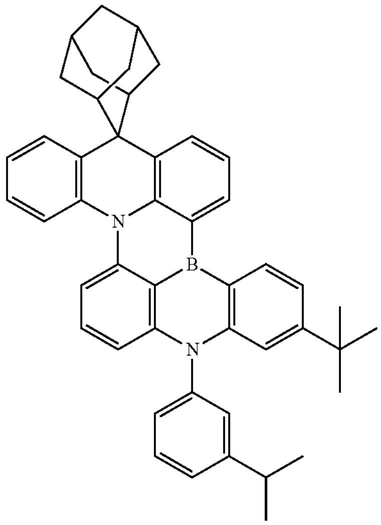
P93
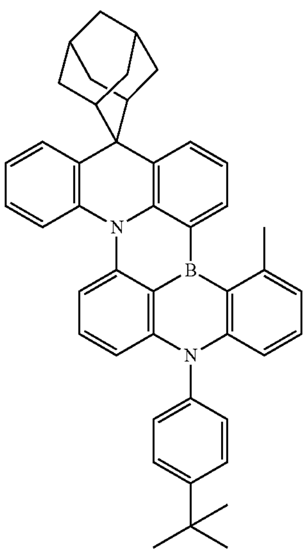
P94
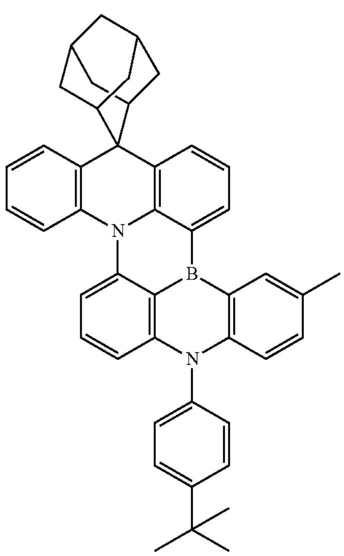
-continued
P95
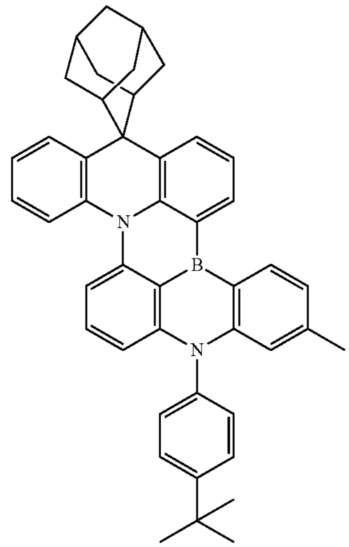
P96
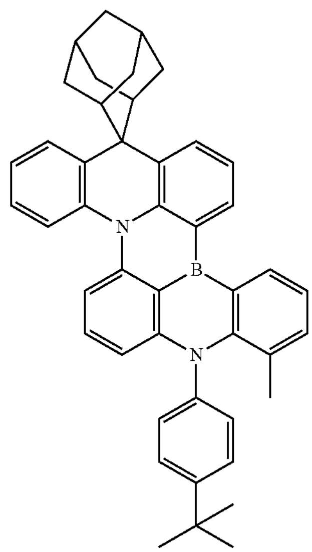
P97
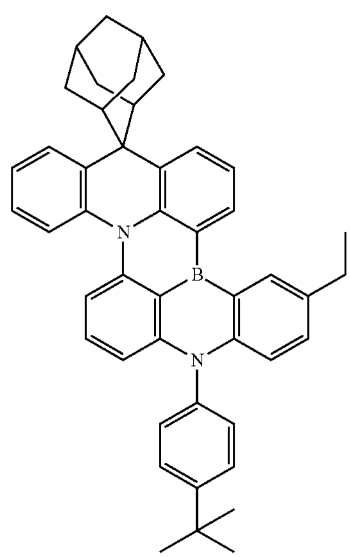

-continued
P98
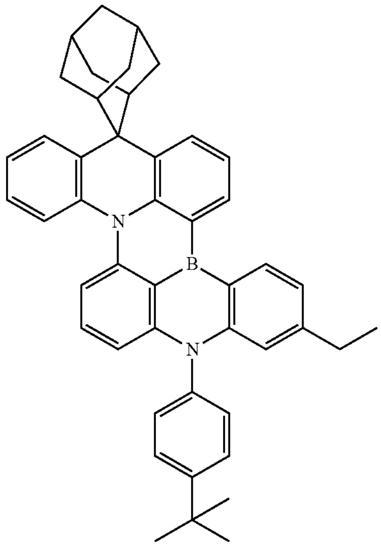
P99
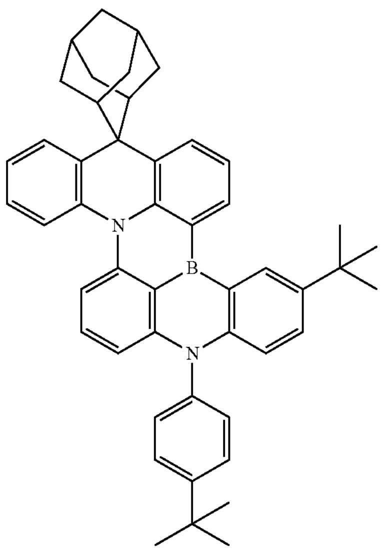
P100
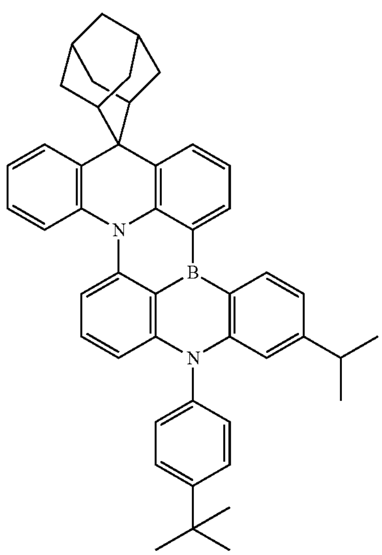
-continued
P101
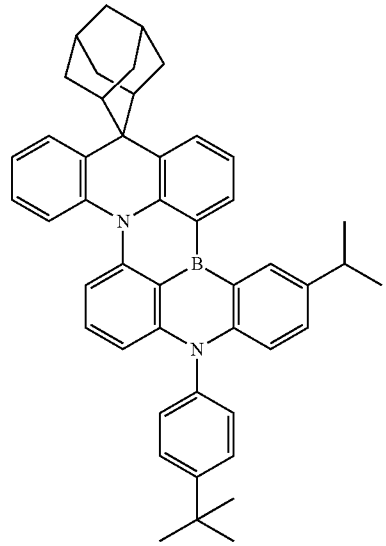
P102
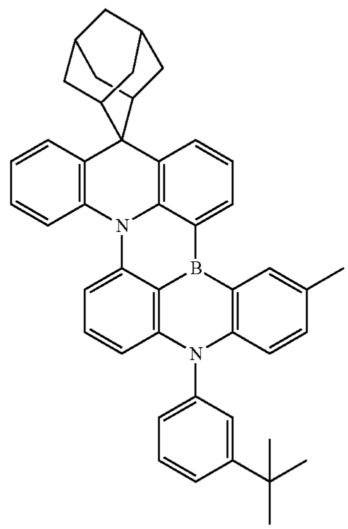
P103
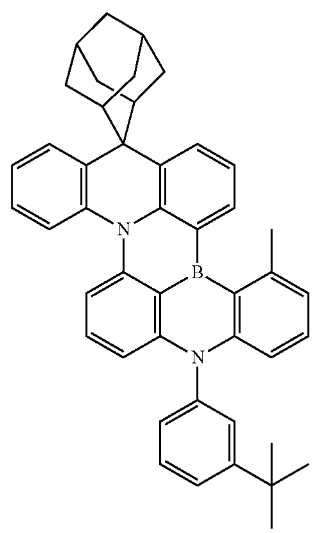

-continued
P104
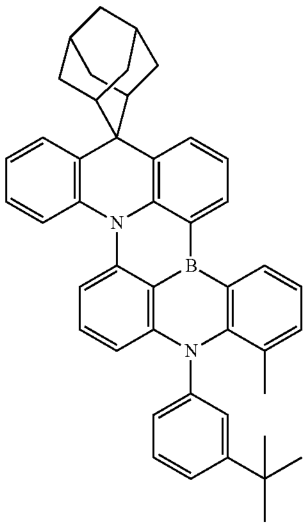
P105
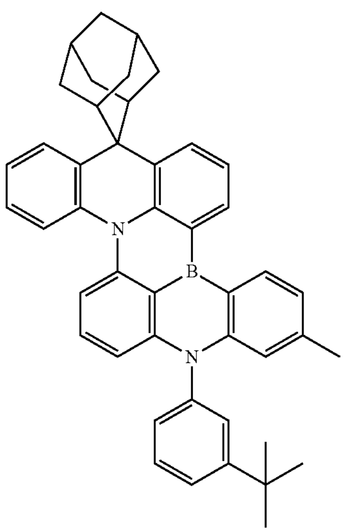
P106
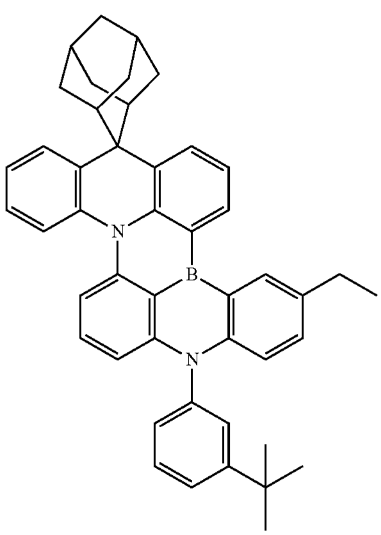
-continued
P107
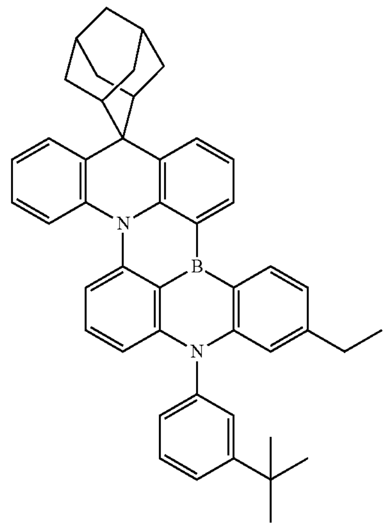
P108
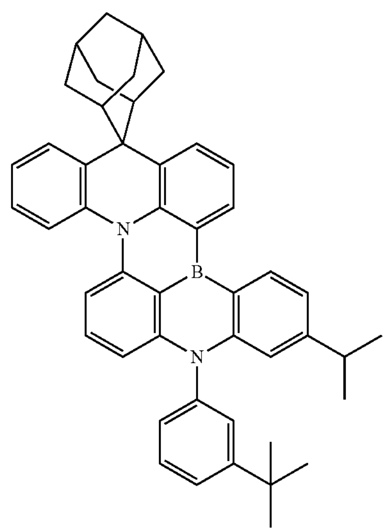
P109
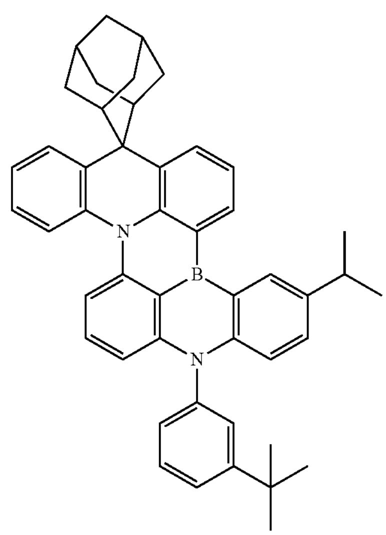

-continued
P110
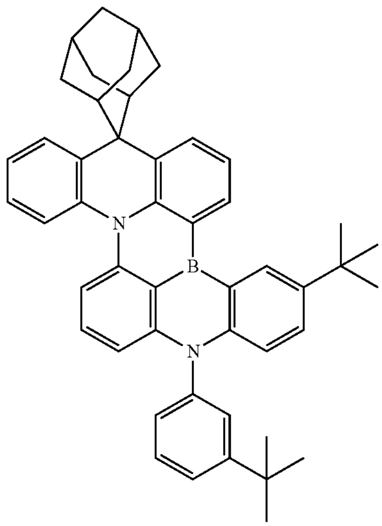
P111
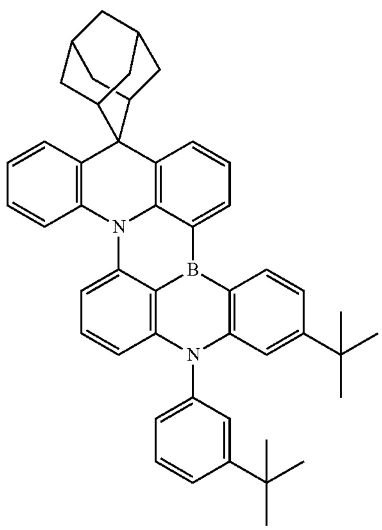
P112
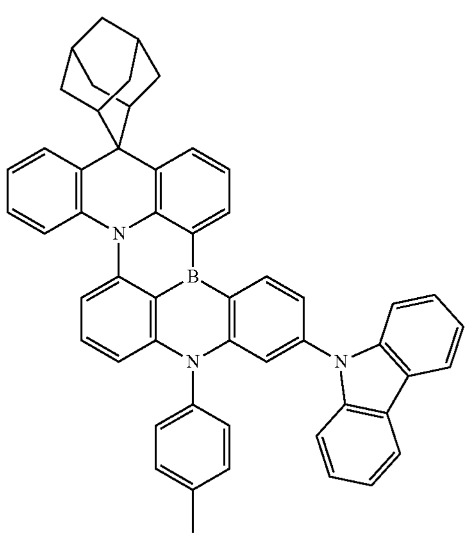
-continued
P113
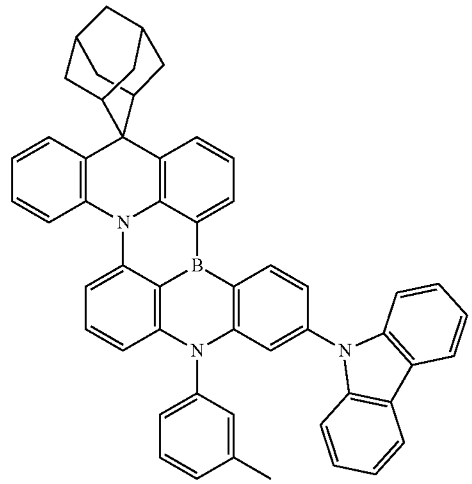
P114
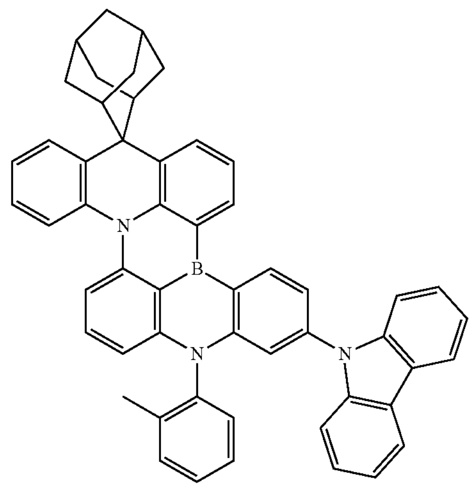
P115
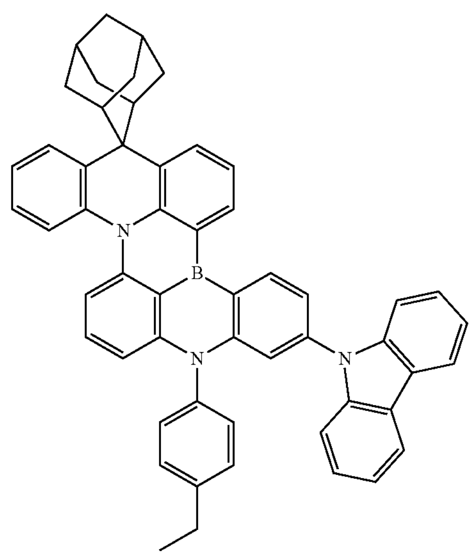

-continued
P116
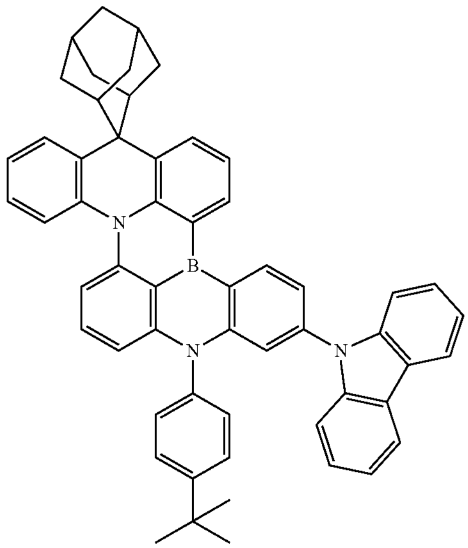
P117
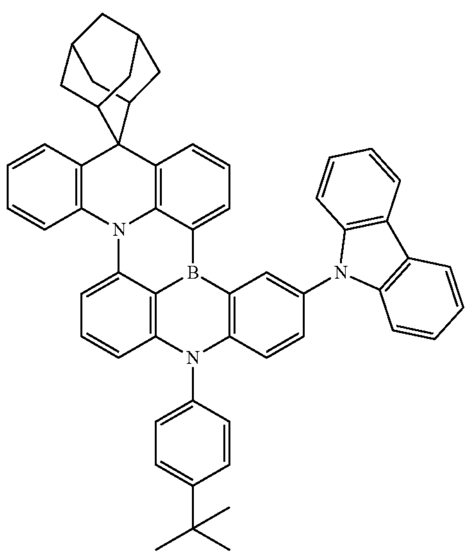
P118
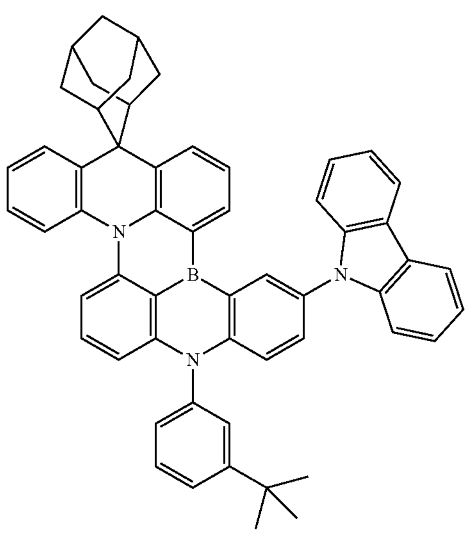
-continued
P119
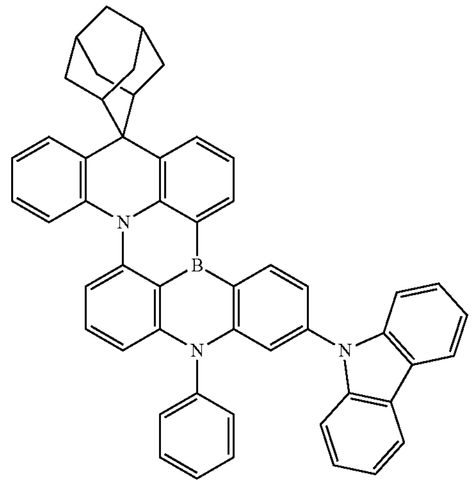
P120
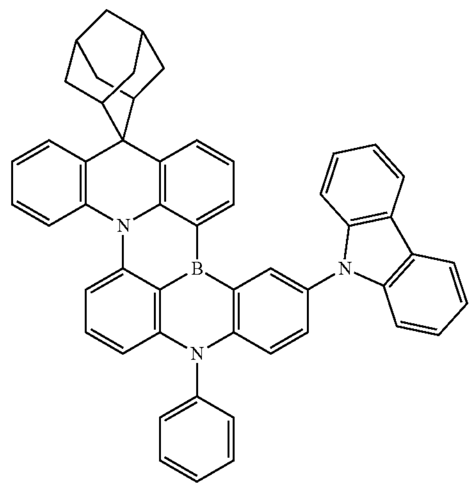
P121
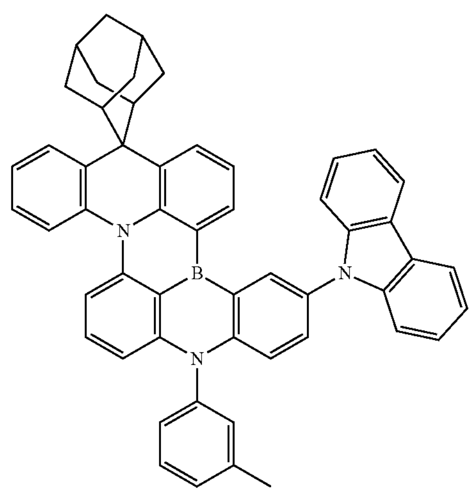

P122
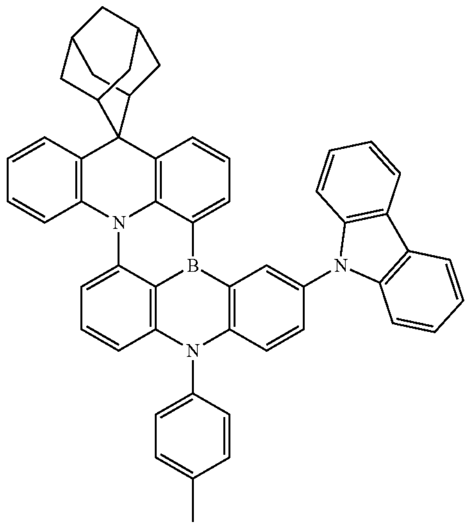
P123
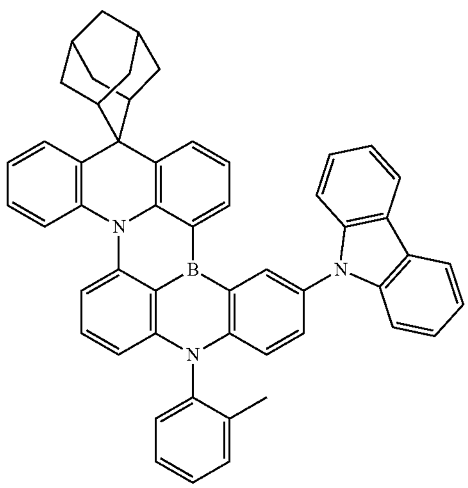
P124
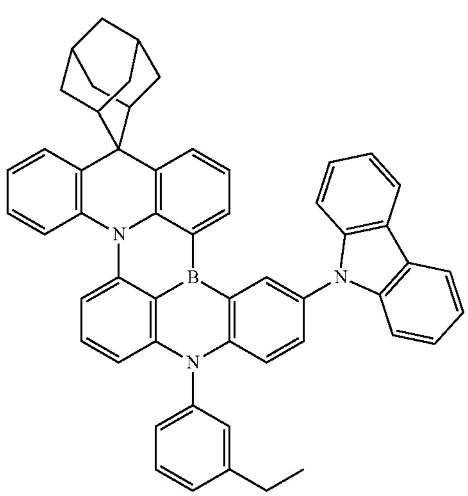
P125
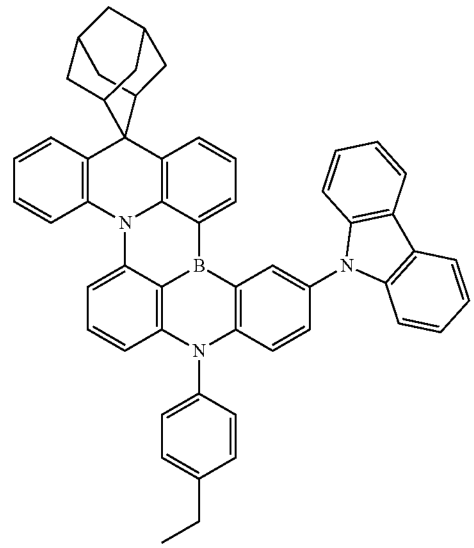
P126
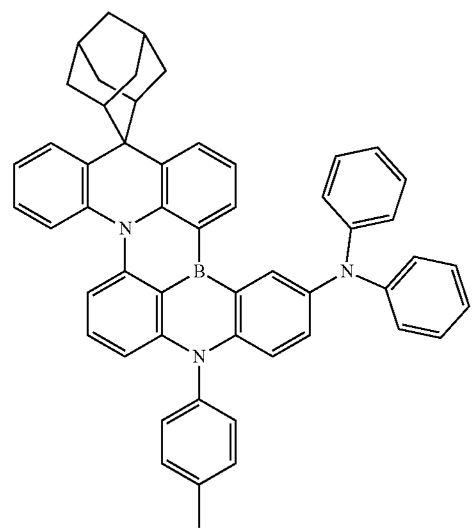
P127
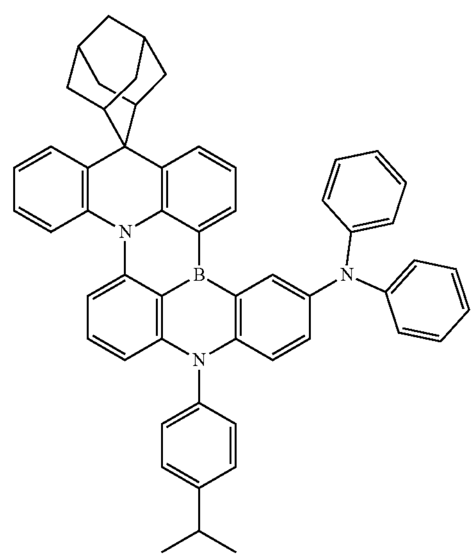

-continued
P128
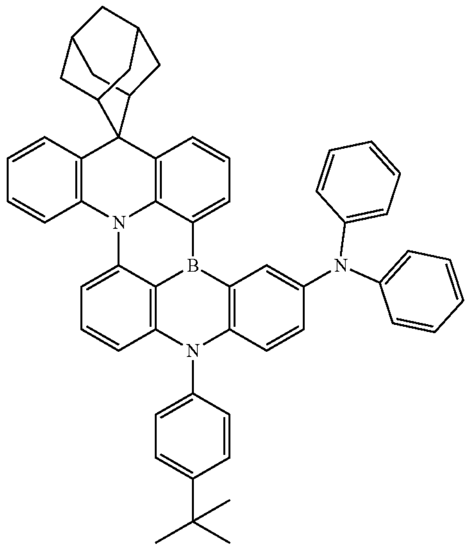
P129
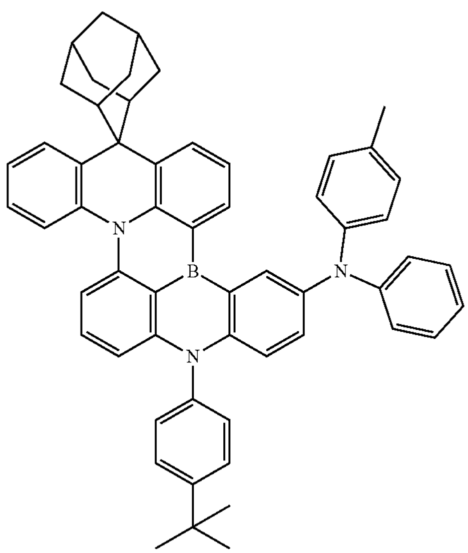
P130
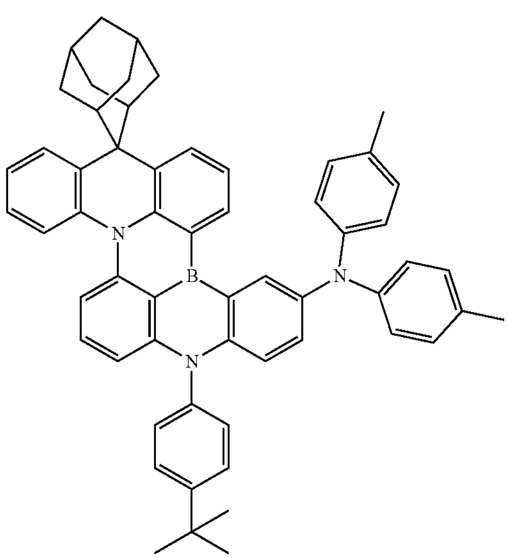
-continued
P131
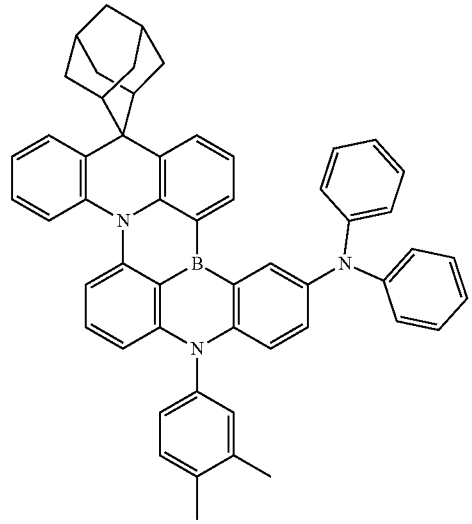
P132
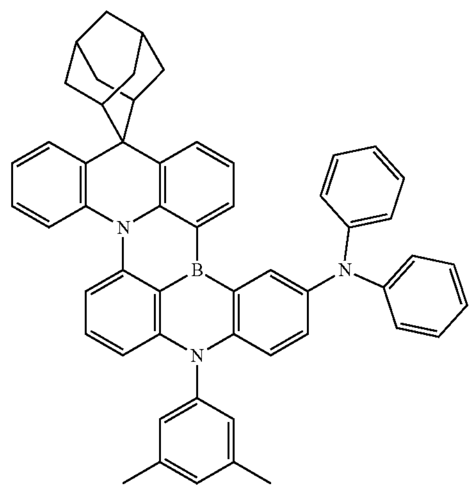
P133
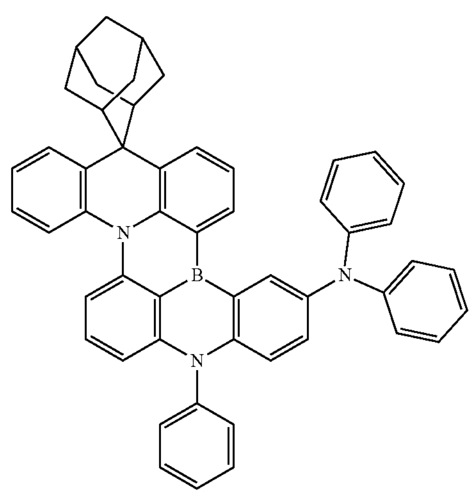

P134
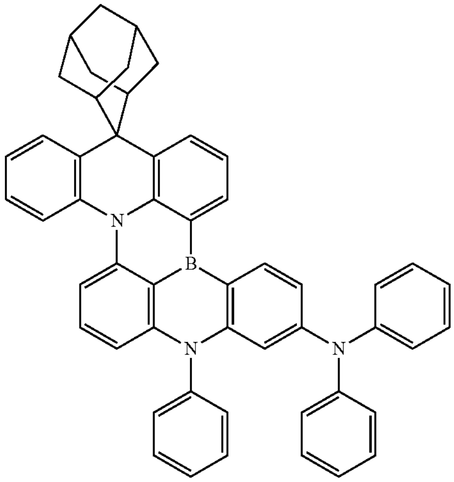
P135
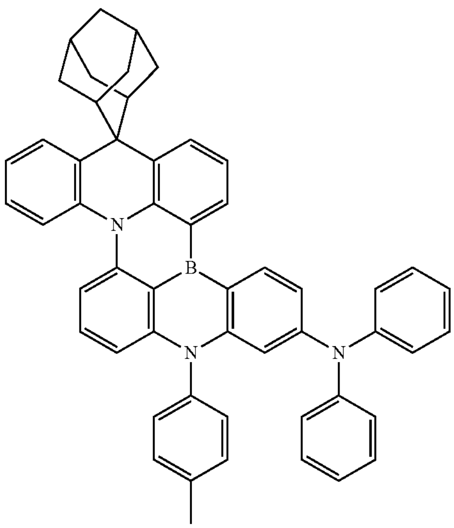
P136
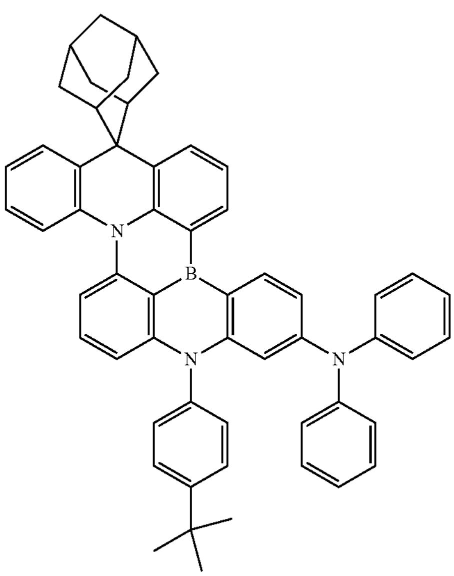
P137
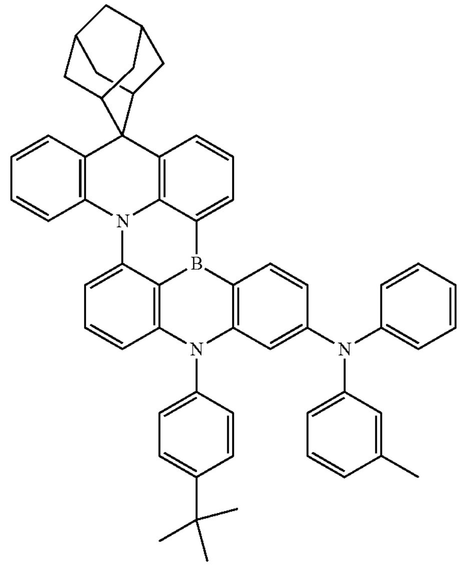
P138
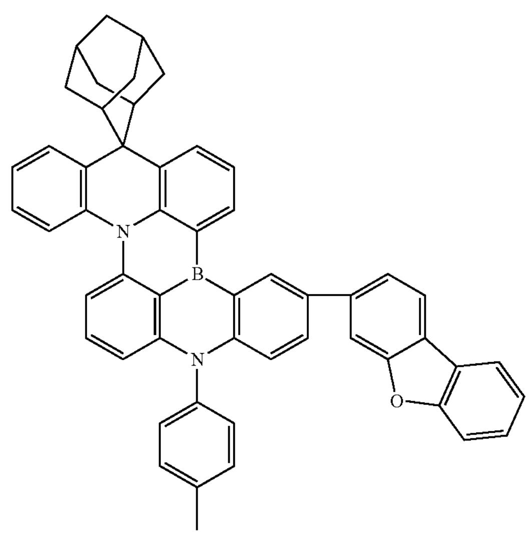

-continued
P139
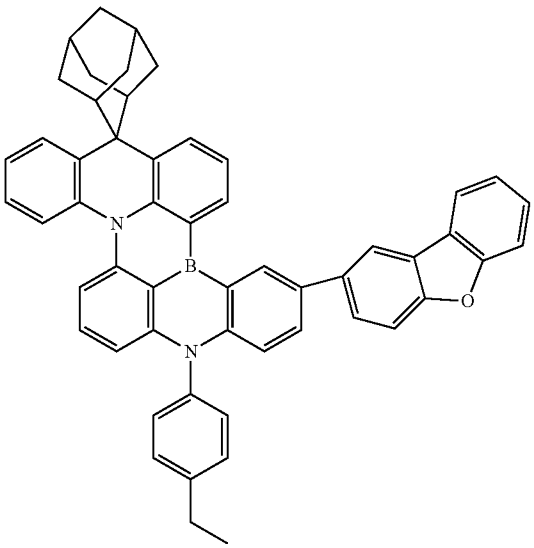
P140
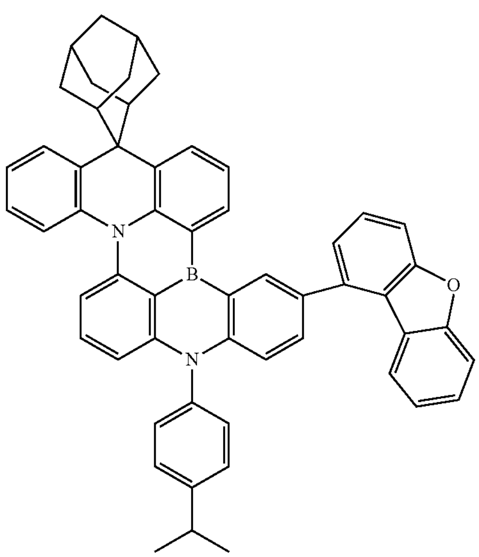
-continued
P141
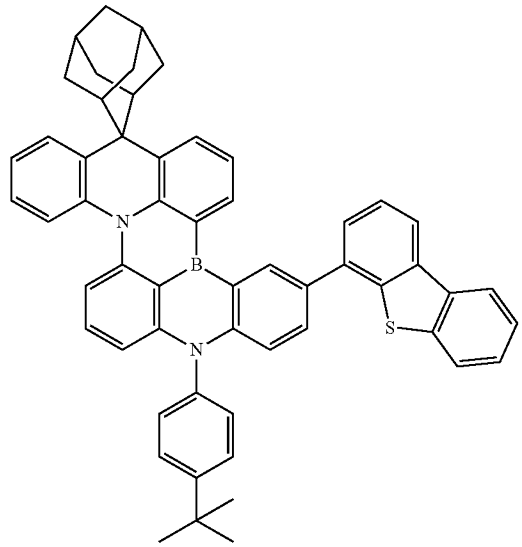
P142
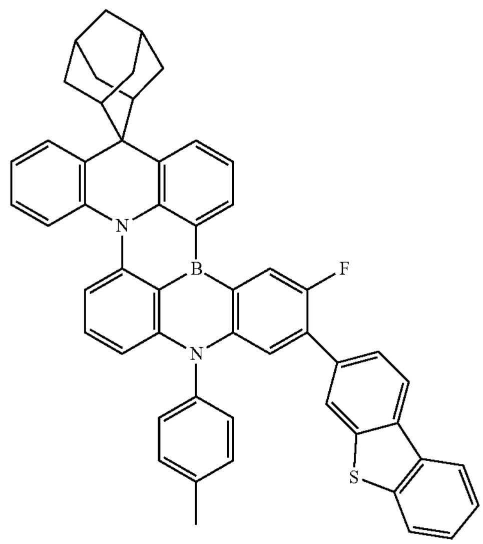
P143
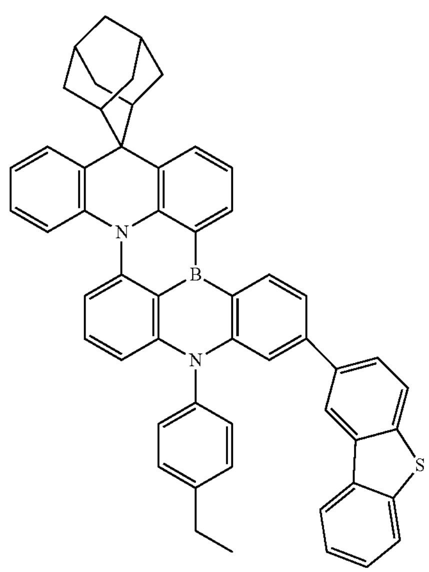

-continued
P144
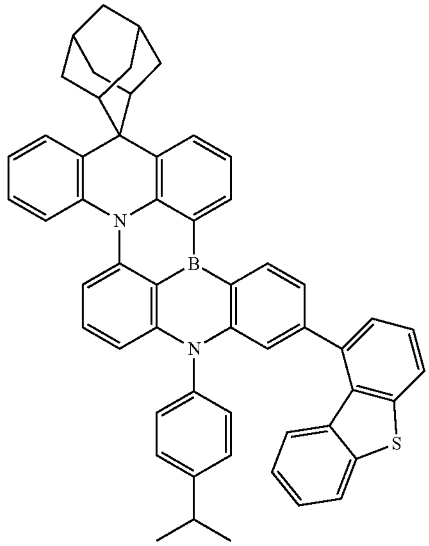
P145
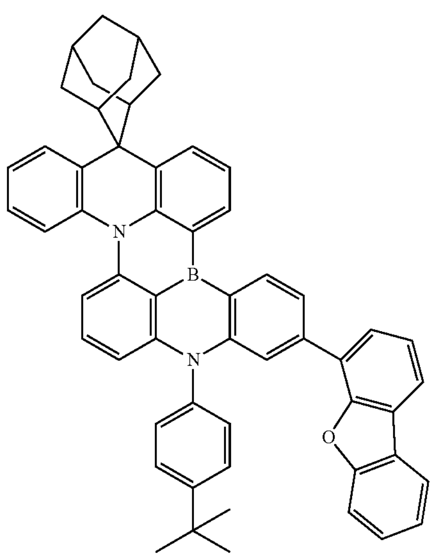
-continued
P146
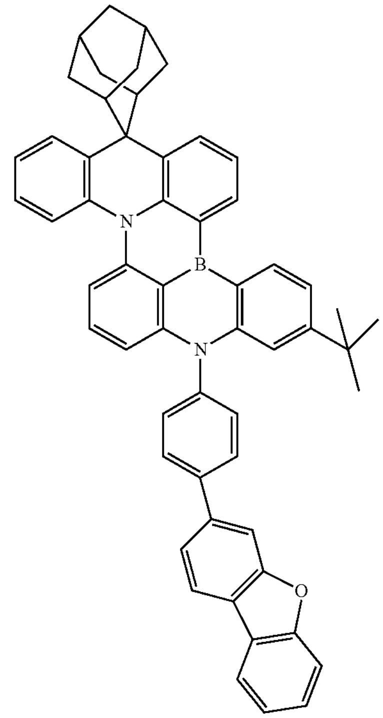
P147
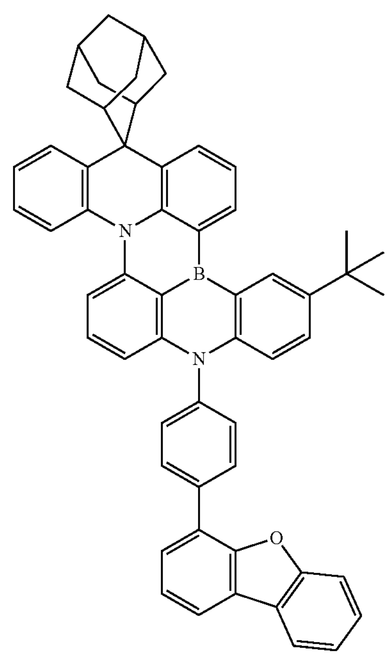

-continued
P148
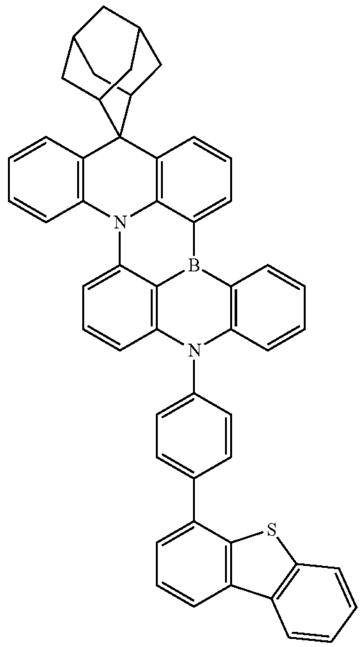
P149
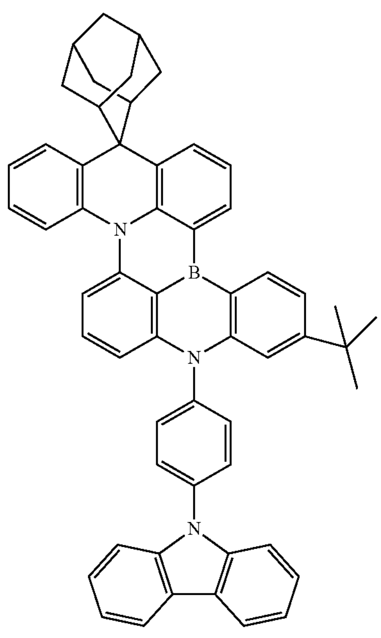
-continued
P150
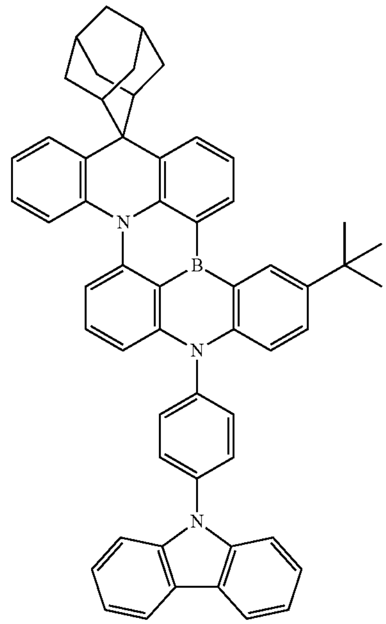
P151
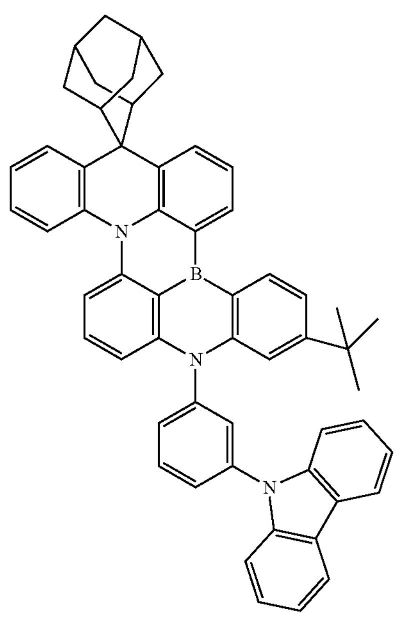

-continued
P152
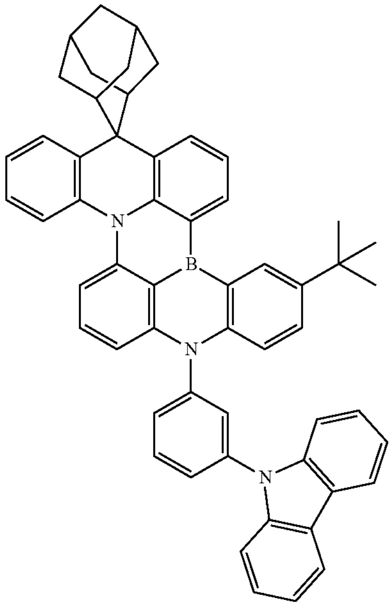
P153
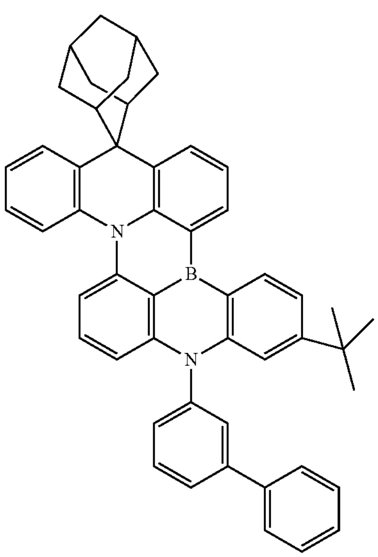
-continued
P154
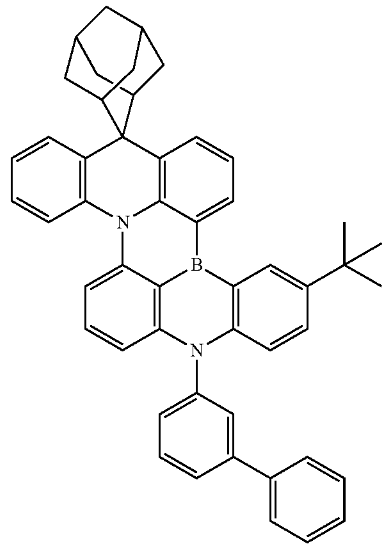
P155
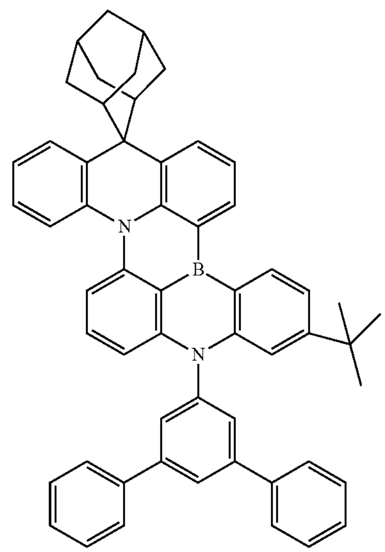
P156
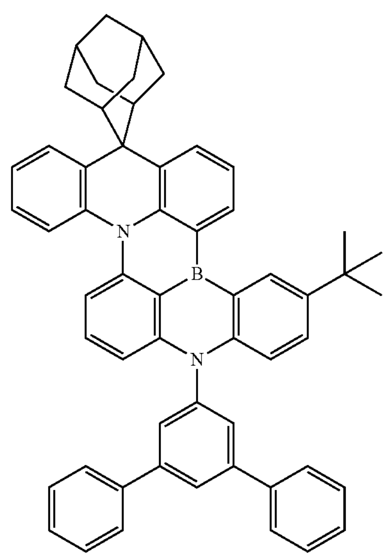

-continued
P157
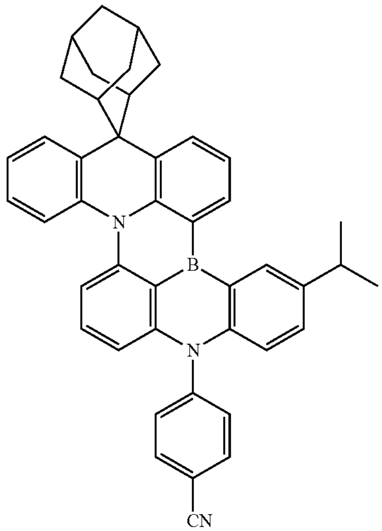
P158
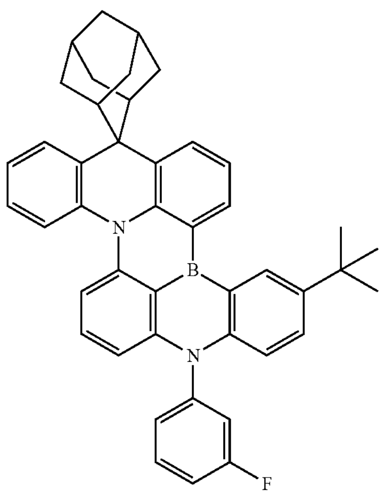
P159
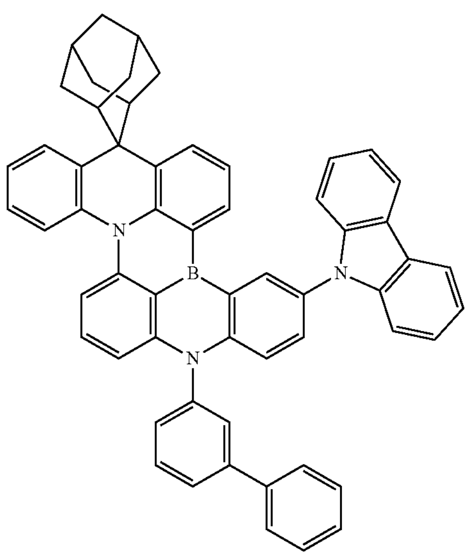
-continued
P160
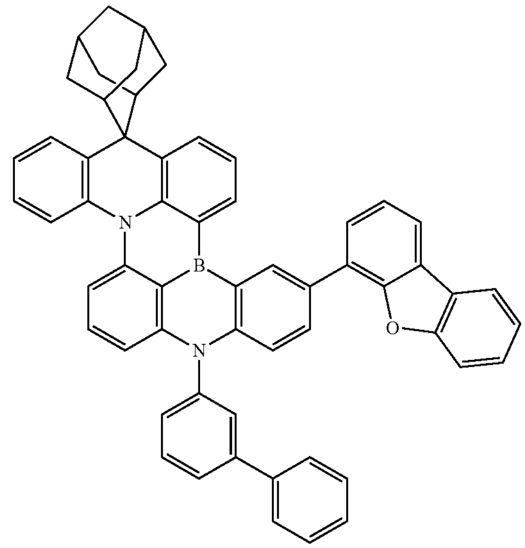
P161
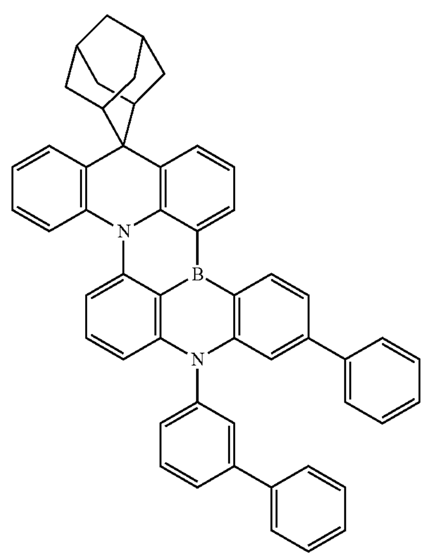

-continued
P162
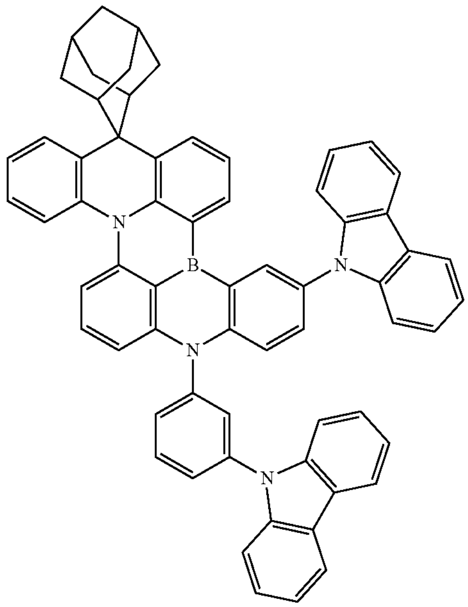
P163
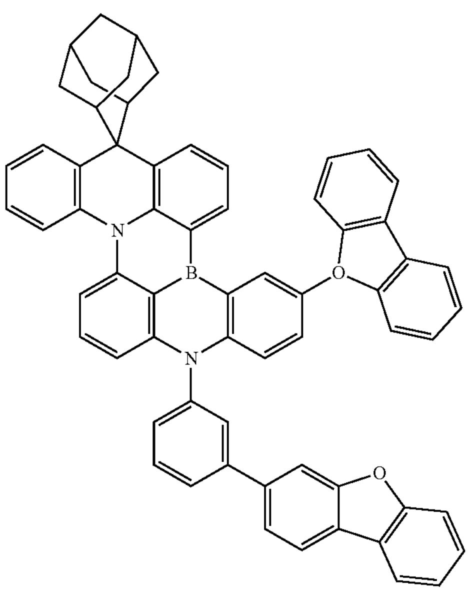
-continued
P164
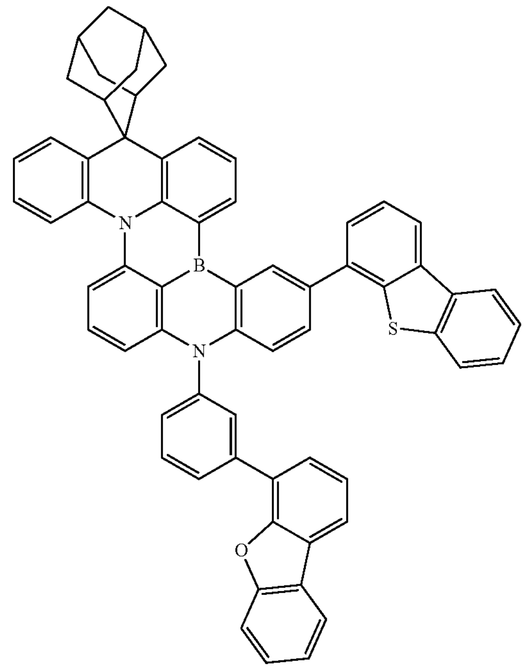
P165
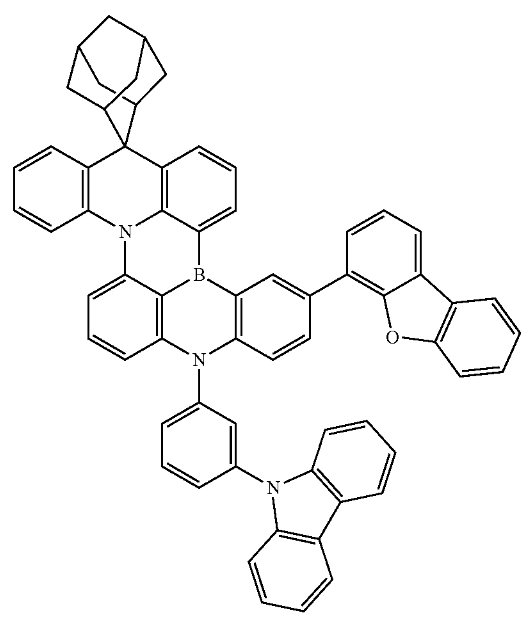

-continued
P166
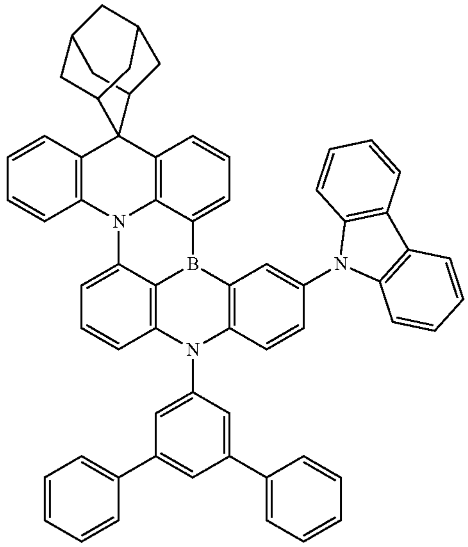
P167
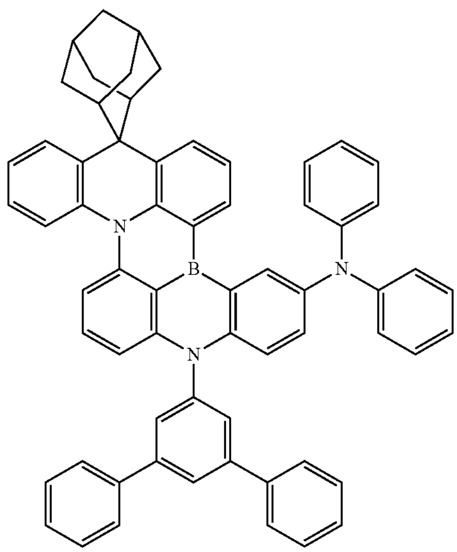
P168
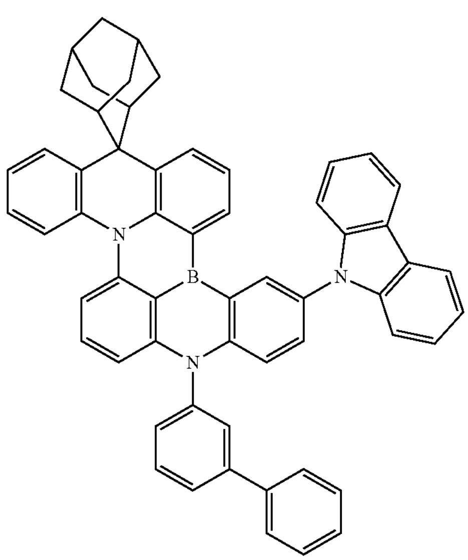
-continued
P169
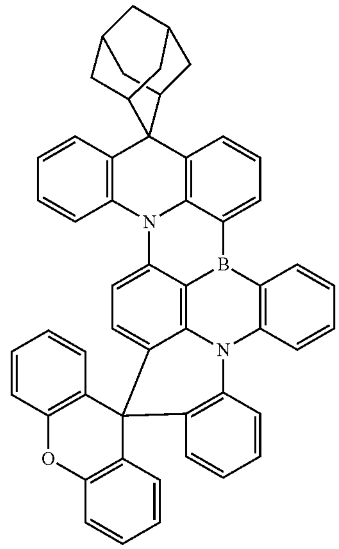
P170
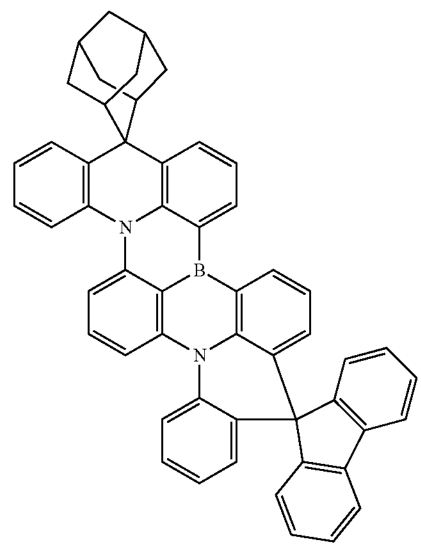
P171
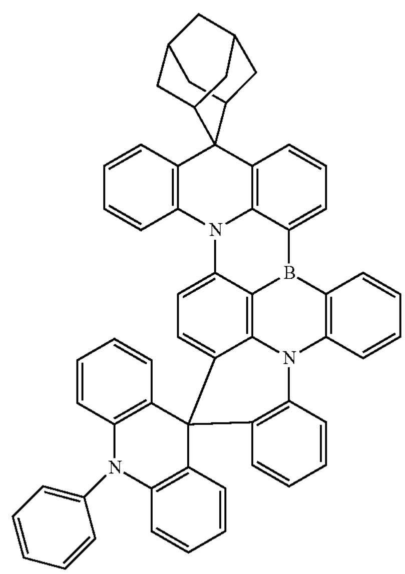

-continued
P172
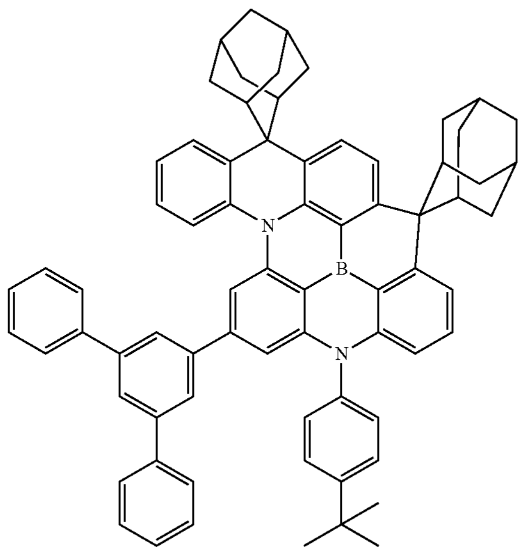
P173
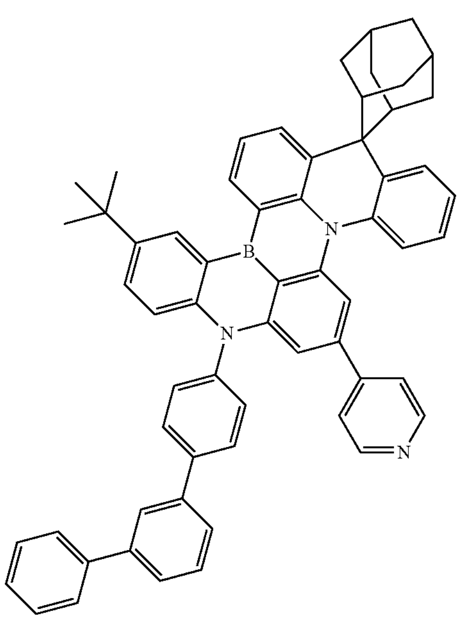
-continued
P174
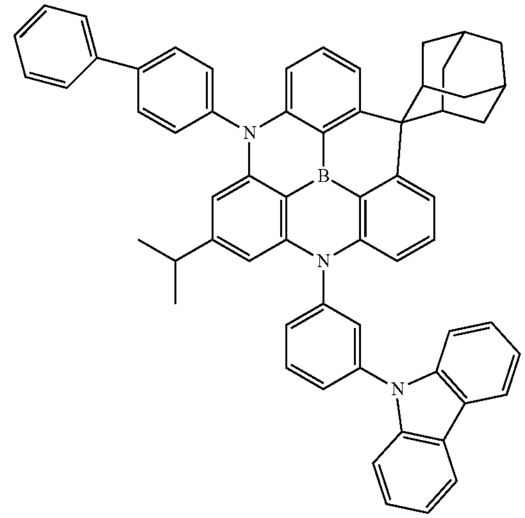
P175
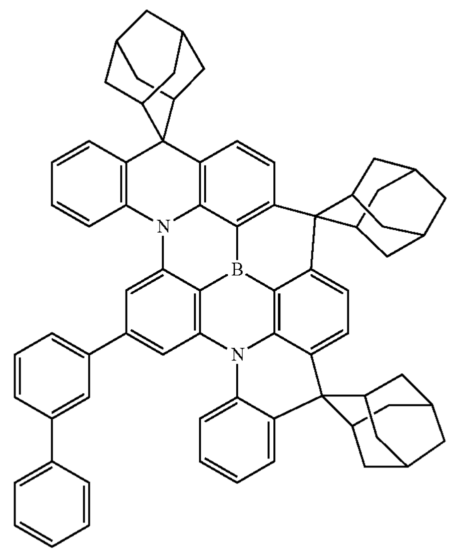
P176
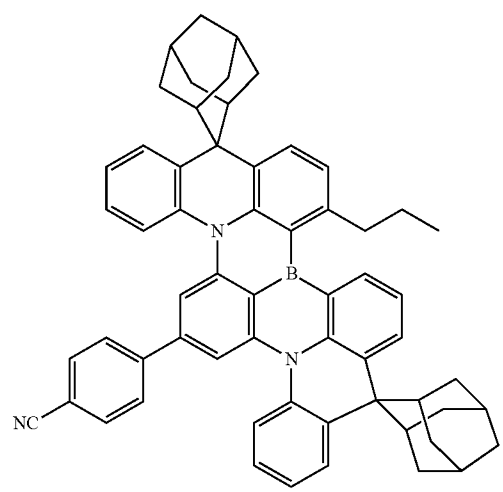

-continued
P177
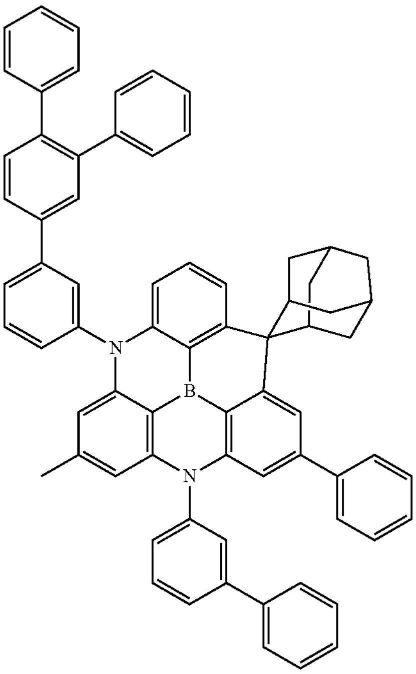
P178
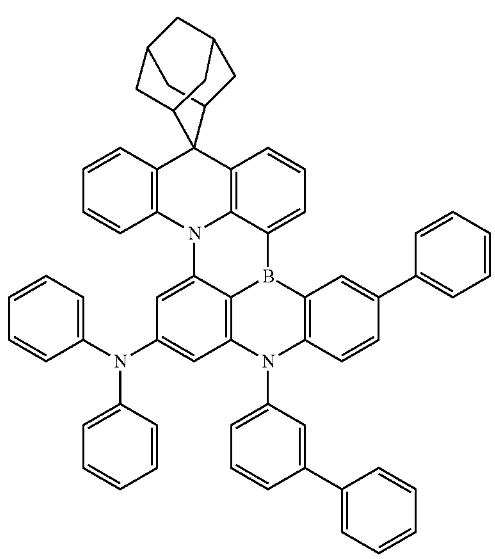
-continued
P179
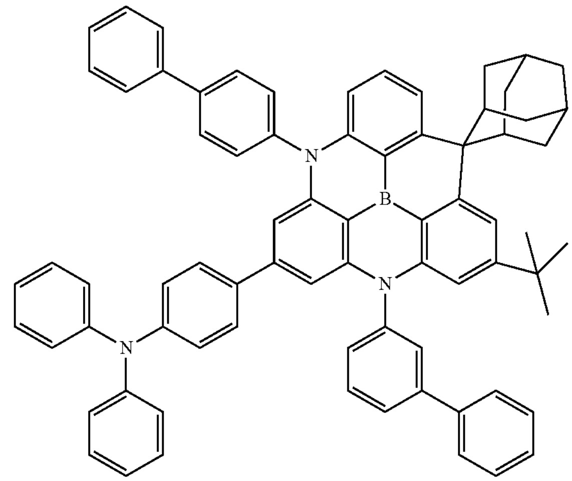
P180
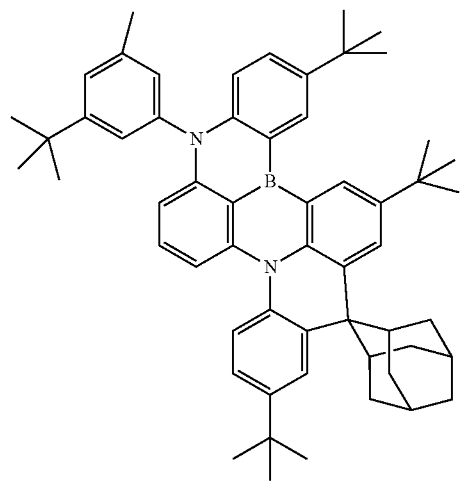
P181
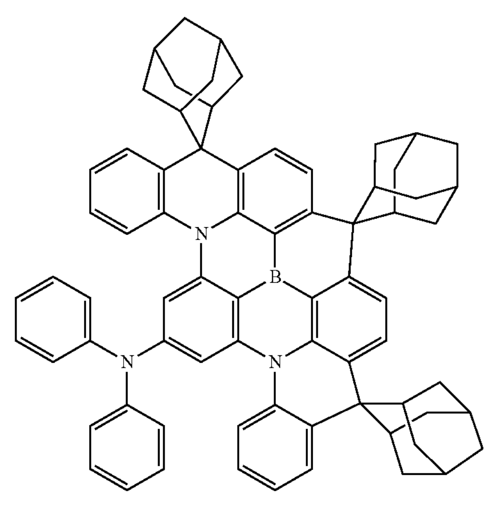

P182
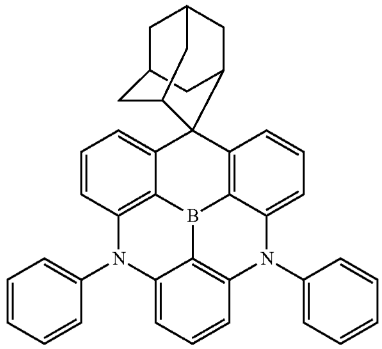
P183
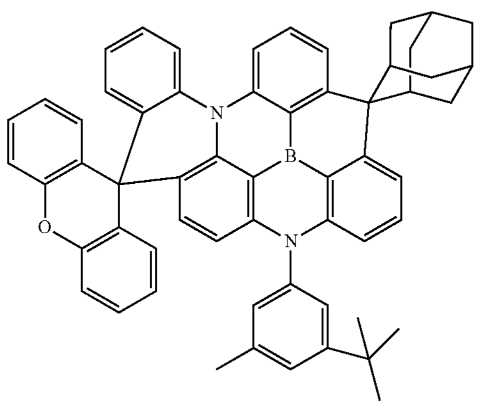
P184
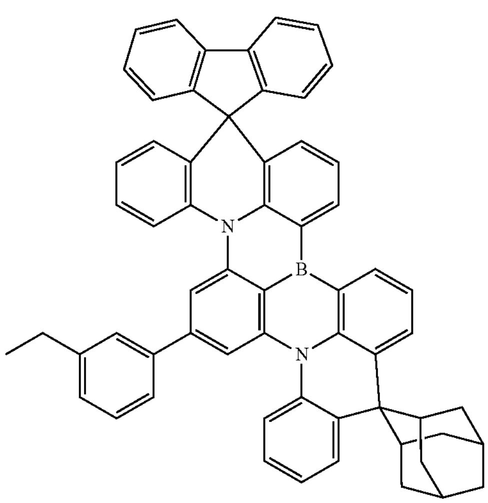
P185
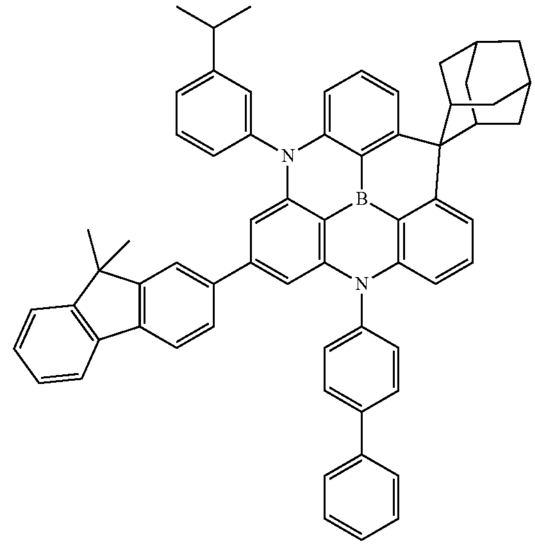
P186
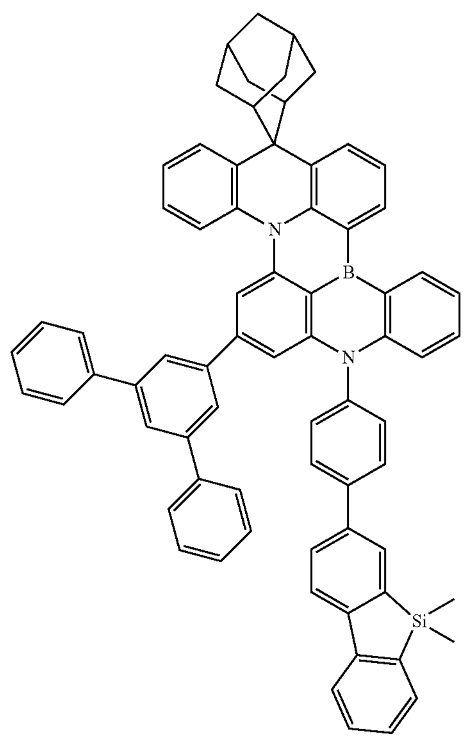

-continued
P187
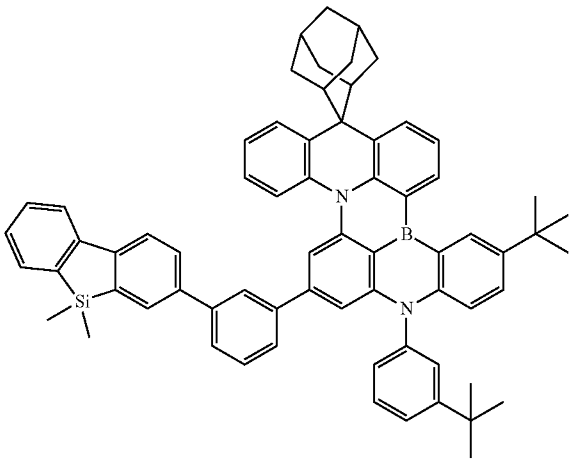
P188
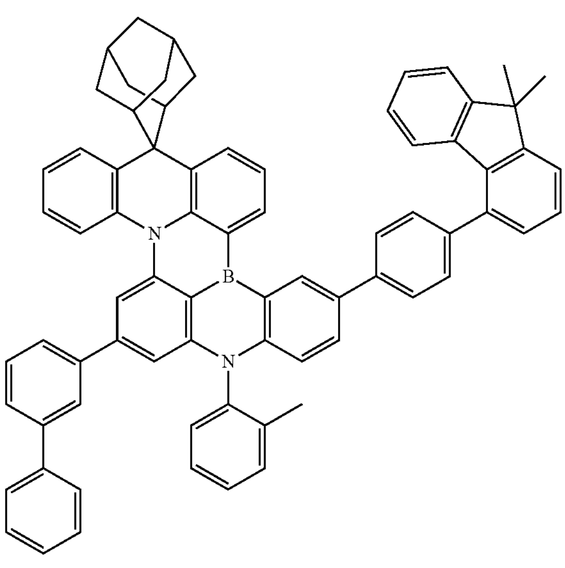
-continued
P189
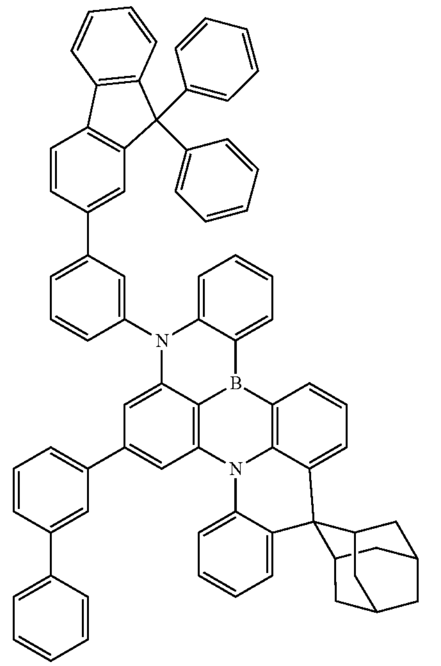
P190
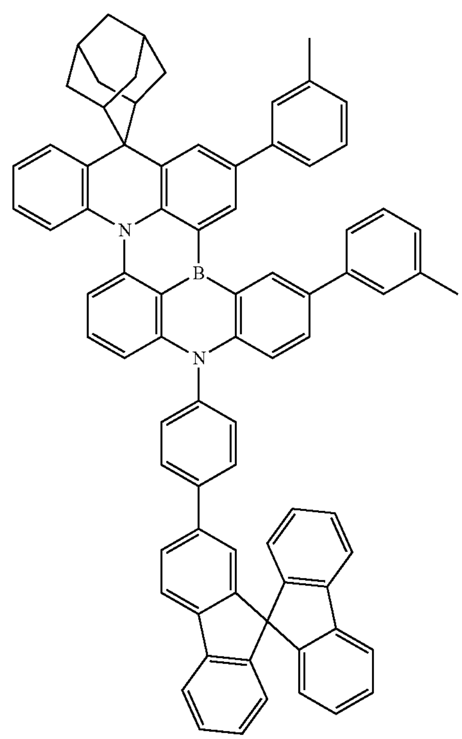

P191
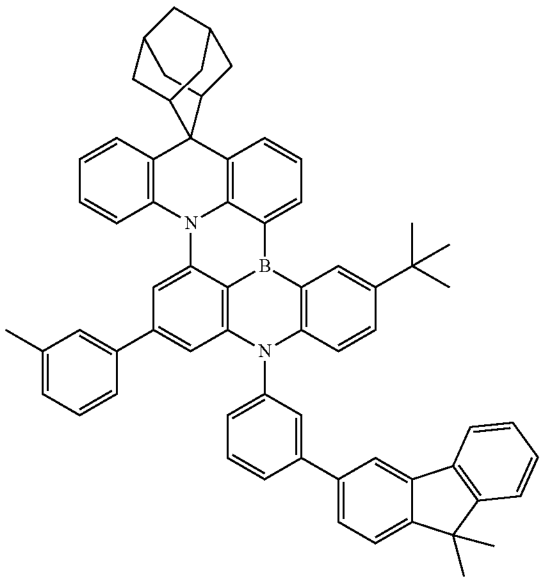
P192
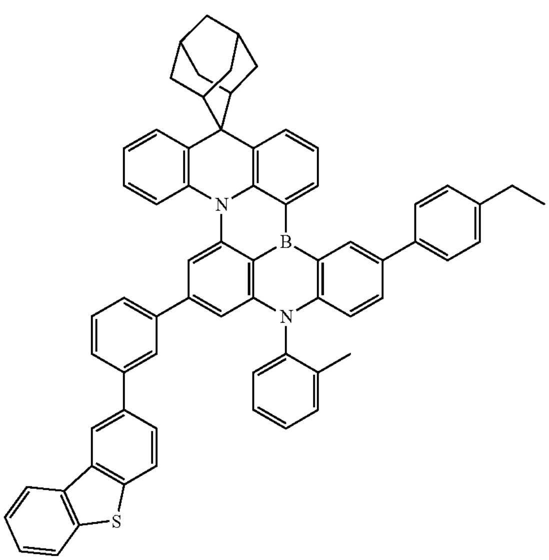
P193
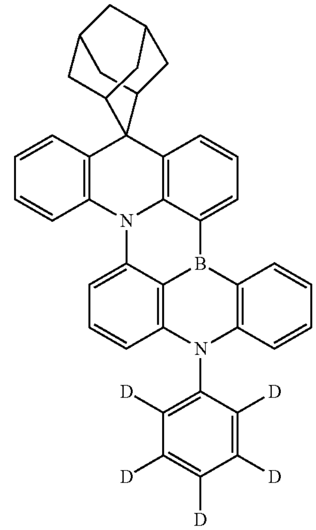
P194
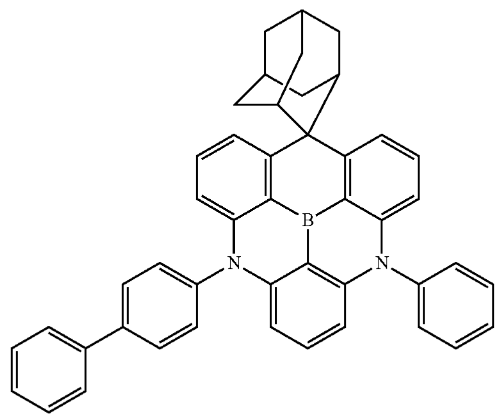
P195
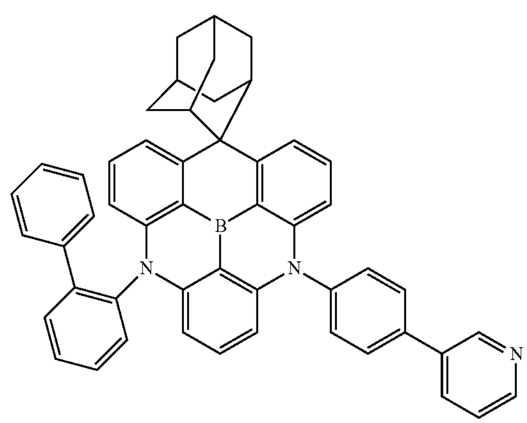

-continued

P196

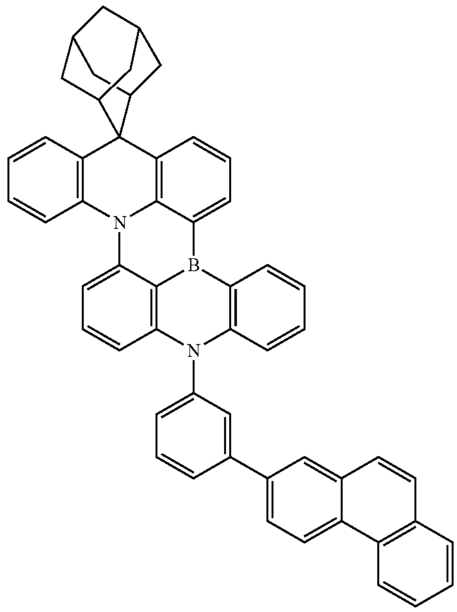

P197

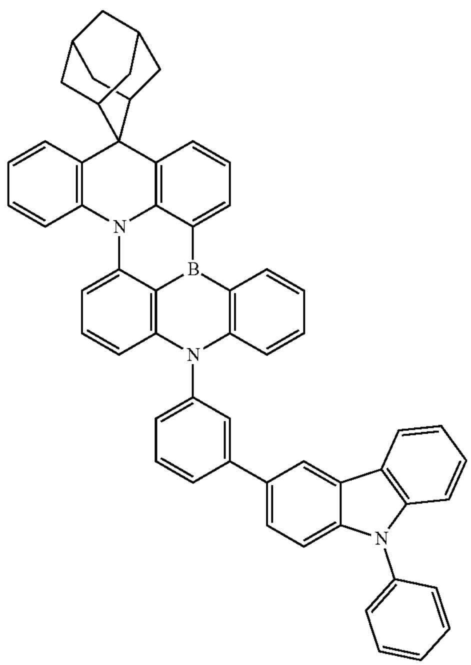

P198

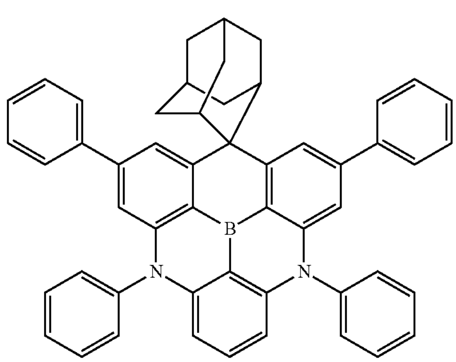

-continued

P199

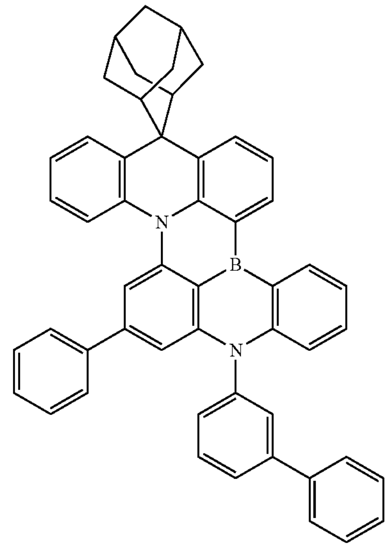

P200

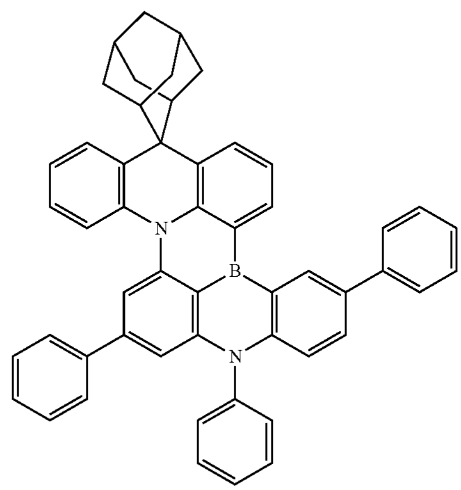

12. An organic electroluminescent device, comprising;

an anode;

a cathode; and at least one functional layer between the anode and the cathode, wherein the functional layer comprises a hole injecting layer, a hole transporting layer, an organic electroluminescent layer, an electron transporting layer and an electron injecting layer, wherein a dopant of the organic electroluminescent layer comprises the organic compound of claim 1.

13. A method of preparing an organic electroluminescence device, comprising;

applying the organic compound of claim 1 to the organic electroluminescence device, wherein the organic electroluminescence device comprises an organic electroluminescent layer.

14. The method according to claim 13, wherein the applied organic compound is used to prepare the organic electroluminescent layer of the organic electroluminescent device.

* * * * *